(12) United States Patent
Yamaguchi et al.

(10) Patent No.: US 9,419,249 B2
(45) Date of Patent: Aug. 16, 2016

(54) LIGHT EXTRACTION PRODUCT FOR SEMICONDUCTOR LIGHT EMITTING DEVICE AND LIGHT EMITTING DEVICE

(71) Applicant: ASAHI KASEI E-MATERIALS CORPORATION, Tokyo (JP)

(72) Inventors: Fujito Yamaguchi, Tokyo (JP); Jun Koike, Tokyo (JP); Aya Takagiwa, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/394,056

(22) PCT Filed: Apr. 11, 2013

(86) PCT No.: PCT/JP2013/060906
§ 371 (c)(1),
(2) Date: Oct. 10, 2014

(87) PCT Pub. No.: WO2013/154150
PCT Pub. Date: Oct. 17, 2013

(65) Prior Publication Data
US 2015/0076468 A1 Mar. 19, 2015

(30) Foreign Application Priority Data

Apr. 13, 2012 (JP) .................................. 2012-092266
Jun. 27, 2012 (JP) .................................. 2012-144616
Oct. 12, 2012 (JP) .................................. 2012-227296
Oct. 12, 2012 (JP) .................................. 2012-227297
Oct. 12, 2012 (JP) .................................. 2012-227298

(51) Int. Cl.
*H01L 51/52* (2006.01)
*G02B 1/118* (2015.01)
(Continued)

(52) U.S. Cl.
CPC .......... *H01L 51/5275* (2013.01); *B32B 37/025* (2013.01); *B32B 37/24* (2013.01);
(Continued)

(58) Field of Classification Search
None
See application file for complete search history.

(56) References Cited

U.S. PATENT DOCUMENTS 4,794,302 A 12/1988 Nire et al.
6,476,550 B1 11/2002 Oda et al.
(Continued)

FOREIGN PATENT DOCUMENTS

JP 62-172691 A 7/1987
JP 2991183 B2 12/1999
(Continued)

OTHER PUBLICATIONS

The International Preliminary Report on Patentability and an English translation of the Written Opinion of the International Searching Authority, dated Oct. 23, 2014, issued in the corresponding International Application No. PCT/JP2013/060906.
(Continued)

*Primary Examiner* — Yasser A Abdelaziez
(74) *Attorney, Agent, or Firm* — Birch, Stewart, Kolasch & Birch, LLP

(57) ABSTRACT

A light extraction product (1) for a semiconductor light emitting device is provided with a concavo-convex structure layer (11), provided with a concavo-convex structure (11a) on a surface thereof, having a first refractive index (n1) and a light extraction layer (12), provided on the convex portion of the concavo-convex structure (11a), having a second refractive index (n2), where in a first light extraction layer (12a) a distance Lcv between an average position Sh of tops of the convex-portions and a convex-portion upper interface average position Scv of the first light extraction layer (12a) meets equation (1) 10 nm≤Lcv≤5000 nm, in the concavo-convex structure (11a) a convex-portion average height H meets equation (2) 10 nm≤H≤5000 nm, an average pitch P meets equation (3) 50 nm≤P≤5000 nm, and the distance Lcv and the convex-portion average height H meet equation (4) 50 nm≤Lcv+H≤6000 nm. It is possible to improve light extraction efficiency from the semiconductor light emitting device using the light extraction product (1), and further to enhance long-term reliability of the semiconductor light emitting device.

37 Claims, 39 Drawing Sheets

(51) Int. Cl.
*G02B 5/02* (2006.01)
*G02B 5/18* (2006.01)
*B32B 37/00* (2006.01)
*B32B 37/24* (2006.01)
*B32B 38/10* (2006.01)
*H01L 33/58* (2010.01)

(52) U.S. Cl.
CPC ............... *B32B 38/10* (2013.01); *G02B 1/118* (2013.01); *G02B 5/0294* (2013.01); *G02B 5/18* (2013.01); *G02B 5/1809* (2013.01); *G02B 5/1814* (2013.01); *G02B 5/1847* (2013.01); *B32B 2037/243* (2013.01); *B32B 2551/08* (2013.01); *H01L 33/58* (2013.01); *H01L 2251/5369* (2013.01); *H01L 2251/55* (2013.01); *H01L 2251/558* (2013.01); *H01L 2933/0058* (2013.01); *H01L 2933/0091* (2013.01); *Y10T 156/10* (2015.01)

(56) References Cited

U.S. PATENT DOCUMENTS

| | | | |
|---|---|---|---|
| 7,449,215 | B2 * | 11/2008 | Akiyoshi ............ H01L 51/5275 427/162 |
| 7,902,748 | B2 | 3/2011 | Cok |
| 8,461,611 | B2 | 6/2013 | Ono et al. |
| 8,704,253 | B2 | 4/2014 | Noda et al. |
| 2008/0197764 | A1 | 8/2008 | Bechtel et al. |
| 2009/0015142 | A1 | 1/2009 | Potts et al. |
| 2009/0298213 | A1 | 12/2009 | Lee et al. |
| 2010/0150513 | A1 | 6/2010 | Zhang et al. |
| 2012/0049170 | A1 | 3/2012 | Yamae et al. |
| 2012/0286258 | A1 | 11/2012 | Naraoka et al. |

FOREIGN PATENT DOCUMENTS

| | | |
|---|---|---|
| JP | 2004-273122 A | 9/2004 |
| JP | 2004-311419 A | 11/2004 |
| JP | 2005-284276 A | 10/2005 |
| JP | 2007-335253 A | 12/2007 |
| JP | 2008-541368 A | 11/2008 |
| JP | 2010-529598 A | 8/2010 |
| JP | 2010-533932 A | 10/2010 |
| JP | 2011-28940 | 2/2011 |
| JP | 2012-124257 A | 6/2012 |
| WO | WO 2010/044489 A1 | 4/2010 |
| WO | WO 2011/132773 A1 | 10/2011 |

OTHER PUBLICATIONS

International Search Report, issued in PCT/JP2013/060906, dated Jul. 2, 2013.

Partial Supplementary European Search Report, issued Mar. 23, 2015, for European Application No. 13775407.3.

* cited by examiner

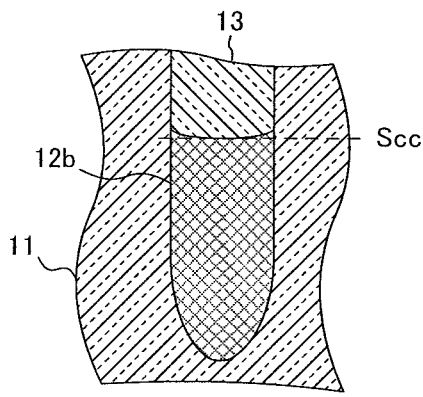
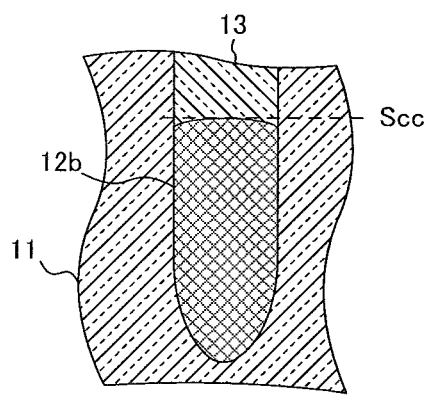
FIG.5A  FIG.5B
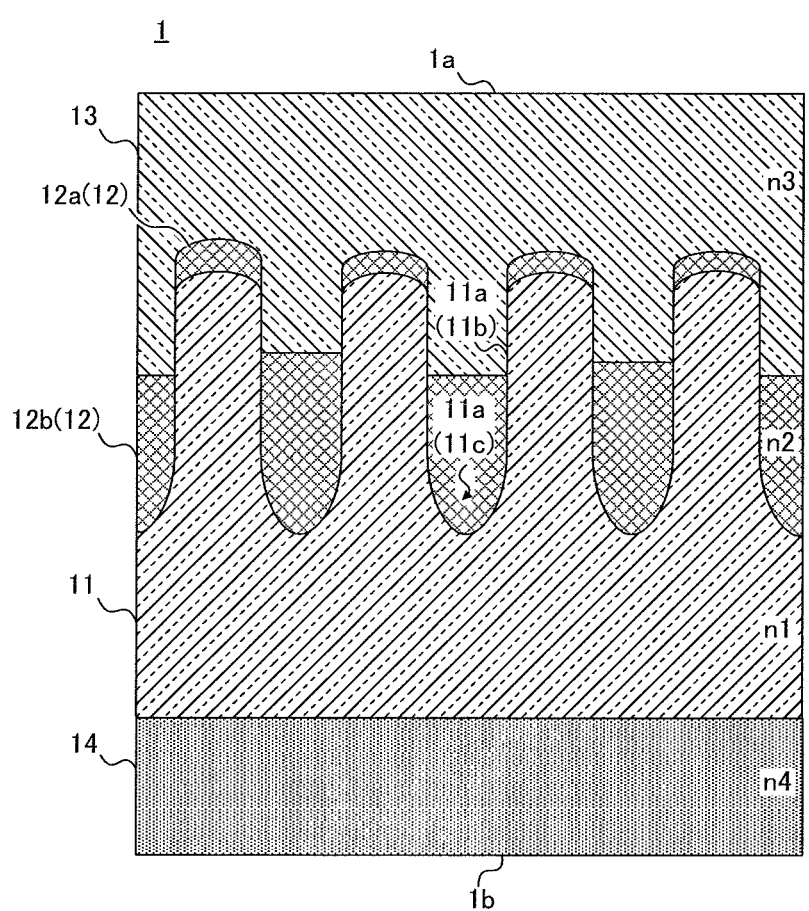
FIG.6

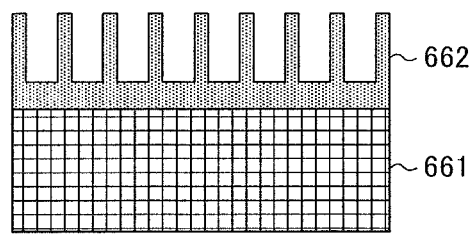
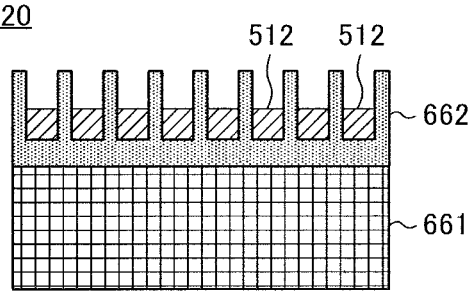
FIG.36A                FIG.36B
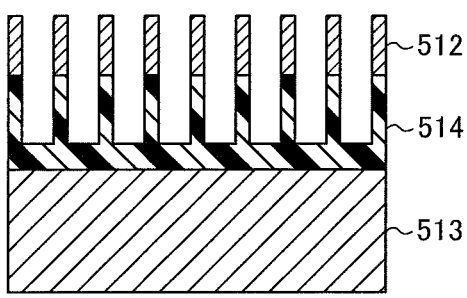
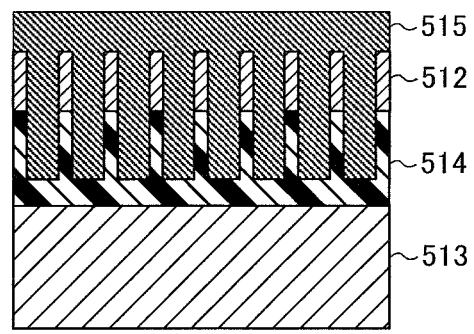
FIG.36C                FIG.36D

LIGHT EXTRACTION PRODUCT FOR SEMICONDUCTOR LIGHT EMITTING DEVICE AND LIGHT EMITTING DEVICE

TECHNICAL FIELD

The present invention relates to a light extraction product for semiconductor light emitting device and light emitting device, and for example, to a light extraction product for semiconductor light emitting device suitably used in a semiconductor light emitting device such as an organic EL device and LED, and light emitting device.

BACKGROUND ART

In recent years, in order to improve luminous efficiency in a semiconductor light emitting device such as an organic EL device, fluorescent product and LED, improvements have been studied in light extraction efficiency from the semiconductor light emitting device. Such a semiconductor light emitting device has a configuration that a high refractive index region is sandwiched between low refractive index regions and that a light emitting portion is included inside the high refractive index region. Therefore, emitted light emitted in the light emitting portion becomes a waveguide mode that the light is guided inside the high refractive index region, while being enclosed inside the high refractive index region, and is absorbed in the waveguide process to attenuate. Accordingly, it is not possible to extract the light to the outside of the semiconductor light emitting device, and light extraction efficiency significantly decreases.

In order to effectively improve light extraction efficiency, it is necessary to break the waveguide mode early. Therefore, to improve light extraction efficiency, such a method is proposed that an intermediate refractive index layer is formed between the low refractive index region and the high refractive index region (for example, see Patent Document 1). However, in this method as described in Patent Document 1, it is not possible to break total reflection of light in the interface between the high refractive index region and the intermediate refractive index layer and in the interface between the intermediate refractive index layer and the low refractive index region. Therefore, the totally reflected light maintains the waveguide mode to attenuate, and it is not expected to significantly improve light extraction efficiency.

Further, such a method is proposed that light enclosed by the waveguide mode is extracted as diffracted light using a diffraction grating or zone plate provided in a position for suppressing total reflection in the device interface (for example, see Patent Document 2). In the method as described in Patent Document 2, since required are materials with a refractive index close to that of the high refractive index region and the waveguide mode is broken with diffracted light, light extraction efficiency is improved in only light of a critical angle or more, and it is not expected to obtain radical improvements in light extraction efficiency. Further, glare occurs based on a diffraction color specific to diffracted light. In other words, when a user of a light emitting device sees the light emitting device that is emitting, the user feels glare, visibility to the light emitting device decreases, and softness of light like natural light decreases.

Further, to break the waveguide mode with diffracted light, the diffraction angle dependence for each wavelength is remarkable, and another problems also arises that an emitted light color is seen differently corresponding to an angle to visually identify i.e. so-called the color shift increases.

On the other hand, as another example of breaking the waveguide mode and improving light extraction efficiency, a light extraction film is proposed to extract an evanescent wave oozing from the high refractive index region to the low refractive index region (for example, Patent Document 3). In the light extraction film as described in Patent Document 3, a structuring layer having a first refractive index is provided on a flexible substrate, and a filling material layer containing a material having a second refractive index is provided on the structuring layer. The filling material layer is provided to fill a concavo-convex structure provided on the surface of the structuring layer and to flatten the surface on the side opposite to the structuring layer. In the film for light extraction as described in Patent Document 3, it is designed that when the surface of the filling material layer having the second refractive index comes into contact with the high refractive index region of the light emitting device, the concavo-convex structure of the structuring layer having the first refractive index is included inside the evanescent wave region. Therefore, it is possible to extract the evanescent wave, which occurs in the interface between the filling material layer and the high refractive index region of the waveguide mode light that is reflected in the high refractive index region and returns to the inside of the light emitting device, with the structuring layer, and it is thereby possible to improve light extraction efficiency.

Further, as still another example of breaking the waveguide mode and improving light extraction efficiency, a surface light emitting apparatus is proposed in which a plurality of dielectric antennas is provided on the surface of a light transmission layer provided on the light emitting portion surface (for example, see Patent Document 4).

PRIOR ART DOCUMENT

Patent Document

[Patent Document 1] Japanese Unexamined Patent Publication No. S62-172691
[Patent Document 2] Japanese Patent Gazette No. 2991183
[Patent Document 3] Japanese Unexamined Patent Translation Publication No. 2010-533932
[Patent Document 4] Japanese Unexamined Patent Publication No. 2004-273122

DISCLOSURE OF INVENTION

Problems to be Solved by the Invention

However, in the method as described in Patent Document 2, in the case of disturbing reflection in the transparent dielectric layer interface to obtain light extraction efficiency, it is difficult to highly maintain surface accuracy of the transparent conductive layer surface, and therefore, it is conceivable that long-term reliability degrades in the semiconductor light emitting device (organic electron luminescence device). Further, since a diffraction grating is used to disturb the waveguide mode, strong glare occurs based on a diffraction color specific to diffracted light. In other words, when a user of a light emitting device sees the light emitting device that is emitting, the user feels glare, visibility to the light emitting device decreases, and softness of light like natural light decreases.

Further, in the optical film as described in Patent Document 3, since the surface of the filling material layer is flattened, the distribution is small in the distance between the concavo-convex structure of the structuring layer and the surface of the filling material layer. Therefore, the evanescent wave is extracted as light diffraction, and therefore, there is the problem that the user of the light emitting device feels glare specific to diffracted light. In other words, when the user of the light emitting device sees emitted light of the light emitting device, the user feels glare, and therefore, there are problems that visibility to the light emitting device decreases, and that softness of light like natural light decreases. Furthermore, to more improve light extraction efficiency, it is necessary to make the refractive index of a material constituting the flattened layer close to the refractive index of the transparent conductive layer. Since such a high refractive index material is not only difficult to produce, expensive, and also has a tendency to be stabilized as particles, flatness of the flattened layer surface degrades to tend to have roughness. Therefore, it is conceivable that the distribution occurs in the film thickness of the transparent conductive film layer provided on the filling material layer, and that long-term reliability as the light emitting device degrades due to current concentration.

Furthermore, in the surface light emitting apparatus as described in Patent Document 4, since a plurality of dielectric antennas is provided in the interface between the light emitting layer and the light transmission layer, on the surface of the light transmission layer, or any one of interface of the light transmission layer formed of a multi-layer film, it is necessary to directly process the surface light emitting apparatus or assemble the surface light emitting apparatus on a substrate provided with exposed dielectric antennas. In such a case, since the dielectric antenna is a structure product of nanoscale, it is conceivable that throughput decreases in manufacturing of the surface light emitting apparatus, or defects in the surface light emitting device increase. Still furthermore, in the surface light emitting apparatus as described in Patent Document 4, since the dielectric antennas are provided in the light transmission layer and the interface between layers, it is conceivable that it is not possible to always obtain sufficient physical long-term stability of the dielectric antennas.

The present invention was made in view of such respects, and it is an object of the invention to provide a light extraction product for a semiconductor light emitting device for enabling light extraction efficiency from the semiconductor light emitting device to be improved, enabling the color shift and glare of light to be suppressed, and further enabling long-term reliability of the semiconductor light emitting device to be enhanced, and the light emitting device.

Means for Solving the Problem

A light extraction product for a semiconductor light emitting device of the present invention is characterized by being provided with a concavo-convex structure layer, provided with a concavo-convex structure on a surface thereof, having a first refractive index (n1), and a light extraction layer, provided on the concavo-convex structure, having a second refractive index (n2), where the first refractive index (n1) is substantially different from the second refractive index (n2), the light extraction layer includes a first light extraction layer provided on a convex portion of the concavo-convex structure, in the first light extraction layer a distance Lcv between an average position Sh of tops of the convex-portions and a convex-portion upper interface average position Scv of the first light extraction layer meets following equation (1), in the concavo-convex structure a convex-portion average height H meets following equation (2), while an average pitch P meets following equation (3), and the distance Lcv and the convex-portion average height H meet following equation (4).

$10 \text{ nm} \leq Lcv \leq 5000 \text{ nm}$  Eq. (1)

$10 \text{ nm} \leq H \leq 5000 \text{ nm}$  Eq. (2)

$50 \text{ nm} \leq P \leq 5000 \text{ nm}$  Eq. (3)

$50 \text{ nm} \leq Lcv + H \leq 6000 \text{ nm}$  Eq. (4)

Further, a light extraction product for a semiconductor light emitting device of the present invention is characterized by being provided with a concavo-convex structure layer, provided with a concavo-convex structure on a surface thereof, having a first refractive index (n1), and a light extraction layer, provided on the concavo-convex structure, having a second refractive index (n2), where the first refractive index (n1) is substantially different from the second refractive index (n2), the light extraction layer includes a second light extraction layer provided inside a concave portion of the concavo-convex structure, in the second light extraction layer a distance Lcc between an average position Sh of tops of the convex-portions and a concave-portion internal interface average position Scc of the second light extraction layer and a convex-portion average height H meet following equation (5), and in the concavo-convex structure a convex-portion average height H meets following equation (2), while an average pitch P meets following equation (3).

$10 \text{ nm} \leq H \leq 5000 \text{ nm}$  Eq. (2)

$50 \text{ nm} \leq P \leq 5000 \text{ nm}$  Eq. (3)

$0.0H < Lcc < 1.0H$  Eq. (5)

Furthermore, a light extraction product for a semiconductor light emitting device of the present invention is characterized by being provided with a concavo-convex structure layer, provided with a concavo-convex structure on a surface thereof, having a first refractive index (n1), and a light extraction layer, provided on the concavo-convex structure, having a second refractive index (n2), where the first refractive index (n1) is substantially different from the second refractive index (n2), the light extraction layer includes a first light extraction layer provided on a convex portion of the concavo-convex structure and a second light extraction layer provided inside a concave portion of the concavo-convex structure, in the second light extraction layer a distance Lcc between an average position Sh of tops of the convex-portions and a concave-portion internal interface average position Scc of the second light extraction layer and a convex-portion average height H meet following equation (5), in the first light extraction layer a distance Lcv between the average position Sh of tops of the convex-portions and a convex-portion upper interface average position Scv of the first light extraction layer provided on the convex portion of the concavo-convex structure and the convex-portion average height H meet following equation (6), and in the concavo-convex structure the convex-portion average height H meets following equation (2), while an average pitch P meets following equation (3).

$10 \text{ nm} \leq H \leq 5000 \text{ nm}$  Eq. (2)

$50 \text{ nm} \leq P \leq 5000 \text{ nm}$  Eq. (3)

$0.0H < Lcc < 1.0H$  Eq. (5)

$0.0H < Lcv \leq 1.5H$  Eq. (6)

According to these configurations, by bringing the light extraction layer surface side of the above-mentioned light extraction product for a semiconductor light emitting device into contact with the light emitting layer surface (for example, transparent conductive layer) of the semiconductor light emitting device via a thin adhesive layer, it is possible to extract oozing light derived from the waveguide mode oozing in the interface between the light emitting layer surface and the adhesive layer by light diffraction due to both the light extraction layer and the concavo-convex structure layer.

Particularly, it is possible to exert the following effects, when the concavo-convex structure layer having the first refractive index (n1) of the light extraction product for a semiconductor light emitting device has a structure in the shape of dots, in the shape of holes, or in the shape of a palisade body or lattice and the average pitch of the concavo-convex structure meets a predetermined range.

(1) It is possible to decrease an energetically stable film thickness of the adhesive layer on tops of convex-portions in the concavo-convex structure of the concavo-convex structure layer having the first refractive index (n1). In other words, it is possible to decrease a difference between a surface position on the tops of the convex-portions of the concavo-convex structure and a surface position on the concave portion of the concavo-convex structure of the adhesive layer in arranging the adhesive layer on the concavo-convex structure of the concavo-convex structure layer. Therefore, it is possible to thin on a nanoscale and uniform a distance between the top of the concavo-convex structure having the first refractive index (n1) and the light emitting layer surface. In view of the foregoing, first, since it is possible to enhance film thickness uniformity of the adhesive layer, it is possible to highly keep surface accuracy of the light emitting layer surface, and as a result, it is possible to suppress deterioration and breakage due to current concentration of the semiconductor light emitting device. It is thus possible to improve long-term stability of the semiconductor light emitting device. Next, since it is possible to thin the film thickness of the adhesive layer on a nanoscale, it is conceivable that it is possible to effectively propagate the oozing light, which oozes from the interface between the adhesive layer and the light emitting layer surface and attenuates exponentially with distance in the thickness direction of the semiconductor light emitting device, to the light extraction layer having the second refractive index and the concavo-convex structure layer having the first refractive index, as a result it is possible to extract the oozing light by the light extraction layer and the concavo-convex structure of the concavo-convex structure layer having the first refractive index, and that light extraction efficiency is improved.

(2) Since the concavo-convex structure of the concave-convex structure layer having the first refractive index is in the shape of dots, in the shape of holes, or in the shape of a palisade body or lattice and meets a predetermined average pitch, it is possible to decrease the size of the light extraction layer having the second refractive index with respect to the in-plane direction of the light extraction product for a semiconductor light emitting device. Therefore, it is possible to suppress reflection inside the light extraction product for a semiconductor light emitting device of the emitted light (incident emitted light within the critical angle) input to the light extraction product for a semiconductor light emitting device from the light emitting layer surface. In other words, it is possible to suppress returning of the incident emitted light within the critical angle with respect to the light emitting layer surface to the light emitting layer surface side. Therefore, it is possible to extract the above-mentioned oozing light, and to maintain extraction of the incident emitted light within the critical angle with respect to the light emitting layer surface.

(3) Since the second refractive index (n2) of the light extraction layer is substantially different from the first refractive index (n1) of the concavo-convex structure layer, diffraction modes are mutually different, and it is presumed that such a function develops that as if two diffraction point groups causing different light diffraction phenomena overlap. By this means, it is conceivable that light output characteristics are further disturbed in the oozing light extracted from the light extraction layer and concavo-convex structure layer and the incident emitted light within the critical angle, and that light scattering properties thereby develop. Since such light scattering has a great effect of disturbing the waveguide mode, it is possible to effectively improve light extraction efficiency.

Further, when the concavo-convex structure of the concavo-convex structure layer having the first refractive index is in the shape of dots, in the shape of holes, or in the shape of a palisade body or lattice, it is made easy introducing disturbance (disturbance of arrangement and shape) to the concavo-convex structure. Therefore, scattering properties of output light are strengthened, the color shift is reduced, and it is possible to obtain output light closer to natural light. This is presumed due to light scattering properties corresponding to the distribution of effective medium approximate refractive index Nema in terms of the emitted light of the semiconductor light emitting device when the wavelength of the emitted light is sufficiently larger than the average pitch of the concavo-convex structure. On the other hand, when the wavelength of emitted light is equal to or less than the average pitch of the concavo-convex structure, it is conceivable that the number of light diffraction modes increases which occur on a microscopic scale such as one by one of the concavo-convex structure, and that dispersion is included in the light diffraction mode. In other words, on a macroscopic scale such as several tens of micrometers, averaged light of a plurality of light diffraction modes is observed. From the same reason, it is made easy introducing disturbance (arrangement and shape) to the light extraction layer having the second refractive index (n2), and therefore, it is possible to develop the effect of suppressing the color shift. As a result, it is also possible to suppress glare when a user of the semiconductor light emitting device visually identifies the device.

Furthermore, by these configurations, in the case of having the first light extraction layer on the convex portion and the second light extraction layer inside the concave portion, since the distribution occurs in the distance between the interface between the adhesive layer and the light emitting layer surface and the light extraction layer, it is possible to extract the oozing light oozing from the interface in emitted light forming the waveguide mode in the interface between the light emitting layer surface and the adhesive layer, by light diffraction due to the first light extraction layer, second light extraction light and concavo-convex structure layer. In this case, since the first light extraction layer, second light extraction light and concavo-convex structure layer have substantially different refractive indexes, diffraction modes are mutually different, and it is conceivable that such a function develops that as if three diffraction point groups causing different light diffraction phenomena overlap, the above-mentioned scattering properties are further strengthened, and that light extraction efficiency is thereby further improved. Moreover, since it is conceivable that the degree of improvement of scattering properties is high in adding disturbance to the shape and arrangement of the concavo-convex structure as described above, it is presumed that the effect of reducing the color effect is also more enhanced.

The light extraction product for a semiconductor light emitting device of the invention is provided with a flattened layer, provided to cover the concavo-convex structure layer and the light extraction layer, having a third refractive index (n3), where it is preferable that the first refractive index (n1), the second refractive index (n2) and the third refractive index (n3) meet any one of following equations (7) to (9), and that in the flattened layer, an average distance Lor between the convex-portion upper interface average position Scv of the first light extraction layer and a surface of the flattened layer meets following equation (10).

$$n2>n3 \geq n1 \text{ and } (n2-n3) \geq 0.1 \quad \text{Eq. (7)}$$

$$n3>n2>n1 \text{ and } (n3-n2) \geq 0.1 \quad \text{Eq. (8)}$$

$$n3 \geq n1>n2 \text{ and } (n1-n2) \geq 0.1 \quad \text{Eq. (9)}$$

$$0 \text{ nm} \leq Lor \leq 800 \text{ nm} \quad \text{Eq. (10)}$$

The light extraction product for a semiconductor light emitting device of the invention is provided with a flattened layer, provided to cover the concavo-convex structure layer and the light extraction layer, having a third refractive index (n3), where it is preferable that the first refractive index (n1), the second refractive index (n2) and the third refractive index (n3) meet any one of following equations (7) to (9), and that in the flattened layer, an average distance Lor between the concave-portion internal interface average position Scc of the second light extraction layer and a surface of the flattened layer and the distance Lcc meet following equation (11).

$$n2>n3 \geq n1 \text{ and } (n2-n3) \geq 0.1 \quad \text{Eq. (7)}$$

$$n3>n2>n1 \text{ and } (n3-n2) \geq 0.1 \quad \text{Eq. (8)}$$

$$n3 \geq n1>n2 \text{ and } (n1-n2) \geq 0.1 \quad \text{Eq. (9)}$$

$$Lcc \leq Lor \leq 800 \text{ nm} \quad \text{Eq. (11)}$$

The light extraction product for a semiconductor light emitting device of the invention is provided with a flattened layer, provided to cover the concavo-convex structure layer and the light extraction layer, having a third refractive index (n3), where it is preferable that the first refractive index (n1), the second refractive index (n2) and the third refractive index (n3) meet any one of following equations (7) to (9), and that in the flattened layer, an average distance Lor between the concave-portion internal interface average position Scc of the second light extraction layer and a surface of the flattened layer, the distance Lcc and the distance Lcv meet following equation (12).

$$n2>n3 \geq n1 \text{ and } (n2-n3) \geq 0.1 \quad \text{Eq. (7)}$$

$$n3>n2>n1 \text{ and } (n3-n2) \geq 0.1 \quad \text{Eq. (8)}$$

$$n3 \geq n1>n2 \text{ and } (n1-n2) \geq 0.1 \quad \text{Eq. (9)}$$

$$(Lcc+Lcv) \leq Lor \leq 800 \text{ nm} \quad \text{Eq. (12)}$$

According to these configurations, it is possible to improve long-term reliability of the semiconductor light emitting device, and to significantly improve light extraction efficiency. Further, it is also possible to exert the effect of suppressing the color shift, while improving light extraction efficiency. Since it is possible to decrease an energetically stable film thickness of the flattened layer provided on the concavo-convex structure layer having the first refractive index (n1) and light extraction layer, on tops of convex-portions in the concavo-convex structure of the concavo-convex structure layer having the first refractive index (n1), even when the film thickness of the flattened layer is thinned to nanoscale, it is possible to improve surface accuracy. Herein, surface accuracy is film thickness accuracy in the case of a microscopic view (scale such as one by one of the concavo-convex structure) and film thickness accuracy in the case of a macroscopic view (scale of several tens of micrometers or more). In other words, it is possible to improve flatness of the flattened layer inside the surface of the light extraction product for a semiconductor light emitting device. Therefore, it is possible to thin on a nanoscale and uniform a distance between the top of the concavo-convex structure having the first refractive index (n1) and the interface between the flattened layer and the light emitting layer surface (for example, transparent conductive layer). In view of the foregoing, first, since it is possible to enhance film thickness uniformity of the flattened layer, it is possible to highly keep surface accuracy of the light emitting layer surface, as a result it is possible to suppress deterioration and breakage due to current concentration of the semiconductor light emitting device, and it is thereby possible to improve long-term stability of the semiconductor light emitting device. Next, since the film thickness of the flattened layer is thinned on a nanoscale, the distance between the surface of the flattened layer and the light extraction layer and the distance between the concavo-convex structure layer and the light extraction layer are in a predetermined range. Therefore, when the flattened layer comes into contact with the light emitting layer surface of the semiconductor light emitting device, it is possible to propagate the oozing light, which oozes from the interface between the light emitting layer surface and the flattened layer in the emitted light forming the waveguide mode in the interface, to the light extraction layer and the concavo-convex structure layer before the oozing light attenuates, and it is possible to extract by light diffraction due to both the light extraction layer and the concavo-convex structure layer. In this case, in the light extraction layer and the concavo-convex structure layer, since the refractive indexes meet the relationships of above-mentioned equations (7) to (9), the degree of light diffraction is large due to both the light extraction layer and the concavo-convex structure layer, and light extraction efficiency is improved. Further, in terms of the emitted light of the semiconductor light emitting device, diffraction modes are mutually different, and it is conceivable that such a function develops that as if two diffraction point groups causing different light diffraction phenomena overlap. By this means, it is presumed that light output characteristics are disturbed in the oozing light extracted from the light extraction layer and concavo-convex structure layer, and that light scattering properties thereby develop. Since such light scattering has a great effect of disturbing the waveguide mode, it is conceivable that the degree of light extraction efficiency is increased. Further, improvements in the scattering properties due to disturbance are enhanced in the case of adding disturbance to the shape and arrangement of the concavo-convex structure as described above, and therefore, the output light exerts the scattering properties. In other words, the color shift is suppressed, and it is also possible to make emitted light closer to natural light. As a result, it is possible to suppress glare when a user of the semiconductor light emitting device visually identifies the device.

Particularly, when the first refractive index (n1) to the third refractive index (n3) meet the relationship of above-mentioned equation (7), since the difference between the second refractive index and the first refractive index is large, heterogeneity is strengthened between the light extraction layer having the second refractive index and the concavo-convex structure layer having the first refractive index in terms of the emitted light of the semiconductor light emitting device. In other words, extraction is improved in the oozing light propagated by the flattened layer indifferent diffraction modes due to the light extraction layer and the concavo-convex structure layer, and therefore, light extraction efficiency is improved. Further, it is conceivable that the degree of increase in scattering properties is large in adding disturbance to the shape and arrangement of the concavo-convex structure, and that it is thereby possible to reduce the color shift while maintaining improvements in light extraction efficiency. In such a state in which the second refractive index is the highest, and a difference between the second refractive index (n2) and the first refractive index (n1) is large i.e. even in the case where the center of light extraction action is the light extraction layer having the second refractive index and the concavo-convex structure layer having the first refractive index, since the concavo-convex structure of the concavo-convex structure layer is in the shape of dots, in the shape of holes or in the shape of a palisade body or lattice, it is conceivable that it is possible to limit the size in the in-plane direction of the light extraction product for a semiconductor light emitting device of the light extraction layer having the second refractive index, it is thereby possible to suppress reflection of incident emitted light within the critical angle in the light extraction layer having the second refractive index, and it is possible to significantly improve light extraction efficiency. Further, in the case of adding disturbance (shape and arrangement) to the concavo-convex structure of the concavo-convex structure layer having the first refractive index and the light extraction layer having the second refractive index, when the wavelength of the emitted light is sufficiently larger than the average pitch of the concavo-convex structure, it is conceivable that the distribution contrast of effective medium approximate refractive index Nema is large in terms of the emitted light of the semiconductor light emitting device. In other words, since it is conceivable that the degree of the light scattering properties is increased corresponding to the distribution of effective medium approximate refractive index Nema, it is presumed that the effect of improving the color shift is enhanced. On the other hand, when the wavelength of the emitted light is equal to or less than the average pitch of the concavo-convex structure, since the dispersion degree is high in the light diffraction mode occurring on a microscopic scale such as one by one of the concavo-convex structure, it is conceivable that light scattering properties are strengthened in macroscopic observation such as several tens of micrometers, and that the color shift is thereby effectively reduced.

Further, when the first refractive index (n1) to the third refractive index (n3) meet the relationship of above-mentioned equation (8), it is possible to decrease a total reflection light quantity in the interface between the light emitting layer surface (for example, transparent conductive layer) and the flattened layer, and it is thereby possible to decrease the emitted light quantity forming the waveguide mode. Further, since it is possible to increase a difference between the third refractive index and the first refractive index, it is possible to strengthen heterogeneity between the flattened layer and the concavo-convex structure in terms of the emitted light of the semiconductor light emitting device. Therefore, it is conceivable that extraction efficiency by the concavo-convex structure layer is improved in the oozing light propagated inside the flattened layer. Further, it is presumed that it is possible to suppress reflection of the light extracted in respective different diffraction modes due to the light extraction layer and the concavo-convex structure layer and the incident emitted light within the critical angle in the interface between the concavo-convex structure layer and the flattened layer and in the interface between the light extraction layer and the flattened layer, due to averaging action (effective medium approximation) of light specific to nano-structure. Therefore, the oozing light guided to the inside of the flattened layer effectively reaches the light output surface side, and improved is light extraction efficiency from the semiconductor light emitting device. By this means, it is possible to extract emitted light, which forms the waveguide mode inside the semiconductor light emitting device and is not output to the outside of the semiconductor light emitting device under normal circumstances, to the outside of the semiconductor light emitting device. Further, also in the case of adding disturbance to the shape and arrangement of the concavo-convex structure, since the above-mentioned principles are established, it is also possible to acquire high light extraction efficiency, reductions in the color shift and reductions in glare at the same time.

Furthermore, when the first refractive index (n1) to the third refractive index (n3) meet the relationship of above-mentioned equation (9), it is possible to decrease total reflection in the interface between the light emitting layer surface (for example, transparent conductive layer) and the flattened layer, and it is thereby possible to decrease a rate of emitted light forming the waveguide mode. Moreover, since it is possible to increase a difference between the third refractive index and the second refractive index, it is possible to strengthen heterogeneity between the flattened layer and the light extraction layer in terms of the emitted light of the semiconductor light emitting device, and therefore, it is conceivable that extraction efficiency by the light extraction layer is improved in the oozing light oozing from the interface between the light emitting layer surface and the flattened layer. Further, it is conceivable that it is possible to extract the oozing light from the interface between the light emitting layer surface and the flattened layer as diffraction phenomena of respective different diffraction modes due to the light extraction layer and the concavo-convex structure layer, and that it is possible to improve light extraction efficiency. Furthermore, from the same principles, it is conceivable that by adding disturbance (shape and arrangement) to the light extraction layer, it is possible to increase the degree of light scattering properties, and that the effects of reducing the color shift and reducing glare are enhanced.

On the other hand, (1) in the case of having the first light extraction layer on the convex portion of the concavo-convex structure and the second light extraction layer inside the concave portion, since the distribution occurs in the distance between the interface between the flattened layer and the light emitting layer surface and the light extraction layer, it is possible to extract the oozing light by light diffraction due to the first light extraction layer, second light extraction layer and concavo-convex structure layer. In this case, since the light extraction layers and the concavo-convex structure layer meet relationship equations (7) to (9) in the refractive index, diffraction modes are mutually different, and it is conceivable that such a function develops that as if three diffraction point groups causing different light diffraction phenomena overlap, scattering properties are thereby strengthened, the effect of disturbing the waveguide mode is enhanced, and that light extraction efficiency is improved. Further, also in the case of adding disturbance to the shape and arrangement of the concavo-convex established, it is also possible to acquire high light extraction efficiency, reductions in the color shift and reductions in glare at the same time.

Further, (2) in the case of having the first light extraction layer on the tops of the convex-portions of the concavo-convex structure, it is made easy to decrease the distance between the interface between the flattened layer and the light emitting layer surface and the light extraction layer. Since the oozing light, which oozes from the interface between the light emitting layer surface and the flattened layer in the emitted light forming the waveguide mode in the interface, attenuates exponentially with distance in the thickness direction of the semiconductor light emitting device, it is conceivable that by decreasing the distance between the interface between the flattened layer and the light emitting layer surface and the light extraction layer, it is possible to extract more effectively. Further, when the concavo-convex structure of the concavo-convex structure layer is in the shape of dots, in the shape of holes or in the shape of a palisade body or lattice and the light extraction layer is provided on the tops of the convex-portions of the concavo-convex structure, it is possible to decrease the vertex-portion area of the light extraction layer. By this means, it is possible to suppress reflection of incident light within the critical angle with respect to the light emitting layer surface in the emitted light of the semiconductor light emitting device. In other words, it is presumed that since it is possible to extract the oozing light occurring from the interface between the light emitting layer surface and the flattened layer, and it is possible to decrease returning of the emitted light input to the flattened layer within the critical angle with respect to the light emitting layer surface to the light emitting layer surface side, light extraction efficiency is improved.

A light extraction product for a semiconductor light emitting device of the present invention is a light extraction product for a semiconductor light emitting device that is comprised of a medium having a first refractive index (n1) including a plurality of nanoparticles having a second refractive index (n2), and is characterized in that an absolute value (|n1−n2|) of a difference between the first refractive index (n1) and the second refractive index (n2) is 0.1 or more, the light extraction product for a semiconductor light emitting device has mutually substantially parallel first surface and second surface, and that when it is assumed that a center surface is a virtual surface that maximizes the number of nanoparticles crossing a surface approximately parallel to the first surface and the second surface, the nanoparticles are arranged so that the number of nanoparticles crossing a virtual surface approximately parallel to the center surface decreases with distance from the center surface.

According to this configuration, since a plurality of nanoparticles having the second refractive index (n2) substantially different from the first refractive index (n1) is dispersed inside the medium having the first refractive index (n1), while being arranged so that the number of a plurality of nanoparticles decreases with distance from the center surface, the nanoparticles are not dispersed randomly inside the light extraction product. By this means, since the light extraction function based on the nanoparticles maximally develops near the center surface, the emitted light input from the semiconductor light emitting device to the light extraction product for the semiconductor light emitting device is subjected to light scattering or light diffraction by a plurality of nanoparticles arranged near the center surface. As a result, uniformity is improved in extraction, by the nanoparticles, of the oozing light oozing from the interface between the light emitting layer surface side of the semiconductor light emitting device and the light extraction product, and it is possible to achieve the light extraction product for enabling light extraction efficiency from the semiconductor light emitting device to be improved with ease. Further, as compared with the case where nanoparticles are randomly arranged inside the light extraction product, it is possible to maintain good flatness of the surface of the medium having the first refractive index (n1). In this case, when the semiconductor light emitting device is assembled with the light extraction product as a substrate, it is possible to improve surface accuracy of the transparent conductive layer of the semiconductor light emitting device.

When abrupt unevenness exists on the transparent conductive layer surface, long-term reliability of the semiconductor light emitting device degrades due to current concentration on the convex portion. In other words, since the nanoparticles having the second refractive index (n2) are provided to decrease with distance from the center surface, it is possible to improve long-term reliability of the semiconductor light emitting device. On the other hand, when nanoparticles are dispersed randomly, in the case of adding to the semiconductor light emitting device, due to low flatness of the surface, a gap is formed with the transparent conductive layer surface. Such formation produces a large refractive index gap, and becomes a cause of reducing light extraction efficiency. In other words, in the light extraction product of the invention, the nanoparticles having the second refractive index (n2) are provided to decrease with distance from the center surface, and it is thereby possible to improve light extraction efficiency of the semiconductor light emitting device. Further, since it is possible to decrease the number of nanoparticles, physical durability of the light extraction product is improved.

In the light extraction product for a semiconductor light emitting device of the invention, in the plurality of nanoparticles, it is preferable that an average pitch inside the center surface ranges from 50 nm to 1500 nm, an average diameter in the in-plane direction of the center surface ranges from 1 nm to 1000 nm, and that the average pitch is larger than the average diameter.

According to this configuration, since regularity of the arrangement of the plurality of nanoparticles inside the light extraction product is in a moderate range, and it is possible to increase the density in a region in which light scattering or light diffraction occurs due to the nanoparticles, it is possible to effectively extract the emitted light from the semiconductor light emitting device as light scattering or light diffraction due to the plurality of nanoparticles. Further, since it is possible to control the interval and diameter of the nanoparticles to within predetermined ranges, it is possible to suppress reflection of emitted light within the critical angle in the emitted light input from the semiconductor light emitting device to the light extraction product, and it is possible to more improve light extraction efficiency. Moreover, since it is possible to control the size of the nanoparticles to within a predetermined range, it is possible to keep flatness of the light extraction product surface more excellent, and it is possible to improve long-term reliability of the semiconductor light emitting device.

In the light extraction product for a semiconductor light emitting device of the invention, in the plurality of nanoparticles crossing the inside of the center surface, it is preferable that an average thickness in the direction perpendicular to the center surface ranges from 10 nm to 1000 nm.

According to this configuration, even in the case of relatively increasing the average pitch of the plurality of nanoparticles, it is possible to develop light scattering and light diffraction due to the nanoparticles, and light extraction efficiency is further improved. Moreover, since the size of the nanoparticles is decreased moderately, it is possible to improve physical stability of the nanoparticles, it is also possible to keep flatness of the light extraction product surface more excellent, and it is possible to improve long-term reliability of the semiconductor light emitting device.

In the light extraction product for a semiconductor light emitting device of the invention, in the plurality of nanoparticles crossing the inside of the center surface, it is preferable that a distance (Lort) between an average end portion position (Spt) on the first surface side and the first surface exceeds 0 nm and is 1000 nm or less.

According to this configuration, since it is possible to set a moderate range on a distance between the interface between the first surface of the light extraction product and the light emitting layer surface of the semiconductor light emitting device and the nanoparticles, it is possible to effectively propagate the oozing light oozing from in the interface position to the nanoparticles. Then, since the propagated oozing light is extracted as light scattering or light diffraction due to the nanoparticles, it is possible to improve light extraction of the semiconductor light emitting device.

In the light extraction product for a semiconductor light emitting device of the invention, it is preferable that an absolute value (|n1−n2|) of a difference between the second refractive index (n2) and the first refractive index (n1) is 0.2 or more.

According to this configuration, since optical heterogeneity is large between the nanoparticles and the medium forming the light extraction product, light scattering properties of the emitted light from the semiconductor light emitting device due to the nanoparticles are improved inside the light extraction product. By the improvements in the light scattering properties, it is possible to improve light extraction efficiency of the semiconductor light emitting device.

In the light extraction product for a semiconductor light emitting device of the invention, it is preferable that a distance (Lorb) between an average end portion position (Spb) on the second surface side of the plurality of nanoparticles crossing the center surface and the second surface is the distance (Lort) or more.

According to this configuration, it is possible to improve arrangement controllability of nanoparticles arranged inside the center surface, and to improve continuous productivity of the light extraction product. Further, since it is possible to improve physical strength of the light extraction product, it is possible to improve applicability of the light extraction product to the semiconductor light emitting device.

In the light extraction product for a semiconductor light emitting device of the invention, it is preferable that in the first direction in which the concavo-convex structure layer or the nanoparticles belong to the inside of the surface, a plurality of convex portions or concave portions or the plurality of nanoparticles has a plurality of convex portion lines, concave portion lines, or nanoparticle lines arranged with a pitch (Py), the plurality of convex portion lines, concave portion lines, or nanoparticle lines is arranged parallel with a pitch (Px) in the second direction orthogonal to the first direction, each of the pitch (Px) and the pitch (Py) ranges from 50 nm to 5000 nm, and that one of the pitch (Py) and the pitch (Px) is a constant interval, while the other one is an inconstant interval, or both are inconstant intervals.

According to this configuration, the concavo-convex structure of the concavo-convex structure layer forms a predetermined structure, and is the concavo-convex structure of nanoscale. Accordingly, the shape of the light extraction layer also forms a predetermined structure, and is the concavo-convex structure of nanoscale. Therefore, the light scattering properties and light diffraction due to the above-mentioned light extraction layer and concavo-convex structure layer are further easy to develop, and it is possible to further enhance the light extraction efficiency improvement effect and the long-term reliability improvement effect.

Particularly, by the pitch being 5000 nm or less, it is possible to decrease the vertex-portion area of the light extraction layer. Therefore, it is possible to suppress reflection of incident light within the critical angle with respect to the light emitting layer surface in the emitted light from the semiconductor light emitting device. In other words, it is presumed that it is possible to reduce returned light to the light emitting layer surface side in the emitted light input to the flattened layer within the critical angle with respect to the light emitting layer surface (for example, transparent conductive layer), while performing extraction of the oozing light occurring from the interface between the light emitting layer surface and the flattened layer, and that light extraction efficiency is thereby improved. Further, by the pitch being 5000 nm or less, it is possible to decrease the volume in an energetically stable state of the flattened layer (adhesive layer) positioned on the tops of the convex-portions of the concavo-convex structure. Therefore, the flattened layer is hard to undergo the effect of energy corresponding to the surface contour of the concavo-convex structure, it is thereby possible to improve surface accuracy of the flattened layer surface, and it is possible to improve long-term reliability of the semiconductor light emitting device. Further, by the pitch being 50 nm or more, since it is possible to effectively develop light scattering and light diffraction corresponding to the arrangements and shapes of the flattened layer, light extraction layer and concavo-convex structure layer, it is possible to improve extraction efficiency of the oozing light oozing from the interface between the light emitting layer and the flattened layer. Furthermore, by the pitch being 50 nm or more, it is conceivable that it is possible to increase the distribution contrast of the effective medium approximate refractive index Nema in the case of adding disturbance to the arrangement and shape of the concavo-convex structure of the concavo-convex structure layer and the arrangement and shape of the light extraction layer, and that it is thereby possible to strengthen scattering properties of the extracted light. Still furthermore, it is also conceivable that it is possible to develop the scattering properties developed by adding disturbance to the shape and arrangement of the concavo-convex structure in a state of maintaining improvements in long-term reliability and light extraction efficiency as described above. In other words, it is possible to concurrently reduce the color shift, while improving long-term reliability and light extraction efficiency of the semiconductor light emitting device.

Further, according to this configuration, since regularity of the arrangement of a plurality of nanoparticles inside the light extraction product is in a moderate range, and it is possible to increase the density in a region in which light scattering or light diffraction occurs by the nanoparticles, it is possible to effectively extract the emitted light from the semiconductor light emitting device as light scattering or light diffraction due to the plurality of nanoparticles. In the case of applying nanoparticles to the light extraction product, when the pitch is 1500 nm or less, it is possible to increase the density in the region in which light scattering or light diffraction occurs and to cause light scattering properties or light diffraction properties to effectively function, and therefore, such a pitch is particularly preferable.

Furthermore, according to the configuration in which one of the pitch (Py) and the pitch (Px) is a constant interval, while the other one is an inconstant interval, or both are inconstant intervals, it is possible to add disturbance to the oozing light extracted in the interface of the flattened layer, light extraction layer and concavo-convex structure layer or the nanoparticles. In other words, on a microscopic scale such as one by one of the concavo-convex structure or nanoparticles, the oozing light is extracted by light diffraction. Further, since it is possible to add disturbance in the output direction of light diffracted light, in the case of a macroscopic view (scale of several tens of micrometers or more), light scattering properties are exhibited, and it is possible to improve light extraction efficiency and reduce the color shift.

Particularly, in the case where the average pitch of the concavo-convex structure or nanoparticles is on a nanoscale, it is possible to develop light scattering properties corresponding to the distribution of the effective medium approximate refractive index Nema formed by the flattened layer, light extraction layer, concavo-convex structure layer and nanoparticles, and it is possible to effectively suppress the color shift. Further, also in such a case where the arrangement of the concavo-convex structure includes disturbance, since the concavo-convex structure is in the shape of dots, in the shape of holes, or in the shape of a palisade body or lattice, it is possible to maintain film thickness accuracy of the flattened layer at high microscopic and macroscopic accuracy, and it is thereby possible to improve long-term reliability of the semiconductor light emitting device. This is because by the dot-shaped or hole-shaped structure or palisade or lattice-shaped structure, it is possible to decrease an energetically stable film thickness of the flattened layer (including the adhesive layer) formed on the tops of the convex-portions of the concavo-convex structure.

Herein, when both the pitch (Py) and the pitch (Px) are inconstant intervals, it is possible to enhance the light scattering effect and color shift reduction effect due to disturbance of periodicity. In other words, it is possible to obtain light-emitting characteristics nearer natural light, while effectively breaking the waveguide mode and improving light extraction efficiency, being effective in suppression of glare.

On the other hand, when one of the pitch (Py) and the pitch (Px) is an inconstant interval, while the other one is a constant interval, as compared with the case where both the pitch (Py) and the pitch (Px) are inconstant intervals, disturbance of periodicity of the light extraction layer and concavo-convex structure is decreased, and the light scattering effect is reduced. Therefore, light-emitting characteristics near natural light decrease, but light extraction efficiency is improved by the diffraction phenomenon.

In the light extraction product for a semiconductor light emitting device of the invention, it is preferable that the pitch (Py) with the inconstant interval is equal to a distance between centers of respective convex portions, concave portions or nanoparticles, the pitch (Px) with the inconstant interval is equal to a distance among the plurality of convex portion lines, concave portion lines or nanoparticle lines, the pitch (Py) and the pitch (Px) are larger than a diameter of the convex portion, an opening diameter of the concave portion, or a diameter of the nanoparticle, pitches (Py)n among at least adjacent four or more to m or less convex portions, concave portions or nanoparticles ($3 \leq n \leq 2a$ or $3 \leq n \leq 2a+1$. In addition, m and a are positive integers and n=m−1.) meet the relationship of following equation (13) while at least one or more convex portion groups, concave portion groups or nanoparticle groups formed with the pitches (Py)1 to (Py)n are arranged in the first direction when the pitch (Py) is the inconstant interval, and that when the pitch (Px) is the inconstant interval, pitches (Px)n among at least adjacent four or more to m or less convex portion lines, concave portion lines or nanoparticle lines ($3 \leq n \leq 2a$ or $3 \leq n \leq 2a+1$. In addition, m and a are positive integers and n=m−1.) meet the relationship of following equation (14) while at least one or more convex portion line groups, concave portion line groups or nanoparticle line groups formed with the pitches (Px)1 to (Px)n are arranged in the second direction.

$$(Py)1 < (Py)2 < (Py)3 < \ldots < (Py)a > \ldots > (Py)n \qquad \text{Eq. (13)}$$

$$(Px)1 < (Px)2 < (Px)3 < \ldots < (Px)a > \ldots > (Px)n \qquad \text{Eq. (14)}$$

Further, in the light extraction product for a semiconductor light emitting device of the invention, it is preferable that the pitch (Py) with the inconstant interval is equal to a distance between centers of respective convex portions, concave portions or nanoparticles, the pitch (Px) with the inconstant interval is equal to a distance among the plurality of convex portion lines, concave portion lines or nanoparticle lines, the pitch (Py) and the pitch (Px) are larger than the diameter of the convex portion, the opening diameter of the concave portion, or the diameter of the nanoparticle, pitches (Py)n among at least adjacent four or more to m or less convex portions, concave portions or nanoparticles ($3 \leq n \leq 2a$ or $3 \leq n \leq 2a+1$. In addition, m and a are positive integers and n=m−1.) meet the relationship of following equation (13) while convex portion groups, concave portion groups or nanoparticle groups formed with the pitches (Py)1 to (Py)n are arranged repeatedly with a long period Lyz in the first direction when the pitch (Py) is the inconstant interval, and that when the pitch (Px) is the inconstant interval, pitches (Px)n among at least adjacent four or more to m or less convex portion lines, concave portion lines or nanoparticle lines ($3 \leq n \leq 2a$ or $3 \leq n \leq 2a+1$. In addition, m and a are positive integers and n=m−1.) meet the relationship of following equation (14) while convex portion line groups, concave portion line groups or nanoparticle line groups formed with the pitches (Px)1 to (Px)n are arranged repeatedly with a long period Lxz in the second direction.

$$(Py)1 < (Py)2 < (Py)3 < \ldots < (Py)a > \ldots > (Py)n \qquad \text{Eq. (13)}$$

$$(Px)1 < (Px)2 < (Px)3 < \ldots < (Px)a > \ldots > (Px)n \qquad \text{Eq. (14)}$$

According to these configurations, since both or either of the pitch (Px) and the pitch (Py) of the concavo-convex structure is an inconstant interval, the periodicity of nano-order is disturbed in the concavo-convex structure and light extraction layer or nanoparticles, and it is thereby possible to add disturbance to light diffraction properties of the oozing light extracted due to the interface of the flattened layer, light extraction layer and concavo-convex structure layer or the nanoparticles and the incident emitted light within the critical angle. In other words, on a microscopic scale such as one by one of the concavo-convex structure, the oozing light is extracted by light diffraction, and it is possible to add disturbance in the output direction of the light diffracted light. Therefore, in the case of a macroscopic view (scale of several tens of micrometers or more), light scattering properties are exhibited, and it is possible to improve light extraction efficiency and reduce the color shift. Particularly, in the case where the average pitch of the concavo-convex structure or nanoparticles is on a nanoscale, it is possible to increase the distribution of the effective medium approximate refractive index Nema formed by the flattened layer, light extraction layer and concavo-convex structure layer or nanoparticles. Therefore, it is possible to develop light scattering properties corresponding to the distribution of the effective medium approximate refractive index Nema, and it is possible to effectively suppress the color shift. Particularly, since the arrangement of the concavo-convex structure or nanoparticles has periodicity with the long period Lz, the distribution of the effective medium approximate refractive index Nema has a period corresponding to the long period Lz. Therefore, it is possible to also add the light diffraction phenomenon to disturbance. In other words, it is conceivable that since it is possible to use light diffraction on a microscopic scale such as one by one of the concavo-convex structure or nanoparticles, and to use light diffraction corresponding to long periods Lxz and Lyz, the degree of improvement in light extraction efficiency is more improved, and that it is also possible to obtain the effect of reducing the color shift. Further, also in such a case where the arrangement of the concavo-convex structure includes disturbance, since the concavo-convex structure is in the shape of dots, in the shape of holes, or in the shape of a palisade body or lattice, it is possible to maintain film thickness accuracy of the flattened layer at high microscopic and macroscopic accuracy, and it is thereby possible to improve long-term reliability of the semiconductor light emitting device. This is because by the dot-shaped, hole-shaped, palisade or lattice-shaped structure, it is possible to decrease an energetically stable film thickness of the flattened layer (including the adhesive layer) formed on the tops of the convex-portions of the concavo-convex structure.

Further, in the light extraction product for a semiconductor light emitting device of the invention, it is preferable that the diameter of the convex portion, the opening diameter of the concave portion or the diameter of the nanoparticle increases or decreases corresponding to the pitch (Py) and/or the pitch (Px), diameters or opening diameters (Dyn) of at least adjacent four or more to m or less convex portions, concave portions or nanoparticles ($3 \leq n \leq 2a$ or $3 \leq n \leq 2a+1$. In addition, m and a are positive integers and n=m−1.) forming the pitch meet the relationship of following equation (15) while at least one or more convex portion groups, concave portion groups or nanoparticle groups formed with the diameters or opening diameters (Dy)1 to (Dy)n are arranged in the first direction when the pitch (Py) is the inconstant interval, and that when the pitch Px is the inconstant interval, diameters or opening diameters (Dxn) of at least adjacent four or more to m or less convex portions, concave portions or nanoparticles ($3 \leq n \leq 2a$ or $3 \leq n \leq 2a+1$, in addition, m and a are positive integers and n=m−1) forming the pitch meet the relationship of following equation (16) while at least one or more convex portion line groups, concave portion line groups or nanoparticle line groups formed with the diameters or opening diameters Dx1 to Dxn are arranged in the second direction.

$$Dy1 < Dy2 < Dy3 < \ldots < Dya > \ldots > Dyn \qquad \text{Eq. (15)}$$

$$Dx1 < Dx2 < Dx3 < \ldots < Dxa > \ldots > Dxn \qquad \text{Eq. (16)}$$

Further, in the light extraction product for a semiconductor light emitting device of the invention, it is preferable that the diameter of the convex portion, the opening diameter of the concave portion or the diameter of the nanoparticle increases or decreases corresponding to the pitch (Py) and/or the pitch (Px), diameters or opening diameters (Dyn) of at least adjacent four or more to m or less convex portions, concave portions or nanoparticles ($3 \leq n \leq 2a$ or $3 \leq n \leq 2a+1$. In addition, m and a are positive integers and n=m−1.) forming the pitch meet the relationship of following equation (15) while convex portion groups, concave portion groups or nanoparticle groups formed with the diameters or opening diameters (Dy)1 to (Dy)n are arranged repeatedly with a long period unit Lyz in the first direction when the pitch (Py) is the inconstant interval, and that when the pitch (Px) is the inconstant interval, diameters or opening diameters (Dxn) of at least adjacent four or more to m or less convex portions, concave portions or nanoparticles ($3 \leq n \leq 2a$ or $3 \leq n \leq 2a+1$, in addition, m and a are positive integers and n=m−1) forming the pitch meet the relationship of following equation (16) while convex portion line groups, concave portion line groups or nanoparticle line groups formed with the diameters or opening diameters Dx1 to Dxn are arranged with a long period unit Lxz.

$$Dy1 < Dy2 < Dy3 < \ldots < Dya > \ldots > Dyn \qquad \text{Eq. (15)}$$

$$Dx1 < Dx2 < Dx3 < \ldots < Dxa > \ldots > Dxn \qquad \text{Eq. (16)}$$

Furthermore, in the light extraction product for a semiconductor light emitting device of the invention, it is preferable that a height of each of the convex portion or the concave portion increases or decreases corresponding to the pitch (Py) and/or the pitch (Px), heights Hyn of at least adjacent four or more to m or less convex portions or concave portions ($3 \leq n \leq 2a$ or $3 \leq n \leq 2a+1$, in addition, m and a are positive integers and n=m−1) forming the pitch meet the relationship of following equation (17) while at least one or more convex portion groups or concave portion groups formed with the heights Hy1 to Hyn are arranged in the first direction when the pitch (Py) is the inconstant interval, and that when the pitch (Px) is the inconstant interval, heights Hxn of at least adjacent four or more to m or less convex portions or concave portions ($3 \leq n \leq 2a$ or $3 \leq n \leq 2a+1$, in addition, m and a are positive integers and n=m−1) forming the pitch meet the relationship of following equation (18) while at least one or more convex portion line groups or concave portion line groups formed with the heights Hx1 to Hxn are arranged in the second direction.

$$Hy1 < Hy2 < Hy3 < \ldots < Hya > \ldots > Hyn \qquad \text{Eq. (17)}$$

$$Hx1 < Hx2 < Hx3 < \ldots < Hxa > \ldots > Hxn \qquad \text{Eq. (18)}$$

Still furthermore, in the light extraction product for a semiconductor light emitting device of the invention, it is preferable that the height of each of the convex portion or the concave portion increases or decreases corresponding to the pitch (Py) and/or the pitch (Px), heights Hyn of at least adjacent four or more to m or less convex portions or concave portions ($3 \leq n \leq n2a$ or $3 \leq n \leq 2a+1$, in addition, m and a are positive integers and n=m−1) forming the pitch meet the relationship of following equation (17) while convex portion groups or concave portion groups formed with the heights Hy1 to Hyn are arranged repeatedly with a long period unit Lyz in the first direction when the pitch (Py) is the inconstant interval, and that when the pitch (Px) is the inconstant interval, heights Hxn of at least adjacent four or more to m or less convex portions or concave portions ($3 \leq n \leq 2a$ or $3 \leq n \leq 2a+1$, in addition, m and a are positive integers and n=m−1) forming the pitch meet the relationship of following equation (18) while convex portion line groups or concave portion line groups formed with the heights Hx1 to Hxn are arranged repeatedly with a long period unit Lxz in the second direction.

$$Hy1 < Hy2 < Hy3 < \ldots < Hya > \ldots > Hyn \qquad \text{Eq. (17)}$$

$$Hx1 < Hx2 < Hx3 < \ldots < Hxa > \ldots > Hxn \qquad \text{Eq. (18)}$$

Also in the above-mentioned configurations, as described previously, in addition to disturbance of periodicity of nano-order in the concavo-convex structure and light extraction layer or nanoparticles, since light diffraction properties with long periods Lxz and Lyz are added, the configurations are effective in improvements in light extraction efficiency, color shift reduction and glare suppression.

In the light extraction product for a semiconductor light emitting device of the invention, it is preferable that a shift amount $\alpha 1$ in the first direction between mutually adjacent first convex portion line and second convex portion line, between mutually adjacent first concave portion line and second concave portion line or between mutually adjacent first nanoparticle line and second nanoparticle line is different from a shift amount $\alpha 2$ in the first direction between mutually adjacent the second convex portion line and third convex portion line, between mutually adjacent the second concave portion line and third concave portion line or between mutually adjacent the second nanoparticle line and third nanoparticle line.

According to this configuration, since the periodicity of nano-order is disturbed in the concavo-convex structure and light extraction layer or nanoparticles, it is possible to develop light scattering properties relatively strongly on oozing light extraction to the light emitting layer surface (for example, transparent conductive layer) and the flattened layer (or, adhesive layer as described above) derived from the waveguide mode, as compared with the degree of improvement in light extraction due to diffracted light. By the light scattering properties, since light extraction efficiency is enhanced and uniformity of nano-order is disturbed in the light extraction layer and the concavo-convex structure, it is possible to reduce the color shift, and to obtain light-emitting characteristics nearer natural light, and it is possible to suppress glare.

In the light extraction product for a semiconductor light emitting device of the invention, it is preferable that a difference between the shift amount $\alpha1$ and the shift amount $\alpha2$ is not constant.

According to this configuration, since the periodicity of the concavo-convex structure and light extraction layer or nanoparticles is more significantly disturbed, it is possible to more enhance the effect of light scattering properties relatively, as compared with the degree of improvement in light extraction due to diffracted light, and it is thereby possible to enhance light extraction efficiency by the light scattering properties. Further, since uniformity of the light extraction layer and the concavo-convex structure or nanoparticles is disturbed, it is possible to reduce the color shift, and to obtain light-emitting characteristics nearer natural light, and it is possible to more suppress glare.

In the light extraction product for a semiconductor light emitting device of the invention, it is preferable to have a minimal convex portion or a minimal concave portion provided between adjacent convex portions or concave portions.

According to this configuration, it is presumed that since it is possible to increase the distribution of the light extraction layer in the thickness direction of the light extraction product for a semiconductor light emitting device, it is possible to use a plurality of diffraction modes in oozing light extraction to the light emitting layer surface (for example, transparent conductive layer) and the flattened layer surface derived from the waveguide mode, and that it is possible to more enhance the effect of light scattering properties. Therefore, light extraction efficiency is improved while it is possible to obtain light-emitting characteristics nearer natural light, and it is possible to more suppress glare.

In the light extraction product for a semiconductor light emitting device of the invention, it is preferable that the plurality of convex portions or concave portions of the concavo-convex structure includes a plurality of first convex portions or concave portions having a first height and a plurality of second convex portions or concave portions having a second height lower than the first height, and that the second convex portions or concave portions have a convex-portion height hn meeting following equation (19) relative to a convex-portion average height h of the concavo-convex structure, and exist with a probability of Z meeting following equation (20) in the concavo-convex structure.

$$0.9h \geq hn \qquad \text{Eq. (19)}$$

$$1/10000 \leq Z \leq 1/5 \qquad \text{Eq. (20)}$$

According to this configuration, since convex portions lower than the convex-portion average height h are included with a predetermined probability, it is conceivable that increased are the distribution in the light extraction product plane direction and the volume distribution of the light extraction layer, and that the effect of light scattering properties is increased relatively to improvements in light extraction due to diffraction. Then, by the increased light scattering properties, it is possible to enhance light extraction efficiency while reducing the color shift by the light scattering effect, it is possible to obtain light-emitting characteristics nearer natural light, and it is possible to suppress glare. Particularly, when the existence probability Z of convex portions meeting Eq. (19) is $1/10000$ or more, it is possible to strongly add scattering properties to extracted light. This is because the mode of light diffraction is different between the convex portions meeting Eq. (19) and convex portions that do not meet Eq. (19). In other words, even in the light extracted as light diffraction on a microscopic scale such as one by one of the concavo-convex structure, such light is observed as averaged light of a plurality of light diffraction modes in observation on a macroscopic scale such as several tens of micrometers or more, and therefore, scattering properties are exhibited. On the other hand, when the existence probability Z is $1/5$ or less, controllability is improved in each interface shape of the concavo-convex structure of the concavo-convex structure layer having the first refractive index, the light extraction layer having the second refractive index and the flattened layer (or adhesive layer) having the third refractive index, and it is thereby possible to improve controllability on light extraction. In other words, since it is possible to perform design centering on light diffraction properties caused by the concavo-convex structure that does not meet Eq. (19), it is made easy to achieve a balance between light extraction efficiency and color shift reduction.

In the light extraction product for a semiconductor light emitting device of the invention, it is preferable that a distance tcv between adjacent the first convex portions or concave portions via the second convex portion or concave portion on a line segment lcv inside the convex-portion average position scv of the plurality of convex portions or concave portions, and an interval P between adjacent convex portions or concave portions meet following equation (21).

$$1.0P < tcv \leq 9.5P \qquad \text{Eq. (21)}$$

According to these configurations, it is possible to limit the number (size) of set convex portions lower than the convex-portion average height h, and it is thereby possible to limit the size of the light extraction layer in the plane direction of the light extraction product for a semiconductor light emitting device. Therefore, since the light extraction layer of a predetermined size or less is included, extraction efficiency due to light diffraction is improved in the oozing light in the interface between the light emitting layer surface (for example, transparent conductive layer) of the semiconductor light emitting device and the flattened layer. Further, it is conceivable that by bringing the surface of the flattened layer of the light extraction product for a semiconductor light emitting device into contact with the light emitting layer surface of the semiconductor light emitting device to extract the oozing light derived from the waveguide mode, it is possible to suppress reflection of the emitted light guided to the inside of the light extraction product for a semiconductor light emitting device in the interface between the concavo-convex structure layer and the flattened layer (or the adhesive layer as described above) and in the interface between the light extraction layer and the flattened layer, and that it is thereby possible to effectively guide the light to the exposed surface of the substrate.

In the light extraction product for a semiconductor light emitting device of the invention, it is preferable that the plurality of nanoparticles includes a plurality of first nanoparticles having a first diameter in the in-plane direction of the center surface and a plurality of second nanoparticles having a second diameter larger than the first diameter, the first diameter is smaller than the average pitch, the pitch (Px) or the pitch (Py), the second diameter is larger than the average pitch, the pitch (Px) or the pitch (Py), and is a size 9.5 times the pitch or less, and that the second nanoparticles having the second diameter exist in a ratio ranging from 1/10000 to 1/5 relative to the first nanoparticles having the first diameter.

By this configuration, since nanoparticles with a different size are included with a predetermined probability, the distribution in the in-plane direction of the center surface and the volume distribution of the nanoparticles are large, and the effect of light scattering properties is increased. Then, by the increased light scattering properties, it is possible to enhance light extraction efficiency while reducing the color shift by the light scattering effect, it is possible to obtain light-emitting characteristics nearer natural light, and it is possible to suppress glare. Further, since it is possible to limit the size of the nanoparticles having the second diameter larger the first diameter to a predetermined size or less, it is possible to suppress reflection of emitted light from the semiconductor light emitting device in the interface between the nanoparticle and the medium, and it is possible to increase emitted light output from the second surface.

In the light extraction product for a semiconductor light emitting device of the invention, it is preferable to have an antireflection layer comprised of a single layer or multilayer provided on a main surface opposed to the main surface on which the concavo-convex structure layer or the nanoparticle lines are formed of the light extraction product, or an antireflection layer comprised of a plurality of convex portions or concave portions arranged at intervals of nanoscale.

According to this configuration, it is possible to suppress reflection of emitted light guided to the inside of the light extraction product for a semiconductor light emitting device, such as extracted light with the waveguide broken and transmission light to the flattened layer within the critical angle, on the light output surface side of the concavo-convex structure layer. In other words, it is possible to decrease a returned light quantity to the inside of the light extraction product for a semiconductor light emitting device. Further, it is possible to suppress a reflection of outside light in the device when a user of the semiconductor light emitting device visually identifies the device, and visibility is thereby improved.

In the light extraction product for a semiconductor light emitting device of the invention, it is preferable that the product has a substrate having a fourth refractive index (n4) provided on a main surface opposed to the main surface on which the concavo-convex structure layer or the nanoparticle lines are formed of the light extraction product, and that the fourth refractive index (n4) is substantially equal or equal to the first refractive index (n1).

According to the configuration, throughput is improved in manufacturing the light extraction product for a semiconductor light emitting device of the invention, and manufacturing controllability is also improved in the concavo-convex structure of the concavo-convex structure layer. Further, since the refractive index (n4) of the newly provided substrate is substantially equal to the refractive index (n1) of the concavo-convex structure layer, the oozing light from the interface between the light emitting layer surface (for example, transparent conductive layer) of the semiconductor light emitting device and the flattened layer which is extracted by the concavo-convex structure layer and light extraction layer or the nanoparticles, and transmission light to the flattened layer within the critical angle is hard to recognize the interface between the concavo-convex structure layer and the substrate, it is thereby possible to suppress reflection in the interface, and it is possible to effectively guide the emitted light to the exposed surface of the substrate.

In the light extraction product for a semiconductor light emitting device of the invention, it is preferable that the substrate has at least one of a gas barrier function and water vapor barrier function. According to this configuration, reliability as the light emitting device is improved.

In the light extraction product for a semiconductor light emitting device of the invention, it is preferable that the product has dots or holes provided on the surface of the substrate, and that the average pitch of the dots or holes ranges from 100 nm to 5000 nm.

According to this configuration, it is possible to suppress the fact that the extracted light with the waveguide mode broken and transmission light to the flattened layer within the critical angle is reflected on the light output surface of the substrate, and becomes returned light to the inside of the light extraction product for a semiconductor light emitting device. Further, it is possible to suppress a reflection of outside light in the device when a user of the semiconductor light emitting device visually identifies the device, and visibility is thereby improved.

In the light extraction product for a semiconductor light emitting device of the invention, it is preferable to further include at least one function layer selected from the group consisting of the gas barrier function, water vapor barrier function, antifriction function, reserve printing function, hydrophobic function, hydrophilic function, antistatic function, color filter function, color shift function, polarization modifying function, antireflection function, light re-directivity function, diffusion function, and optical rotation function.

According to the configuration, by further including the function layer, the device functions are improved in the light emitting device manufactured using the light extraction product for a semiconductor light emitting device. For example, by further including gas barrier properties and water vapor barrier properties, it is possible to extend life of a light emitting portion of an organic EL device. Moreover, for example, by further including the antifriction function, reserve printing function, hydrophobic function, hydrophilic function, antistatic function and the like on the exposed surface of the substrate, an amount of stains attached to the device is decreased, and wiping is made easy. Further, for example, by adding the antireflection function onto the exposed surface of the substrate, visibility is improved.

A light emitting device of the present invention is characterized by being provided with the above-mentioned light extraction product for a semiconductor light emitting device, and a light emitting portion provided on a main surface side on which the above-mentioned concavo-convex structure layer or the nanoparticle lines are formed.

A top emission type organic EL device of the present invention is characterized by being provided with the above-mentioned light extraction product for a semiconductor light emitting device, and a light emitting layer provided on the light extraction layer via an adhesive layer, where a distance between the interface between the light emitting layer surface and the adhesive layer and the interface between the adhesive layer and the light extraction layer ranges from 10 nm to 800 nm. According to this configuration, it is possible to easily extract the emitted light wave-guided inside the organic EL device.

Further, a top emission type organic EL device of the present invention is characterized by being provided with the above-mentioned light extraction product for a semiconductor light emitting device, and a light emitting layer provided on the surface of the flattened layer. According to this configuration, it is possible to easily extract the emitted light wave-guided inside the organic EL device.

A bottom emission type organic EL device of the present invention is characterized by being provided with the above-mentioned light extraction product for a semiconductor light emitting device, a transparent conductive film provided on the flattened layer, and a light emitting portion provided on the transparent conductive film. According to this configuration, it is possible to easily extract the emitted light wave-guided inside the organic EL device.

A method of manufacturing a light extraction product for a semiconductor light emitting device of the present invention is a method of manufacturing the above-mentioned light extraction product for a semiconductor light emitting device, and is characterized by including a concavo-convex structure layer formation step of providing a concavo-convex structure layer having a first refractive index (n1) on a surface of a substrate having a fourth refractive index (n4) by a transfer method, a light extraction layer formation step of applying a dilute solution of light extraction layer raw materials having a second refractive index (n2) onto the concavo-convex structure layer, and removing an excessive solvent to form a light extraction layer having the second refractive index (n2) on the concavo-convex structure layer, and a flattened layer formation step of forming a flattened layer having a third refractive index (n3) to cover the light extraction layer and the concavo-convex structure layer.

According to this method, controllability is improved in each component of the above-mentioned light extraction product for a semiconductor light emitting device, and throughput is improved in manufacturing.

In the method of manufacturing a light extraction product for a semiconductor light emitting device of the invention, it is preferable to include an adhesive layer formation step of providing an adhesive layer on the surface of the substrate or a hydrophilic treatment step of making the surface of the substrate hydrophilic before the concavo-convex structure layer formation step. According to this method, arrangement accuracy is improved in the concavo-convex structure.

A method of manufacturing a light extraction product for a semiconductor light emitting device of the present invention is a method of manufacturing the above-mentioned light extraction product for a semiconductor light emitting device, and is characterized by including a concavo-convex structure layer formation step of providing a concavo-convex structure layer containing the medium having the first refractive index (n1) on a surface of the substrate having the third refractive index (n3) by a transfer method, a nanoparticle arrangement step of applying a solution containing nanoparticle raw materials onto the concavo-convex structure layer provided in the concavo-convex structure formation step, and arranging the nanoparticles having the second refractive index (n2) only in the inside of each concave portion of the concavo-convex structure layer, and a flattened layer formation step of applying a solution of medium raw materials having the first refractive index (n1) onto the concavo-convex structure layer and the nanoparticles arranged in the inside of each concave portion of the concavo-convex structure layer, and forming a flattened layer having the first refractive index (n1) to cover the nanoparticles and the concavo-convex structure layer.

In the method of manufacturing a light extraction product for a semiconductor light emitting device of the invention, it is preferable that in the concavo-convex structure layer, at least the concavo-convex structure surface is hydrophobic.

In the method of manufacturing a light extraction product for a semiconductor light emitting device of the invention, it is preferable that the solution containing nanoparticle raw materials contains an aqueous solvent.

In the method of manufacturing a light extraction product for a semiconductor light emitting device of the invention, it is preferable that the nanoparticle raw materials contain metal alkoxide.

In the method of manufacturing a light extraction product for a semiconductor light emitting device of the invention, it is preferable to include an adhesive layer formation step of providing an adhesive layer on the surface of the substrate or a hydrophilic treatment step of making the surface of the substrate hydrophilic before the concavo-convex structure layer formation step.

In the method of manufacturing a light extraction product for a semiconductor light emitting device of the invention, it is preferable that in the flattened layer formation step, the solution of medium raw materials is applied onto the concavo-convex structure layer and the nanoparticles, a mirror surface is laminated and pressed to the medium raw materials, and that the mirror surface is then peeled off from the medium raw materials to form the flattened layer.

In the method of manufacturing a light extraction product for a semiconductor light emitting device of the invention, it is preferable that an energy line is applied in a state in which the mirror surface is laminated and pressed to the medium raw materials, and that the mirror surface is then peeled off from the medium raw materials to form the flattened layer.

A method of manufacturing a light extraction product for a semiconductor light emitting device of the present invention is a method of manufacturing the above-mentioned light extraction product for a semiconductor light emitting device, and is characterized by including a mold formation step of transferring a concavo-convex structure provided on a cylindrical mold surface by a light transfer method, and adding a concavo-convex structure onto a main surface of a film-shaped substrate to obtain a film-shaped mold, a light extraction layer filling step of applying a dilute solution of a light extraction layer having a second refractive index (n2) onto a surface of the concavo-convex structure of the film-shaped mold, removing an excessive solvent, and forming the light extraction layer in the inside of each concave portion of the concavo-convex structure, a light extraction layer transfer step of obtaining a light extraction product for a semiconductor light emitting device comprised of a substrate having a fourth refractive index (n4)/concavo-convex structure layer having a first refractive index (n1)/light extraction layer having the second refractive index (n2) provided on a top of each convex portion of the concavo-convex structure layer by laminating the surface of the concavo-convex structure of the film-shaped mold with the light extraction layer filled and arranged to a surface of the substrate having the fourth refractive index (n4) via concavo-convex structure layer raw materials having the first refractive index (n1), applying an energy line, and then, peeling off the film-shaped mold, and a flattened layer formation step of forming a flattened layer having a third refractive index (n3) to cover the light extraction layer and the concavo-convex structure layer after the light extraction layer transfer step.

A method of manufacturing a light extraction product for a semiconductor light emitting device of the present invention is a method of manufacturing the above-mentioned light extraction product for a semiconductor light emitting device, and is characterized by including a first mold formation step of transferring a concavo-convex structure provided on a cylindrical mold surface by a light transfer method, and adding a concavo-convex structure onto a main surface of a film-shaped substrate to obtain a first film-shaped mold, a second mold formation step of transferring the concavo-convex structure of the first film-shaped mold by the light transfer method, and adding a concavo-convex structure substantially equal to the concavo-convex structure of the cylindrical mold onto a main surface of a film-shaped substrate to obtain a second film-shaped mold, a light extraction layer filling step of applying a dilute solution of a light extraction layer having a second refractive index (n2) onto a surface of the concavo-convex structure of the second film-shaped mold, removing an excessive solvent, and forming the light extraction layer in the inside of each concave portion of the concavo-convex structure, a light extraction layer transfer step of obtaining a light extraction product for a semiconductor light emitting device comprised of a substrate having a fourth refractive index (n4)/concavo-convex structure layer having a first refractive index (n1)/light extraction layer having the second refractive index (n2) provided on a top of each convex portion of the concavo-convex structure layer by laminating the surface of the concavo-convex structure of the second film-shaped mold with the light extraction layer filled and arranged to a surface of the substrate having the fourth refractive index (n4) via concavo-convex structure layer raw materials having the first refractive index (n1), applying an energy line, and then, peeling off the second film-shaped mold, and a flattened layer formation step of forming a flattened layer having a third refractive index (n3) to cover the light extraction layer and the concavo-convex structure layer after the light extraction layer transfer step.

According to these methods, it is possible to manufacture the light extraction product for a semiconductor light emitting device of the present invention with high throughput properties by continuous process.

Advantageous Effect of the Invention

According to the present invention, it is possible to achieve the light extraction product for a semiconductor light emitting device for enabling light extraction efficiency from the semiconductor light emitting device to be improved, while reducing the color shift and glare in emitted light from the semiconductor light emitting device, and further enabling long-term reliability of the semiconductor light emitting device to be enhanced, and the light emitting device.

BRIEF DESCRIPTION OF DRAWINGS

FIG. 5 contains explanatory diagrams of concave-portion internal interface average positions in the light extraction products according to the first and second aspects;

FIG. 6 is a cross-sectional schematic diagram showing another example of the light extraction product according to the first aspect;

FIG. 36 contains cross-sectional schematic diagrams illustrating each step of a manufacturing method 2 of the light extraction product according to this Embodiment;

BEST MODE FOR CARRYING OUT THE INVENTION

Figure 1:
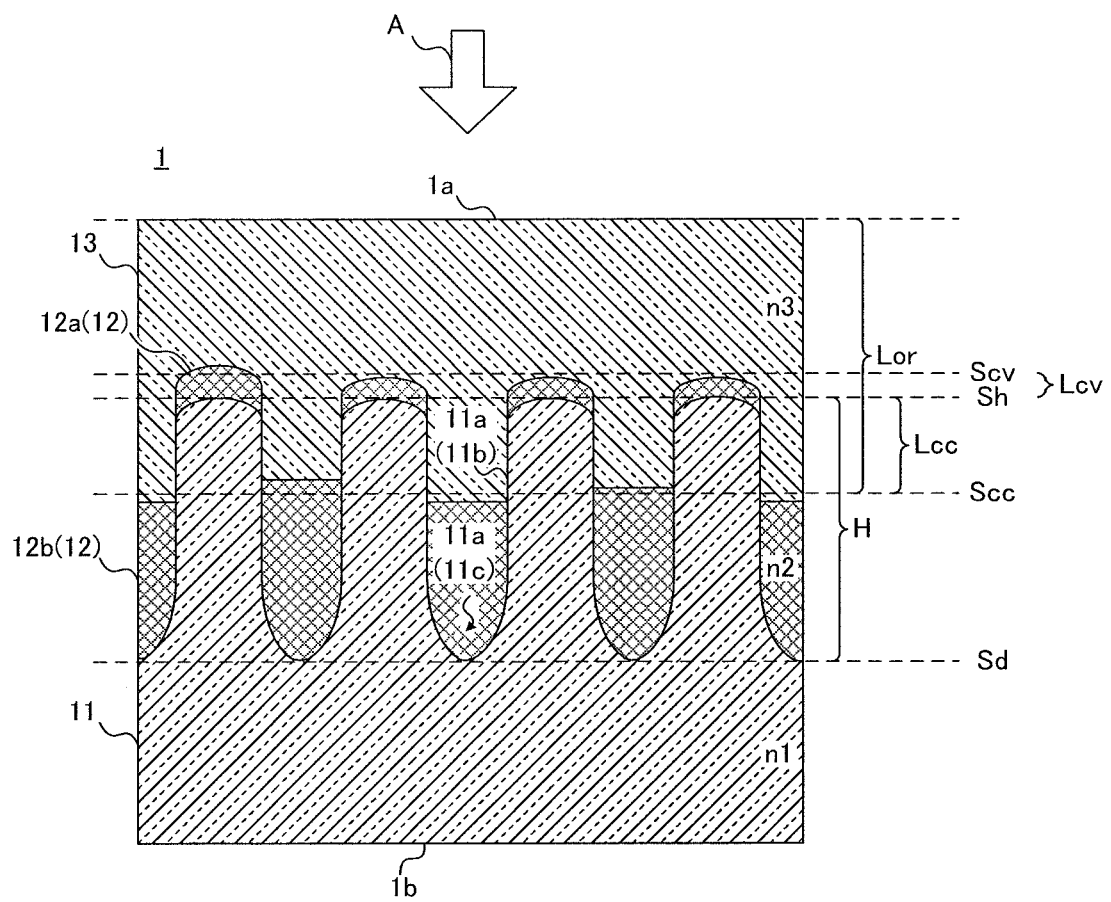
FIG. 1 is a cross-sectional schematic diagram showing an example of a light extraction product according to a first aspect.

Embodiments of the present invention will specifically be described below.

In a semiconductor light emitting device, as described in the Background Art, the waveguide mode is formed that the emitted light is enclosed inside the high refractive index medium. Therefore, efficiency (light extraction efficiency) that the emitted light is released to the outside of the device is significantly reduced. In order to disturb the waveguide mode and improve light extraction efficiency, as described in Patent Document 2, such a method is effective that a concavo-convex structure is provided in the interface on which total reflection occurs inside the light emitting device. Particularly, from the relationship in the refractive index among members forming the semiconductor light emitting device, it is effective to disturb reflection of emitted light in the transparent conductive layer interface to suppress the waveguide mode. With consideration given to such a viewpoint, it is conceivable that by providing the transparent conductive layer itself with a concavo-convex structure, disturbance of the waveguide mode is increased, and that light extraction efficiency is significantly improved. However, the film thickness distribution of the transparent conductive layer and abrupt unevenness on the transparent conductive layer surface develop current concentration, and deterioration of the device is promoted. In other words, it is conceivable that by providing the transparent conductive layer with a concavo-convex structure, optically the waveguide mode is disturbed, and that it is possible to improve light extraction efficiency, but it is possible to think that long-term reliability degrades as the semiconductor light emitting device. Accordingly, required are techniques for improving light extraction efficiency without directly providing the concavo-convex structure in the transparent conductive layer itself.

The method as described in Patent Document 3 is characterized by extracting an evanescent wave oozing from the transparent conductive layer interface. However, in order to more improve light extraction efficiency, it is necessary to make the refractive index of the member forming the flattened layer near the refractive index of the transparent conductive layer. Since such a high refractive index material is not only difficult to produce, expensive, and also has a high tendency to be stabilized as particles, it is conceivable that flatness of the flattened layer surface degrades, i.e. the film thickness distribution of the transparent conductive layer degrades, and that long-term reliability is reduced as the semiconductor light emitting device. In other words, required is a light extraction method easy to control the film thickness of the transparent conductive layer without providing the concavo-convex structure in the transparent conductive layer itself.

Further, the method as described Patent Document 2 is characterized by using a diffraction grating or zone plate, and therefore, strong glare specific to light diffraction occurs. In the case of the method as described in Patent Document 3, an evanescent wave occurring from the transparent conductive layer interface is extracted. Therefore, light extraction efficiency is improved due to light diffraction determined by a difference in the refractive index between a filling agent layer and a structuring layer, and the shape and arrangement of the concavo-convex structure of a concave-convex structure layer. In this case, the interface of a light extraction element in terms of the evanescent wave is only the interface between the filling layer and the concavo-convex structure layer. Therefore, output light at a predetermined angle specific to light diffraction is met, and strong glare occurs.

In the present invention, noting such respects, work was made for the purpose of concurrently improving long-term reliability as the device and light extraction efficiency. Further, attention was also given to the fact that it is important to suppress the color shift of the semiconductor light emitting device in using the semiconductor light emitting device in a display and illumination, particularly, in a display. In other words, it is the gist of the invention to improve long-term reliability as the device, concurrently improve light extraction efficiency, and reduce the color shift and glare of light output from the semiconductor light emitting device.

As a result of studying from such a background, it was found out that it is possible to solve the above-mentioned problems by using a light extraction product (hereinafter, simply referred to as a light extraction product also) for a semiconductor light emitting device in which a light extraction layer having a second refractive index (n2) is provided in a predetermined position on the concavo-convex structure of the concavo-convex structure layer having a first refractive index (n1) in the shape of dots, in the shape of holes, in the shape of palisades or in the shape of a lattice. (1) In other words, it is possible to stabilize film formation properties of the transparent conductive layer in manufacturing a semiconductor light emitting device using the light extraction product. By the film formation properties of the transparent conductive layer being stable, since it is possible to suppress the film thickness distribution of the transparent conductive layer and unevenness on the transparent conductive layer surface, it is possible to suppress current concentration, and as a result, long-term reliability as the device is improved. This is because the concavo-convex structure having the first refractive index (n1) is in the shape of dots, in the shape of holes, in the shape of palisades or in the shape of a lattice. More specifically, this is because it is possible to control energetical stability of a medium disposed on the concavo-convex structure. Further, (2) since it is possible to easily decrease the distance between the transparent conductive layer and the light extraction layer on a nanoscale, it is possible to easily extract the oozing light oozing from the transparent conductive layer surface, and it is possible to improve light extraction efficiency. Furthermore, since it is possible to suppress reflection due to the light extraction layer of the emitted light passing through the transparent conductive layer, the degree of improvement in light extraction efficiency is further increased. The reasons are that the concavo-convex structure having the first refractive index (n1) is in the shape of dots, in the shape of holes, in the shape of palisades or in the shape of a lattice. Still furthermore, since it is possible to increase the number of interfaces in terms of the oozing light oozing from the transparent conductive layer, it is possible to provide light diffraction with a plurality of modes, the extracted light behaves as if a plurality of diffraction points causing different light diffraction phenomena exists, and light scattering properties are enhanced. Therefore, disturbance of the waveguide mode is increased, and light extraction efficiency is more improved.

Moreover, since it is made easy to control disturbance with respect to the shape and arrangement of the concavo-convex structure, it is possible to develop light scattering properties caused by the disturbance. Therefore, it is conceivable that the color shift is reduced. Further, since it is made easy to control dispersion of the distance between the transparent conductive layer and the light extraction layer, it is made easier to reduce the color shift. In the case of attaining the light extraction action by light diffraction, the extracted light is strongly extracted with respect to a predetermined angle. However, by providing the distance between the transparent conductive layer and the light extraction layer with the distribution, dispersion is included in the mode of light diffraction on a microscopic scale such as one by one of the concavo-convex structure. In other words, it is possible to perform light extraction by light diffraction on a microscopic scale, and in macroscopic observation of several tens of micrometers or more, since averaged light of disturbance of light diffraction of nanoscale is observed, light scattering properties are exhibited. Particularly, since the concavo-convex structure of the first concavo-convex structure layer is in the shape of dots, or in the shape of holes, it is possible to arbitrarily add disturbance with respect to the concavo-convex structure, and the color shift reduction effect is further improved.

The inventors of the present invention noted that in a light extraction product in which a light extraction layer having a refractive index different from that of a concave-concavo structure layer is provided on the concavo-convex structure layer provided with a concavo-convex structure on its surface to flatten the concavo-convex structure, it is possible to improve light extraction efficiency from a semiconductor light emitting device, and that on the other hand, to effectively extract the oozing light from the semiconductor light emitting device to improve light extraction efficiency, since a high refractive index material is required, flatness of a flattened layer surface degrades to reduce long-term reliability of the semiconductor light emitting device. Further, the inventors noted that as the distribution of the distance, between the surface of the semiconductor light emitting device on which the oozing light occurs from the semiconductor light emitting device and the concave-convex structure layer or the light extraction layer, is decreased, glare of the emitted light based on diffracted light occurs due to a single medium interface to extract the oozing light. Then, the inventors of the invention found out that it is possible to achieve both improvements in light extraction efficiency from the semiconductor device and improvements in long-term reliability of the semiconductor light emitting device by providing the light extraction layer having the second refractive index (n2) that is substantially different from the first refractive index (n1) on the concavo-convex structure layer having the first refractive index (n1) in the shape of dots, in the shape of holes, in the shape of palisades, or in the shape of a lattice, and setting the distance between the light extraction layer and the light input surface in a predetermined range. Further, it was found out that it is also possible to achieve reductions in glare.

Further, the inventors of the invention found out that it is also possible to achieve above-mentioned both improvements in light extraction efficiency from the semiconductor light emitting device and improvements in long-term reliability of the semiconductor light emitting device by providing the light extraction layer having the second refractive index (n2) that is substantially different from the first refractive index (n1) and/or the third refractive index (n3) in between the concavo-convex structure layer having the first refractive index (n1) and a flattened layer having the third refractive index (n3) on the concavo-convex structure layer having the first refractive index (n1), and setting the distance between the light extraction layer and the light input surface in a predetermined range. Further, the inventors found out that it is also possible to achieve reductions in glare of the emitted light, and arrived at completion of the present invention.

Furthermore, as a result of further studying the background as described above, the inventors of the invention found out that it is possible to solve the above-mentioned problems by using the light extraction product containing nanoparticles having the second refractive index (n2) inside a predetermined surface of a medium thin film having the first refractive index (n1). (1) In other words, it is possible to stabilize film formation properties of the transparent conductive layer in manufacturing a semiconductor light emitting device using the light extraction product. By the film formation properties of the transparent conductive layer being stable, since it is possible to suppress the film thickness distribution of the transparent conductive layer and unevenness on the transparent conductive layer surface, it is possible to suppress current concentration, and as a result, long-term reliability as the device is improved. This is because the nanoparticles having the second refractive index (n2) are contained inside the predetermined surface inside the medium thin film having the first refractive index (n1).

More specifically, in the case where the nanoparticles are dispersed in the surface direction and thickness direction inside the thin film having the first refractive index (n1), this is because the surface of the thin film having the first refractive index (n1) undergoes the effect of the nanoparticles, and flatness degrades. Further, (2) since it is possible to easily decrease the distance between the transparent conductive layer and the nanoparticles on a nanoscale, it is possible to easily extract the oozing light oozing from the transparent conductive layer surface, and it is possible to improve light extraction efficiency. Furthermore, it is possible to suppress reflection of emitted light within the critical angle with respect to the interface between the transparent conductive layer and the medium having the first refractive index (n1). This is because the particles having the second refractive index (n2) are nanoparticles, the medium other than the nanoparticles having the second refractive index (n2) is the medium having the first refractive index (n1) and optical interfaces do not exist among the nanoparticles having the second refractive index (n2). Still furthermore, (3) it is conceivable that by adding the distribution to the shape of nanoparticles and arrangement inside the predetermined surface, it is also possible to suppress the color shift. For example, in the case of improving light extraction efficiency using light diffraction due to the arrangement of the nanoparticles, the extracted light is strongly extracted with respect to a predetermined angle. However, by providing the shape and arrangement of the nanoparticles with the distribution, dispersion is included in the mode of light diffraction on a microscopic scale such as one by one of the nanoparticles, and in macroscopic observation of several tens of micrometers or more, since averaged light of disturbance of light diffraction of nanoscale is observed, light scattering properties are exhibited. Accordingly, it is conceivable that the color shift is reduced.

The inventors of the present invention noted that in a light extraction product used in extracting emitted light from a semiconductor light emitting device, it is effective to control the refractive indexes of media forming the light extraction product to break the waveguide, and that on the other hand, it is difficult to control the refractive indexes of media forming the light extraction product. Then, the inventors found out that by arranging a plurality of nanoparticles having a refractive index that is substantially different from that of a medium forming the light extraction product inside the light extraction product formed of the medium having a predetermined refractive index to decrease with distance from a particular surface inside the light extraction product, it is possible to improve extraction efficiency of emitted light from the semiconductor light emitting device due to a plurality of nanoparticles, and arrived at completion of the present invention.

In other words, the gist of the present invention is a light extraction product comprised of a medium having the first refractive index (n1) including a plurality of nanoparticles having the second refractive index (n2), in which an absolute value (|n1−n2|) of a difference between the first refractive index (n1) and the second refractive index (n2) is 0.1 or more, and is the light extraction product that has mutually parallel first surface and second surface in which when it is assumed that a center surface is a surface that maximizes the number of nanoparticles crossing the surface approximately parallel to the first surface and the second surface, the nanoparticles are arranged so that the number of nanoparticles crossing a surface approximately parallel to the center surface decreases with distance from the center surface. According to the light extraction product, a plurality of nanoparticles having the refractive index that is substantially different from that of the medium forming the light extraction product is distributed near the center surface of the light extraction product, while being arranged so that the number of a plurality of nanoparticles decreases with distance from the center surface, and therefore, as compared with the case where nanoparticles are arranged randomly inside the light extraction product, it is possible to effectively develop the optical function based on the nanoparticles. By this means, since extraction efficiency is improved in emitted light from the semiconductor light emitting device due to a plurality of nanoparticles near the center surface, it is also possible to extract the emitted light sufficiently when the number of nanoparticles is decreased, and it is possible to actualize the light extraction product that easily extracts light from the semiconductor light emitting device. Further, as compared with the case where nanoparticles are arranged randomly, it is possible to suppress the effect of nanoparticles on the surface of the light extraction product, it is thereby possible to keep flatness of the light extraction product surface excellent, and it is possible to improve long-term reliability and light extraction efficiency of the semiconductor light emitting device.

The refractive indexes in the invention are capable of being measured with a general optical refractometer, spectroscopic ellipsometry and the like, and the refractive index in a particularly minute region is capable of being obtained from the dielectric function measured with TEM-EELS and the like.

Embodiments of the present invention will specifically be described below with reference to drawings.

<First Aspect>

FIG. 1 is a cross-sectional schematic diagram of a light extraction product 1 (hereinafter, simply referred to as "light extraction product 1") for a semiconductor light emitting device according to a first aspect of the present invention. In addition, in the following description, it is assumed that the upper portion shown in FIG. 1 is an input direction of light from a semiconductor light emitting device (not shown) to the light extraction product 1, and that the lower portion as shown in FIG. 1 is an output direction of light from the light extraction product 1. Further, it is assumed that the upper surface of the light extraction product 1 is a light input surface 1a, and that the lower surface of the light extraction product 1 is a light output surface 1b. In FIG. 1, the arrow A indicates input light.

As shown in FIG. 1, the light extraction product 1 according to the first aspect is provided with a concavo-convex structure layer 11 having the first refractive index (n1) provided with a concavo-convex structure 11a formed on its surface, a light extraction layer 12 having the second refractive index (n2) provided on the concavo-convex structure 11a of the concavo-convex structure layer 11, and a flattened layer 13 having the third refractive index (n3) provided to cover the concavo-convex structure 11a of the concavo-convex structure layer 11 and the light extraction layer 13. The light extraction product 1 is used with the upper surface (light input surface 1a) of the flattened layer 13 disposed on the surface on the light emitting layer surface (for example, transparent conductive layer) side of the semiconductor light emitting device (not shown). Hereinafter, the light emitting layer surface typified by the transparent conductive layer is simply described as a transparent conductive layer surface. Emitted light of the semiconductor light emitting device input from the light input surface 1a of the light extraction product 1 into the light extraction product 1 is output from the lower surface (light output surface 1b) of the concavo-convex structure layer 11.

The light input from the light input surface 1a of the light extraction product 1 according to the first aspect is emitted light emitted from the light emitting layer of the semiconductor light emitting device, and is broadly classified into two. First, the light is emitted light (hereinafter, referred to as "emitted light within the critical angle") input at an angle within a critical angle with respect to the transparent conductive layer surface. In other words, the emitted light within the critical angle is emitted light input at an incident angle that does not cause total reflection on the transparent conductive layer surface. Second, the light is oozing light (hereinafter, also simply referred to as "oozing light") such that emitted light forming the waveguide mode inside the semiconductor light emitting device oozes from the transparent conductive layer surface to the light input surface 1a side when being reflected on the transparent conductive layer surface. In order to improve light extraction efficiency of the semiconductor light emitting device, it is necessary to output both the emitted light within the critical angle and the oozing light from the light output surface 1b of the light extraction product 1. In other words, by manufacturing a semiconductor light emitting device using the light extraction product 1 according to the first aspect, it is possible to extract the oozing light, which is originally not extracted to the outside of the semiconductor light emitting device, to take out from the light output surface 1b of the light extraction product 1, and it is also possible to suppress the fact that the emitted light within the critical angle is reflected inside the light extraction product 1 and returns to the light input surface 1a of the light extraction product 1. Therefore, it is possible to improve light extraction efficiency of the semiconductor light emitting device. The emitted light within the critical angle input from the light input surface 1a develops light diffraction and travels toward the light output surface 1b, based on each interface shape of the concavo-convex structure of the concavo-convex structure layer, the light extraction layer and the flattened layer, and relationship among the first refractive index (n1), second refractive index and third refractive index (n3). Herein, since the above-mentioned interface shape is determined based on the shape of the concavo-convex structure 11a, by making the shape of the concavo-convex structure 11a a predetermined shape, it is possible to suppress reflection of the emitted light within the critical angle inside the light extraction product 1 to effectively guide to the light output surface 1b. On the other hand, the oozing light oozes from the interface between the light input surface 1a of the light extraction product 1 and the transparent conductive layer surface to the light input surface 1a side, propagates inside the flattened layer 13, and reaches the light extraction layer 12 and concavo-convex structure layer 11. The propagated oozing light is extracted by light diffraction and travels toward the light output surface 1b, based on each interface shape of the concavo-convex structure of the concavo-convex structure layer, the light extraction layer and the flattened layer, and relationship among the first refractive index (n1), second refractive index and third refractive index (n3). Herein, since the oozing light attenuates exponentially with distance in the thickness direction of the light extraction product, it is necessary to decrease the distance between the light extraction layer and the concavo-convex structure 11a, and the light input surface 1a to a nanoscale. In the light extraction product 1 according to Embodiment 1, since the concavo-convex structure 11a of the concavo-convex structure layer 11 meets the predetermined shape and size, it is possible to easily thin the distance between the light extraction layer and the concavo-convex structure 11a of the concavo-convex structure layer, and the light input surface 1a to a nanoscale, and it is possible to extract the oozing light.

Further, in the light extraction product 1 according to the first aspect, since the shape and size of the concavo-convex structure 11a of the concavo-convex structure layer 11 meet predetermined ranges, it is possible to decrease a difference between a surface position of the flattened layer positioned on convex portions 11b of the concavo-convex structure 11a and a surface position of the flattened layer positioned on concave portions 11c of the concavo-convex structure 11a. In other words, it is possible to highly keep surface accuracy of the light input surface 1a. Therefore, it is possible to suppress deterioration mainly caused by current concentration in the semiconductor light emitting device, and it is possible to improve long-term reliability of the semiconductor light emitting device.

Furthermore, in the light extraction product 1 according to the first aspect, since the concavo-convex structure 11a meets the predetermined structure, it is possible to easily add disturbance of the arrangement and shape with respect to the concavo-convex structure 11a arbitrarily. Therefore, since the first refractive index (n1), second refractive index (n2) and third refractive index (n3) meet a predetermined relationship, the oozing light and emitted light within the critical angle input from the light input surface 1a is capable of recognizing a plurality of disturbed interfaces inside the light extraction product 1. In other words, also in the case of limiting the arrangements of the light extraction layer 12 and flattened layer 13 by the arrangement of the concavo-convex structure 11a, the oozing light and emitted light within the critical angle is capable of behaving as if a plurality of disturbed diffraction point groups causing different light diffraction phenomena exists. Accordingly, on a microscopic scale such as one by one of the concavo-convex structure, light diffraction occurs corresponding to each interface position, and these diffraction modes include a plurality of modes. Therefore, in the case of viewing on a macroscopic scale of several tens of micrometers or more, it is conceivable that the extracted light exhibits scattering properties, and that it is also possible to reduce the color shift. Further, also in the case of decreasing the size of the concavo-convex structure 11a so as to minimize reflection of the emitted light within the critical angle, it is possible to extract the oozing light as light scattering properties corresponding to the distribution of effective medium approximate refractive index Nema.

The concavo-convex structure 11a includes a plurality of convex portions 11b or concave portions 11c provided mutually separately, and a plurality of concave portions 11c or convex portions 11b provided between respective convex portions 11b or concave portions 11c. The concavo-convex structure 11a is provided continuously over inside the surface of the light extraction product 1. In addition, the concavo-convex structure 11a including a plurality of convex portions 11b provided mutually separately, and continuous concave portions 11c provided between respective convex portions 11b is described as the shape of dots (first concavo-convex structure 101a described later (see FIG. 7)). Further, the concavo-convex structure 11a including a plurality of concave portions 11c provided mutually separately, and continuous convex portions 11b provided between respective concave portions 11c is described as the shape of holes (second concavo-convex structure 111a described later (see FIG. 9)).

Further, the concavo-convex structure layer 11 may be palisade bodies continuously provided over inside the surface of the light extraction product 1. In addition, a state in which a plurality of palisade bodies is arranged parallel to one another is described as the shape of palisades (third concavo-convex structure 121a described later (see FIG. 11)). Furthermore, a state in which a plurality of palisade bodies is provided to cross is described as the shape of a lattice (fourth concavo-convex structure 131a described later (see FIG. 12)).

Moreover, when a fine structure of the concavo-convex structure layer 11 in the light extraction product 1 is comprised of the shape of palisades or the shape of a lattice, the long-axis direction of a line is defined as the first direction D1.

In a plurality of line lines arranged in the second direction D2 orthogonal to the first direction D1, the shortest distance between center lines of adjacent lines corresponds to the pitch Px. In other words, the structure in the shape of palisades corresponds to a state in which the pitch Py of dot lines arranged with the pitch Py in the first direction D1 asymptotically approaches zero and adjacent dots are connected in the description of the above-mentioned shape of dots.

Figure 2A:
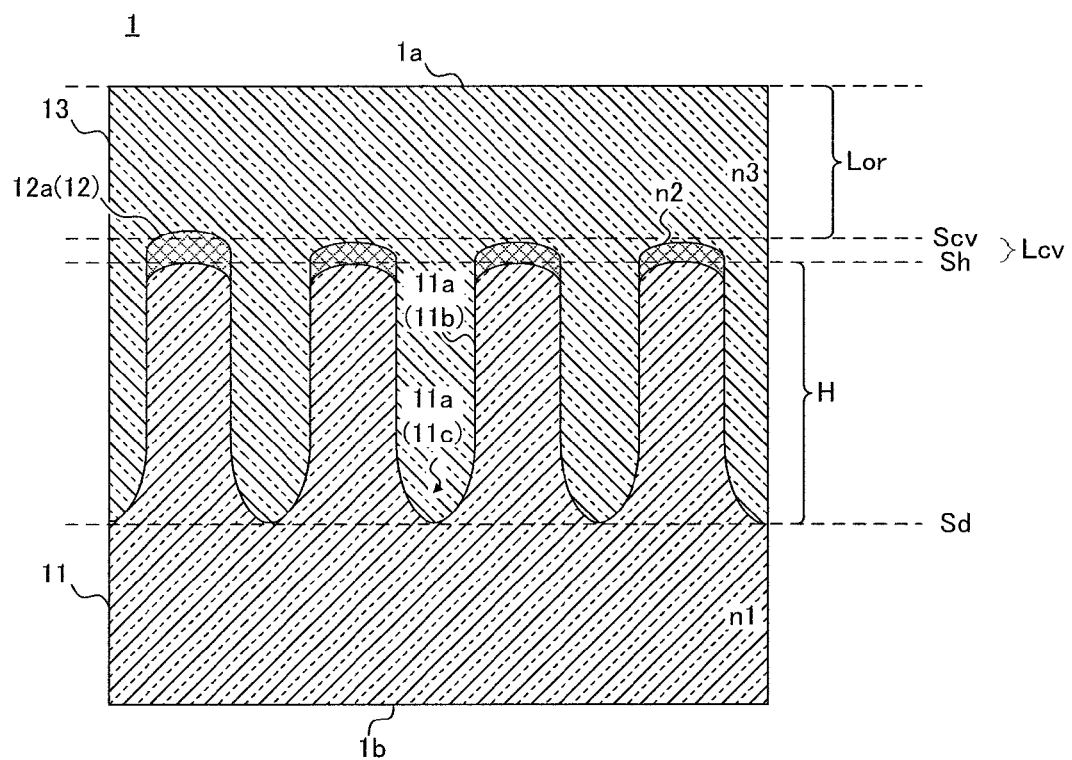
FIG. 2 contains cross-sectional schematic diagrams showing another example of the light extraction product according to the first aspect.
Figure 2B:
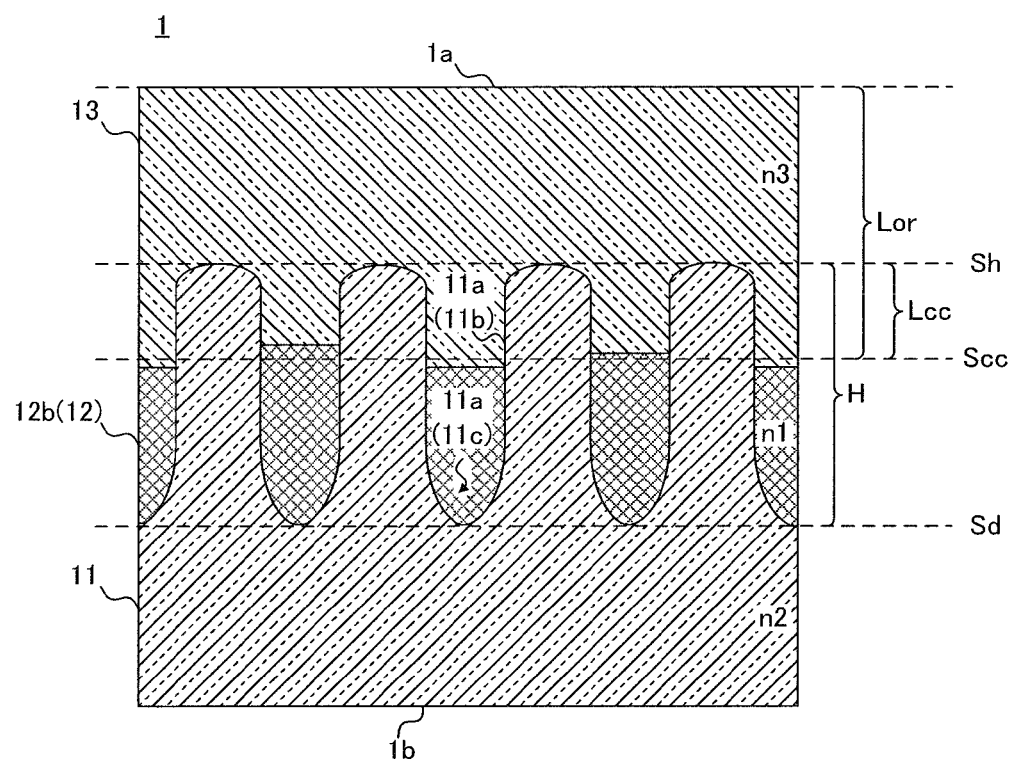

The light extraction layer 12 includes a first light extraction layer 12a provided on each convex portion 11b of the concavo-convex structure 11a and a second light extraction layer 12b provided inside each concave portion 11c. In addition, it is not necessary that the light extraction layer 12 always includes both the first light extraction layer 12a and the second light extraction layer 12b. For example, the light extraction layer 12 may be provided with only the first light extraction layer 12a on the convex portion 11b as shown in FIG. 2A, or may be provided with only the second extraction layer 12b inside the concave portion 11c as shown in FIG. 2B.

Further, when the light extraction layer 12 has both the first light extraction layer 12a and the second light extraction layer 12b, it is not necessary that the first light extraction layer 12a and the second light extraction layer 12b are always provided separately as shown in FIG. 1. In the light extraction layer 12, unless the second light extraction layer 12b is provided to completely fill the inside of the concave portion 11c of the concavo-convex structure 11, the first light extraction layer 12a and the second light extraction layer 12b may be provided continuously. In other words, in the light extraction layer 12, the first light extraction layer 12a and the second light extraction layer 12b may be provided continuously from the inside of the concave portion 11c to the top of the convex portion 11b of the concavo-convex structure 11a. Also in such a case where the first light extraction layer 12a and the second light extraction layer 12b are provided continuously, it is possible to extract the oozing light by the concavo-convex structure formed of the first light extraction layer 12a and the second light extraction layer 12b. In such a case, it is preferable that the oozing light is extracted by the first light extraction layer, and that the distance between the first light extraction layer 12a and the second light extraction layer 12b is increased to suppress reflection of the emitted light within the critical angle.

The flattened layer 13 propagates the oozing light to the concavo-convex structure 11a and light extraction layer 12. The light extraction layer 12 extracts the oozing light propagated by the flattened layer 13 by light diffraction or light diffraction and light scattering phenomenon. The concavo-convex structure 11a supports the light extraction layer 12, and extracts the oozing light propagated by the flattened layer 13 by light diffraction or light diffraction and light scattering phenomenon.

As described above, in the light extraction product 1 according to the first aspect of the present invention, it is possible to extract the oozing light by light diffraction or light diffraction and light scattering. Such a difference in the extraction scheme is determined by the arrangement of the concavo-convex structure 11a of the concavo-convex structure layer 11 and the wavelength of emitted light of the semiconductor light emitting device. Light diffraction in the present Description means an optical phenomenon occurring in the case where the wavelength of emitted light is equal to the average pitch P of the concavo-convex structure 11a or less. On the other hand, light diffraction and light scattering means optical phenomena occurring in the case where the wavelength of emitted light is larger than the average pitch P of the concavo-convex structure 11a. In the case where the wavelength of incident light is larger than the average pitch P of the concave-convex structure, this is based on the effective medium approximate action such that the concavo-convex structure is averaged in terms of the incident light. In this case, the optical phenomenon occurs corresponding to the distribution and contrast of effective medium approximate refractive index Nema formed in terms of the emitted light, and when the distribution is random or sufficiently larger than the emitted light, the light scattering phenomenon develops, while when the distribution is equal to the wavelength of the emitted light or more, the light diffraction phenomenon develops.

In addition, in the following description, unless otherwise specified, expression of light diffraction is represented to use.

<Second Aspect>

Figure 3:
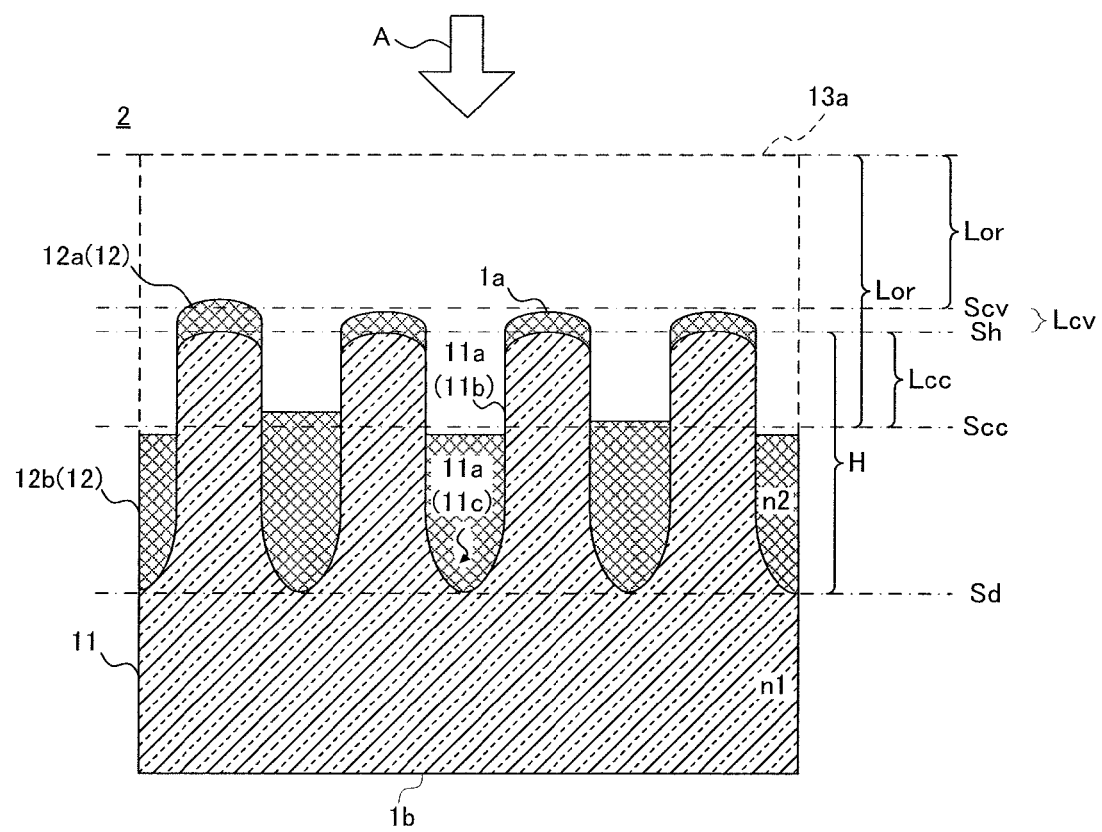
FIG. 3 is a cross-sectional schematic diagram showing an example of a light extraction product according to a second aspect.

Alight extraction product 2 according to the second aspect of the present invention will be described next. FIG. 3 is a cross-sectional schematic diagram of the light extraction product 2 according to the second aspect of the invention. As shown in FIG. 3, the light extraction product 2 has a configuration with the flattened layer 13 omitted from the light extraction product 1 as shown in FIG. 1. The light extraction product 2 is used by bringing the transparent conductive layer surface of the semiconductor light emitting device into contact with the surface of the light extraction layer 12 (the first light extraction layer 12a and the second light extraction layer 12b) via an adhesive layer 13a. In other words, it is possible to think that the light extraction product 1 according to the above-mentioned first aspect is beforehand provided with, as the flattened layer 13, the adhesive layer 13a required in using the light extraction product 2 according to the second aspect.

The shape and arrangement of the concavo-convex structure or light extraction layer of the light extraction product 2 according to the second aspect or effects and principles to use are the same as those described in the light extraction product 1 according to the above-mentioned first aspect, and it is possible to replace the flattened layer used in the description of the light extraction product 1 according to the first aspect with the adhesive layer to read.

<Light Extraction Product>

The description will be given below based on the light extraction product 1 according to the first aspect, and unless otherwise specified, by replacing the flattened layer 13 with the adhesive layer 13a to read in the description of the light extraction product 1, it is assumed that the light extraction product 2 according to the second aspect is described at the same time. Further, in the following description, the case of providing both the first light extraction layer 12a on the convex portion 11b of the concavo-convex structure 11a and the second light extraction layer 12b inside the concave portion 11c as shown in FIG. 1 is represented to describe, and unless otherwise specified, it is assumed that the same definitions are made also in the case where the first light extraction layer 12a is provided only on the convex portion 11b and the case where and the second light extraction layer 12b is provided only inside the concave portion 11c.

First, the first refractive index (n1) to third refractive index (n3) of the light extraction product 1 according to the first aspect will specifically be described. In addition, in the case of the light extraction product 2 according to the second aspect, it is assumed that the refractive index of the adhesive layer 13a in using the light extraction product 2 meets the third refractive index as described below. Further, in the present Description, "refractive indexes are substantially equal" is the case where an absolute value ($|nA-nB|$) of a difference in the refractive index between a medium (A) with the refractive index (nA) and a medium (B) with the refractive index (nB) is less than 0.1, and "refractive indexes are equal" is the case where an absolute value (|nA−nB|) of a difference in the refractive index between a medium (A) with the refractive index (nA) and a medium (B) with the refractive index (nB) is 0.

When the refractive indexes are substantially equal, it is possible to control reflection of light in the interface between the medium (A) having the refractive index (nA) and the medium (B) having the refractive index (nB) to within 0.1% or less, and the light does almost not recognize the interface between the medium with the refractive index (nA) and the medium with the refractive index (nB). Therefore, the case where an absolute value (|nA−nB|) of a difference in the refractive index is less than 0.1 is defined as "refractive indexes are substantially equal". In addition, it is more preferable that the absolute value (|nA−nB|) of the difference between the refractive indexes is 0.07 or less. In this case, it is possible to control reflection of light in the interface between media (A) and (B) to within 0.05% or less.

For three or more kinds of media, as in the case of two kinds of media, it is assumed that the case where the absolute value of the difference in the refractive index is less than 0.1 is "refractive indexes are substantially equal", and that the case where the difference in the refractive index is 0 is "refractive indexes are equal". For example, in the case that there are the medium (A) having the refractive index (nA), medium (B) having the refractive index (nB) and medium (C) having a refractive index (nC), when all values of (|nA−nB|), (|nA−nC|) and (|nC−nB|) are less than 0.1, the medium (A) with the refractive index (nA), medium (B) with the refractive index (nB) and the medium (C) with the refractive index (nC) are handled as media having substantially mutually equal refractive indexes.

Further, in the present Description, "state in which refractive indexes are mutually different" is the case where the absolute value of the difference in the refractive index is 0.1 or more. In other words, a state in which the refractive index (nA) and the refractive index (nB) are mutually different is defined as the case where the absolute value (|nA−nB|) of the difference in the refractive index is 0.1 or more.

For three or more kinds of media, as in the case of two kinds of media, the case where the absolute value of the difference in the refractive index is 0.1 or more is handled as a state in which refractive indexes are mutually different. For example, in the case that there are the medium (A) having the refractive index (nA), medium (B) having the refractive index (nB) and medium (C) having the refractive index (nC), when all values of (|nA−nB|), (|nA−nC|) and (|nC−nB|) are 0.1 or more, the medium (A) with the refractive index (nA), medium (B) with the refractive index (nB) and medium (C) with the refractive index (nC) are handled as media having mutually different refractive indexes.

In the light extraction product 1 according to the first aspect, the first refractive index (n1) to third refractive index (n3) meet relationships of the refractive index expressed by following equations (7) to (9).

$$n2 > n3 \geq n1 \text{ and } (n2-n3) \geq 0.1 \qquad \text{Eq. (7)}$$

$$n3 > n2 > n1 \text{ and } (n3-n2) \geq 0.1 \qquad \text{Eq. (8)}$$

$$n3 \geq n1 > n2 \text{ and } (n1-n2) \geq 0.1 \qquad \text{Eq. (9)}$$

In the light extraction product 1 according to the first aspect, when the surface (light input surface 1a) of the flattened layer 13 comes into contact with the surface of the transparent conductive layer surface (not shown) of the semiconductor light emitting device, the oozing light is extracted as light diffraction due to the light extraction layer 12 and concavo-convex structure 11a. Then, the extracted oozing light is taken out to the outside of the semiconductor light emitting device from the light output surface 1b via the light extraction layer 12 and concavo-convex structure 11a.

In this case, when the first refractive index (n1) to the third refractive index (n3) meet the relationship of above-mentioned equation (7), since the difference between the second refractive index and the first refractive index is large, heterogeneity is strengthened between the light extraction layer having the second refractive index and the concavo-convex structure layer having the first refractive index in terms of the emitted light of the semiconductor light emitting device. In other words, it is conceivable that the light extraction layer and the concavo-convex structure layer develop the function such that as if two diffraction point groups causing different light diffraction phenomena overlap. Therefore, since the oozing light is extracted in different diffraction modes and develops scattering properties, the waveguide mode is effectively disturbed, and it is possible to improve light extraction efficiency. Further, in such a state in which the second refractive index is the highest, and a difference between the second refractive index (n2) and the first refractive index (n1) is large i.e. even in the case where the center of light extraction action is the light extraction layer having the second refractive index (n2) and the concavo-convex structure layer having the first refractive index (n1), since the concavo-convex structure of the concavo-convex structure layer is in the shape of dots, in the shape of holes, in the shape of palisades or in the shape of a lattice, it is conceivable that it is possible to limit the size in the in-plane direction of the light extraction product 1 of the light extraction layer having the second refractive index, it is thereby possible to suppress reflection of emitted light within the critical angle in the light extraction layer having the second refractive index, and that it is possible to significantly improve light extraction efficiency. Further, in the case of adding disturbance (shape and arrangement) to the concavo-convex structure of the concavo-convex structure layer having the first refractive index and the light extraction layer having the second refractive index, also when the wavelength of the emitted light is sufficiently larger than the average pitch of the concavo-convex structure, it is presumed that the distribution contrast of effective medium approximate refractive index Nema is large in terms of the emitted light of the semiconductor light emitting device, the degree of the light scattering properties is increased corresponding to the distribution of effective medium approximate refractive index Nema, and that the effect of improving the color shift is enhanced. On the other hand, when the wavelength of the emitted light is equal to or less than the average pitch of the concavo-convex structure, since dispersion is high in the light diffraction mode on a microscopic scale such as one by one of the concavo-convex structure, it is conceivable that light scattering properties are more strengthened on a macroscopic scale such as several tens of micrometers or more.

Further, in the case where the light extraction layer 12 has both the first light extraction layer 12a and the second light extraction layer 12b, it is also conceivable that the oozing light is extracted by mutually different diffraction modes due to the first light extraction layer 12a, second light extraction layer 12b and concavo-convex structure 11a. Therefore, it is presumed that such a function develops that as if three diffraction point groups causing different light diffraction phenomena overlap, and that strong light scattering properties are developed. It is conceivable that such light scattering is high in the effect of disturbing the waveguide mode, and that it is possible to more improve light extraction efficiency. Further, it is possible to strengthen scattering properties due to disturbance in the case of arbitrarily adding the disturbance to the shape and arrangement of the concavo-convex structure. Therefore, since output properties to the predetermined angle specific to diffracted light are not met, the color shift is suppressed, and it is possible to make emitted light nearer natural light. Therefore, it is possible to suppress glare when a user of the semiconductor light emitting device visually identifies the device.

Furthermore, in above-mentioned equation (7), the difference value (n2−n3) between the second refractive index (n2) and the third refractive index (n3) meets 0.1 or more, and therefore, heterogeneity of the light extraction layer is enhanced in terms of the emitted light from the semiconductor light emitting device. In other words, the oozing light causes light diffraction based on a difference in the refractive index between the third refractive index (n3) and the second refractive index (n2) in the interface between the flattened layer 13 and the light extraction layer 12, and it is thereby possible to effectively extract the oozing light. Particularly, from the viewpoint of further exerting the above-mentioned effect, the difference value (n2−n3) between the second refractive index (n2) and the third refractive index (n3) is preferably 0.15 or more, more preferably 0.25 or more, and further preferably 0.3 or more.

In addition, in above-mentioned equation (7), the difference value (n3−n1) between the first refractive index (n1) and the third refractive index (n3) is not limited particularly, and preferably meets (n3−n1)≥0. When (n3−n1)≥0, it is possible to promote transmission of the oozing light and emitted light within the critical angle to the light output surface 1b side. Further, in the case of increasing (n3−n1) in the range meeting Eq. (7), it is conceivable that it is possible to improve the extraction capability due to light diffraction of the oozing light by the concavo-convex structure 11a. In addition, when (n3−n1) is small in the range meeting Eq. (7), for example, also in the case where the third refractive index (n3) is equal to the first refractive index (n1) or asymptotically approaches the first refractive index (n1), since a distance L or described later meets a predetermined range, the oozing light propagates inside the flattened layer 13, and is extracted by the light extraction layer 12.

By bringing the third refractive index (n3) close to the refractive index ($n_{sc}$) of the light emitting layer surface (for example, transparent conductive layer) of the semiconductor light emitting device while meeting above-mentioned equation (7), it is possible to increase the rate of the emitted light within the critical angle. In other words, it is possible to reduce the emitted light forming the waveguide mode. Further, from the viewpoint of suppressing reflection in the interface between the flattened layer 13 and the transparent conductive layer surface of the semiconductor light emitting device, the absolute value (|n3−$n_{sc}$|) of the difference value between the third refractive index (n3) and the refractive index ($n_{sc}$) of the light emitting layer surface is preferably 0.5 or less. Furthermore, from the viewpoint of reducing a total reflection light quantity of emitted light in the interface between the light emitting layer and the flattened layer 13, the absolute value (|n3−$n_{sc}$|) of the difference value is preferably 0.3 or less, more preferably 0.15 or less, and most preferably less than 0.1 that meets the substantially equal refractive index relationship.

Further, by bringing the third refractive index (n3) close to the first refractive index (n1) while meeting above-mentioned equation (7), it is possible to make the center of the oozing light extraction action the light extraction layer. In this case, it is possible to extract the oozing light due to light diffraction based on the difference between the third refractive index and the second refractive index (n2), and it is also possible to reduce reflection of the emitted light within the critical angle in the interface between the flattened layer and the concavo-convex structure layer.

Furthermore, by decreasing the first refractive index (n1) of the concavo-convex structure layer 11 while meeting above-mentioned equation (7), oozing light extraction efficiency is further improved due to the light extraction layer 12 and concavo-convex structure 11a. Still furthermore, it is possible to promote transmission of the extracted light with the waveguide mode broken and the emitted light within the critical angle to the light output surface 1b side.

Moreover, by the above-mentioned principles, it is possible to extract the oozing light and to guide the emitted light within the critical angle to the light output surface 1b, and it is thereby possible to enhance selectivity of materials to form the flattened layer. Therefore, it is made easy to keep surface accuracy of the surface (light input surface 1a) of the flattened layer higher, and it is thereby possible to improve long-term reliability of the semiconductor light emitting device.

Further, by the first refractive index (n1) to the third refractive index (n3) meeting above-mentioned equation (8), when the surface (light input surface 1a) of the flattened layer 13 is brought into contact with the transparent conductive layer surface, it is possible to decrease total reflection in the interface between the transparent conductive layer surface and the flattened layer 13. In other words, it is possible to decrease the emitted light forming the waveguide mode, and increase the emitted light within the critical angle. Further, since it is possible to increase a difference between the third refractive index and the first refractive index, it is possible to strengthen heterogeneity between the flattened layer and the concavo-convex structure layer in terms of the emitted light of the semiconductor light emitting device. Therefore, it is conceivable that extraction efficiency by the concavo-convex structure layer is improved in the oozing light propagated inside the flattened layer. Further, it is conceivable that it is possible to suppress reflection of the emitted light within the critical angle in the interface between the concavo-convex structure layer 11 and the flattened layer 13 and in the interface between the light extraction layer 12 and the flattened layer 13, due to averaging action (effective medium approximation) specific to nano-structure and the intermediate refractive index action due to the second refractive index. Therefore, it is conceivable that the emitted light within the critical angle proceeding to the inside of the flattened layer 13 from the light input surface 1a effectively reaches the light output surface 1b of the light extraction product 1, and that light extraction efficiency is improved in the semiconductor light emitting device. Therefore, the oozing light guided to the inside of the flattened layer from the interface between the transparent conductive layer surface of the semiconductor light emitting device and the flattened layer effectively reaches the light output surface side, and improved is light extraction efficiency from the semiconductor light emitting device.

In addition, the oozing light is extracted by the light extraction layer 12 and concavo-convex structure 11a. In this case, since the diffraction mode due to the light extraction layer 12 is different from the diffraction mode due to the concavo-convex structure 11a, it is presumed that output properties to the predetermined angle specific to diffracted light are disturbed, and that light scattering properties develop. In other words, it is conceivable that the light extraction layer 12 and concavo-convex structure 11a develop such a function that as if two diffraction point groups causing different light diffraction phenomena overlap.

Further, in the case where the light extraction layer 12 has both the first light extraction layer 12a and the second light extraction layer 12b, it is also conceivable that the oozing light is extracted by mutually different diffraction modes due to the first light extraction layer 12a, second light extraction layer 12b and concavo-convex structure layer 11a. Therefore, it is also presumed that such a function develops that as if three diffraction point groups causing different light diffraction phenomena overlap, and that strong light scattering properties are provided. It is presumed that since such light scattering is high in the effect of disturbing the waveguide mode, the effect of improving light extraction efficiency is enhanced. Further, it is possible to strengthen scattering properties occurring caused by controlling disturbance of the shape and arrangement of the concavo-convex structure. Therefore, since the extracted emitted light does not meet output properties to the predetermined angle specific to diffracted light, the color shift is suppressed, and it is possible to make emitted light nearer natural light. Therefore, it is possible to suppress glare when a user of the semiconductor light emitting device visually identifies the device.

In above-mentioned equation (8), since the difference value (n3−n2) between the third refractive index (n3) and the second refractive index (n2) meets 0.1 or more, heterogeneity of the light extraction layer 12 is enhanced in terms of the emitted light from the semiconductor light emitting device. In other words, the oozing light causes light diffraction in the interface between the flattened layer 13 and the light extraction layer 12. Therefore, it is possible to effectively extract the oozing light by the light extraction layer 12. Particularly, from the viewpoint of further exerting the above-mentioned effect, the difference value (n3−n2) between the refractive index (n3) of the flattened layer 13 and the refractive index (n2) of the light extraction layer 12 is preferably 0.15 or more, more preferably 0.25 or more, and most preferably 0.3 or more.

On the other hand, also in the case where the difference value (n3−n2) is a small value in the range of 0.1 or more, when the difference value (n2−n1) between the second refractive index (n2) and the first refractive index (n1) increases in the range of 0.1 or more, heterogeneity of the concavo-convex structure 11a is enhanced in terms of the emitted light from the semiconductor light emitting device. In other words, it is conceivable that the oozing light causes light diffraction in the interface between the flattened layer 13 and the concavo-convex structure 11a. Therefore, it is possible to effectively extract the oozing light. In the case of improving light extraction efficiency by this mode, the difference value (n2−n1) between the second refractive index (n2) and the first refractive index (n1) is preferably 0.15 or more, more preferably 0.25 or more, and most preferably 0.3 or more.

By bringing the third refractive index (n3) close to the refractive index ($n_{sc}$) of the transparent conductive layer surface of the semiconductor light emitting device while meeting above-mentioned equation (8), it is possible to increase the emitted light within the critical angle. In other words, it is possible to reduce the emitted light forming the waveguide mode. From the viewpoint of suppressing reflection in the interface between the flattened layer 13 and the transparent conductive layer surface, the absolute value ($|n3-n_{sc}|$) of the difference between the third refractive index (n3) and the refractive index ($n_{sc}$) of the light emitting layer surface is preferably 0.5 or less. From the viewpoint of reducing a total reflection light quantity of emitted light in the interface between the light emitting layer surface and the flattened layer 13, the absolute value of the difference is preferably 0.3 or less, more preferably 0.15 or less, and most preferably less than 0.1 that meets the substantially equal refractive index relationship. Further, in this case, since the difference between the third refractive index (n3) and the second refractive index (n2) tends to be larger, it is presumed that extraction efficiency is improved by diffraction phenomena of the oozing light due to the light extraction layer 12 and concavo-convex structure layer 11.

On the other hand, by decreasing the first refractive index (n1) in the range meeting above-mentioned equation (8), it is possible to promote transmission of the extracted oozing light and emitted light within the critical angle to the light output surface 1b of the light extraction product 1. Further, it is presumed that it is possible to suppress reflection of the emitted light within the critical angle in the interface between the concavo-convex structure layer 11 and the flattened layer 13 and in the interface between the light extraction layer 12 and the flattened layer 13, due to averaging action (effective medium approximation) specific to nano-structure.

Moreover, by the above-mentioned principles, it is possible to extract the oozing light and to guide the emitted light within the critical angle to the light output surface 1b, and it is thereby possible to enhance selectivity of materials to form the flattened layer. Therefore, it is made easy to keep surface accuracy of the surface (light input surface 1a) of the flattened layer higher, and it is thereby possible to improve long-term reliability of the semiconductor light emitting device.

By the first refractive index (n1) to the third refractive index (n3) meeting above-mentioned equation (9), when the upper surface (light input surface 1a) of the flattened layer 13 is brought into contact with the transparent conductive layer surface of the semiconductor light transmitting device, it is possible to decrease a total reflection light quantity in the interface between the light emitting layer surface and the flattened layer 13. Further, it is possible to extract the oozing light as light diffraction due to the light extraction layer 12 and concavo-convex structure 11a. Therefore, in the emitted light forming the waveguide mode inside the semiconductor light transmitting device, the oozing light thereof is extracted as light diffraction due to the light extraction layer 12 and concavo-convex structure 11a, thereby exhibits light scattering properties to the outside of the semiconductor light transmitting device and is extracted. Further, since it is possible to increase a difference between the third refractive index and the second refractive index, it is possible to strengthen heterogeneity between the flattened layer and the light extraction layer in terms of the emitted light of the semiconductor light emitting device, and therefore, it is conceivable that extraction efficiency by the light extraction layer is improved in the oozing light oozing from the interface between the transparent conductive layer surface and the flattened layer. Furthermore, since it is possible to apply the above-mentioned principles to light scattering properties by adding disturbance to the shape and arrangement of the concavo-convex structure, it is conceivable that it is possible to increase the degree of light scattering properties, and that it is also possible to effectively reduce the color shift. Still furthermore, it is conceivable that it is possible to extract the oozing light from the interface between the transparent conductive layer surface and the flattened layer as diffraction phenomena of respective different diffraction modes due to the light extraction layer and the concavo-convex structure layer, and that it is possible to improve light extraction efficiency.

In this case, it is presumed that since the diffraction mode due to the light extraction layer 12 is different from the diffraction mode due to the concavo-convex structure 11, output properties to the predetermined angle specific to diffracted light are disturbed, and that light scattering properties develop. In other words, it is conceivable that the light extraction layer 12 and concavo-convex structure 11a develop such a function that as if two diffraction point groups causing different light diffraction phenomena overlap. Further, in the case where the light extraction layer 12 has the first light extraction layer 12a and the second light extraction layer 12b, it is also conceivable that the oozing light is extracted by different diffraction modes due to the first light extraction layer 12a, second light extraction layer 12b and concavo-convex structure 11a. Therefore, it is presumed that such a function develops that as if three diffraction point groups causing different light diffraction phenomena overlap, and that strong light scattering properties are provided. Since the emitted light extracted by such light scattering does not meet output properties to the predetermined angle specific to diffracted light, the color shift is suppressed, and it is possible to make emitted light nearer natural light. Therefore, it is possible to suppress glare when a user of the semiconductor light emitting device visually identifies the device.

Since the difference value (n1−n2) between the first refractive index (n1) and the second refractive index (n2) meets 0.1 or more, heterogeneity of the light extraction layer is enhanced in terms of the emitted light from the semiconductor light emitting device. In other words, the oozing light causes light diffraction in the interface between the flattened layer 13 and the light extraction layer 12. Therefore, it is possible to effectively extract the oozing light due to the light extraction layer 12 and the concavo-convex structure 11a. Particularly, from the viewpoint of further exerting the above-mentioned effect, the difference value (n1−n2) between the first refractive index (n1) and the second refractive index (n2) is preferably 0.15 or more, more preferably 0.25 or more, and most preferably 0.3 or more. In addition, in the case of increasing the difference value (n1−n2), for example, there are methods of using gas typified by air and inert gas, porous materials typified by porous $SiO_2$ and the like, liquid typified by ion liquid or the like, as the light extraction layer 12.

The difference (n3−n1) between the first refractive index (n1) and the third refractive index (n3) is not limited particularly, and is only required to meet (n3−n1)≥0. By meeting (n3−n1)≥0, it is possible to promote transmission of the extracted oozing light and emitted light within the critical angle to the light output surface 1b side of the light extraction product 1.

By bringing the third refractive index (n3) close to the refractive index ($n_{sc}$) of the transparent conductive layer of the semiconductor light emitting device in the range meeting above-mentioned equation (9), it is possible to increase a transmission light quantity to the flattened layer within the critical angle. Particularly, the absolute value ($|n_{sc}-n3|$) of the difference between the refractive index ($n_{sc}$) of the light emitting layer surface and the third refractive index (n3) of the flattened layer is preferably 0.5 or less. From the viewpoint of reducing a total reflection light quantity of emitted light in the interface between the transparent conductive layer surface and the flattened layer 13, the absolute value $|(n_{sc}-n3)|$ of the difference is preferably 0.3 or less, more preferably 0.15 or less, and most preferably less than 0.1 that meets the substantially equal refractive index relationship.

Further, by decreasing the first refractive index (n1) in the range meeting above-mentioned equation (9), improved is light extraction efficiency by diffraction due to the concavo-convex structure 11a of the concavo-convex structure layer 11. Furthermore, it is possible to promote transmission of the extracted oozing light and emitted light within the critical angle to the light output surface 1b side of the light extraction product 1.

Moreover, by the above-mentioned principles, it is possible to extract the oozing light and to guide the emitted light within the critical angle to the light output surface 1b, and it is thereby possible to enhance selectivity of materials to form the flattened layer. Therefore, it is made easy to keep surface accuracy of the surface (light input surface 1a) of the flattened layer higher, and it is thereby possible to improve long-term reliability of the semiconductor light emitting device.

In the light extraction product 1 according to the first aspect, the light extraction layer 12 having the second refractive index (n2) may be comprised of a plurality of layers of two or more layers. For example, the light extraction layer 12 may be comprised of two layers (layer having a refractive index (nα)/layer having a refractive index (nβ), or may be comprised of m layers (m≥2) formed by successively stacking a layer having a refractive index (nβ) on a layer having a refractive index (nα) (layer having a refractive index (nα)/ layer having a refractive index (nβ). Similarly, the light extraction layer 12 may be comprised of three or more layers with mutually different refractive indexes.

In the case of forming the light extraction layer 12 of a plurality of layers with mutually different refractive indexes, in the relationship between the first refractive index (n1) and the second refractive index (n2) in above-mentioned equations (7) to (9), in the first light extraction layer 12a, the refractive index of a layer (layer closest to the top of the convex portion 11b of the concavo-convex structure 11a) closest to the concavo-convex structure layer 11 side is set at the second refractive index (n2), and in the light second extraction layer 12b, the refractive index of a layer (layer closest to the bottom of the concave portion 11c of the concavo-convex structure 11a) closest to the concavo-convex structure layer 11 side is set at the second refractive index (n2). Further, in the relationship between the third refractive index (n3) and the second refractive index (n2), in both the first light extraction layer 12a and the second light extraction layer 12b, the refractive index of a layer closest to the flattened layer 13 side is set at the third refractive index (n3).

For example, in the case of forming the light extraction layer 12 of three layers (layer with a refractive index (nα)/layer with a refractive index (nβ)/layer with a refractive index (nγ)) from the flattened layer 13 side to the concavo-convex structure layer 11 side of the light extraction product 1, in the relationship with the first refractive index (n1), at least the refractive index (nγ) can be used as the second refractive index (n2), and in the relationship with the third refractive index (n3), at least the refractive index (nα) can be used as the second refractive index (n2). In other words, with respect to the refractive index (nβ), it is not necessary to always meet the relationships of above-mentioned equations (7) to (9). In addition, in the case of forming the light extraction layer 12 of a plurality of layers, it is the most preferable that all refractive indexes of respective layers meet above-mentioned equations (7) to (9). Further, in the case of forming the light extraction layer 12 of a plurality of layers, the average film thickness in the thickness direction of the light extraction product 1 is preferably respectively 5 nm or more, and more preferably 15 nm or more.

Further, the light extraction layer 12 may be a structure containing phase separation as well as the above-mentioned multilayer structure. In this case, as the refractive index (n2) in above-mentioned equations (7) to (9), used is an average refractive index of refractive indexes of all phases contained in the light extraction layer 12. For example, as the light extraction layer 12, when two phases of a phase having a refractive index (nα) and phase having a refractive index (nβ) are contained, a state in which the two layers are phase-separated may be used. In this case, the average of the refractive index (nα) and refractive index (nβ) is used as the second refractive index (n2). Further, the phase separation size preferably ranges from 50 nm to 800 nm.

In the light extraction product 2 according to the second aspect, the first refractive index (n1) of the concavo-convex structure layer 11 is substantially different from the second refractive index (n2) of the light extraction layer 12. Herein, in the light extraction product 2, as described above, "refractive indexes are substantially different" means that the absolute value (|nA−nB|) of the difference in the refractive index between the medium (A) with the refractive index (nA) and the medium B with the refractive index (nB) is 0.1 or more.
<Concavo-Convex Structure>

The configuration of the concavo-convex structure 11a of the concavo-convex structure layer 11 will specifically be described next. As specifically described later, the concavo-convex structure layer 11 has a plurality of convex portions 11 (or concave portions 11c, the same in the following description) extending along the first direction D1 belonging to the inside of the surface of the concavo-convex structure layer 11. In the examples as shown in FIGS. 1 and 3, the convex portions 11 are provided at a predetermined distance away from one another along the second direction D2 orthogonal to the first direction D1. In a cross-sectional view (viewed in the cross section perpendicular to the orthogonal direction) along the thickness direction of the light extraction product 1, the convex portions 11 protrude in the direction perpendicular to the main surface of the concavo-convex structure layer 11. Concave portions 11c are formed among the convex portions 11b. The convex portions 11b and concave portions 11c form the concavo-convex structure 11a.

Terms used in describing the concavo-convex structure 11a of the light extraction product 1 will be described next. In the following description, the terms are described based on the examples as shown in FIGS. 1 and 3, and unless otherwise specified, on details, the same terms are used also in a first concavo-convex structure 101a and second concavo-convex structure 111a described later.

A symbol Sh as shown in FIG. 1 means a convex-portion vertex-portion average position of the convex portions 11b of the concavo-convex structure. The convex-portion vertex-portion average position Sh means a position of an in-plane average of the vertex-portion position of each convex portion 11b. It is preferable that the average position Sh of tops of the convex-portions is obtained by averaging ten or more tops of the convex-portion 11b.

A symbol Sd as shown in FIG. 1 means a concave-portion bottom-portion average position of the concave portions 11c of the concavo-convex structure. The concave-portion bottom-portion average position Sd means a position of an in-plane average of the bottom-portion position of each concave portion 11c. It is preferable that the concave-portion bottom-portion average position Sd is obtained by averaging ten or more concave-portion 11c bottoms.

A symbol H as shown in FIG. 1 means an average height (depth) of the concavo-convex structure 11a. In other words, H is the shortest distance between the concave-portion bottom-portion average position Sd and the average position Sh of tops of the convex-portions of the concavo-convex structure 11a. From the viewpoint of effectively extracting the oozing light with the light extraction layer 12, the average height (depth) H preferably ranges from 10 nm to 5000 nm. Further, from the viewpoint of improving extraction efficiency of the oozing light, H is more preferably 50 nm or more. On the other hand, from the viewpoints of improving physical stability of the light extraction layer and improving long-term reliability of the semiconductor light emitting device, the upper limit value is preferably 3000 nm or less, and more preferably 1500 nm or less. Further, from the viewpoint of suppressing reflection of the emitted light within the critical angle, the value is preferably 1000 nm or less, and more preferably 800 nm or less. In addition, from the same effect, it is preferable the average height (depth) in the case of providing the light extraction layer 12 (second light extraction layer 12b) only inside the concave portions 11c meets the above-mentioned range.

In addition, in the average height (depth) H in the case of providing the light extraction layer 12 (first light extraction layer 12a) only on the convex portions 11b, from the viewpoint of effectively extracting the oozing light with the first light extraction layer 12a and from the viewpoint of physical stability of the first light extraction layer 12a, H preferably ranges from 10 nm to 5000 nm. Particularly, from the viewpoint of improving the light diffraction action on the oozing light, H is preferably 30 nm or more. On the other hand, from the viewpoints of improving physical stability of the light extraction layer and improving long-term reliability of the semiconductor light emitting device, the upper limit value is preferably 3000 nm or less, more preferably 1500 nm or less, and more preferably 1000 nm or less. Further, from the viewpoint of suppressing reflection of the emitted light within the critical angle, the value is preferably 800 nm or less. Further, from the viewpoint of further exerting the above-mentioned effects, the value is more preferably 600 nm or less, and most preferably 400 nm or less.

A symbol Scc as shown in FIG. 1 means an average position of interfaces in which the second light extraction layer 12b provided inside the concave portion 11c of the concavo-convex structure 11a contacts the flattened layer 13. The concave-portion internal interface average position Scc means a position of an in-plane average of the interface between the second light extraction layer 12b and the flattened layer 13. It is preferable that concave-portion internal interface average position Scc is obtained by an average of ten or more interfaces.

In addition, in the case of the light extraction product 2 according to the second aspect, the concave-portion internal interface average position Scc as shown in FIG. 3 means an average position of surface (exposed surface) positions of the second light extraction layers 12b provided inside the respective concave portions 11c of the concavo-convex structure 11a. The concave-portion internal interface average position Scc means a position of an in-plane average of the interface between the second light extraction layer 12b and the adhesive layer 13a filled in the concave portion 11c.

When the interface between the second light extraction layer 12b and the flattened layer 13 forms a curve and the curve forms a convex curve downward, the concave-portion internal interface average position Scc is obtained with the lowest position in the vertical direction of the curve of the second light extraction layer 12b. In other words, also when the second light extraction layer 12b partially adheres to the inner wall of the concave portion 11c of the concavo-convex structure 11a, the concave-portion internal interface average position Scc is obtained with the lowest portion of the second light extraction layer 12b (see FIG. 5A). Further, when the curve forms a convex curve upward, the concave-portion internal interface average position Scc is obtained with the highest portion in the vertical direction of the second light extraction layer 12b (see FIG. 5B).

A symbol Lcc as shown in FIG. 1 means the shortest distance between the average position Sh of tops of the convex-portions and the concave-portion internal interface average position Scc. In other words, Lcc means an average value of values each obtained by subtracting a thickness in the vertical direction of the second light extraction layer 12b inside the concave portion 11c from the average height (depth) H of the concavo-convex structure 11a.

The distance Lcc meets 0.0H<Lcc<1.0H. By meeting the range of Lcc<1.0H, it is possible to efficiently extract the oozing light propagated through the flattened layer with the light extraction layer. Further, when the distance Lcc meets Lcc<0.0H, it means that the concave portion 11c is all filled with the second light extraction layer 12b, and that a thin film of the second light extraction layer 12b is formed on the concavo-convex structure 11a. In this case, in extracting the oozing light, not only the use degree of light diffraction significantly decreases, reflection of the emitted light within the critical angle is also increased in the interface between the flattened layer and the light extraction layer 12, and light extraction efficiency is significantly reduced. Therefore, the lower limit value of LCC is preferably 0.0H<Lcc.

From the viewpoint of further exerting the above-mentioned effects, the distance LCC preferably meets the range of 0.0H<Lcc≤0.6H, more preferably meets the range of 0.0H<Lcc≤0.4H, and further preferably meets the range of 0.0H<Lcc≤0.2H. In addition, Lcc may asymptotically approach zero. In addition, also when the light extraction layer 12 (second light extraction layer 12b) is provided only inside the concave portions 11c, it is conceivable that by meeting the above-mentioned range of Lcc, the same effects are produced.

In addition, when the light extraction layer 12 (first light extraction layer 12a) is provided only on the convex portions 11b, it is not possible to provide the second light extraction layer 12b inside the concave portion 11c. Therefore, using the definition of the above-mentioned Lcc, it is possible to express Lcc=1.0H. When the distance Lcc is the average height (depth) H of the concavo-convex structure 11a, the flattened layer 13 is provided to cover the concavo-convex structure 11a and the first light extraction layer 12a on the convex portions 11b of the concavo-convex structure 11a. Also in this case, it is possible to efficiently extract the oozing light with the first light extraction layer 12a on the convex portions 11b of the concavo-convex structure 11a and the concavo-convex structure 11a.

While being dependent on the height of the concavo-convex structure 11a, it is presumed that the principles of improving light extraction efficiency using the light extraction product 1 varies with the range that the distance Lcc meets. As the distance Lcc is deceased, the interface area in which the concavo-convex structure 11a of the concavo-convex structure layer 11 contacts the flattened layer 13 is reduced, and the volume of the concavo-convex structure 11a included inside the flattened layer 13 is reduced. In this case, in terms of the emitted light guided to the inside of the light extraction product 1, since the volume of the concavo-convex structure 11a included inside the flattened layer 13 is of nanoscale and extremely small, by the light averaging action (effective medium approximate), the emitted light is hard to recognize the volume. In other words, it is presumed that the oozing light propagated by the flattened layer 13 and is extracted with the light extraction layer 12. In this case, in the light extraction product 1, it is presumed that the light extraction capability due to the light extraction layer 12 is relatively larger than light extraction capability due to the concavo-convex structure layer 11. As such a mode, it is conceivable that the distance Lcc is substantially in the range of Lcc≤0.2H, and it is conceivable that such a mode is further strengthened when Lcc≤0.1H. In other words, when the distance Lcc meets such a range, it is conceivable that in the light extraction product 1, the light extraction layer 12 almost controls the function of light extraction.

Conversely, as the distance Lcc is increased, the interface area between the concavo-convex structure 11a of the concavo-convex structure layer 11 and the flattened layer 13 is increased, and the volume of the concavo-convex structure 11a included inside the flattened layer 13 is increased. Further, an increase in the distance Lcc means that the distance from the interface between the semiconductor light emitting device and the flattened layer 13 to the second light extraction layer 12b inside the concave portion 11c is increased. The oozing light decreases exponentially with distance in the thickness direction of the light extraction product 1. Accordingly, in this case, it is conceivable that the oozing light is propagated by the flattened layer 13, and is preferentially extracted with the concavo-convex structure 11a and the first light extraction layer 12a.

Further, an increase in the distance Lcc means an increase in the difference between the distance between the interface between the semiconductor light emitting device and the flattened layer 13 and the light extraction layer 12b inside the concave portion 11c and the distance between the interface and the concavo-convex structure 11a. Therefore, it is conceivable those diffraction modes due to the concavo-convex structure 11a and the light extraction layer 12a are significantly different, and that the degree of scattering is improved. As such modes, it is presumed that the distance Lcc is approximately in the range of Lcc≥0.5H. In other words, when the distance Lcc meets such a range, it is conceivable that in the light extraction product 1, the concavo-convex structure layer 11 almost controls the function of light extraction. In addition, approximately in the range of 0.5H≤Lcc≤0.2H, it is presumed that both light extraction due to the light extraction layer 12 and light extraction due to the concavo-convex structure layer 11 develops.

Furthermore, when the distribution of ±25% or less is provided in a distance between the interface position of the second light extraction layer 12b provided inside the concave portion 11c of the concavo-convex structure 11a and the flattened layer 13 and the average position Sh of tops of the convex-portions, it is conceivable that it is possible to remarkably add scattering properties to light extraction due to the light extraction layer 12 with the second refractive index (n2). Since it is possible to make the degree of improvement in extraction due to light scattering properties of the oozing light relatively larger than that due to diffraction, it is possible to reduce the color shift, and it is possible to obtain an emission spectrum from the light emitting device nearer natural light. In other words, glare is reduced. In addition, an average value of distances between the interface position of the second light extraction layer 12b provided inside the concave portion 11c of the concavo-convex structure 11a and the flattened layer 13 and the average position Sh of tops of the convex-portions corresponds to the distance Lcc. Further, in the case of the light extraction product 2, by providing the distribution of ±25% or less in a distance between the surface (exposed) position of the light extraction layer 12b provided inside the concave portion 11c of the concavo-convex structure 11a and the average position Sh of tops of the convex-portions, it is possible to exhibit the same effects as described above.

A symbol Scv as shown in FIG. 1 is a convex-portion upper interface average position, and is a position of an in-plane average of the top surface position of the first light extraction layer 12a provided on the convex portion 11b of the concavo-convex structure 11a. It is preferable that the convex-portion upper interface average position Scv is obtained by an average value of ten or more points.

In addition, in the case of the light extraction product 2 according to the second aspect, a symbol Scv as shown in FIG. 3 means an in-plane average position of the surface (exposed surface) position of the first light extraction layer 12a provided on the top of the convex-portion of the convex portion 11b of the concavo-convex structure 11 (see FIG. 3). The convex-portion upper interface average position Scv means a position of an in-plane average of the interface between the first light extraction layer 12a and the adhesive layer 13a on the convex portion 11b.

Further, when the interface between the first light extraction layer 12a and the flattened layer 13 forms a curve, in both the case where the curve forms a convex curve downward and the case where the curve forms a convex curve upward, the convex-portion upper interface average position Scv is obtained with a portion in which the thickness of the first light extraction layer 12a is the thickest.

A symbol Lcv as shown in FIG. 1 means the shortest distance between the average position Sh of tops of the convex-portions and the convex-portion upper interface average position Scv. In other words, Lcv means an average thickness of the first light extraction layers 12a provided on the convex portions 11b. In the case where the distance Lcv is 0, the flattened layer 13 is provided to cover the concavo-convex structure 11a and the second light extraction layer 12b inside the concave portions 11c of the concavo-convex structure 11a. Also in this case, it is possible to extract the oozing light with the second light extraction layer 12b inside the concave portions 11c of the concavo-convex structure 11a and the concavo-convex structure 11a.

As the upper limit value of the distance Lcv, from the viewpoint of exerting the light extraction effects of both the first light extraction layer 12a provided on the convex portions 11b of the concavo-convex structure 11a and the second light extraction layer 12b inside the concave portions 11c of the concavo-convex structure 11a, the value is preferably 1.5H. From the viewpoint of further exerting the above-mentioned effects, as the distance Lcv, it is preferable that $0.0H < Lcv \leq 1.0H$, it is more preferable that $0.0H < Lcv \leq 0.45H$, and it is the most preferable that $0.0H < Lcv \leq 0.3H$. In addition, when the light extraction layer 12 is provided only inside the concave portions 11c (the second extraction layer 12b is only provided), since the light extraction layer 12 (first extraction layer 12a) on the convex portions 11b is not disposed, using the above-mentioned Lcv, it is possible to express Lcv=0.0H.

In addition, in the case where the light extraction layer 12 has only the first light extraction layer 12a on the convex portions 11b without having the second light extraction layer 12b inside the concave portions 11c of the concavo-convex structure 11a, the oozing light is extracted with the first light extraction layer 12a. In this case, from the viewpoint of extracting the oozing light with the first light extraction layer 12a, it is preferable that the distance Lcv meets 10 nm≤Lcv<5000 nm. Particularly, by being 3000 nm or less, it is possible to improve physical stability of the first light extraction layer, and it is possible to improve long-term reliability of the semiconductor light emitting device. Further, by being 1500 nm or less, it is possible to more improve surface accuracy of the light input surface 1a, and to improve long-term reliability of the semiconductor light emitting device, and therefore, such a range is preferable. Furthermore, from the viewpoint of suppressing reflection of the emitted light within the critical angle, Lcv is preferably 1000 nm or less, more preferably 800 nm or less, and most preferably 600 nm or less. On the other hand, as the lower limit value, from the viewpoint of improving light extraction efficiency with the first light extraction layer, the value is preferably 30 nm or more, more preferably 50 nm or more, and most preferably 80 nm or more.

Further, in the case where the light extraction layer 12 has only the first light extraction layer 12a on the convex portions 11b without having the second light extraction layer 12b inside the concave portions 11c of the concavo-convex structure 11a, from the viewpoint of arrangement accuracy of the flattened layer 13 and propagation properties of the oozing light, it is preferable that the sum (Lcv+H) of the distance Lcv and the average height (depth) H of the concavo-convex structure 11a meets the range of 50 nm to 5000 nm. From the viewpoint of further exerting the above-mentioned effects and from the viewpoint of physical stability of the first light extraction layer 12a, Lcv+H preferably ranges from 100 nm to 3000 nm, more preferably ranges from 100 nm to 1500 nm, and most preferably 100 nm to 800 nm.

When the distribution of ±25% or less is provided in a distance between the interface between the first light extraction layer 12a provided on the convex portion 11b of the concavo-convex structure 11a and the flattened layer 13 and the average position Sh of tops of the convex-portions, it is conceivable that it is possible to remarkably add scattering properties to light extraction due to the first light extraction layer 12a. Further, it is possible to make the degree of improvement in extraction due to light scattering properties of the oozing light relatively larger than that due to diffraction. Therefore, it is possible to reduce the color shift, it is possible to obtain an emission spectrum from the light emitting device nearer natural light, and glare is reduced.

An average value of distances between the interface between the first light extraction layer 12a provided on the convex portion 11b of the concavo-convex structure 11a and the flattened layer 13 and the average position Sh of tops of the convex-portions corresponds to the distance Lcv. In addition, in the case of the light extraction product 2, when the distribution of ±25% or less is provided in a distance between the surface (exposed) position of the first light extraction layer 12a provided on the convex portion 11b of the concavo-convex structure 11a and the average position Sh of tops of the convex-portions, it is possible to exhibit the same effects as described above, being preferable.

In addition, the second light extraction layer 12b (light extraction layer 12 having a thickness obtained by subtracting the distance Lcc from the average height (depth) H) inside the concave portion 11c and the first light extraction layer 12a (light extraction layer 12 having a thickness of the finite distance Lcv) on the convex portion 11b may be continuous. For example, in the light extraction layer 12, the interface between the concavo-convex structure layer 11 and the flattened layer 13 does not exist, and the flattened layer 13 may be provided to cover only the light extraction layer 12. Also in such a case that the second light extraction layer 12b having a thickness obtained by subtracting the distance Lcc from the average height (depth) H and the first light extraction layer 12a having a thickness of the finite distance Lcv are continuous, it is assumed that the definitions of the distance Lcv and distance Lcc and the ranges met by the distances meet the above-mentioned ranges. In such a case that the first light extraction layer and the second light extraction layer are continuous, from the viewpoint of suppressing reflection of the emitted light within the critical angle, the distance Lcc is preferably 0.1H or more, more preferably 0.2H or more, and most preferably 0.3H or more.

A symbol Lor as shown in FIG. 1 is an average value of distances between the concave-portion internal interface average position Scc and the upper surface (light input surface 1a) of the flattened layer 13. It is preferable that the average Lor is obtained from an average value of ten or more points. In addition, in the case where the light extraction layer 12 (first light extraction layer 12a) is provided only on the convex portions 11b (FIG. 2A), Lor is an average value of distances between the convex-portion upper interface average position Scv and the upper surface (light input surface 1a) of the flattened layer 13. In addition, in the case where the light extraction layer (second light extraction layer 12b) is provided only inside the concave portions 11c (FIG. 2B), Lor is the average value of distances between the concave-portion internal interface average position Scc and the upper surface (light input surface 1a) of the flattened layer 13.

In addition, in the light extraction product 2 according to the second aspect, the light extraction layer 12 of the light extraction product 2 is disposed on the surface of the transparent conductive layer surface of the semiconductor light emitting device via the adhesive layer 13a. Therefore, in the state of the light extraction product 2 disposed in the semiconductor light emitting device, Lor is defined as an average value of distances between the concave-portion internal interface average position Scc and the surface of the transparent conductive layer surface (upper surface of the adhesive layer 13a). In addition, in the light extraction product 2 in which the light extraction layer 12 (first light extraction layer 12a) is provided only on the convex portions 11b, in the state of the light extract ion product 2 disposed in the semiconductor light emitting device, Lor is defined as an average value of distances between the convex-portion upper interface average position Scv and the upper surface of the adhesive layer 13a. In other words, in the case of using the light extraction product 2, it is preferable to control the thickness of the adhesive layer 13a so as to meet the range of Lor in the case of the light extraction product 1 as described below.

From the viewpoint of effectively propagating the oozing light to the light extraction layer 12 and concavo-convex structure 11a, the average distance Lor is preferably in the range of (Lcc+Lcv)≤Lor≤800 nm. In addition, in the case of providing the light extraction layer 12 only in the concave portions 11c (the case of having only the second light extraction layer 12b: FIG. 2B), by meeting Lcc≤Lor≤800 nm, it is possible to obtain the same effects.

From the viewpoint of the above-mentioned effects, the lower limit value of the average distance Lor is preferably (Lcc+Lcv) or more. From the viewpoints of handling of the light extraction product, easiness in applying the light extraction product 1 to the semiconductor light emitting device, reliability of the semiconductor light emitting device and the like, the value is preferably 1.1(Lcv+Lcc) or more, more preferably 1.2(Lcv+Lcc) or more, and most preferably 1.3 (Lcv+Lcc) or more. On the other hand, from the viewpoint of propagation properties of the oozing light, Lor is more preferably 500 nm or less. In addition, in the case of providing the light extraction layer (second light extraction layer 12b) only inside the concave portions 11c of the concavo-convex structure 11a (FIG. 2B), Lcv=0 is substituted in the above-mentioned description.

In addition, in the case where the light extraction layer 12 is provided only on the convex portions 11b (the case of only providing the first light extraction layer 12a: FIG. 2A), when Lor defined as the average value of distances between the convex-portion upper interface average position Scv and the upper surface of the flattened layer 13 ranges from 10 nm to 800 nm, it is possible to effectively extract the oozing light with the light extraction layer 12 (12a). From the viewpoint of further exerting the above-mentioned effect, Lor in the case of providing only the first light extraction layer 12a more preferably ranges from 30 nm to 500 nm, and most preferably ranges from 30 nm to 300 nm.

When the upper limit value of the average distance Lor is 800 nm or less, it is possible to effectively propagate the oozing light to the light extraction layer 12 and concavo-convex structure layer 11. It is possible to design the upper limit value as appropriate from light emitted from the light emitting layer of the semiconductor light emitting device. For example, when the upper limit value is a value of $0.8\lambda$ or less with respect to the emitted light with a wavelength $\lambda$, it is possible to effectively propagate the oozing light to the light extraction layer 12. The upper limit value is more preferably $0.65\lambda$ or less, and further preferably $0.55\lambda$ or less. When a plurality of wavelength components is included in the emitted light from the light emitting device, it is possible to design by setting the shortest wavelength or average wavelength of the light to extract as $\lambda$. From the above-mentioned viewpoint, in order to suppress attenuation when the oozing light propagates inside the flattened layer 13, approximately Lor≤500 nm is preferable, Lor≤300 nm is more preferable, and Lor≤150 nm is the most preferable. As the average distance Lor is shorter in the above-mentioned range, propagation properties are improved, and therefore, such a distance is preferable. For example, in the case of an organic EL device having emission wavelengths of RGB, the wavelength of B (blue light) with the shortest wavelength may be considered the above-mentioned $\lambda$, or an average value of wavelengths of R (red light), G (green light) and B (blue light) may be set as $\lambda$. In addition, the oozing light from the interface decreases exponentially with distance in the thickness direction of the light extraction product. In other words, the emitted light with a shorter wavelength attenuates faster. Therefore, as described above, in the case of a light emitting device having emission wavelengths of RGB, it is preferable to design the average distance Lor by setting the wavelength of blue light with the shortest wavelength as $\lambda$.

Figure 4A:
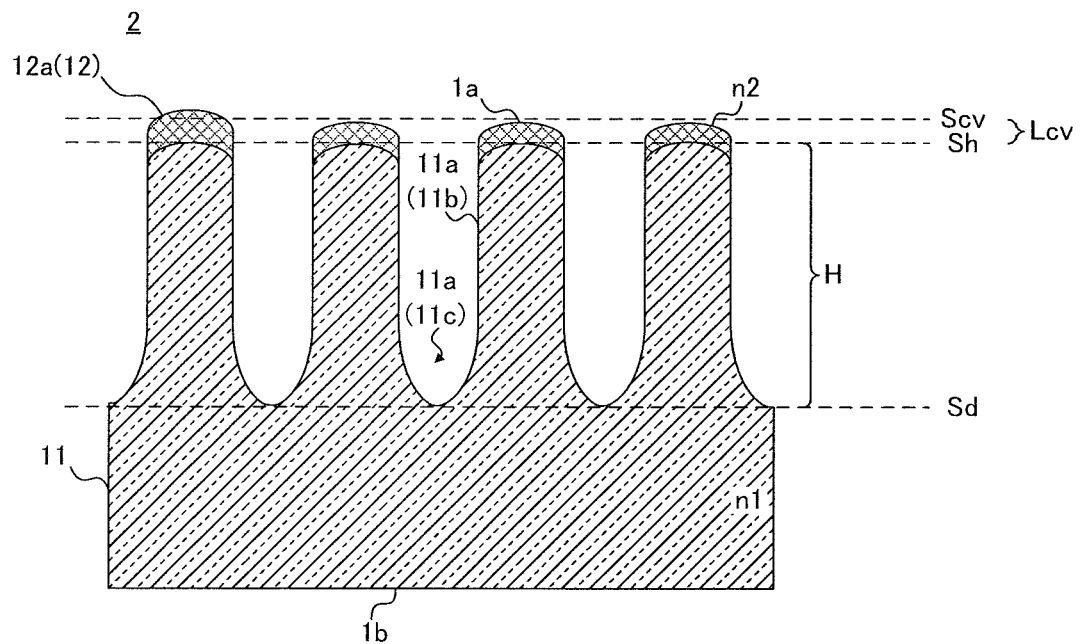
FIG. 4 contains cross-sectional schematic diagrams showing another example of the light extraction product according to the second aspect.
Figure 4B:
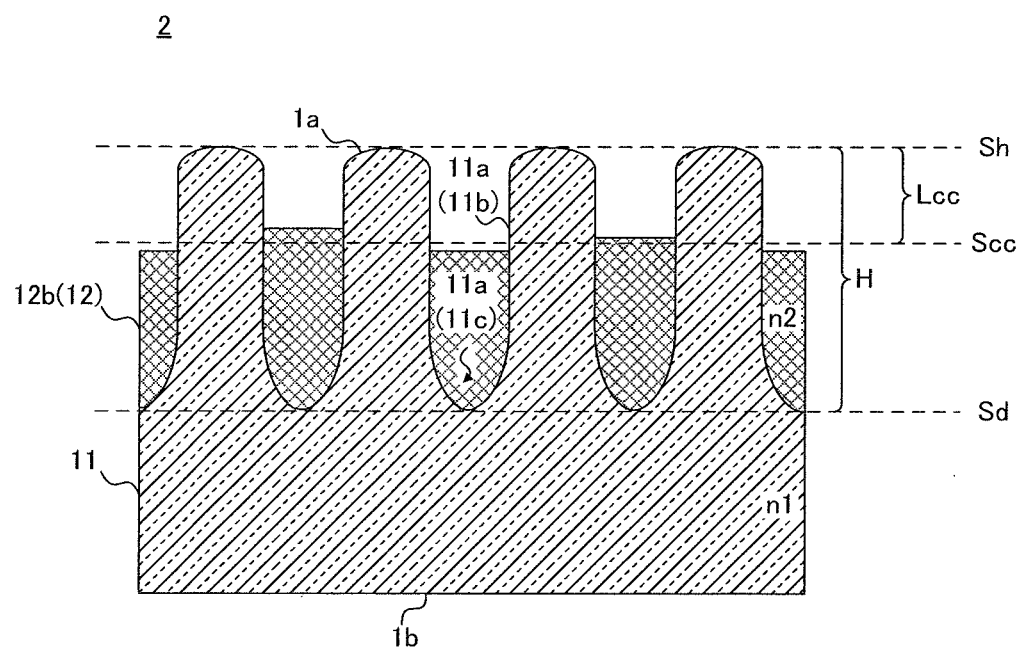

FIG. 4 contains cross-sectional schematic diagrams showing another example of the light extraction product according to the second aspect. In the light extraction product 2 according to the above-mentioned second aspect, in the case where the light extraction layer 12 is provided only on the convex portions 11b of the concavo-convex structure 11a (only the first light extraction layer 12a is provided) (FIG. 4A), the distance Lcv meets the relationship of following equation (1), the convex-portion average height H meets the relationship of following equation (2), and the sum (Lcv+H) of the distance Lcv and the convex-portion average height H meets following equation (4). By this configuration, it is possible to effectively propagate the oozing light to the light extraction layer 12. Since the concavo-convex structure layer 11, light extraction layer 12 and flattened layer 13 meet the above-mentioned relationship equations of refractive indexes, it is possible to effectively extract the propagated oozing light, and it is thereby possible to significantly improve light extraction efficiency.

$$10 \text{ nm} \leq Lcv \leq 5000 \text{ nm} \qquad \text{Eq. (1)}$$

$$10 \text{ nm} \leq H \leq 5000 \text{ nm} \qquad \text{Eq. (2)}$$

$$50 \text{ nm} \leq Lcv+H \leq 6000 \text{ nm} \qquad \text{Eq. (4)}$$

Further, in the light extraction product 2 according to the above-mentioned second aspect, in the case where the light extraction layer 12 is provided only inside the concave portions 11c of the concavo-convex structure 11a (only the second light extraction layer 12b is provided) (FIG. 4b), the distance Lcc and the convex-portion average height H meet the relationship of following equation (5). By this configuration, it is possible to effectively propagate the oozing light oozing from the interface between the light emitting layer surface (for example, transparent conductive layer) of the semiconductor light emitting device and the adhesive layer 13a to the light extraction layer 12 and concavo-convex structure layer 11. Since the concavo-convex structure layer 11, light extraction layer 12 and adhesive layer 13a meet the above-mentioned relationship equations of refractive indexes, it is possible to effectively extract the propagated oozing light, and it is thereby possible to significantly improve light extraction efficiency.

$$0.0H < Lcc < 1.0H \quad \text{Eq. (5)}$$

Furthermore, in the light extraction product 2 according to the above-mentioned second aspect, in the case where the light extraction layer 12 is provided both on the convex portions 11b of the concavo-convex structure 11a and inside the concave portions 11c (the first light extraction layer 12a and second light extraction layer 12b are provided) (FIG. 3), in the concavo-convex structure 11a, the distance Lcc and the convex-portion average height H meet following equation (5), and the distance Lcc and the convex-portion average height H meet following equation (6). By this configuration, it is possible to effectively propagate the oozing light to the light extraction layer 12. Since the concavo-convex structure layer, light extraction layer and flattened layer meet the above-mentioned relationship equations of refractive indexes, it is possible to effectively extract the propagated oozing light, and it is thereby possible to significantly improve light extraction efficiency.

$$0.0H < Lcc < 1.0H \quad \text{Eq. (5)}$$

$$0.0H < Lcv \leq 1.5H \quad \text{Eq. (6)}$$

Still furthermore, in the light extraction product 1 according to the above-mentioned first aspect, in the case where the light extraction layer 12 is provided only on the convex portions 11b of the concavo-convex structure 11a (only the first light extraction layer 12a is provided) (FIG. 2A), it is preferable that the above-mentioned first refractive index (n1) to the third refractive index (n3) meet above-mentioned equations (7) to (9), and that the average distance Lor meets the relationship of following equation (10). By this configuration, it is possible to effectively propagate the oozing light to the light extraction layer 12 and the concavo-convex structure 11a. Since the concavo-convex structure layer 11, light extraction layer 12 and flattened layer 13 meet the above-mentioned relationship equations of refractive indexes, it is possible to effectively extract the propagated oozing light, the distance between the first light extraction layer 12a and the surface of the flattened layer 13 is thereby in a moderate range, propagation properties of the oozing light are improved, and light extraction efficiency is further improved.

$$0 \text{ nm} \leq Lor \leq 800 \text{ nm} \quad \text{Eq. (10)}$$

Moreover, in the light extraction product 1 according to the above-mentioned first aspect, in the case where the light extraction layer 12 is provided only inside the concave portions 11c of the concavo-convex structure 11a (only the second light extraction layer 12b is provided) (FIG. 2B), it is preferable that the above-mentioned first refractive index (n1) to the third refractive index (n3) meet above-mentioned equations (7) to (9), and that the average distance Lor and distance Lcc meet the relationship of following equation (11). By this configuration, it is possible to effectively propagate the oozing light to the light extraction layer 12 and the concavo-convex structure layer 11. Since the concavo-convex structure layer 11, light extraction layer 12 and flattened layer 13 meet the above-mentioned relationship equations of refractive indexes, it is possible to effectively extract the propagated oozing light, the distance between the second light extraction layer 12b and the surface of the flattened layer 13 is thereby in a moderate range, propagation properties of the oozing light are improved, and light extraction efficiency is further improved.

$$Lcc \leq Lor \leq 800 \text{ nm} \quad \text{Eq. (11)}$$

Further, in the light extraction product 1 according to the above-mentioned first aspect, in the case where the light extraction layer 12 is provided both on the convex portions 11b of the concavo-convex structure 11a and inside the concave portions 11c (the first light extraction layer 12a and second light extraction layer 12b are provided) (FIG. 1), it is preferable that the above-mentioned first refractive index (n1) to the third refractive index (n3) meet above-mentioned equations (7) to (9), and that in the concavo-convex structure 11a, the average distance Lor, distance Lcc and distance Lcv meet the relationship of following equation (12). By this configuration, it is possible to effectively propagate the oozing light to the light extraction layer 12 and the concavo-convex structure layer 11. Since the concavo-convex structure layer 11, light extraction layer 12 and flattened layer 13 meet the above-mentioned relationship equations of refractive indexes, it is possible to effectively extract the propagated oozing light, the distance between the first light extraction layer 12a and the surface of the flattened layer 13 is thereby in a moderate range, the distance between the second light extraction layer 12b and the surface of the flattened layer 13 is also in a moderate range, propagation properties of the oozing light are improved, and light extraction efficiency is further improved.

$$(Lcc + Lcv) \leq Lor \leq 800 \text{ nm} \quad \text{Eq. (12)}$$

In the light extraction product 1 according to the above-mentioned first aspect and the light extraction product 2 according to the second aspect, since the concavo-convex structure layer 11 and the light extraction layer 12 have substantially different refractive indexes, the diffraction mode due to the light extraction layer 12 is different from the diffraction mode due to the concavo-convex structure layer 11. As a result, it is presumed that light output characteristics to the predetermined angle specific to diffracted light are disturbed, and that light scattering properties thereby develop. In other words, it is conceivable that the light extraction layer 12 and concavo-convex structure layer 11 develop such a function that as if two diffraction point groups causing different light diffraction phenomena overlap.

Further, in the case of having both the first light extraction layer 12a and second light extraction layer 12b, it is possible to extract the oozing light by mutually different diffraction modes due to the first light extraction layer 12a, second light extraction layer 12b and concavo-convex structure layer 11. Therefore, it is presumed that such a function develops that as if three diffraction point groups causing different light diffraction phenomena overlap, and that strong light scattering properties are developed.

According to the above-mentioned principles, the oozing light is effectively propagated to the concavo-convex structure 11a and light extraction layer 12 by the flattened layer 13 (or adhesive layer 13a), it is possible to extract the propagated oozing light by light diffraction due to the light extraction layer 12 and concavo-convex structure layer 11, and light extraction efficiency is thereby significantly improved. Further, also in the case of controlling disturbance of the shape and arrangement of the concavo-convex structure, the above-mentioned principles hold. In other words, on a microscopic scale such as one by one of the concavo-convex structure, the oozing light is extracted by light diffraction corresponding to the arrangement of the concavo-convex structure 11a, and since diffraction modes are different in extracting, light scattering properties are exhibited on a macroscopic scale of several tens of micrometers or more. Accordingly, it is conceivable that the color shift specific to diffracted light is reduced, and that it is possible to effectively extract as light nearer natural light with less glare from the semiconductor light emitting device.

In the light extraction product 1 according to the first aspect, the concavo-convex structure layer 11 may have a gradient of the refractive index inside the concavo-convex structure layer 11. The gradient of the refractive index herein is a gradient in the thickness direction of the light extraction product 1. The gradient of the refractive index may decrease or increase from the surface on the flattened layer 13 side of the light extraction product 1 toward the surface of the light output surface 1b of the concavo-convex structure layer 11. Particularly, when the concavo-convex structure layer 11 has the gradient of the refractive index such that the refractive index decreases from the surface on the flattened layer 13 side of the light extraction product 1 to the light output surface 1b side of the concavo-convex structure layer 11, the rate of transmission light transmitting to the light output surface 1b side of the concavo-convex structure layer 11 is increased relative to the emitted light guided inside the light extraction product 1.

It is possible to form the gradient of the refractive index by a concentration gradient due to fine particles or fillers, and a gradient using a difference in the density among two or more resins. In addition, the gradient of the refractive index is defined by being formed by a layer having a refractive index different from the first refractive index (n1) of the size smaller than a half the wavelength of the emitted light. Therefore, when the wavelength of the emitted light is described as $\lambda$, it is defined that the size of the above-mentioned fine particles or fillers and the density unevenness size of two or more resins are smaller than $\lambda/2$.

Further, the concavo-convex structure layer 11 may contain a phase having a refractive index that is substantially different from the first refractive index (n1) of a half ($\lambda/2$) the wavelength of the emitted light or more and 800 nm or less. By containing such a phase, it is possible to scatter the emitted light guided to the inside of the light extraction product 1 inside the concavo-convex structure 11a. By this means, it is possible to reduce the color shift, and make a semiconductor light emitting device that emits light nearer natural light. As such a layer, examples thereof are layers provided with fine particles and/or fillers.

In the light extraction product 1 according to the first aspect, the flattened layer 13 may have a gradient of the refractive index inside the flattened layer 13. The gradient of the refractive index herein is a gradient in the thickness direction of the light extraction product 1. The gradient of the refractive index may decrease or increase from the light input surface 13a side of the flattened layer 13 to the concavo-convex structure layer 11. Particularly, when the flattened layer 13 has the concentration gradient that decreases from the light input surface 13a side to the concavo-convex structure layer 11 side, it is possible to reduce a total reflection light quantity in the interface between the flattened layer 13 and the transparent conductive layer surface of the semiconductor light emitting device. Further, it is made easy to set a large difference between the second refractive index (n2) of the light extraction layer 12 and the third refractive index (n3) of the flattened layer 13 near the interface between the light extraction layer 12 and the flattened layer 13. Therefore, heterogeneity of the light extraction layer 12 is increased in terms of the light guided inside the light extraction product 1, and the extraction capability due to the light extraction layer 12 of the oozing light is improved.

It is possible to form the gradient of the refractive index by a concentration gradient due to fine particles or fillers, a gradient using a difference in the density among two or more resins and the like. In addition, the gradient of the refractive index is defined by being formed by a layer having a refractive index different from the third refractive index (n3) of the size smaller than a half the wavelength of the emitted light. Therefore, when the wavelength of the emitted light is described as $\lambda$, it is defined that the size of the above-mentioned fine particles or fillers and the density unevenness size of two or more resins are smaller than $\lambda/2$.

Further, the flattened layer 13 may contain a phase having a refractive index that is substantially different from the third refractive index (n3) of a half ($\lambda/2$) the wavelength of the emitted light or more and 800 nm or less. By containing such a phase, it is possible to more improve extraction of the oozing light and to provide the emitted light guided inside the light extraction product 1 with scattering properties, and it is thereby possible to reduce the color shift, and obtain a spectrum nearer natural light. As such a layer, examples thereof are phases provided with fine particles and/or fillers. In this case, the refractive index that is substantially different from the third refractive index (n3) of a half ($\lambda/2$) the wavelength of the emitted light or more and 800 nm or less is preferably larger than the refractive index (n3) by 0.1 or more, more preferably larger by 0.2 or more, and most preferably larger by 0.3 or more.

In the light extraction product 1 according to the first aspect, another concavo-convex structure may be provided on the light output surface 1b of the concavo-convex structure layer 11. By providing another concavo-convex structure, it is possible to develop optical phenomena corresponding to the size of another concavo-convex structure and the wavelength of light to extract. When the average pitch of another concavo-convex structure is several tens of micrometers or more, light scattering properties are exhibited, light diffraction properties are exhibited by being equal to the wavelength or more, and effective medium approximate properties are exhibited by being less than the wavelength. Particularly, in the light extraction product 1 according to the first aspect, a concavo-convex structure of nanoscale may be provided on the light output surface 1b of the concavo-convex structure layer 11. When the size of the concavo-convex structure is a nanoscale, transmittance of the emitted light is improved in the light output surface 1b of the concavo-convex structure layer 11, and it is possible to reduce a reflection of outside light. As the concavo-convex structure of nanoscale, a concavo-convex structure may be provided on the light output surface 1b of the concavo-convex structure layer 11, or a concavo-convex structure layer may be provided on the light output surface 1b separately.

Further, the average pitch of the concavo-convex structure newly provided on the light output surface 1b of the concavo-convex structure layer 11 preferably ranges from 100 nm to 800 nm. Particularly, when the average pitch is 300 nm or less, it is possible to reduce a reflection of light when a user uses the semiconductor light emitting device provided with the light extraction product 1.

The structure shape of the concavo-convex structure newly provided on the concavo-convex structure layer 11 is not limited particularly, but reflectance of light with respect to the surface of the concavo-convex structure is preferably 0.15% or less, and more preferably 0.1% or less. As the concavo-convex structure to obtain such optical performance, for example, there is a concavo-convex structure in which a plurality of convex portions is arranged in a hexagonal arrangement, the average pitch of the convex portions is about 200 nm, the diameter of the bottom of the convex-portion is about 180 nm, and the aspect ratio (height of the convex portion/diameter of bottom of the convex-portion) ranges from about 0.8 to 2.5.

Further, a concavo-convex structure of microscale (not shown) may be provided. Particularly, when the size of the concavo-convex structure is microscale, scattering properties of emitted light to output are improved, and it is possible to obtain output light nearer natural light. The concavo-convex structure of microscale may be provided on the light output surface 1b, or may be provided as a concavo-convex structure on the light output surface 1b separately. Particularly, it is preferable that the average pitch of the concavo-convex structure ranges from 1 μm to 50 μm. Particularly, when the average pitch is 2 μm or more, it is possible to more suppress glare when a user uses (sees) the light emitting device provided with the light extraction product, and therefore, such a range is preferable.

In addition, in the case of separately providing a concavo-convex structure layer on the light output surface 1b of the concavo-convex structure layer 11, from the viewpoint of suppressing reflection of the emitted light in the interface between the light output surface 1b of the concavo-convex structure layer 11 and the newly provided concavo-convex structure layer and reflection of light from the outside, it is preferable that the refractive index of the newly provided concavo-convex structure layer is substantially equal to the first refractive index (n1).

Further, in the shape and arrangement of the newly provided concavo-convex structure, it is possible to use the shape and arrangement of the concavo-convex structure 11a of the concavo-convex structure layer 11 specifically described later, arrangement LP, arrangement α and distribution DF thereof described later in the range in which the average pitches thereof meet the above-mentioned ranges. Further, as a substitute for the newly provided concavo-convex structure, an antireflection layer comprised of a single layer or multilayer may be formed. Particularly, it is effective when a difference is large between the first refractive index (n1) of the concavo-convex structure layer 11 and the refractive index of air, or a difference is large (for example, 0.1 or more) between the first refractive index (n1) of the concavo-convex structure layer 11 and the refractive index of a sealant used in the semiconductor light emitting device. By providing the above-mentioned concavo-convex structure or antireflection layer, also when the above-mentioned difference in the refractive index is 0.5 or more, or 0.7 or more and thus extremely large, it is possible to increase intensity of transmission light extracted from the light extraction product 1 and to suppress reflection of outside light.

FIG. 6 is a cross-sectional schematic diagram showing another example of the light extraction product according to the first aspect. In the light extraction product 1 according to the first aspect, it is preferable to provide a substrate 14 having a fourth refractive index (n4) on the light output surface 1b of the concavo-convex structure layer 11. By providing the substrate 14, throughput is improved in manufacturing the light extraction product 1, and easiness is also improved in applying the light extraction product 1 to the semiconductor light emitting device. Further, by using a substrate having functions such as gas barrier properties and water vapor barrier properties, long-term reliability of the semiconductor light emitting device is improved. Herein, as the substrate 14, it is preferable to use a substrate such that the fourth refractive index (n4) is substantially equal or equal to the first refractive index (n1) of the concavo-convex structure layer 11. By providing the substrate 14 meeting such a refractive-index relationship, the extracted oozing light and emitted light within the critical angle do not undergo the effect of reflection in the interface between the concavo-convex structure layer 11 and the substrate 14, and is effectively extracted from the light output surface side of the substrate 14 of the light extraction product 1.

Further, from the same effects as described above, another concavo-convex structure or a single-layer (multilayer) anti-reflection film provided on the light output surface 1b as described above may be provided on the light output surface of the substrate 14.

The light extraction layer 12 of the light extraction product 1 according to the first aspect may be disposed only inside the concave portions 11c (FIG. 2B), disposed in the concave portions 11c and on the convex portions 11b (FIG. 1) or disposed only on the convex portions (FIG. 2A). By the configuration (FIG. 1) in which the light extraction layer 12 is provided in inner portions of the concave portions 11c and on upper portions of the convex portions 11b, since the distribution occurs in the distance between the interface between the flattened layer 13 and the transparent conductive layer surface and the light extraction layer 12, it is conceivable that it is possible to extract oozing light, which oozes from the interface in the emitted light forming the waveguide mode in the interface between the transparent conductive layer surface and the flattened layer 13, by light diffraction due to the first light extraction layer 12a on the convex portions 11b, second light extraction layer 12b inside the concave portions 11c and concavo-convex structure layer 11a. In this case, diffraction modes are mutually different, and it is conceivable that such a function develops that as if three diffraction point groups causing different light diffraction phenomena overlap, and that light scattering properties are thereby developed. Further, since the effect of light extraction using light scattering properties is great, it is conceivable that light extraction efficiency is more improved. Furthermore, in the case of controlling disturbance of the shape and arrangement of the concavo-convex structure, it is possible to strengthen the effect of light scattering properties corresponding to the disturbance. Therefore, it is conceivable that it is possible to suppress glare when a user of the semiconductor light emitting device visually identifies the device. Further, it is possible to manufacture the light extraction product by continuous process, and throughput is improved in manufacturing.

In the case of the configuration (FIG. 2B) in which the second light extraction layer 12b is provided only inside the concave portions 11c, since the distance between the interface between the flattened layer 13 and the transparent conductive layer surface and the light extraction layer 12 is different from the distance between the interface between the flattened layer 13 and the light emitting layer and the concavo-convex structure layer 11, it is possible to extract the oozing light by light diffraction due to the second light extraction layer 12b inside the concave portions 11c and concavo-convex structure 11a. In this case, since the second light extraction layer 12b and concavo-convex structure layer 11 have substantially different refractive indexes, diffraction modes are mutually different, and it is conceivable that such a function develops that as if two diffraction point groups causing different light diffraction phenomena overlap, and that light scattering properties are thereby developed. Further, since the effect of light extraction using light scattering properties is great, it is conceivable that light extraction efficiency is more improved. Furthermore, in the case of controlling disturbance of the shape and arrangement of the concavo-convex structure, it is possible to strengthen the effect of light scattering properties corresponding to the disturbance. Therefore, it is conceivable that it is possible to suppress glare when a user of the semiconductor light emitting device visually identifies the device. Further, in the case of the configuration where the second light extraction layer 12b is provided only inside the concave portions 11c, since the light extraction layer 12 is supported by the concavo-convex structure layer 11 on the periphery thereof, physical stability is improved.

In the case where the first light extraction layer 12a is provided only on the convex portions 11b (FIG. 2A), it is made easy to decrease the distance between the interface between the flattened layer 13 and the transparent conductive layer surface and the light extraction layer 12. Since the oozing light attenuates exponentially with distance in the thickness direction of the semiconductor light emitting device, by decreasing the distance between the interface between the flattened layer 13 and the light emitting layer and the light extraction layer 12, it is conceivable that it is possible to effectively extract the oozing light which oozes from the interface in the emitted light forming the waveguide mode in the interface between the transparent conductive layer surface and the flattened layer 13. Further, it is made easy to manufacture the light extraction product by continuous process, and throughput is improved in manufacturing.

The configuration of the concavo-convex structure 11a of the concavo-convex structure layer 11 will specifically be described next. The concavo-convex structure 11a is not limited in the arrangement and shape particularly, as long as the concavo-convex structure 11a is in the shape of dots, in the shape of holes, in the shape of palisades or in the shape of a lattice, and it is possible to select as appropriate corresponding to an emission spectrum of a semiconductor light emitting device and a usage method of a semiconductor light emitting device. As such a concavo-convex structure 11a, there are first to fourth concavo-convex structures shown in Embodiments 1 to 4 as described below. By the first concavo-convex structure and second concavo-convex structure, or the third concavo-convex structure and fourth concavo-convex structure, it is possible to effectively add scattering properties to the emitted light oozing from the interface between the light emitting layer surface of the semiconductor light emitting device and the flattened layer of the light extraction product due to the light extraction layer 12 and the concavo-convex structure layer 11 to extract.

Embodiment 1

Figure 7:
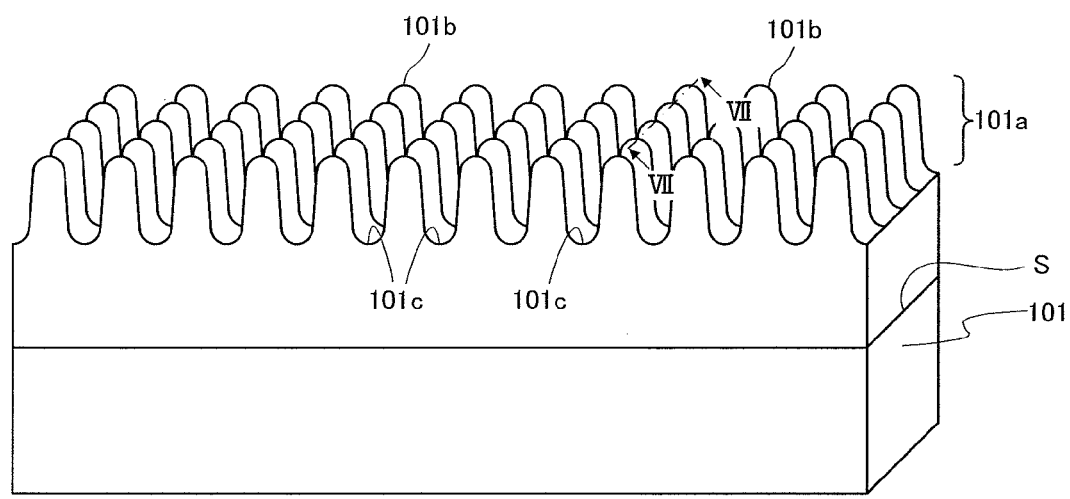
FIG. 7 is a perspective schematic diagram illustrating a first concavo-convex structure according to Embodiment 1.
Figure 8:
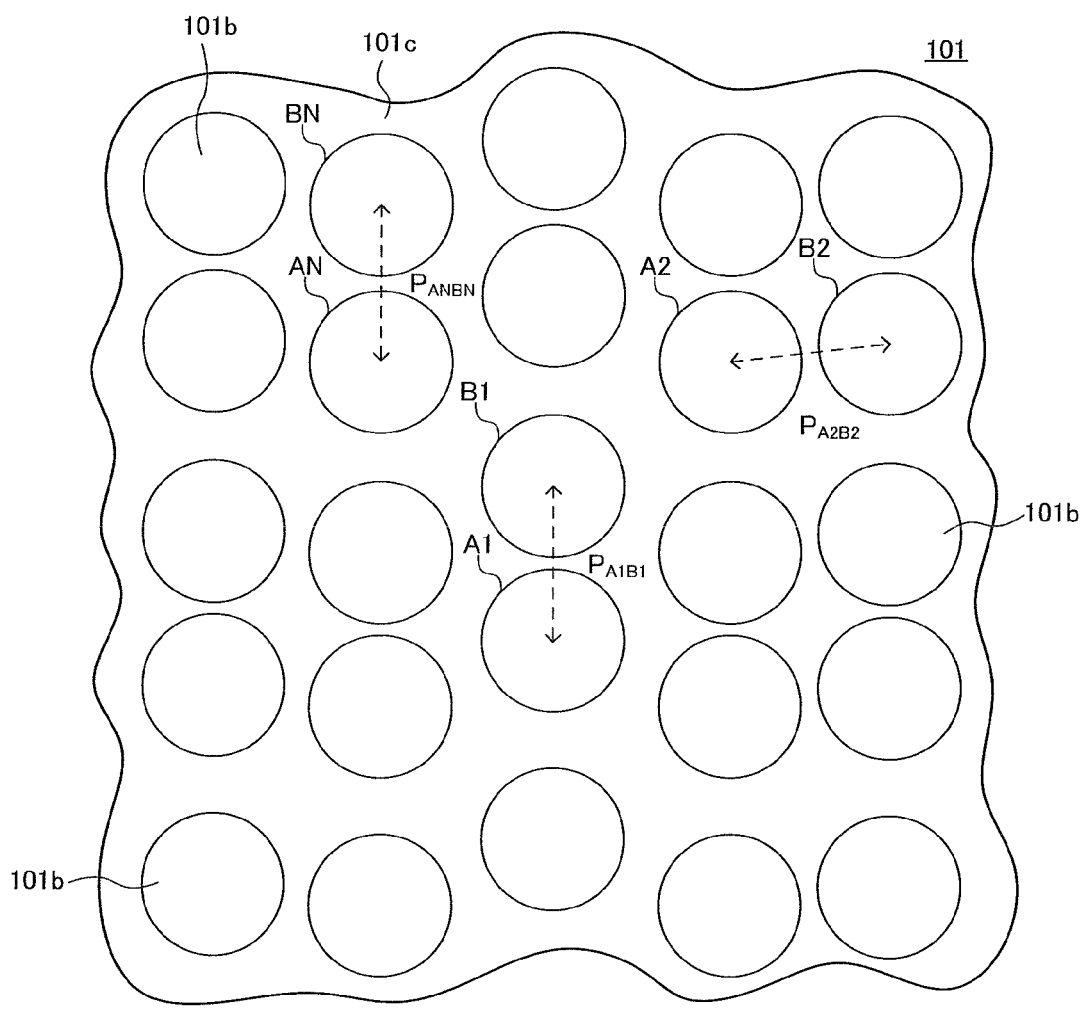
FIG. 8 is a top schematic diagram illustrating the first concavo-convex structure according to Embodiment 1.

FIGS. 7 and 8 are schematic diagrams illustrating the first concavo-convex structure according to Embodiment 1. FIG. 7 is a perspective diagram illustrating a concavo-convex structure layer 101, and FIG. 8 is a top diagram of the concavo-convex structure layer shown in FIG. 7.

As shown in FIG. 7, a first concavo-convex structure 101a includes a plurality of independent convex portions 101b protruding upward in the perpendicular direction to one main surface S of the concavo-convex structure layer 101. The plurality of convex portions 101b are disposed at predetermined intervals. Portions between mutually adjacent convex portions 101b are continuously connected by a concave portion 101c dented downward in the perpendicular direction to one main surface S of the concavo-convex structure layer 101.

In the first concavo-convex structure layer 101a, the shape of the plurality of convex portions 101b is a pillar-shaped body (cone-shaped body), and the concave portion 101c between the convex portions 101b is in a continuous state. In other words, in the light extraction product 1 according to the first aspect, in the case where the concavo-convex structure layer 101 has the concavo-convex structure 101a, the second light extraction layer 12b inside the concave portion 101c forms a continuous thin film. Then, the thin film having the second refractive index (n2) is the configuration being provided inside a plurality of concave portions (holes) 101c having the first refractive index (n1).

On the other hand, the first light extraction layer 12a on the convex portions 101b forms a plurality of mutually independent dots. Then, the plurality of mutually independent dots having the second refractive index (n2) is of structure that the periphery except the surface contacting the convex portions 101b is surrounded by the flattened layer 13 having the third refractive index (n3).

As the shape of the convex portion 101b, examples thereof are a circular cone, cone-shaped body with the circle of the bottom distorted, cylinder, triangular pyramid, triangular prism, quadrangular pyramid, quadrangular prism, polygonal pyramid with a corner of the bottom rounded, polygonal prism with a corner of the bottom rounded, polygonal pyramid, polygonal prism, shapes with the side surface thereof bent upward in the convex shape or downward in the convex shape, the shape of a ring, the shape of a double ring and the like.

As the average pitch of the plurality of convex portions 101b, from the viewpoints of improving extraction efficiency of the oozing light from the semiconductor light emitting device, and suppressing reflection of the emitted light within the critical angle, and from the viewpoints of improving flatness of the surface (light input surface 1a) of the flattened layer and improving long-term reliability of the semiconductor light emitting device, the average pitch preferably ranges from 50 nm to 5000 nm. Particularly, from the viewpoints of extracting the oozing light by light diffraction and improving light extraction efficiency, the pitch is preferably 100 nm or more, more preferably 150 nm or more, and most preferably 200 nm or more. On the other hand, from the viewpoint of suppressing reflection of the emitted light within the critical angle, the upper limit value is preferably 3000 nm or less, and more preferably 1500 nm or less. Further, from the viewpoints of improving surface accuracy of the light input surface 1a and improving long-term reliability of the semiconductor light emitting device, the value is preferably 1000 nm or less, and more preferably 800 nm or less.

Herein, the average pitch of the plurality of convex portions 101b is defined as described below. The pitch is an inter-center distance between the center of some convex portion and the center of another convex portion closest to the convex portion. As shown in FIG. 8, a convex portion B1 closest to some convex portion A1 is selected, and a distance $P_{A1B1}$ between the center of the convex portion A1 and the center of the convex portion B1 is defined as the pitch P. However, as shown in FIG. 8, when the plurality of convex portions 101b is disposed irregularly, and the pitch varies with selected convex portions, the pitch $P_{A1B1}$, pitch $P_{A2B2}$ to pitch $P_{ANBN}$ between selected respective convex portion A1, A2 . . . AN and adjacent convex portion B1, B2 . . . BN are respectively measured. Then, the arithmetical mean value of the pitches is defined as the average pitch P of the plurality of convex portions 101*b*. In other words, $(P_{A1B1}+P_{A2B2}+\ldots+P_{ANBN})/N=P$ is defined. In addition, it is preferable that the number N of convex portions to select in obtaining the above-mentioned arithmetical mean value is 10 or more. In addition, as a structure arrangement (pattern) of the convex portions 101*b* of the first concavo-convex structure 101*a*, it is also possible to use any one of an arrangement LP, arrangement α and distribution DF described later.

Since the concavo-convex structure 101*a* is in the shape of dots, it is possible to improve long-term reliability of the semiconductor light emitting device. Also in the case of providing the flattened layer on the concavo-convex structure 101*a* and in the case of laminating the concavo-convex structure 101*a* and the transparent conductive layer surface via the adhesive layer, importance is wettability of the flattened layer material (adhesive layer material) with respect to the concavo-convex structure 101*a*. For example, in the case of applying the flattened layer material onto the concavo-convex structure 101*a*, the flattened layer material positioned on the convex portion 101*a* includes the pinning effect in the convex-portion vertex-portion edge portion inside the thin film of the flattened layer material, and the contact angle in the convex-portion vertex-portion edge portion is large. In other words, the contact angle of the flattened layer material positioned on the convex portions 101*b* is different from the contact angle of the flattened layer material positioned on the concave portions 101*c*, and an energetically stable state of the flattened layer material positioned on the convex portions of the concavo-convex structure 101*a* and an energetically stable state of the flattened layer material positioned on the concave portions 101*c* are not the same. Therefore, the surface position of the flattened layer positioned on the convex portions 101*b* does sometimes not coincide with the surface position of the flattened layer positioned on the concave portions 101*c*. In such a case, flatness of the flattened layer surface (light input surface 1*a*) is decreased, and therefore, long-term reliability of the semiconductor light emitting device is reduced. By the concavo-convex structure 101*a* being in the shape of dots, it is possible to decrease the area of the top of the convex portion 101*b*. In other words, also in the case where an increase in the contact angle occurs due to the pinning effect as described above, the energetically stable volume of the flattened layer material caused by the contact angle is decreased to a nanoscale order. Therefore, the energy gradient existing between the flattened layer material positioned on the convex portions 101*b* and the flattened layer material positioned on the concave portions 101*c* is decreased, and it is thereby possible to improve surface (light input surface 1*a*) accuracy of the flattened layer. From the above-mentioned principles, to more improve surface (light input surface 1*a*) accuracy of the flattened layer, the diameter of the top of the convex portion 101*b* is preferably 0.5 time the average pitch or less, more preferably 0.3 time or less, and most preferably 0.2 time or less. In addition, in the case where the first light extraction layer is provided, it is possible to replace the above-mentioned convex portion 101*b* with the first light extraction layer to read.

Further, in the case where the top of the convex portion 101*b* of the concavo-convex structure 101*a* is smaller than the bottom-portion diameter of the convex portion 101*b*, it is possible to more exert the above-mentioned effect, and therefore, such a case is preferable. Since the convex portion 101*b* has such a structure having an inclination, it is possible to decrease the contact angle of the flattened layer material positioned on the convex portions 101*b* pinned. In other words, since the vertex-portion diameter is smaller than the bottom-portion diameter in the convex portion 101*b*, it is possible to decrease the energetically stable volume of the flattened layer material positioned on the convex portions 101*b* to a nanoscale order. Therefore, the energy gradient existing between the flattened layer material positioned on the convex portions 101*b* and the flattened layer material positioned on the concave portions 101*c* is decreased, and it is thereby possible to improve surface (light input surface 1*a*) accuracy of the flattened layer. From the above-mentioned principles, to more improve surface (light input surface 1*a*) accuracy of the flattened layer, the vertex-portion diameter of the convex portion 101*b* is preferably a half the bottom-portion diameter or less, more preferably one-fifth or less, and most preferably one-tenth or less. In addition, the most preferable is the case where the top of the convex portion 101*b* and the convex-portion side surface are smoothly continuous i.e. the case where any flat surface does not exist on the top of the convex portion 101*b*. In addition, in the case where the first light extraction layer is provided, it is possible to replace the above-mentioned convex portion 101*b* with the first light extraction layer to read.

From the above-mentioned principles, to more improve surface (light input surface 1*a*) accuracy of the flattened layer, as the filling rate of the concavo-convex structure 101*a*, the filling rate is preferably 45% or more, and more preferably 55% or more. Further, from the viewpoint of more increasing the area of the convex portions 101*b* of the concavo-convex structure 101*a* and more exerting the above-mentioned effects, the filling rate is preferably 65% or more. Furthermore, since it is possible to enhance selectivity of materials of the concavo-convex structure 101*a*, the filling rate is preferably 70% or more, more preferably 75% or more, and most preferably 80% or more. In addition, the filling rate is a value obtained by bottom-portion area of the convex portions 101*b* of the concavo-convex structure 101*a* included in a unit area/unit area×100. In addition, in the case where the first light extraction layer is provided, it is possible to replace the above-mentioned convex portion 101*b* with the first light extraction layer to read.

Moreover, since the concavo-convex structure of the concavo-convex structure layer having the first refractive index (n1) is in the shape of dots, it is made easy introducing a distribution (disturbance of the arrangement and shape) to the concavo-convex structure. The distribution of the concavo-convex structure will be described later. Therefore, scattering properties of light to output are strengthened, the color shift is reduced, and it is possible to obtain output light nearer natural light. This is presumed due to light scattering properties corresponding to the distribution of effective medium approximate refractive index Nema in terms of the emitted light of the semiconductor light emitting device when the wavelength of the emitted light is sufficiently larger than the average pitch of the concavo-convex structure. On the other hand, when the wavelength of the emitted light is equal to or less than the average pitch of the concavo-convex structure, it is conceivable that the number of light diffraction modes increases which occur on a microscopic scale such as one by one of the concavo-convex structure, and that dispersion is included in the light diffraction mode. In other words, on a macroscopic scale such as several tens of micrometers, this is because averaged light of a plurality of light diffraction modes is observed. From the same reason, it is made easy introducing disturbance (arrangement and shape) to the light extraction layer having the second refractive index (n2), and therefore, it is possible to develop the effect of suppressing the color shift. As a result, it is also possible to suppress glare when a user of the semiconductor light emitting device visually identifies the device.

Embodiment 2

Figure 9:
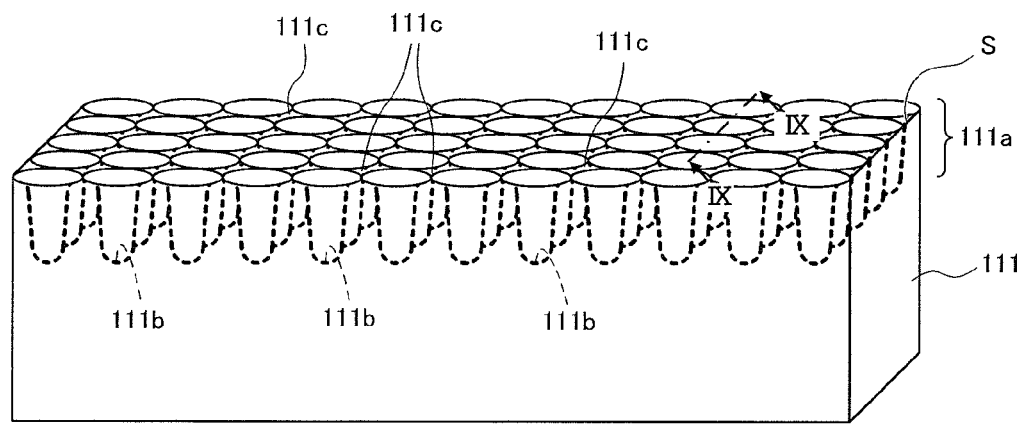
FIG. 9 is a perspective schematic diagram illustrating a second concavo-convex structure according to Embodiment 2.
Figure 10:
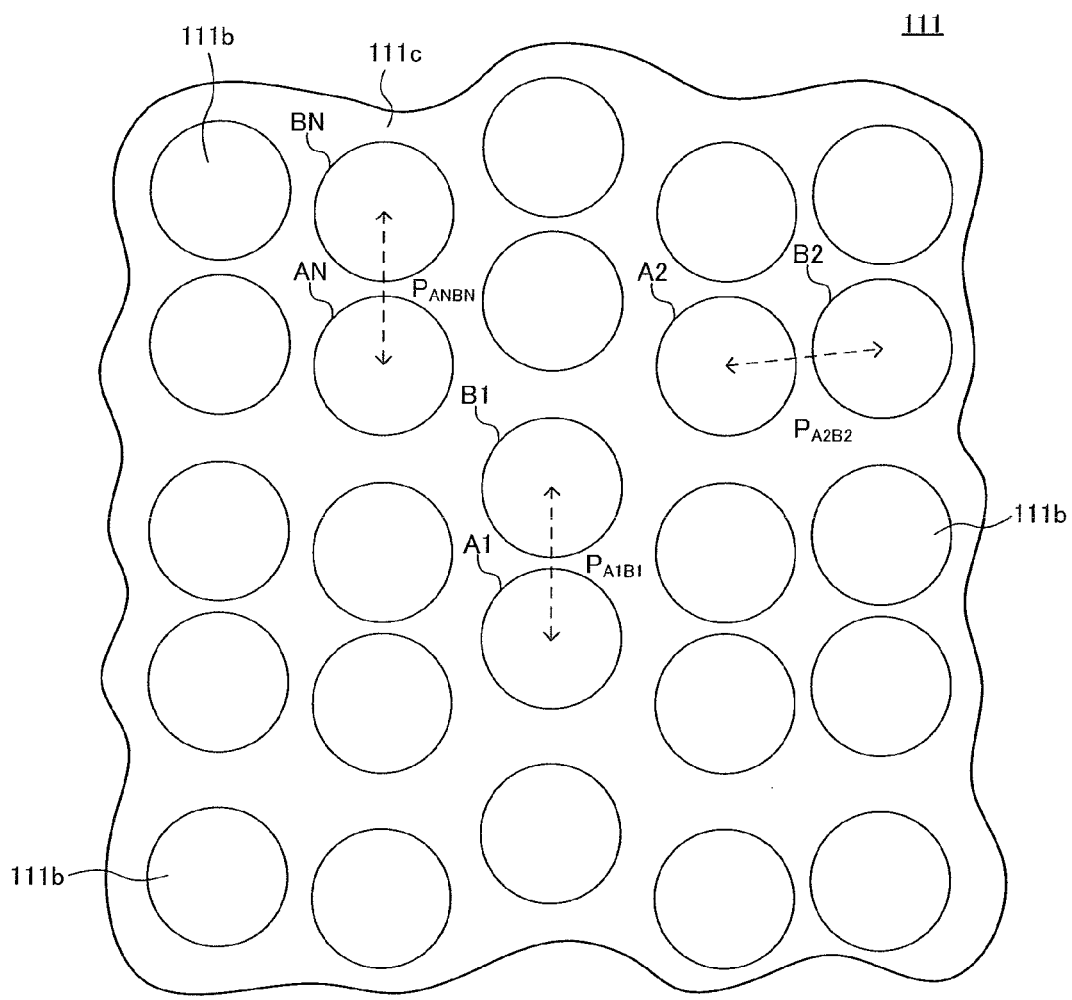
FIG. 10 is a top schematic diagram illustrating the second concavo-convex structure according to Embodiment 2.

FIGS. 9 and 10 are schematic diagrams illustrating the second concavo-convex structure according to Embodiment 2. FIG. 9 is a perspective diagram illustrating a concavo-convex structure layer 111, and FIG. 10 is a top diagram of the concavo-convex structure layer 111 shown in FIG. 9.

As shown in FIG. 9, a second concavo-convex structure 111a includes a plurality of concave portions 111b dented downward in the perpendicular direction to one main surface side of the concavo-convex structure layer 111. The plurality of concave portions 111b are mutually independent and are disposed at predetermined intervals. One main surface of the concavo-convex structure layer 111 is left between mutually adjacent concave portions 111b, and forms convex portions 111c. The convex portions 111c may be mutually continuous or may be independent.

The structure includes a plurality of mutually independent concave portions 111b and convex portions 111c provided to surround the plurality of concave portions 111b. In the second concavo-convex structure 111a, the plurality of concave portions 111b (pillar-shaped (cone-shaped) holes) is provided on the upper surface of the concavo-convex structure layer 111, and adjacent concave portions 111b are isolated by the convex portion 111c.

In other words, in the case where the light extraction product 1 according to the first aspect has the second concavo-convex structure 111a, the second light extraction layer 12b inside the concave portions 111b forms mutually independent pillar-shaped (cone-shaped) bodies. Then, the structure is made in which the pillar-shaped (cone-shaped) bodies having the second refractive index (n2) are surrounded by a medium having the first refractive index (n1). In the case where the light extraction product 1 has the second concavo-convex structure 111a, the first light extraction layer 12a on the convex portions 111c forms a continuous thin film. Then, the continuous thin film having the second refractive index (n2) is the configuration being provided on continuous convex portions 111c (left one main surface of the concavo-convex structure) having the first refractive index (n1).

As the shape of the concave portion 111b, examples thereof are a circular cone, cone-shaped body with the circle of the bottom distorted, cylinder, triangular pyramid, triangular prism, quadrangular pyramid, quadrangular prism, polygonal pyramid with a corner of the bottom rounded, polygonal prism with a corner of the bottom rounded, polygonal pyramid, polygonal prism, shapes with the side surface thereof bent upward in the convex shape or downward in the convex shape, the shape of a ring, the shape of a double ring and the like.

As the average pitch of the plurality of concave portions 111b, from the same effects as in Embodiment 1, it is preferable to meet the range as described in above-mentioned Embodiment 1.

Herein, the average pitch of the plurality of concave portions 111b is defined as described below. The pitch is an inter-center distance between the center of some concave portion and the center of another concave portion closest to the concave portion. As shown in FIG. 10, a concave portion B1 closest to some concave portion A1 is selected, and a distance $P_{A1B1}$ between the center of the concave portion A1 and the center of the concave portion B1 is defined as the pitch P. However, as shown in FIG. 10, when the plurality of concave portions 111b is disposed irregularly, and the pitch varies with selected concave portions, the pitch $P_{A1B1}$, pitch $P_{A2B2}$ to pitch $P_{ANBN}$ between selected respective concave portion A1, A2 . . . AN and adjacent concave portion B1, B2 . . . BN are respectively measured. Then, the arithmetical mean value of the pitches is defined as the average pitch P of the plurality of concave portions 111b. In other words, $(P_{A1B1}+P_{A2B2}+\ldots+P_{ANBN})/N=P$ is defined. In addition, it is preferable that the number N of concave portions to select in obtaining the above-mentioned arithmetical mean value is 10 or more. In addition, as a structure arrangement (pattern) of the concave portions 111b of the second concavo-convex structure 111a, it is also possible to use any one of an arrangement LP, arrangement α and distribution DF described later.

Since the concavo-convex structure 111a is in the shape of holes, it is possible to improve long-term reliability of the semiconductor light emitting device. Also in the case of providing the flattened layer on the concavo-convex structure 111a and in the case of laminating the concavo-convex structure 111a and the transparent conductive layer surface via the adhesive layer, importance is wettability of the flattened layer material (adhesive layer material) with respect to the concavo-convex structure 111a. For example, in the case of applying the flattened layer material onto the concavo-convex structure 111a, the flattened layer material on the convex portions 111c includes the pinning effect in the convex-portion vertex-portion edge portion inside the thin film of the flattened layer material, and the contact angle in the convex-portion vertex-portion edge portion is large. In other words, the contact angle of the flattened layer material positioned on the convex portions 111c is different from the contact angle of the flattened layer material positioned on the concave portions 111b, and an energetically stable state of the flattened layer material positioned on the convex portions 111c of the concavo-convex structure 111a and an energetically stable state of the flattened layer material positioned on the concave portions 111b are not the same. Therefore, the surface position of the flattened layer positioned on the convex portions 111c does sometimes not coincide with the surface position of the flattened layer positioned on the concave portions 111b. In such a case, flatness of the flattened layer surface (light input surface 1a) is decreased, and therefore, long-term reliability of the semiconductor light emitting device is reduced. By the concavo-convex structure 111a being in the shape of holes, it is possible to decrease the area of the top of the convex portion 111c. In other words, also in the case where an increase in the contact angle occurs due to the pinning effect as described above, the energetically stable volume of the flattened layer material caused by the contact angle is decreased to nanoscale order. Therefore, the energy gradient existing between the flattened layer material positioned on the convex portions 111c and the flattened layer material positioned on the concave portions 111b is decreased, and it is thereby possible to improve surface (light input surface 1a) accuracy of the flattened layer. From the above-mentioned principles, to more improve surface (light input surface 1a) accuracy of the flattened layer, as an aperture ratio of the concavo-convex structure 111a, the aperture ratio is preferably 45% or more, and more preferably 55% or more. Further, from the viewpoints of more decreasing the convex portion 111c area of the concavo-convex structure 111a, and more exerting the above-mentioned effects, the aperture ratio is preferably 65% or more. Further, since it is possible to enhance selectivity of the concavo-convex structure 111a, the aperture ratio is preferably 70% or more, more preferably 75% or more, and most preferably 80% or more.

Further, in the case where the opening portion of the concave portion 111b of the concavo-convex structure 111a is larger than the bottom-portion diameter of the concave portion 111b, it is possible to more exert the above-mentioned effect, and therefore, such a case is preferable. Since the concave portion 111b has such a structure having an inclination, it is possible to decrease the contact angle of the flattened layer material positioned on the convex portions 111b pinned. In other words, since the opening diameter of the concave portion 111b is larger than the bottom-portion diameter of the concave portion 111b, it is possible to decrease the energetically stable volume of the flattened layer material positioned on the convex portions 111b to a nanoscale order. Therefore, the energy gradient existing between the flattened layer material positioned on the convex portions 111c and the flattened layer material positioned on the concave portions 111b is decreased, and it is thereby possible to improve surface (light input surface 1a) accuracy of the flattened layer. From the above-mentioned principles, to more improve surface (light input surface 1a) accuracy of the flattened layer, the diameter of the concave portion 111b opening portion is preferably two times the diameter of the bottom of the concave portion 111 or more, more preferably five times or more, and most preferably ten times or more. In addition, the most preferable is the case where the bottom of the concave portion 111b and the concave-portion side surface are smoothly continuous i.e. the case where any flat surface does not exist on the bottom of the concave portion 111b. Further, in the case where the top of the convex portion 111c and the side surface of the concave portion 111b are continuously connected, it is possible to further exert the above-mentioned effect, and therefore, such a case is preferable. In addition, it is the same as in the first light extraction layer.

Moreover, since the concavo-convex structure 111a of the concave-convex structure layer 111 having the first refractive index (n1) is in the shape of holes, it is made easy introducing a distribution (disturbance of the arrangement and shape) to the concavo-convex structure 111a. The distribution of the concavo-convex structure will be described later. Therefore, scattering properties of light to output are strengthened, the color shift is reduced, and it is possible to obtain output light nearer natural light. This is presumed due to light scattering properties corresponding to the distribution of effective medium approximate refractive index Nema in terms of the emitted light of the semiconductor light emitting device when the wavelength of the emitted light is sufficiently larger than the average pitch of the concavo-convex structure 111a. On the other hand, when the wavelength of the emitted light is equal to or less than the average pitch of the concavo-convex structure 111a, it is conceivable that the number of light diffraction modes increases which occur on a microscopic scale such as one by one of the concavo-convex structure, and that dispersion is included in the light diffraction mode. In other words, on a macroscopic scale such as several tens of micrometers, this is because averaged light of a plurality of light diffraction modes is observed. From the same reason, it is made easy introducing disturbance (arrangement and shape) to the light extraction layer having the second refractive index (n2), and therefore, it is possible to develop the effect of suppressing the color shift. As a result, it is also possible to suppress glare when a user of the semiconductor light emitting device visually identifies the device.

In addition, in the above-mentioned description, in above-mentioned equations (7) and (9), the case is described where the first refractive index (n1) is substantially different from the third refractive index (n3), but it is not necessary that the first refractive index (n1) is always substantially different from the third refractive index (n3), and the first refractive index (n1) may be substantially equal or equal to the third refractive index (n3). The case will be described below where the first refractive index (n1) is substantially equal or equal to the third refractive index (n3). In addition, in the following description, portions different from Embodiments 1 and 2 as described above will be described.

Embodiment 3

Figure 11:
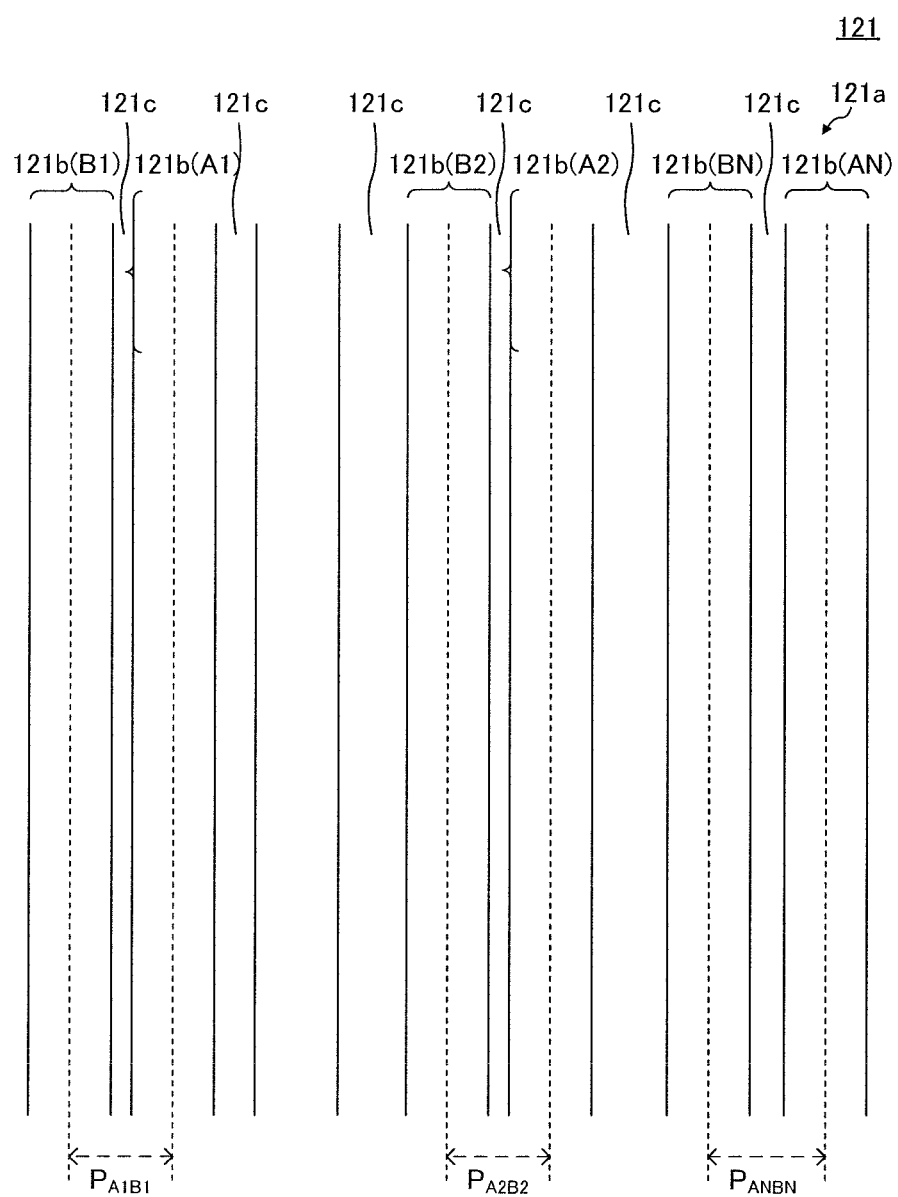
FIG. 11 is a schematic diagram illustrating a third concavo-convex structure according to Embodiment 3.

FIG. 11 is a schematic diagram illustrating a third concavo-convex structure according to Embodiment 3. In addition, FIG. 11 schematically shows a state in which a concavo-convex structure layer 121 is viewed from the upper surface.

As shown in FIG. 11, a third concavo-convex structure 121a includes a plurality of mutually parallel palisade bodies (convex portions) 121b extending along the first direction D1 belonging to the inside of the main surface of the concavo-convex structure layer 121. Each palisade body 121b is provided to protrude perpendicularly upward from the main surface of the concavo-convex structure layer 121, and has a predetermined thickness (width) in the second direction D2 orthogonal to the first direction D1. Further, one main surface of the concavo-convex structure layer 121 is left between respective palisade bodies 121b, and forms concave portions 121c provided between respective palisade bodies 121b.

In other words, in the case where the light extraction product 1 according to the first aspect has the third concavo-convex structure 121a, the second light extraction layer 12b provided inside the concave portions 121b forms mutually independent and parallel palisade bodies. Then, the structure is made in which the palisade bodies having the second refractive index (n2) are surrounded by a medium having the first refractive index (n1). In addition, in the third concave-convex structure 121a, the above-mentioned convex-portion average height (depth) H is an average palisade body height, the average position Sh of tops of the convex-portions is a palisade body vertex-portion average position, and the convex-portion upper interface average position Scv is a palisade body upper interface average position. The first light extraction layer 12a provided on the palisade bodies 121b forms mutually independent and parallel palisade bodies 121b. Then, the structure is made in which the mutually independent and parallel palisade bodies 121b having the second refractive index (n2) are provided on the palisade bodies 121b having the first refractive index (n1).

As the cross-sectional shape of the palisade body 121b, there are a square, rectangle, trapezoid, triangle, shape with the oblique side of a trapezoid curved inwardly or outwardly, shape with the front end rounded in these shapes and the like.

As the average pitch of the palisade bodies 121b, from the viewpoint of improving extraction efficiency of the oozing light, the pitch preferably ranges from 50 nm to 5000 nm. Particularly, from the viewpoints of extracting the oozing light by light diffraction and improving light extraction efficiency, the pitch is preferably 100 nm or more, more preferably 150 nm or more, and most preferably 200 nm or more. On the other hand, from the viewpoint of suppressing reflection of the emitted light within the critical angle, the upper limit value is preferably 3000 nm or less, and more preferably 1500 nm or less. Further, from the viewpoints of improving surface accuracy of the light input surface 1a and improving long-term reliability of the semiconductor light emitting device, the value is preferably 1000 nm or less, and more preferably 800 nm or less.

Herein, the average pitch of the plurality of palisades-shaped bodies 121b is defined as described below. The pitch is an inter-center line distance between the center line of some palisade body and the center line of another palisade body closest to the palisade body. As shown in FIG. 11, a palisade body B1 closest to some palisade body A1 is selected, and the shortest distance PA1B1 between the center line of the palisade body A1 and the center line of the palisade body B1 is defined as the pitch P. Further, when the pitch P varies with selected palisade bodies, a plurality of arbitrary palisade bodies A1, A2 . . . AN are selected, the pitches are measured respectively on the selected palisade bodies A1, A2 . . . AN and adjacent palisade bodies B1, B2 . . . BN, and the arithmetical mean value of the pitches is defined as the average pitch of the plurality of palisade bodies. In other words, (PA1B1+PA2B2+ . . . +PANBN)/N=P is defined. In addition, it is preferable that the number N of palisade bodies to select as samples in obtaining the above-mentioned arithmetical mean value is 10 or more. Further, as an arrangement (pattern) of the plurality of palisade bodies, it is possible to use an arrangement LP described later.

When the pitch of the palisade bodies is considered a factor forming the concavo-convex structure, the ratio (standard deviation/arithmetical mean) that is the distribution of the concavo-convex structure as described above meets equation (i).

$$0.025 \leq \text{(standard deviation/arithmetical mean)} \leq 0.5 \qquad \text{Eq. (i)}$$

From the viewpoints of more enhancing both the effects of light extraction efficiency and suppression of color shift, in the above-mentioned widest range (0.02~50.5), the ratio preferably ranges from 0.03 to 0.4. Particularly, by being 0.03 or more, a contribution to color shift reduction is excellent due to addition of scattering properties, and by being 0.4 or less, a contribution to improvement in light extraction efficiency is excellent by suppressing reflection of the emitted light within the critical angle. From the same viewpoint, the ratio is preferably 0.035 or more, and more preferably 0.04 or more. Further, the ratio is preferably 0.35 or less, more preferably 0.25 or less, and most preferably 0.15 or less.

Further, in the case where the top of the convex portion 121b of the concavo-convex structure 121a is smaller than the bottom-portion width of the convex portion 121b, it is conceivable that it is possible to improve long-term reliability of the semiconductor light emitting device, in addition to the effects of improvements in light extraction efficiency and color shift reduction, and therefore, such a case is preferable. Since the convex portion 121b has such a structure having an inclination, it is possible to decrease the contact angle of the flattened layer material positioned on the convex portions 121b pinned. In other words, since the vertex-portion width of the convex portion 121b is smaller than the bottom-portion width of the convex portion 121b, it is possible to decrease the energetically stable volume of the flattened layer material positioned on the convex portions 121b to a nanoscale order. Therefore, the energy gradient existing between the flattened layer material positioned on the convex portions 121b and the flattened layer material positioned on the concave portions 121c is decreased, it is made possible to improve surface (light input surface 1a) accuracy of the flattened layer, it is possible to improve surface accuracy of the transparent conductive layer, and it is thereby possible to suppress deterioration of the semiconductor light emitting device due to current concentration and the like. From the above-mentioned principles, to more improve surface (light input surface 1a) accuracy of the flattened layer, the width of the top of the convex portion 121b is preferably a half the width of the bottom of the convex portion 121b or less, more preferably one-fifth or less, and most preferably one-tenth or less. In addition, the most preferable is the case where the top of the convex portion 121b and the convex-portion side surface are smoothly continuous i.e. the case where any flat surface does not exist on the top of the convex portion 121b. In addition, in the case where the first light extraction layer is provided, it is possible to replace the above-mentioned convex portion 121b with the first light extraction layer to read.

Furthermore, in the case where the width of the bottom of the convex-portion of the palisade body ranges from 0.1 time to 0.8 time the average pitch P, it is possible to provide both improvements in light extractions efficiency and reductions in the color shift, and therefore, such a range is preferable. Particularly, by being 0.1 time or more, addition of light scattering properties due to the distribution of the concavo-convex structure of above-mentioned equation (i) is effective, and it is possible to reduce the color shift. From the same effect, the width of the bottom of the convex-portion of the palisade body is preferably 0.25 time the average pitch P or more, and more preferably 0.35 time or more. On the other hand, by being 0.8 time or less, since it is possible to suppress reflection of the emitted light within the critical angle, it is possible to improve light extraction efficiency. From the same viewpoint, 0.7 time or less is preferable, and 0.6 time or less is more preferable.

Still furthermore, in the case where the height of the convex portion of the palisade body is 2 times the average pitch P or less, it is conceivable that it is possible to improve long-term reliability of the semiconductor light emitting device, and therefore, such a case is preferable. Particularly, in the case of being the average pitch P or less, since the refractive index distribution in the concavo-convex structure, light extraction layer and flattened layer is appropriate in terms of the emitted light, it is possible to more improve light extraction efficiency. From this viewpoint, the height of the concavo-convex structure is more preferably 0.8 time the average pitch P or less, and most preferably 0.6 time or less.

Moreover, (standard deviation/arithmetical mean) with respect to the height H preferably ranges from 0.03 to 0.40 in the above-mentioned widest range (0.02~50.5). Particularly, by being 0.03 or more, a contribution to color shift reduction is excellent due to addition of light scattering properties, and by being 0.4 or less, a contribution to improvement in light extraction efficiency is excellent by suppressing reflection of the emitted light within the critical angle. From the same viewpoint, the ratio is preferably 0.04 or more, more preferably 0.05 or more, and most preferably 0.12 or more. Further, the ratio is preferably 0.35 or less, more preferably 0.3 or less, and most preferably 0.25 or less.

In the semiconductor light emitting device, in the case where unevenness and swell exists on the transparent conductive layer surface, current concentration occurs on the convex portion, and deterioration of the semiconductor light emitting device is promoted. From the viewpoint of suppressing such current concentration by surface accuracy of the flattened layer surface, as the filling rate (area of the bottoms of the convex-portion included in a unit area/unit area×100) of the concavo-convex structure 121a as shown in FIG. 11, the filling rate is preferably 45% or more, and more preferably 55% or more. Further, from the viewpoint of making the area of the convex portions (palisade bodies) 121b of the concavo-convex structure 121a sufficiently larger than the area of the opening portions (concave portions 121c) of the concavo-convex structure 121a and more exerting the above-mentioned effects, the filling rate is preferably 65% or more. Furthermore, since it is possible to enhance selectivity of materials of the concavo-convex structure 121a, the filling rate is preferably 70% or more, more preferably 75% or more, and most preferably 80% or more. This is due to the following reason. Also in the case of providing the flattened layer on the concavo-convex structure 121a and in the case of laminating the concavo-convex structure 121a and the transparent conductive layer surface via the adhesive layer, importance is wettability of the flattened layer material (adhesive layer material) with respect to the concavo-convex structure 121a. For example, in the case of applying the flattened layer material onto the concavo-convex structure 121a, the flattened layer material on the convex portions 121a includes the pinning effect in the convex-portion vertex-portion edge portion inside the thin film of the flattened layer material, and the contact angle in the convex-portion vertex-portion edge portion is large. In other words, the contact angle of the flattened layer material positioned on the convex portions 121b is different from the contact angle of the flattened layer material positioned on the concave portions 121c, and an energetically stable state of the flattened layer material positioned on the convex portions 121b of the concavo-convex structure 121a and an energetically stable state of the flattened layer material positioned on the concave portions 121c are not the same. Therefore, the surface position of the flattened layer positioned on the convex portions 121b does sometimes not coincide with the surface position of the flattened layer positioned on the concave portions 121c. However, by the above-mentioned filling rate meeting the above-mentioned range, it is possible to decrease the effect of an increase in the contact angle due to the pinning effect. Therefore, the energy gradient existing between the flattened layer material positioned on the convex portions 121b and the flattened layer material positioned on the concave portions 121c is decreased, and it is thereby possible to improve surface (light input surface 1a) accuracy of the flattened layer. In addition, when the width of the top of the convex-portion of the palisade body is smaller than the width of the bottom, it is possible to more exert the above-mentioned effects.

Embodiment 4

Figure 12:
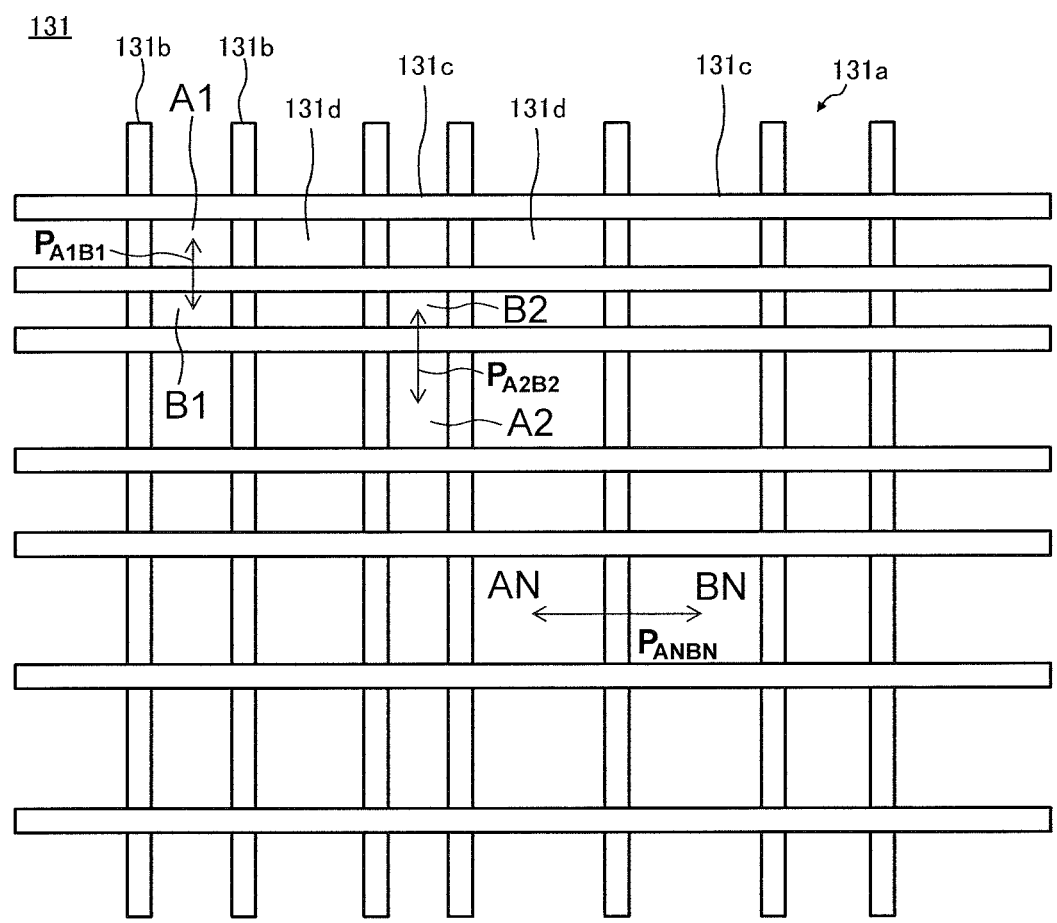
FIG. 12 is a plan schematic diagram illustrating a concavo-convex structure according to Embodiment 4.
Figure 12:
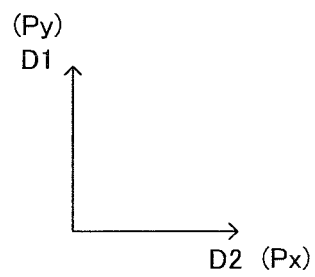

FIG. 12 is a plan schematic diagram illustrating a concavo-convex structure according to Embodiment 4. In addition, FIG. 12 schematically shows an upper surface of a concavo-convex structure layer 131.

As shown in FIG. 12, a fourth concavo-convex structure 131a includes a plurality of palisade bodies (convex portions) 131b arranged along the first direction D1 belonging to the inside of the main surface of the concavo-convex structure layer 131, and a plurality of palisade bodies (convex portions) 131c arranged along the second direction D2 orthogonal to the first direction D1. Pluralities of palisade bodies 131b and 131c are provided to protrude perpendicularly upward from the main surface of the concavo-convex structure layer 131. The pluralities of palisade bodies 131b and 131c are provided in the shape of a lattice to mutually cross substantially orthogonally. One main surface of the concavo-convex structure layer 131 is left in regions surrounded by the pluralities of palisade bodies 131b and 131c, and forms concave portions 131d provided between respective palisade bodies 131b and 131c.

In other words, in the case where the light extraction product 1 according to the first aspect has the fourth concavo-convex structure 131a, the second light extraction layer 12b forms mutually independent sections divided in the shape of a lattice by a medium having the first refractive index (n1). As a result, the structure is made in which the second light extraction layer 12b having the second refractive index (n2) is surrounded by the palisade bodies 131b and 131c having the first refractive index (n1) inside the surface of the light extraction product 1, and a plurality of layers 12b is arranged in shape of a staggered lattice. In addition, in the fourth concavo-convex structure 131a, the above-mentioned convex-portion average height (depth) H is an average palisade body height, the average position Sh of tops of the convex-portions is a palisade body vertex-portion average position, and the convex-portion upper interface average position Scv is a palisade body upper interface average position. When the light extraction product 1 has the fourth concavo-convex structure 131a, the first light extraction layer 12a forms a plurality of palisade bodies arranged along the first direction D1 belonging to the inside of the main surface of the concavo-convex structure layer 131, and a plurality of palisade bodies arranged along the second direction D2 orthogonal to the first direction D1. Then, these pluralities of first light extraction layers are provided on upper portions of the palisade bodies 131b and 131c having the first refractive index (n1).

As the cross-sectional shape of the palisade body 131b, 131c, there are a square, rectangle, trapezoid, triangle, shape with the oblique side of a trapezoid curved inwardly or outwardly, shape with the front end rounded in these shapes and the like. Further, the lattice may be a triangular lattice, quadrangular lattice or polygonal lattice.

As the average pitch of the lattice, from the viewpoint of improving extraction efficiency of oozing light derived from the waveguide mode, the pitch preferably ranges from 50 nm to 5000 nm. Particularly, from the viewpoints of extracting the oozing light by light diffraction and improving light extraction efficiency, the pitch is preferably 100 nm or more, more preferably 150 nm or more, and most preferably 200 nm or more. On the other hand, from the viewpoint of suppressing reflection of the emitted light within the critical angle, the upper limit value is preferably 3000 nm or less, and more preferably 1500 nm or less. Further, from the viewpoints of improving surface accuracy of the light input surface 1a and improving long-term reliability of the semiconductor light emitting device, the value is preferably 1000 nm or less, and more preferably 800 nm or less.

Herein, the average pitch of the lattice is defined as described below. The pitch is an inter-center distance between the center of some section having the second refractive index (n2) surrounded by the lattice and the center of another section adjacent to the section. As shown in FIG. 12, a section B1 (provided by being divided by one side of the lattice having the first refractive index (n1)) adjacent to some section A1 is selected, and the shortest distance PA1B1 between the center of the section A1 and the center of the section B1 is defined as the pitch P. As shown in FIG. 12, when the pitch P varies with selected sections, a plurality of arbitrary sections A1, A2 ... AN are selected, the pitches are measured respectively on B1, B2 and BN respectively adjacent to the selected sections A1, A2 ... AN, and the arithmetical mean value of the pitches is defined as the average pitch of the lattice. In other words, (PA1B1+PA2B2+ ... +PANBN)/N=P is defined. In addition, it is preferable that the number of sections to select as samples in obtaining the above-mentioned arithmetical mean value is 20 or more. Further, as an arrangement (pattern) of the lattice, it is possible to use both of an arrangement LP and distribution DF described later.

When the pitch of the lattice is considered a factor forming the concavo-convex structure, from the viewpoints of more enhancing both the effects of light extraction efficiency and suppression of the color shift, the ratio (standard deviation/arithmetical mean) that is the distribution of the concavo-convex structure as described above preferably ranges from 0.03 to 0.40 in the above-mentioned widest range (0.02~50.5). Particularly, by being 0.03 or more, a contribution to color shift reduction is excellent due to addition of scattering properties, and by being 0.4 or less, a contribution to improvement in light extraction efficiency is excellent by suppressing reflection of the emitted light within the critical angle. From the same viewpoint, the ratio is preferably 0.035 or more, and more preferably 0.04 or more. Further, the ratio is preferably 0.35 or less, more preferably 0.25 or less, and most preferably 0.15 or less.

Further, in the case where the top of the convex portion 131b of the concavo-convex structure 131a is smaller than the bottom-portion width of the convex portion 131b, it is conceivable that it is possible to improve long-term reliability of the semiconductor light emitting device, in addition to the effects of improvement in light extraction efficiency and color shift reduction, and therefore, such a case is preferable. Since the convex portion 131b has such a structure having an inclination, it is possible to decrease the contact angle of the flattened layer material positioned on the convex portions 131b pinned. In other words, since the vertex-portion width of the convex portion 131b is smaller than the bottom-portion width of the convex portion 131b, it is possible to decrease the energetically stable volume of the flattened layer material positioned on the convex portions 131b to a nanoscale order. Therefore, the energy gradient existing between the flattened layer material positioned on the convex portions 131b and the flattened layer material positioned on the concave portions 131d is decreased, it is made possible to improve surface (light input surface 1a) accuracy of the flattened layer, it is possible to improve surface accuracy of the transparent conductive layer, and it is thereby possible to suppress deterioration of the semiconductor light emitting device due to current concentration and the like. From the above-mentioned principles, to more improve surface (light input surface 1a) accuracy of the flattened layer, the width of the top of the convex portion 131b is preferably a half the width of the bottom of the convex portion 131b or less, more preferably one-fifth or less, and most preferably one-tenth or less. In addition, the most preferable is the case where the top of the convex portion 131b and the side surface of the convex portion 131b are smoothly continuous i.e. the case where any flat surface does not exist on the top of the convex portion 131b. In addition, in the case where the first light extraction layer is provided, it is possible to replace the above-mentioned convex portion 131b with the first light extraction layer to read.

Furthermore, in the case where the width of the bottom of the convex-portion of the lattice ranges from 0.1 time to 0.8 time the average pitch P, it is possible to provide both improvements in the light efficiency and reductions in the color shift, and therefore, such a range is preferable. Particularly, by being 0.1 time or more, addition of light scattering properties due to the distribution of the concavo-convex structure of above-mentioned equation (i) is effective, and it is possible to reduce the color shift. From the same effect, the width of the bottom of the convex-portion of the palisade body is preferably 0.25 time the average pitch P or more, and more preferably 0.35 time or more. On the other hand, by being 0.8 time or less, since it is possible to suppress reflection of the emitted light within the critical angle, it is possible to improve light extraction efficiency. From the same viewpoint, 0.7 time or less is preferable, and 0.6 time or less is more preferable.

Still furthermore, in the case where the height of the convex portion of lattice is 2 times the average pitch P or less, it is conceivable that it is possible to improve long-term reliability of the semiconductor light emitting device, and therefore, such a case is preferable. Particularly, in the case of being the average pitch P or less, since the refractive index distribution in the concavo-convex structure, light extraction layer and flattened layer is appropriate in terms of the emitted light, it is possible to more improve light extraction efficiency. From this viewpoint, the height of the concavo-convex structure is more preferably 0.8 time the average pitch P or less, and most preferably 0.6 time or less.

Moreover, (standard deviation/arithmetical mean) with respect to the height H preferably ranges from 0.03 to 0.40 in the above-mentioned widest range (0.025~0.5). Particularly, by being 0.03 or more, a contribution to color shift reduction is excellent due to addition of light scattering properties, and by being 0.40 or less, a contribution to improvement in light extraction efficiency is excellent by suppressing reflection of the emitted light within the critical angle. From the same viewpoint, the ratio is preferably 0.04 or more, more preferably 0.05 or more, and most preferably 0.12 or more. Further, the ratio is preferably 0.35 or less, more preferably 0.3 or less, and most preferably 0.25 or less.

Further, from the viewpoints of improving surface accuracy of the flattened layer surface and improving long-term reliability of the semiconductor light emitting device, as the filling rate of the concavo-convex structure 131a, the filling rate is preferably 45% or more, and more preferably 55% or more. Furthermore, from the viewpoint of more increasing the area of the convex portions 131c of the concavo-convex structure 131a and more exerting the above-mentioned effects, the filling rate is preferably 65% or more. Still furthermore, since it is possible to enhance selectivity of materials of the concavo-convex structure 131a, the filling rate is preferably 70% or more, more preferably 75% or more, and most preferably 80% or more.

In addition, in the above-mentioned description, in above-mentioned equations (7) and (9), the case is described where the first refractive index (n1) is substantially different from the third refractive index (n3), but it is not necessary that the first refractive index (n1) is always substantially different from the third refractive index (n3), and the first refractive index (n1) may be substantially equal or equal to the third refractive index (n3). The case will be described below where the first refractive index (n1) is substantially equal or equal to the third refractive index (n3). In addition, in the following description of a light extraction product 140, portions different from the light extraction products 1 and 2 of this Embodiment described above will be described.

<Third Aspect>

Figure 13:
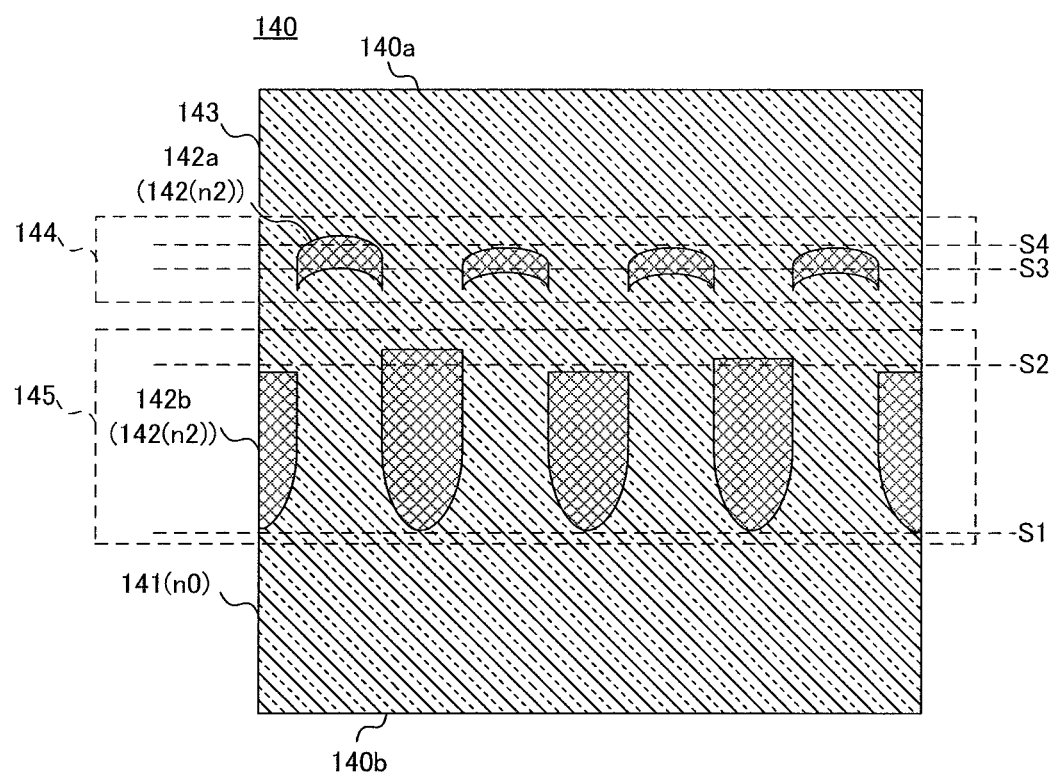
FIG. 13 is a cross-sectional schematic diagram illustrating a light extraction product according to a third aspect.

FIG. 13 is a cross-sectional schematic diagram illustrating a light extraction product 140 according to a third aspect of the present invention. In the light extraction product 140, since the first refractive index (n1) of a concavo-convex structure layer 141 is substantially equal or equal to the third refractive index (n3) of a flattened layer 143, the emitted light (oozing light and emitted light within the critical angle) guided to the inside of the light extraction product 140 is not capable of recognizing the interface between the concavo-convex structure layer 141 and the flattened layer 143. Therefore, in terms of the light guided to the inside of the light extraction product 140 in the emitted light of the semiconductor light emitting device, formed is a state in which only a light extraction layer 142 having the second refractive index (n2) floats in a predetermined surface inside the light extraction product 140. In other words, in the light extraction product 1 according to the first aspect as shown in FIG. 1, such a state is made that the interface between the concavo-convex structure 11 and the flattened layer 13 does not exist.

In other words, in terms of the emitted light (oozing light and emitted light within the critical angle) guided to the inside of the light extraction product 140, it is possible to make a state in which a medium having the second refractive index (n2) is surrounded by a medium having a different refractive index from the second refractive index (n2), and it is possible to extract the oozing light by light diffraction. In addition, in the following description, the first refractive index (n1) and the third refractive index (n3) are collectively described as a refractive index (n0).

Further, in the arrangement in the in-plane direction of the light extraction product 140 surface of the light extraction layer 142, also in the case where the interval of the light extraction layer 142 is large and the case where the light extraction layer 142 does partially not exist, the emitted light (oozing light and emitted light within the critical angle) guided to the inside of the light extraction product 140 behaves as if the medium surrounding the light extraction layer 142 is only one kind. Therefore, it is conceivable that it is possible to suppress reflection of the emitted light within the critical angle. In the case where the first refractive index (n1) is substantially equal or equal to the third refractive index (n3), the convex-portion upper interface average position Scv and concave-portion internal interface average position Scc in the concavo-convex structure 11a according to the above-mentioned first aspect lose meaning of the definition. It is assumed that the light extraction product 1 in this case meets the following requirements.

The light extraction product 140 has at least a light input surface 140a (first surface) and a light output surface 140b (second surface), and the light input surface 140a is provided on the transparent conductive layer surface side of the semiconductor light emitting device. In viewed from the thickness direction, the light extraction product 140 includes the light extraction layer 142 having the second refractive index (n2) between the light input surface 140a and the light output surface 140b. The light extraction layer 142 is provided by being surrounded by media having the different refractive index (n0) from the second refractive index (n2) with the concavo-convex structure layer 141 and flattened layer 143. Further, the light extraction layer 142 is provided to have the spread inside the surface (paper front and back direction and right and left direction) parallel to the light input surface 140a and the light output surface 140b.

Further, inside the light extraction product 140, as the spread of the second refractive index (n2) inside the surface parallel to the light input surface 140a and the light output surface 140b, at least one or more layers exist. In other words, in the case of having only a first light extraction layer 142a, in the case of having only a second light extraction layer 142a, and in the case where the first light extraction layer 142a and second light extraction layer 142b are continuous, the spread of the second refractive index (n2) inside the light extraction product 140 is one layer, and in the case where the first light extraction layer 142a and second light extraction layer 142b are mutually separated, the spread of the second refractive index (n2) inside the light extraction product 140 is two layers.

When the spread of the second refractive index (n2) is two layers, the oozing light input from the light input surface 140a is extracted as diffracted light by each layer. In this case, diffraction modes are different in respective layers, and light scattering properties are developed. Further, since the effect of light extraction efficiency using light scattering properties is great, it is conceivable that light extraction efficiency is significantly improved. Furthermore, in the case of controlling disturbance of the shape and arrangement of the concavo-convex structure, it is possible to strengthen the effect of light scattering properties corresponding to the disturbance. Therefore, it is conceivable that since output properties to the predetermined angle specific to the diffraction phenomenon are not met, the color shift is suppressed, and that it is possible to make emitted light nearer natural light. Therefore, it is possible to suppress glare when a user of the semiconductor light emitting device visually identifies the device.

As the difference between the second refractive index (n2) and the refractive index (n0) is larger, the emitted light from the semiconductor light emitting device feels heterogeneity between the light extraction layer 142 having the second refractive index (n2) and the medium including the refractive index (n0) strongly. In other words, as the difference between the second refractive index (n2) and the refractive index (n0) is larger, the light recognizes that the light extraction layer 142 having the second refractive index (n2) is disposed inside the light extraction product 140. Therefore, it is possible to develop light diffraction in the interface between the light extraction layer 142 having the second refractive index (n2) and the medium with the refractive index (n0), and it is possible to contribute to improvements in light extraction efficiency. As the range meeting such a difference in the refractive index, it is preferable that $0.1 \leq |n2-n0|$, it is more preferable that $0.15 \leq |n2-n0|$, it is further preferable that $0.25 \leq |n2-n0|$, and it is particularly preferable that $0.3 \leq |n2-n0|$. Particularly, in the above-mentioned $|n2-n0|$, in the case where $n2-n0>0$, it is possible to suppress reflection in the light output surface, and therefore, such a case is preferable.

In the following description, in the cross-sectional view of the light extraction product 140, in the case where there are two kinds of sets of the refractive index (n2) of the light extraction layer included inside the surface parallel to the light input surface 140a of the light extraction product 140, it is assumed that a set of the light extraction layer 142 closer to the light input surface 140a of the light extraction product 140 is a first layer 144, and that a set of the light extraction layer 142 closer to the light output surface 140b of the light extraction product 140 is a second layer 145. On the other hand, in the cross-sectional view of the light extraction product 140, in the case where there is only one kind of a set of the second refractive index (n2) included inside the surface parallel to the light input surface 140a of the light extraction product 140, the layer is defined as the first layer 144.

In addition, in the cross-sectional view of the light extraction product 140, the case where there is only one kind of a set of the second refractive index (n2) included inside the surface parallel to the light input surface 140a of the light extraction product 140 is the case where the above-mentioned Lcv is 0 (the case where only the second light extraction layer 12b is provided), (the case where only the first light extraction layer 12a is provided), and the case where the first light extraction layer 142a having a finite thickness of the distance Lcv and the second light extraction layer 142b are continuous. The difference between the first layer 144 closer to the light input surface 140a of the light extraction product 140 and the second layer 145 closer to the light output surface 140b is considered as described below.

A thickness of the first layer 144 is defined as an average thickness. The average thickness is defined as an average value of thicknesses of light extraction layers 142 included in the first layer 144. As the thickness of each light extraction layer 142 included in the first layer 144, a maximum thickness in the thickness direction of the light extraction product 140 is used. The maximum thickness of each light extraction layer 142 is measured in 20 points or more, and an averaged value thereof is the thickness of the first layer 144. When the thickness of the first layer 144 is 5000 nm or less, it is possible to effectively extract the oozing light with the first light extraction layer 142a (first layer 144), and therefore, such a thickness is preferable. From the viewpoints of improving physical stability of the light extraction layer 142a and improving long-term reliability of the semiconductor light emitting device, the thickness is preferably 3000 nm or less, more preferably 1500 nm or less, and more preferably 1400 nm or less. Further, from the viewpoint of suppressing reflection of the emitted light within the critical angle, the thickness is preferably 800 nm or less. Furthermore, from the viewpoints of further exerting the above-mentioned effects, the thickness is more preferably 600 nm or less, and most preferably 400 nm or less.

Particularly, in the case of extracting the oozing light with the second light extraction layer 142b (second layer 145) and the first light extraction layer 142a (first layer 144), the thickness of the first layer 144 is preferably 300 nm or less, and more preferably 140 nm or less. Further, when the thickness of each first light extraction layer 142a included in the first layer 144 is provided with the distribution of ±25% or less, it is possible to significantly add scattering properties to light extraction with the first layer 144.

On the other hand, in the case of extracting the oozing light with only the first light extraction layer 142a (first layer 144), the thickness of the first layer 144 is preferably 5000 nm or less. From the viewpoints of improving physical stability of the light extraction layer 142a and improving long-term reliability of the semiconductor light emitting device, the thickness is preferably 3000 nm or less, more preferably 1500 nm or less, and more preferably 1400 nm or less. From the viewpoint of adding light scattering properties with the thickness distribution of each first light extraction layer 142a of ±25% or less, the lower limit value is preferably 10 nm or more, more preferably 30 nm or more, and most preferably 140 nm or more.

A thickness of the second layer 145 is defined as an average thickness. The average thickness is defined as an average value of thicknesses of light extraction layers 142 included in the second layer 145. As the thickness of each light extraction layer 142 included in the second layer 145, a maximum thickness in the thickness direction of the light extraction product 140 is used. The maximum thickness of each light extraction layer 142 is measured in 20 points or more, and an averaged value thereof is the thickness of the second layer 144.

From the viewpoint of effectively extracting the oozing light with the second light extraction layer 142b (second layer 145), the thickness of the second layer 145 preferably ranges from 10 nm to 5000 nm. Particularly, from the viewpoint of extracting the oozing light with the first light extraction layer 142a and the second light extraction layer 142b (first layer 144 and second layer 145), the thickness of the second layer 145 is preferably 50 nm or more, and more preferably 140 nm or more. Further, from the viewpoints of improving physical stability of the light extraction layer 142b and improving long-term reliability of the semiconductor light emitting device, the thickness is preferably 3000 nm or less, more preferably 1500 nm or less, and more preferably 1400 nm or less. When the thickness of each light extraction layer 142 included in the second layer 145 is provided with the distribution of ±25% or less, it is possible to significantly add scattering properties to light extraction with the second layer 145.

As shown in FIG. 13, among surfaces parallel to the light input surface 140a and light output surface 140b of the light extraction product 140, it is assumed that a surface on the side closer to the light output surface 140b of the second layer 145 is S1, and that a surface on the side closer to the light input surface of the second layer 145 is S2. It is preferable that these surfaces S1 and S2 are obtained by averaging 20 or more points. In addition, the surface S1 is obtained as an average value of shortest distances between the light output surface 140b and the second light extraction layer 142b included in the second layer 145 in the thickness direction of the light extraction product 140 inside the second layer 145. Further, the surface S2 is obtained as an average value of farthest distances between the light output surface 140b and the second light extraction layer 142b included in the second layer 145 in the thickness direction of the light extraction product inside the second layer 145.

Further, among surfaces parallel to the light input surface 140a and light output surface 140b of the light extraction product 140, it is assumed that a surface on the side closer to the light output surface 140b of the first layer 144 is S3, and that a surface on the side closer to the light input surface 140a of the first layer 144 is S4. It is preferable that these surfaces S3 and S4 are obtained by averaging 20 or more points. In addition, the surface S4 is obtained as an average value of shortest distances between the light input surface 140a and the first light extraction layer 142a included in the first layer 144 in the thickness direction of the light extraction product inside the first layer 144. Further, the surface S3 is obtained as an average value of farthest distances between the light input surface 140a and the first light extraction layer 142a included in the first layer 144 in the thickness direction of the light extraction product inside the first layer 144.

An average value of shortest distances from the light input surface 140a of the light extraction product 140 to the second layer 145 that corresponds to the distance Lor as described above is preferably larger than the sum of the distance between the above-mentioned surfaces S2 and S3 and the average thickness (distance between the surfaces S3 and S4) of the first layer 144 and is 800 nm or less. Since this average value is larger than the sum of the distance between the above-mentioned surfaces S2 and S3 and the average thickness of the first layer 144, improved are handling properties in arranging the light extraction product 140 on the transparent conductive layer surface side of the semiconductor light emitting device and stability in manufacturing the semiconductor light emitting device using the light extraction product 140. From the viewpoint of further exerting this effect, the value is preferably 0 nm or more, more preferably 10 nm or more, and most preferably 20 nm or more. On the other hand, by being 800 nm or less, it is possible to easily propagate the oozing light derived from the waveguide mode to the light extraction layer 142.

In addition, when only the first layer 144 is provided, the distance that corresponds to the above-mentioned Lor is the shortest distance from the light input surface 140a of the light extraction product 140 to the surface S4 of the first layer 144. When the distance ranges from 0 nm to 800 nm, it is possible to effectively extract the oozing light oozing from the interface between the light emitting layer (for example, transparent conductive layer) of the semiconductor light emitting device and the light input surface 140a with the first light extraction layer 142a inside the first layer 144. From the viewpoint of further exerting the above-mentioned effect, Lor more preferably ranges from 10 nm to 600 nm, and most preferably ranges from 30 nm to 500 nm.

Described next are arrangements of the above-mentioned first concavo-convex structure 101a, second concavo-convex structure 111a, third concavo-convex structure 121a and fourth concavo-convex structure 131a in the light extraction product 140 according to the third aspect.

Hereinafter, since the third concavo-convex structure 121a and fourth concavo-convex structure 131a are the same in cross-sectional structure, the first concavo-convex structure 101a is described as a representative.

(First Concavo-Convex Structure)

Described first is the relationship with the first concavo-convex structure 101a as shown in FIG. 7.

The first layer 144 has the same arrangement as the arrangement of a plurality of convex portions 101b as shown in FIG. 7. In the thickness direction of the light extraction product 140, as shown in FIG. 7, the first light extraction layer 142a included in the first layer 144 has predetermined thicknesses on the tops of the plurality of convex portions 101b, and an average value of the thicknesses is a thickness of the first layer 144.

The second layer 145 is provided inside the concave portion 101c of FIG. 7, and therefore, has continuity. In the case of viewing from the light input surface side of the light extraction product 140, in FIG. 8, the plurality of convex portions 101b shown by circular shapes is a plurality of first light extraction layers 142a included in the first layer 144, and a continuous clearance among the plurality of first light extraction layers 142a is the second light extraction layer 142b forming the second layer 145. In other words, in the surface parallel to the light input surface 140a and light output surface 140b, in between the light input surface 140a and light output surface 140b, the second layer 145 is a continuous body (film) having the second refractive index (n2) provided with a plurality of mutually independent holes (pillar-shape (cone-shape) holes) having the refractive index (n0).

On the other hand, in the surface parallel to the light input surface 140a and light output surface 140b between the light input surface 140a and light output surface 140b, the first layer 144 forms a plurality of mutually independent dots (convex shape) having the second refractive index (n2) and is a layer with the periphery surrounded by the medium having the refractive index (n0).

Further, in the thickness direction of the light extraction layer 140, the medium having the refractive index (n0) included inside the second layer 145 is provided on the light output surface 140b side of the first light extraction layer 142a forming the first layer 144. The second light extraction layer 142b having the second refractive index (n2) forming the second layer 145 is provided on the light output surface 140b side of the medium having the refractive index (n0) included inside the first layer 144.

In the case where the light extraction layer 142 is formed of the first layer 144 and second layer 145, and in the case where the light extraction layer 142 is formed of only the first layer 144 including a plurality of independent light extraction layers 142, as a pitch of the arrangement of the light extraction layer 142, it is possible to use the definition of the convex portions 101b of the above-mentioned first concavo-convex structure 101a with respect to the first light extraction layers 142a forming the first layer 144 inside the first layer 144. On the other hand, in the case where the light extraction layer 142 is formed of only the first layer 144 including the continuous light extraction layer 142, it is possible to use the definition of the convex portions 101b of the above-mentioned first concavo-convex structure 101a with respect to the medium having the refractive index (n0) forming the first layer 144 inside the first layer 144.

In addition, in the arrangement LP, arrangement α and distribution DF as described later, in the case where the light extraction layer 142 is formed of the first layer 144 and second layer 145, and in the case where the light extraction layer 142 is formed of only the first layer 144 including a plurality of independent light extraction layers 142, it is possible to replace the arrangement of the concavo-convex structure of the concavo-convex structure layer 141 with the arrangement of the first light extraction layers 142a forming the first layer 144 inside the first layer 144. On the other hand, in the case where the light extraction layer is formed of only the first layer 144 including the continuous light extraction layer 142, it is possible to replace the arrangement of the concavo-convex structure of the concavo-convex structure layer 141 with the arrangement of the medium having the refractive index (n0) forming the first layer 144 inside the first layer 144.

(Second Concavo-Convex Structure)

Described next is correspondence with the second concavo-convex structure 111a as shown in FIG. 9.

As the first light extraction layer 142a forming the first layer 144, it is possible to use the same arrangement as that of the convex portions 111c as shown in FIG. 9. Therefore, the first light extraction layer 142a forming the first layer 144 forms a continuous thin film. In the thickness direction of the light extraction product 140, as shown in FIG. 9, the first light extraction layer 142a included in the first layer 144 has predetermined thicknesses on the tops of the convex portions 111c, and an average value of the thicknesses is a thickness of the first layer 144.

On the other hand, the second light extraction layer 142b forming the second layer 145 is provided inside the concave portions 111b as shown in FIG. 9, and therefore, is mutually independent. In the case of viewing from the light input surface 140a side of the light extraction product 140, in FIG. 10, the plurality of concave portions 111b shown by circular shapes is the second extraction layers 142b included in the second layer 145, and a continuous clearance among the second light extraction layers 142b is the first light extraction layer 142a forming the first layer 144.

In other words, in the surface parallel to the light input surface 140a and light output surface 140b between the light input surface 140a and light output surface 140b, the first layer 144 is a continuous body having the second refractive index (n2) provided with a plurality of mutually independent holes having the refractive index (n0). On the other hand, in the surface parallel to the light input surface 140a and light output surface 140b between the light input surface 140a and light output surface 140b, the second layer 145 is provided with a plurality of mutually independent dots (convex shape) having the second refractive index (n2) and is a layer with the periphery surrounded by the medium having the refractive index (n0). Further, in the thickness direction of the light extraction product 140, the medium having the refractive index (n0) included inside the second layer 145 is provided on the light output surface 140b side of the first light extraction layer 142a forming the first layer 144, and the second light extraction layer 142b having the second refractive index (n2) forming the second layer 145 is provided on the light output surface 140b side of the medium having the refractive index (n0) included inside the first layer 144.

In the case where the light extraction layer 142 is formed of the first layer 144 and second layer 145, it is possible to define by applying the definition of the concave portions 111b of the above-mentioned second concavo-convex structure 111a to the second light extraction layers 142b having the second refractive index (n2) inside the second layer 144. In the case where the light extraction layer 142 is formed of only the first layer 144 including a plurality of independent light extraction layers 142, it is possible to define by applying the definition of the concave portions 111b of the above-mentioned second concavo-convex structure 111a to the light extraction layers 142 having the second refractive index (n2) inside the first layer 144. In the case where the light extraction layer 142 is formed of only the first layer 144 including the continuous light extraction layer 142, it is possible to define by applying the definition of the concave portions 111b of the above-mentioned second concavo-convex structure 111a to the medium having the refractive index (n0) inside the first layer 144. As the shape of the second layer 145, it is possible to use the shape of the convex portions 11b of the first concavo-convex structure 111a.

In addition, in the arrangement LP, arrangement α and distribution DF as described later, in the case where the light extraction layer 142 is formed of the first layer 144 and second layer 145, it is possible to apply the arrangement of the concavo-convex structure (convex portion or concave portion) of the concavo-convex structure layer 141 to the light extraction layers 142 forming the second layer 145 inside the second layer 145. In the case where the light extraction layer 142 is formed of only the first layer 144 including a plurality of independent light extraction layers 142, it is possible to apply the arrangement of the concavo-convex structure (convex portion or concave portion) of the concavo-convex structure layer 141 to the light extraction layers 142 forming the first layer 144 inside the first layer 144. In the case where the light extraction layer 142 is formed of only the first layer 144 including the continuous light extraction layer 142, it is possible to apply the arrangement of the concavo-convex structure (convex portion or concave portion) of the concavo-convex structure layer 141 to the arrangement of the medium having the refractive index (n0) inside the first layer 144.

<Fourth Aspect>

Figure 14:
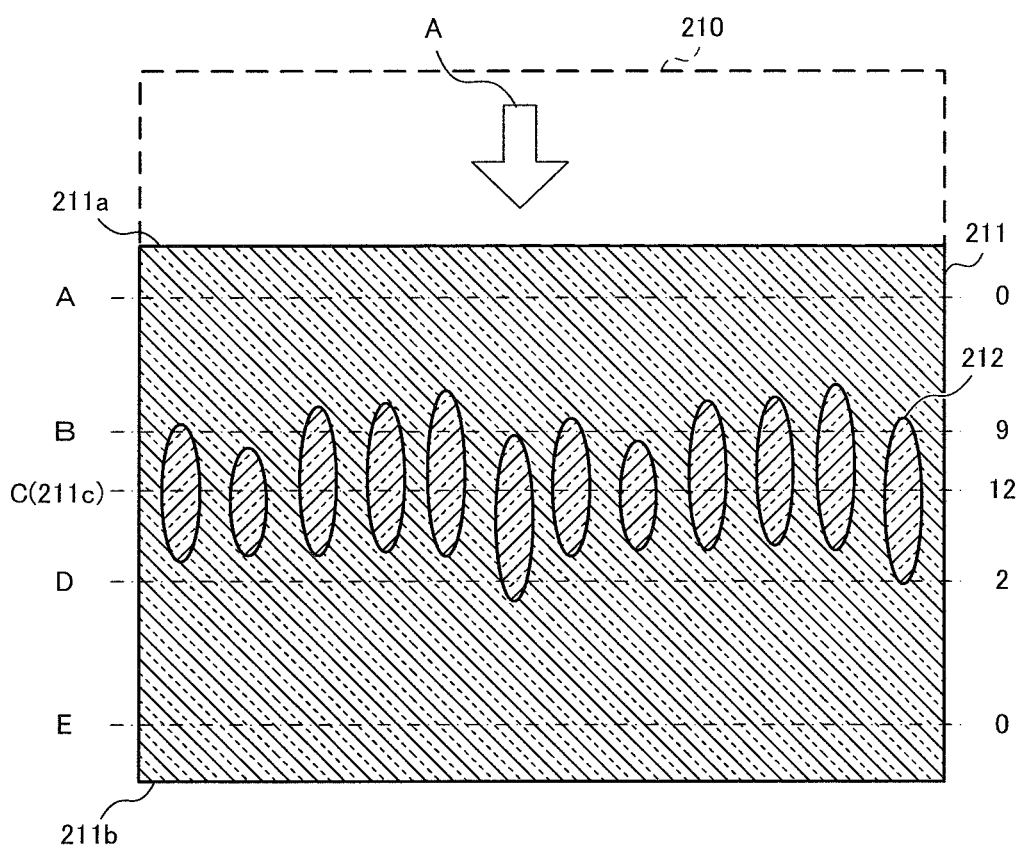
FIG. 14 is a cross-sectional schematic diagram illustrating a light extraction product according to a fourth aspect.

FIG. 14 is a cross-sectional schematic diagram showing a light extraction product according to a fourth aspect. As shown in FIG. 14, a light extraction product 211 according to the fourth aspect is comprised of a medium having the first refractive index (n1) and includes a plurality of nanoparticles 212 having the second refractive index (n2) substantially different from the first refractive index (n1) in the inside thereof. The light extraction product 211 has a pair of mutually approximately parallel main surfaces, one main surface is a light input surface (first surface) 211a disposed on a semiconductor light emitting device 210 side, and the other main surface is a light output surface (second surface) 211b that outputs light input from the semiconductor light emitting device 210. Herein, approximately parallel does always not mean completely parallel, and allows an error to an extent within the scope of exhibiting the effects of the present invention.

The light extraction product 211 has a layer including a plurality of nanoparticles 212 to be comprised thereof between the light input surface 211a and the light output surface 211b. The peripheries of the plurality of nanoparticles 212 are filled with the medium having the first refractive index (n1) substantially different from the second refractive index (n2). Further, inside the layer including the plurality of nanoparticles 212 to be comprised thereof, the plurality of nanoparticles 212 has the predetermined spread inside the surface approximately parallel to light input surface 211a and the light output surface 211b, and arranged with predetermined intervals provided therebetween. Inside the layer in which the plurality of nanoparticles 212 is included, a center surface 211c is included that is approximately parallel to the light input surface 211a and the light output surface 211b and that maximizes the number of a plurality of crossing nanoparticles 212.

In other words, the light extraction product 211 according to the fourth aspect includes a plurality of nanoparticles 212 having the second refractive index (n2) inside the medium having the first refractive index (n1), and the plurality of nanoparticles 212 having the second refractive index (n2) is disposed to have the predetermined spread (paper front and back direction and right and left direction) inside the center surface 211c approximately parallel to the light input surface 211a and the light output surface 211b. Further, a plurality of nanoparticles 212 crossing the center surface 211c is disposed with predetermined intervals provided therebetween inside the center surface 211c.

The distribution of nanoparticles 212 will be described next. In the light extraction product 211 according to the fourth aspect, the center surface 211c is defined by the number of nanoparticles 212 that crosses inside a virtual surface inside the light extraction product 211. More specifically, when a plurality of virtual surfaces approximately parallel to the light input surface 211a and the light output surface 211b is provided inside the light extraction product 211, a virtual surface that maximizes the number of crossing nanoparticles 212 among the plurality of virtual surfaces is set as the center surface 211c.

In the example as shown in FIG. 14, five virtual surfaces A to E are provided from the light input surface 211a side toward the light output surface 211b side between the light input surface 211a and the light output surface 211b of the light extraction product 211. Among the virtual surfaces A to E, the number of nanoparticles 212 that cross the virtual surface C near the center portion in the film thickness direction of the light extraction product 211 is 12 and is the maximum. Accordingly, the virtual surface C is the center surface 211c. In the virtual surfaces B and A on the light input surface 211a side relative to the center surface 211c, as the surface is away from the center surface 211c toward the light input surface 211a, the number of nanoparticles 212 crossing the virtual surfaces B and A monotonously decreases successively as 12, 9 to 0. Further, in the virtual surfaces D and E on the light output surface 211b side relative to the center surface 211c, as the surface is away from the center surface 211c toward the light output surface 211b, the number of nanoparticles 212 crossing the virtual surfaces D and E monotonously decreases successively as 12, 2 to 0.

Thus, in the light extraction product 211 according to the fourth aspect, a plurality of nanoparticles 212 is disposed so that the virtual surface C that maximizes the number of crossing nanoparticles 212 is the center surface 211c among the virtual surfaces A to E approximately parallel to the light input surface 211a and the light output surface 211b, and that the number of nanoparticles 212 crossing the virtual surfaces A, B, D and E decreases with distance from the center surface 211c. According to this configuration, a plurality of nanoparticles 212 having the refractive index that is substantially different from that of the medium forming the light extraction product 211 decreases with distance from the center surface 211c, and therefore, it is conceivable that as compared with the case where nanoparticles 212 are disposed randomly inside the light extraction product 211, it is possible to effectively develop the optical function based on the nanoparticles 212. By this means, since extraction efficiency is improved in the emitted light from the semiconductor light emitting device 210 due to a plurality of nanoparticles 212 near the center surface 211c, and it is also possible to extract the emitted light sufficiently when the number of nanoparticles is decreased, it is possible to actualize the light extraction product that easily extracts the light from the semiconductor light emitting device 212. Further, since the plurality of nanoparticles 212 is provided near the center surface 211c, it is possible to suppress the effect of nanoparticles 212 on the light input surface 211a, and it is thereby possible to keep flatness of the light input surface 211a excellent. Therefore, in the case of applying the light extraction product 211 according to the fourth aspect to a bottom emission type organic EL device, it is presume that it is possible to suppress a short circuit of the organic EL device, and that it is possible to improve long-term reliability of organic EL device. On the other hand, in the case of applying to a top emission type organic EL device, since adhesion of the light extraction product to the organic EL device is improved, it is possible to improve light extraction efficiency. In addition, the number of a plurality of nanoparticles 212 crossing a plurality of surfaces does not need to always monotonously decrease completely, and is intended to include dispersed aspects as appropriate within the scope of exhibiting the effects of the present invention.

Further, when the light extraction product 211 is installed on the light emitting layer surface side (for example, transparent conductive layer) of the semiconductor light emitting device 210, the emitted light inside the medium having the first refractive index (n1) is scattered by a plurality of nanoparticles 212 provided to cross a predetermined virtual surface (for example, inside the center surface 211c). Particularly, since a plurality of nanoparticles 212 is included inside the predetermined surface, uniformity is improved in extracting, with a plurality of nanoparticles 212, the oozing light oozing from the interface between the light emitting layer surface side (for example, transparent conductive layer) of the semiconductor light emitting device 210 and the light extraction product 211, it is also possible to decrease the number of nanoparticles 212 inside the light extraction product 211, and physical durability of the light extraction product 211 is improved.

Figure 15:
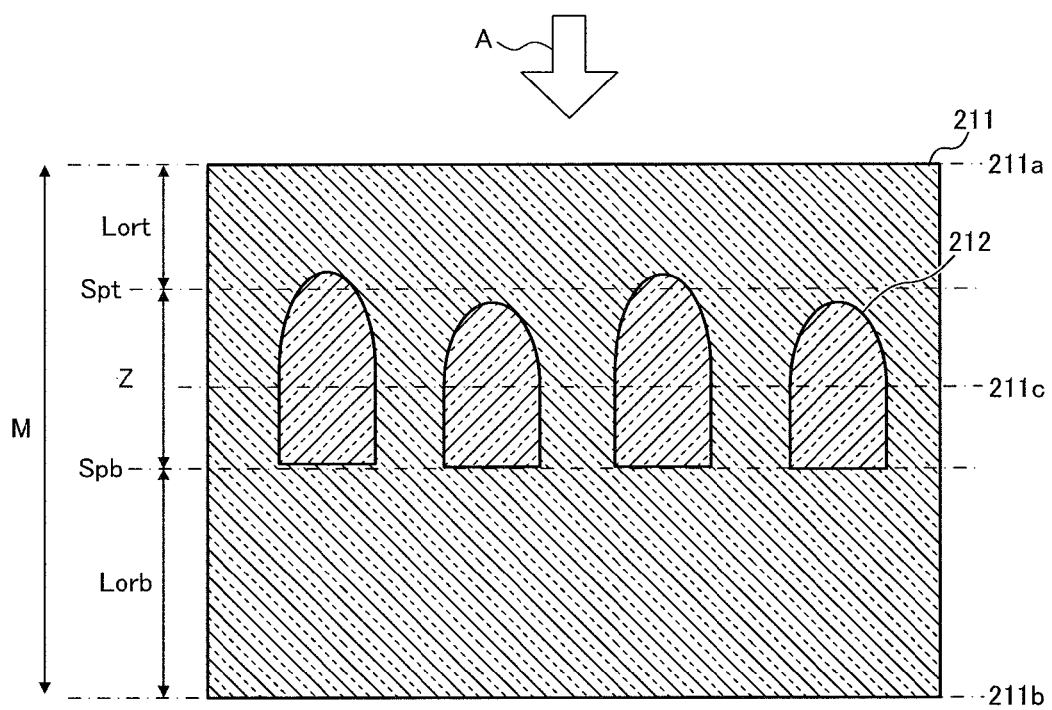
FIG. 15 is a cross-sectional schematic diagram illustrating nanoparticles in the light extraction product according to the fourth aspect.

The arrangement, shape and the like of the nanoparticles 212 according to the fourth aspect will specifically be described next. FIG. 15 is a cross-sectional schematic diagram illustrating nanoparticles in the light extraction product according to the fourth aspect. In addition, as in FIG. 14, FIG. 15 shows the cross section orthogonal to the light input surface 211a and light output surface 211b of the light extraction product 211.

Average End Portion Position (Spt)

An average end portion position (Spt) as shown in FIG. 15 is a surface approximately parallel to the light input surface 211a and the light output surface 211b of the light extraction product 211, and an average surface formed by front ends on the light input surface 211a side of a plurality of nanoparticles 212. The average end portion position (Spt) is obtained as an average value of shortest distances between the front ends on the light input surface 211a side of a plurality of nanoparticles 212 and the light input surface 211a in the film thickness direction M of the light extraction product 211. It is possible to measure the shortest distances between the front ends on the light input surface 211a side of a plurality of nanoparticles 212 and the light input surface 211a by scanning electron microscope or transmission electron microscope observation or techniques using a transmission electron microscope and energy dispersive X-ray spectroscopy. The number of averaged points to obtain the average end portion position (Spt) is preferably 20 or more.

Average End Portion Position (Spb)

An average end portion position (Spb) as shown in FIG. 15 is inside a surface approximately parallel to the light input surface 211a and the light output surface 211b of the light extraction product 211, and an average surface formed by front ends on the light output surface 211b side of a plurality of nanoparticles 212. The average end portion position (Spb) is obtained as an average value of shortest distances between the front ends on the light output surface 211b side of a plurality of nanoparticles 212 and the light output surface 211b in the film thickness direction M of the light extraction product 211. It is possible to measure the shortest distances between the front ends on the light output surface 211b side of a plurality of nanoparticles 212 and the light output surface 211b by scanning electron microscope or transmission electron microscope observation or techniques using a transmission electron microscope and energy dispersive X-ray spectroscopy. The number of averaged points to obtain the average end portion position (Spb) is preferably 20 or more. In addition, the shortest distance between the average end portion position (Spt) and the average end portion position (Spb) is an average size (hereinafter, referred to as "average thickness (Z)" of a plurality of nanoparticles 212 in the film thickness direction M of the light extraction product 211.

In a plurality of nanoparticles 212 crossing inside the center surface 211c, the average thickness (Z) in the perpendicular direction (film thickness direction M) to the center surface 211c of the light extraction product 211 preferably ranges from 10 nm to 1000 nm. When the average thickness (Z) of nanoparticles 212 is 10 nm or more, it is presumed that it is possible to sufficiently exert the thickness distribution effect of nanoparticles 212 described later, and that it is possible to significantly improve light extraction efficiency due to light scattering properties. On the other hand, when the average thickness (Z) of nanoparticles 212 is 1000 nm or less, it is possible to improve physical stability of the nanoparticles 212, and to decrease roughness of the light input surface 211a of the light extraction product 211. As a result, also in the case of relatively increasing the average pitch of a plurality of nanoparticles 212, it is possible to develop light scattering and light diffraction due to the nanoparticles 212, and light extraction efficiency is further improved. Moreover, since the size of the nanoparticles 212 is decreased moderately, it is possible to improve physical stability of the nanoparticles 212. From the viewpoint of further exerting this effect, the average thickness (Z) of nanoparticles 212 more preferably ranges from 30 nm to 800 nm, and most preferably ranges from 50 nm to 500 nm.

Further, from the viewpoints of maintaining improvements in light extraction efficiency and improvements in long-term reliability and reducing the color shift, it is preferable to provide the thickness (height) of nanoparticles 212 in the film thickness direction M of the light extraction product 211 with variations of ±25% or less. Herein, the variations are a value calculated by measuring the thickness (height) in the film thickness direction M of the light extraction product 211 of each of 20 or more nanoparticles 212. As the variations are smaller, light extraction due to diffraction is relatively higher than light extraction due to scattering. On the other hand, when the variations exist, it is conceivable that the degree of scattering properties is increased, light extraction efficiency is improved, and that it is possible to reduce the color shift. However, in the case of having variations exceeding ±25%, it is presumed that variations are increased in the distance from the light input surface 211a of the light extraction product 211 to each nanoparticle 212, nanoparticles 212 appear which reduce extraction performance of propagated light input from the light input surface 211a, and that the degree of efficiency improvement in light extraction efficiency is thereby reduced. In other words, by controlling the variations in the thickness in the film thickness direction M of nanoparticles to within ±25%, it is possible to improve light extraction efficiency, and to obtain output light near natural light with little color shift. In addition, an average value of nanoparticles 212 measured by measuring the thickness (height) in the film thickness direction M of the light extraction product 211 of each of 20 or more nanoparticles 212 corresponds to the average thickness (Z) in the film thickness direction M of nanoparticles 212.

Distance (Lort)

A distance (Lort) as shown in FIG. 15 is the shortest distance between the light input surface 211a and the average end portion position (Spt). The distance (Lort) is an average distance between the average end portion position (Spt) on the light input surface 211a side of a plurality of nanoparticles 212 and the light input surface 211a of the light extraction product 211. In other words, the distance means an average distance at which the emitted light input from the light input surface 211a propagates inside the medium having the first refractive index (n1) inside the light extraction product 211 and is scattered by the nanoparticles 212 having the second refractive index (n2).

The distance (Lort) preferably meets the range of exceeding 0 nm to 1000 nm or less. By meeting this range, when the light input surface 211a of the light extraction product 211 is brought into contact with the light emitting layer surface side (for example, transparent conductive layer) of the semiconductor light emitting device 210, since it is possible to set a moderate range on the distance between the interface between the light input surface 211a of the light extraction product 211 and the light emitting layer surface of the semiconductor light emitting device 210 and the nanoparticles 212, the oozing light derived from the waveguide mode oozing from the interface between the light input surface 211a and the light emitting layer propagates inside the medium of the first refractive index (n1), and is effectively propagated to the nanoparticles 212 having the second refractive index (n2). In other words, by meeting the above-mentioned range, it is possible to extract the propagated oozing light to the outside as light scattering or light diffraction due to the nanoparticles 212 having the second refractive index (n2), and it is thereby possible to improve light extraction efficiency of the emitted light from the semiconductor light emitting device 210.

The upper limit value of the distance (Lort) is capable of being designed as appropriate from light emitted from the light emitting layer of the semiconductor light emitting device 210. For example, when the upper limit value of the distance (Lort) is a value of 0.8λ or less with respect to the emitted light with a wavelength λ, it is possible to effectively perform extraction of the oozing light derived from the waveguide due to the nanoparticles 212. Particularly, the upper limit value of the distance (Lort) is preferably 0.65λ or less, and more preferably 0.55λ or less. In addition, within the range meeting the lower limit value of the distance (Lort) as described later, the shorter distance (Lort) is more preferable.

When a plurality of wavelength components is included in the emitted light from the light emitting device, it is possible to design the light extraction product 211 by setting the shortest wavelength or average wavelength of the light to extract as λ. For example, in the case where emission wavelengths of a semiconductor light emitting device 10 have wavelengths of RGB, in the light extraction product 211, an average wavelength of a wavelength (λR) of R (red light), a wavelength (λG) of G (green light) and a wavelength (λB) of B (blue light) may be set as the above-mentioned λ, or λB that is the shortest wavelength may be set as the above-mentioned λ. Particularly, the oozing light propagating inside the distance (Lort) decreases in the film thickness direction M of the light extraction product 211. For example, the light with a wavelength of λ decreases in the film thickness direction M (in the direction of the light output surface 211b) of the light extraction product 211, and the distance such that intensity is almost 1/e is about λ/2. Therefore, when λR, λG and λB coexist, λB attenuates fastest. Hence, among wavelengths required to extract to the outside of the semiconductor light emitting device 210, it is preferable to set the wavelength of the emitted light with the shortest wavelength as the above-mentioned λ.

From the above-mentioned viewpoint, in order to suppress attenuation when the oozing light derived from the waveguide mode propagates through the medium having the first refractive index (n1), the distance (Lort) is preferably approximately 500 nm or less, and more preferably 300 nm or less, and most preferably 150 nm or less. As the distance (Lort) is shorter in the above-mentioned range, propagation properties are more improved. On the other hand, the lower limit value of the distance (Lort) preferably exceeds 0 nm. In the case of being smaller than 0 nm, the nanoparticle 212 extends from the light input surface 211a of the light extraction product 211. In other words, such a case means a state in which the periphery of the nanoparticle 212 having the second refractive index (n2) is not completely filled with the medium having the first refractive index (n1), and roughness derived from the nanoparticle 212 occurs on the light input surface 211a.

In the case of bringing the light input surface 211a of the light extraction product 211 into contact with the light emitting layer surface side (for example, transparent conductive layer) of the semiconductor light emitting device 210, it is necessary to avoid the occurrence of a void in the interface between the light input surface 211a and the light emitting layer surface side (for example, transparent conductive layer). For example, when air is included in the interface and an air void occurs, since the refractive index of air is almost 1, a difference in the refractive index between the light emitting layer surface (for example, transparent conductive layer) of the semiconductor light emitting device 210 and air is large, the waveguide mode is promoted, and light extraction efficiency significantly decreases. Further, for example, in the case of an organic EL device, since the light emitting layer is weak against outside air, the air void significantly reduces life of the light emitting layer. Furthermore, in the case of a bottom emission light type organic EL device, when the organic EL device is formed on the light input surface to manufacture, surface accuracy of the transparent conductive layer degrades, being a cause of a short circuit. From the above-mentioned viewpoints, the minimum value of the distance (Lort) preferably exceeds 0 nm. Particularly, from the viewpoint of suppressing the occurrence of roughness on the light input surface 211a due to the shape of the nanoparticle 212, the distance (Lort) is preferably 10 nm or less, more preferably 30 nm or more, and most preferably 50 nm or more.

Distance (Lorb)

A distance (Lorb) as shown in FIG. 15 is the shortest distance between the light output surface 211b of the light extraction product 211 and the average end portion position (Spb). The distance (Lorb) is an average distance between the average end portion position (Spb) on the light output surface 211b side of a plurality of nanoparticles 212 and the light output surface 211b of the light extraction product 211. In other words, the sum of the distance (Lort), distance (Lorb) and the average thickness (Z) in the film thickness direction M of the light extraction product 211 of a plurality of nanoparticles 212 is an average thickness of the light extraction product 211.

As described above, the distance (Lort) and the average thickness (Z) of nanoparticles 212 are nanoscale. Therefore, when the distance (Lorb) is extremely small, the entire film thickness of the light extraction product 211 is extremely thin, and physical strength of the light extraction product 211 is decreased. From the viewpoint of improving physical strength of the light extraction product 211, the distance (Lorb) is preferably the distance (Lort) or more. Particularly, in order to improve continuous productivity of the light extraction product and improving convenience in applying the light extraction product to a semiconductor light emitting device, it is preferable that the distance (Lorb) is the size two times the distance (Lort) or more. In this case, it is possible to improve arrangement controllability of nanoparticles 212 arranged inside the center surface 211c. From the viewpoint of further exerting these effects, the distance (Lorb) is preferably 2.5 times the distance (Lort) or more, and most preferably 3.0 times or more. The upper limit value of the distance (Lorb) is not limited particularly. From the viewpoint of decreasing a use amount of the medium having the first refractive index (n1) and aiming at environmental support, the upper limit value is preferably 10 $\lambda$m or less, and more preferably 6 $\lambda$m or less. In addition, within the range meeting the above-mentioned range of the lower limit value, the shorter distance (Lorb) is more preferable.

Figure 16:
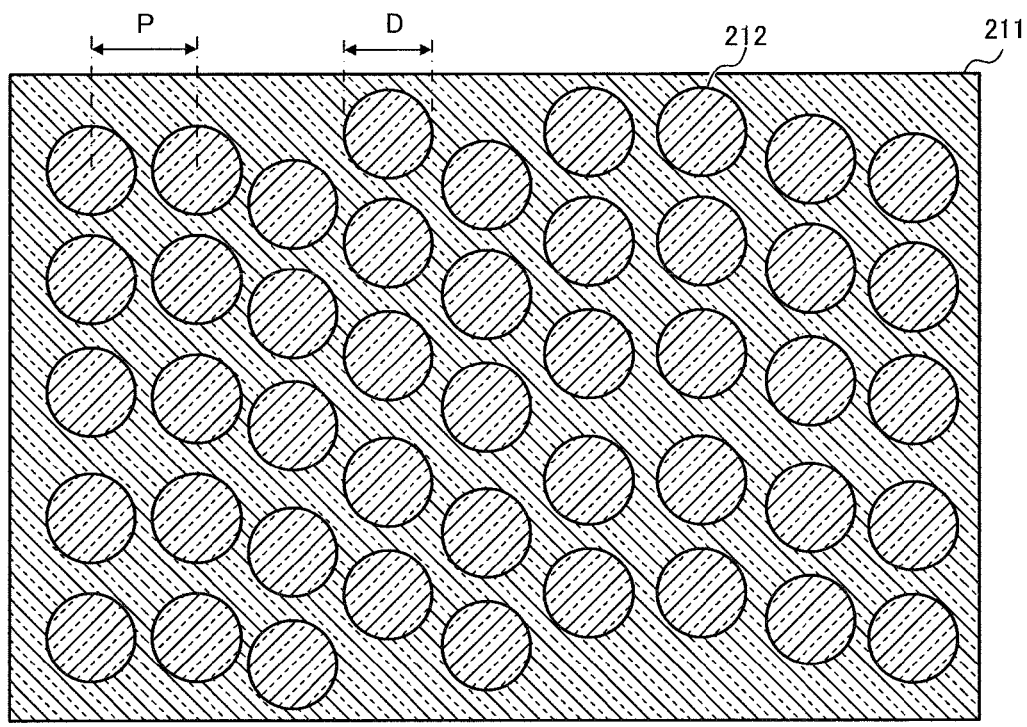
FIG. 16 is a cross-sectional schematic diagram illustrating nanoparticles inside a center surface in the light extraction product according to the fourth aspect.
Figure 17A:
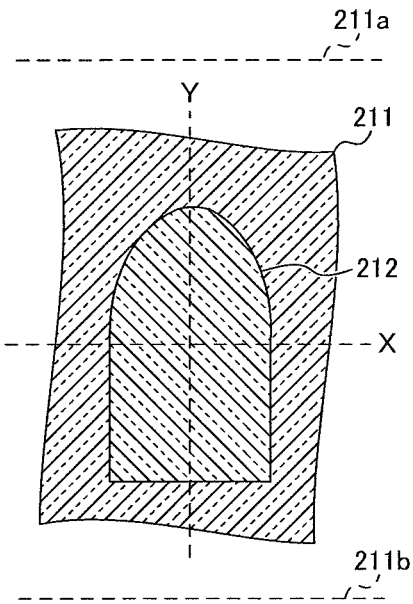
FIG. 17 contains cross-sectional schematic diagrams showing an example of shapes of nanoparticles of the light extraction product according to the fourth aspect.
Figure 17B:
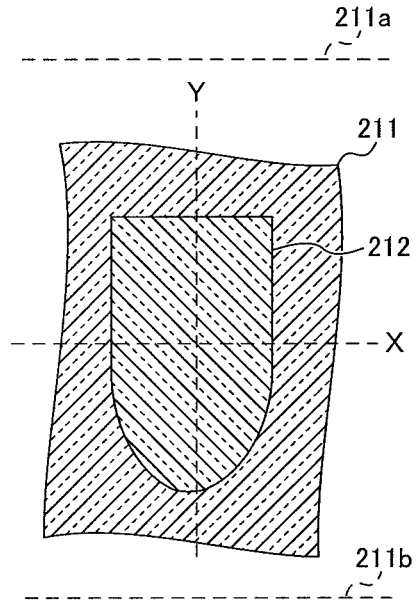
Figure 17C:
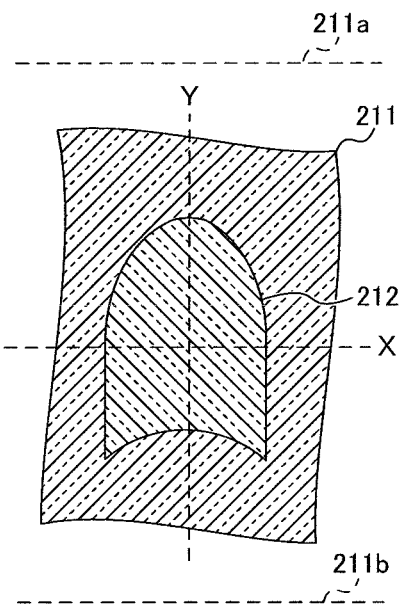
Figure 17D:
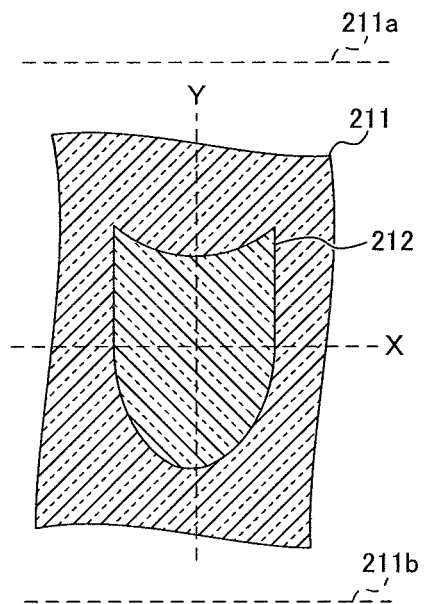

The configuration of the light extraction product 211 in a plan view will specifically be described next with reference to FIG. 16. FIG. 16 is a cross-sectional schematic diagram inside the center surface 211c of the light extraction product 211 as shown in FIG. 15. In other words, FIG. 16 shows a top plan view in slicing the light extraction product 211 along the center surface 211c as shown in FIG. 15 and observing the light extraction product 211 from the light input surface 211c. As shown in FIG. 16, since a plurality of nanoparticles crosses the center surface 211c, in observing from the light input surface 211a side, a plurality of nanoparticles 212 is disposed inside the center surface 211c while being cut inside the center surface.

Average Pitch

As shown in FIG. 16, a pitch (P) is a distance between centers of adjacent nanoparticles 212 inside the center surface 211c. Herein, in the case where the nanoparticle 212 is point symmetry in the in-plane direction of the center surface 211c, the center is a center thereof, and in the case of asymmetry, the center of gravity is defined as the center. When the pitch (P) varies with selected nanoparticles 212, a plurality of nanoparticles 212 is arbitrarily selected, and the average value of pitches (P) thereof is defined as an average pitch. In obtaining the average pitch, the number of averaged points is preferably 20 or more.

The average pitch preferably ranges from 50 nm to 1500 nm. By the average pitch being 50 nm or more, when the light input surface 211a of the light extraction product 211 comes into contact with the light emitting layer surface side (for example, transparent conductive layer) of the semiconductor light emitting device 210, extraction efficiency is improved in extracting the oozing light oozing from the interface between the light input surface 211a and the light emitting layer as light diffraction with the nanoparticles 212 having the second refractive index (n2), and it is also possible to suppress the fact that the light within the critical angle is reflected by the nanoparticle and returns to the light emitting layer surface side of the semiconductor light emitting device 210. Further, by the average pitch being 1500 nm or less, it is possible to improve the density to add light scattering properties, it is also possible to improve intensity of light scattering and light diffraction corresponding to the emitted wavelength of the semiconductor light emitting device 210, and it is conceivable that light extraction efficiency is thereby improved. Furthermore, by the average pitch being 1500 nm or less, since it is possible to suppress the effect imposed on the light input surface 211a by the nanoparticles 212, it is possible to improve flatness of the light input surface 211a. From the viewpoint of further exerting the above-mentioned effects, the average pitch more preferably ranges from 200 nm to 1000 nm, and most preferably ranges from 250 nm to 800 nm. In addition, within the range meeting the above-mentioned average pitch, the nanoparticles 212 may be in a state in which the particles are dispersed randomly in the direction inside the center surface 211c. The pitch may have the distribution of ±50% or less. In this case, it is presumed that it is possible to increase the number of modes of light diffraction on a microscopic scale such as one by one of nanoparticles. Therefore, it is conceivable that the light output from the light output surface 211b is averaged light of a plurality of diffraction mode, and that scattering properties are exhibited. In other words, by the pitch having the distribution, it is possible to further reduce the color shift in a state in which light extraction efficiency and long-term reliability is improved. From the viewpoint of color shift suppression, the distribution of the pitch is preferably ±1% or more. From the viewpoints of more increasing diffraction modes and strengthening scattering properties, the distribution of the pitch is more preferably ±5% or more, and most preferably 7% or more. On the other hand, when nanoparticles 212 are close to each other locally, the interval between the nanoparticles is sufficiently smaller than the wavelength of emitted light of the semiconductor light emitting device. In this case, the emitted light does not recognize each of the nanoparticles, and recognizes nearby nanoparticles at the same time as the distribution of the average refractive index. In other words, since the light recognizes two nearby nanoparticles as one nanoparticle, the diameter of the nanoparticle apparently increases. When the diameter of the nanoparticle increases, there is the case that a part of the emitted light is reflected by the nanoparticle, and returns to the light input surface 211a side from the inside of the light extraction product. This means reduction in light extraction efficiency. From the viewpoint of suppressing such a phenomenon, the pitch is more preferably ±35% or less, and most preferably ±20% or less. In addition, as described later, when the distribution of the pitch is provided with periodicity, it is possible to develop the light diffraction phenomenon corresponding to the distribution of the pitch. In other words, since it is possible to add macroscopic light diffraction due to a nanoparticle group to microscopic light diffraction such as one by one of nanoparticles, it is possible to actualize the arrangement of nanoparticles 212 provided with diffraction points and diffraction lattice developing a plurality of diffraction phenomena. In this case, since it is possible to concurrently develop extraction efficiency and scattering properties using light diffraction with a great light extraction effect, it is conceivable that it is possible to more develop the effects of improvement in light extraction efficiency and color shift reduction.

Average Diameter

As shown in FIG. 16, an average diameter (D) of nanoparticles 212 is an average value of diameters (D) of cut surfaces of nanoparticles 212 cut by the center surface 211c. A plurality of nanoparticles 212 is arbitrarily selected, and the average value is calculated as an average value of diameters (D) thereof. The number of averaged points is preferably 20 or more. Further, the center surface 211c in obtaining the average diameter is a center surface (not shown) set at the center between the average end portion position (Spt) and the average end portion position (Spb). Herein, the center surface is defined as described below. It is assumed that a distance between the average end portion position (Spt) and the average end portion position (Spb) is Z. The center surface is a surface descending Z/2 from the average end portion position (Spt) in the direction of the light output surface 211b i.e. a surface ascending Z/2 from the average end portion position (Spb) in the direction of the light input surface 211a.

The average diameter preferably ranges from 1 nm to 1000 nm. By the average diameter being 1 nm or more, it is possible to improve extraction efficiency of the oozing light oozing from the interface between the light emitting layer surface (for example, transparent conductive layer) of the semiconductor light emitting device 210 and the light input surface 211a. Further, by the average diameter being 1000 nm or less, it is possible to suppress the fact that the emitted light within the critical angle input from interface between the light emitting layer surface (for example, transparent conductive layer) of the semiconductor light emitting device 210 and the light input surface 211a is reflected by the nanoparticle and returns to the interface. From the viewpoint of further exerting this effect, the average diameter preferably ranges from 50 nm to 800 nm, more preferably ranges from 100 nm to 700 nm, and most preferably ranges from 200 nm to 600 nm.

The diameters of the nanoparticles 212 may have the distribution of ±25% or less. By the diameters of the nanoparticles 212 having the distribution, it is conceivable that it is possible to include the distribution in modes of light diffraction on a microscopic scale such as one by one of nanoparticles. Therefore, also when the nanoparticles 212 are arranged regularly, by the diameters of the nanoparticles having the distribution, it is possible make light diffraction modes in respectively nanoparticles different states. In other words, since the light output from the light output surface 211b with an average behavior of the macroscopic optical phenomenon observed exhibits scattering properties, it is possible to reduce the color shift. From the viewpoint of color shift reduction, the distribution of diameters of the nanoparticles 212 is preferably ±1% or more, and more preferably ±5% or more. Further, the large distribution means that nanoparticles 212 with large diameters are included. In this case, there is a possibility that a part of the emitted light is reflected by the nanoparticle with a large diameter, and that light extraction efficiency is reduced. From the viewpoint of suppressing such a phenomenon, the distribution of diameters of nanoparticles 212 is more preferably ±15% or less, and most preferably ±10% or less.

In the light extraction product 211 according to the fourth aspect, in the plurality of nanoparticles 212, it is preferable that the average pitch inside the center surface 211c ranges from 50 nm to 1500 nm, the average diameter in the in-plane direction of the center surface 211c ranges from 1 nm to 1000 nm, and that the average pitch is larger than the average diameter. According to this configuration, since regularity of the arrangement of the plurality of nanoparticles 212 inside the light extraction product 211 is in a moderate range, and it is possible to increase the density in a region in which light scattering or light diffraction occurs due to the nanoparticles 212, it is possible to effectively extract the emitted light from the semiconductor light emitting device 210 as light scattering or light diffraction due to the plurality of nanoparticles.

The shape of the nanoparticles 212 will specifically be described next. The shape of the nanoparticles 212 is not particularly, as long as the shape meets the arrangement area, size and refractive index of the nanoparticles 212 as described above. As the shape of the nanoparticles, examples thereof are a triangular prism, triangular pyramid, quadrangular prism quadrangular pyramid, polygonal prism, polygonal pyramid, circular cone, circular cylinder, elliptic cone, elliptic cylinder, shapes with the bottom thereof distorted, shapes with the side surface thereof curved, sphere, the shape of a disk, the shape of a lens, flattened ellipsoidal shape (oblate spheroid), and prolate ellipsoidal shape (prolate spheroid). Among the shapes, shapes with less corners of the bottom are preferable such as a circular cone, circular cylinder, elliptic cone and elliptic cylinder. It is presumed that by making such shapes, it is possible to further improve light extraction efficiency. When the bottom is an ellipse, the ratio (major-axis diameter/miner-axis diameter) of the major-axis diameter to the miner-axis diameter is preferably 1 or more. The case where the ratio (major-axis diameter/miner-axis diameter) is 1 is a circle. In the arrangement as described later, from the viewpoint of improving the density of nanoparticles to greatly develop light scattering properties, in the case of nanoparticles that the bottom is an ellipse, the ratio (major-axis diameter/miner-axis diameter) is preferably 5 or more.

In the case where the shape of the nanoparticles 212 has the distribution, it is possible to reduce the color shift while improving light extraction efficiency and long-term reliability, and therefore, such a case is preferable. Herein, the distribution of the shape of the nanoparticles 212 is the distribution of a variable that represents the shape of the nanoparticles 212. The shape of the nanoparticle 212 is defined by the height (thickness), angle of the side surface, the number of inflection points of the side surface, length of the side surface, area (diameter) of the flat surface of the upper surface or lower surface, curvature of the upper surface or lower surface, the number of inflection points of the upper surface or the lower surface, roughness of the upper surface, lower surface or side surface, aspect ratio (height/diameter of the lower surface or height/diameter of the upper surface), curvature formed by the upper surface or lower surface and the side surface or the like of the nanoparticle 212. These are assumed to be a variable x that represents the nanoparticle particle 212. When the ratio (standard deviation/arithmetical mean) of the standard deviation to arithmetical mean with respect to the variable x is 0.025 or more, it is conceivable that the number of diffraction modes on a microscopic scale such as one by one of nanoparticles increase, and that the light output from the light output surface is thereby provided with scattering properties.

(Arithmetical Mean)

The arithmetical mean value is defined by the following equation in the case of assuming that N measurement values of some factor (variable) X are x1, x2 ..., xn.

$$\bar{x} = \frac{\sum_{i=1}^{N} xi}{N} \qquad \text{[Math 1]}$$

(Standard Deviation)

In the case of assuming that N measurement values of some factor (variable) X are x1, x2 ..., xn, the standard deviation is defined by the following equation, using the arithmetical mean value defined as described above.

$$\sigma = \sqrt{\frac{1}{N} \sum_{i=1}^{N} (xi - \bar{x})^2} \qquad \text{[Math 2]}$$

The number N of samples in calculating the arithmetical mean is 10 or more to define. Further, the number of samples in calculating the standard deviation is determined to be the same as the number N of samples in arithmetical mean calculation.

Further, standard deviation/arithmetical mean is defined as a local value, instead of a value inside the surface. In other words, instead of measuring N points over the surface to calculate standard deviation/arithmetical mean, local observation is performed, and standard deviation/arithmetical mean in the observation range is calculated. Herein, the local range to use in observation is defined as a range about 5 times to 50 times the average pitch P. For example, when the average pitch is 500 nm, observation is performed in the observation range of 2500 nm to 25000 nm.

As described above, the shape of the nanoparticle 212 is capable of being represented by the variable, it is conceivable that the number of diffraction modes increases when standard deviation/arithmetical mean with respect to the variable is 0.025 or more, and it is possible to strongly add scattering properties. From the viewpoints of more strengthening scattering properties and reducing the color shift, standard deviation/arithmetical mean is preferably 0.03 or more. On the other hand, the upper limit value is determined from the viewpoints of extraction efficiency of the oozing light and reflection suppression of the emitted light within the critical angle, and is preferably 0.5 or less. From the viewpoints of extraction efficiency of the oozing light, reflection suppression of the emitted light within the critical angle, reduction in color shift, and controllability of the nanoparticles 212, standard deviation/arithmetical mean is preferably 0.35 or less, more preferably 0.25 or less, and most preferably 0.15 or less. Particularly, when the factor x is the height (thickness), diameter (area) of the upper surface or lower surface, or aspect ratio, the effect of scattering properties in the above-mentioned range of standard deviation/arithmetical mean is great, and therefore, such a variable is preferable. Further, it is possible to represent the arrangement of the nanoparticles 212 by making the pitch a variable x. Also in this case, meeting the above-mentioned range is preferable from the same effect.

When the pitch of the nanoparticles 212 is considered a factor forming the concavo-convex structure, from the viewpoints of more enhancing both the effects of light extraction efficiency and suppression of color shift, in the above-mentioned widest range (0.025~0.5), the above-mentioned ratio (standard deviation/arithmetical mean) preferably ranges from 0.03 to 0.4. Particularly, by being 0.03 or more, a contribution to color shift reduction is excellent due to addition of scattering properties, and by being 0.4 or less, a contribution to improvement in light extraction efficiency is excellent by suppressing reflection of the emitted light within the critical angle. From the same viewpoint, the ratio is preferably 0.035 or more, and more preferably 0.04 or more. Further, the ratio is preferably 0.35 or less, more preferably 0.25 or less, and most preferably 0.15 or less.

Further, in the case where the top (front end portion on the light input surface side) diameter of the nanoparticle 212 is different from the bottom (front end portion on the light output surface side) diameter of the nanoparticle 212, it is conceivable that it is possible to improve long-term reliability of the semiconductor light emitting device 10, in addition to the effects of light extraction efficiency improvement and color shift reduction, and therefore, such a case is preferable. In other words, it is preferable that the side surface of the nanoparticle 212 has a gradient in the thickness direction of the light extraction product 211. Since the nanoparticle 212 has such a structure having an inclination, it is possible to improve shape stability of the nanoparticle 212 and flatness of the light input surface 221a from a manufacturing method of the light extraction product 211 described later. From the viewpoint of more exerting the effects, a difference between the top (front end portion on the light input surface side) diameter of the nanoparticle 212 and the bottom (front end portion on the light output surface side) diameter of the nanoparticle 212 are different preferably by 2 times or more, different more preferably by 5 times or more, and different most preferably by 10 times or more. In addition, the most preferable is a state in which the top (front end portion on the light input surface side) diameter of the nanoparticle 212 or the bottom (front end portion on the light output surface side) diameter of the nanoparticle 212 asymptotically approaches zero i.e. the case where any flat surface does not exist on the upper surface or the lower surface of the nanoparticle 212.

Furthermore, in the above-mentioned widest range (0.02~50.5), (standard deviation/arithmetical mean) with the height (thickness) preferably ranges from 0.03 to 0.4. Particularly, by being 0.03 or more, a contribution to color shift reduction is excellent due to addition of light scattering properties, and by being 0.4 or less, a contribution to improvement in light extraction efficiency is excellent by suppressing reflection of the emitted light within the critical angle. From the same viewpoint, the ratio is preferably 0.04 or more, more preferably 0.05 or more and most preferably 0.12 or more. Further, the ratio is preferably 0.35 or less, more preferably 0.3 or less, and most preferably 0.25 or less.

FIGS. 17A to 17D are cross-sectional schematic diagrams showing an example of shapes of nanoparticles in the light extraction product according to the fourth aspect. In addition, as in FIG. 14, FIGS. 17A to 17D show the perpendicular cross section with respect to the light input surface 211a and light output surface 211b of the light extraction product 211.

As shown in FIGS. 17A to 17D, it is preferable that the shape of the nanoparticle 212 is asymmetric about a point, asymmetric about a line with respect to a line segment X in the parallel direction to the center surface 211c, and approximately symmetric about a line with respect to a line segment Y in the perpendicular direction to the center surface 211c. Herein, approximately symmetric about a line does not mean only a complete symmetric about a line, and allows symmetric about a line with symmetry distorted within the scope of exhibiting the effects of the present invention. As such a shape of the nanoparticle 212, the front end on the light input surface 211a side may protrude to the light input surface 211a side with the front end on the light output surface 211b side having a shape approximately parallel to the light output surface 211b (see FIG. 17A), or the front end on the light output surface 211b side may protrude to the light output surface 211b side with the front end on the light input surface 211a side having a shape approximately parallel to the light input surface 211a (see FIG. 17B). Further, as the shape of the nanoparticle 212, the front end on the light input surface 211a side may protrude to the light input surface 211a side with the front end on the light output surface 211b side dented toward the light input surface 211a side (see FIG. 17C), or the front end on the light output surface 211b side may protrude to the light output surface 211b side with the front end on the light input surface 211a side dented toward the light output surface 211b side (see FIG. 17D). By using such nanoparticles 212, since arrangement regularity of the nanoparticles 212 is improved inside the center surface 211c, light diffraction properties due to the nanoparticles 212 are improved, and as a result, it is possible to improve light extraction efficiency of the semiconductor light emitting device 210.

Described next is the relationship between the medium having the first refractive index (n1) and the nanoparticles 212 having the second refractive index (n2). The difference in the refractive index is directly coupled to heterogeneity of media in terms of the light. In other words, as the difference in the refractive index is larger, the light recognizes heterogeneity between media and is easy to develop optical phenomena such as light scattering and diffraction. As the difference between the second refractive index (n2) and the first refractive index (n1) is larger, the emitted light from the semiconductor light emitting device 210 strongly feels heterogeneity between the nanoparticles 212 having the second refractive index (n2) and the medium having the first refractive index (n1). As the difference between the second refractive index (n2) and the first refractive index (n1) is larger, the light recognizes that the nanoparticles 212 having the second refractive index (n2) are disposed inside the light extraction product 211. Therefore, light scattering occurs in the inter face between the nanoparticles 212 having the second refractive index (n2) and the medium having the first refractive index (n1).

In this Embodiment, the first refractive index (n1) and the second refractive index (n2) are mutually different. In the present Description, "state in which refractive indexes are mutually different" is the case where the absolute value of the difference in the refractive index is 0.1 or more. In other words, a state in which the refractive index (nA) and the refractive index (nB) are mutually different is defined as the case where the absolute value ($|nA-nB|$) of the difference in the refractive index is 0.1 or more.

In the light extraction product 211 according to the fourth aspect, from the viewpoints of extracting the oozing light due to light scattering in the interface between the medium having the first refractive index (n1) and the nanoparticles 212 having the second refractive index (n2), improving light extraction efficiency from the light output surface 211b, and reducing the color shift of the extracted light, the difference ($|n1-n2|$) in the refractive index between the first refractive index (n1) and the second refractive index (n2) in the light extraction product 211 is preferably 0.15 or more. Further, from the viewpoints of enhancing optical heterogeneity between the nanoparticles 212 and the medium constituting the light extraction product 211, and improving light scattering properties of the emitted light from the semiconductor light emitting device 210 due to the nanoparticles 212 inside the light extraction product 211, the difference ($|n1-n2|$) in the refractive index between the first refractive index (n1) and the second refractive index (n2) is more preferably 0.2 or more, further preferably 0.25 or more, and particularly preferably 0.3 or more.

Further, from the viewpoint of improving light input properties of the emitted light from the semiconductor light emitting device 210 to the medium of the first refractive index (n1), n1>n2 is preferably, and from the viewpoints of stability of the nanoparticles 212 and long-term reliability of the semiconductor light emitting device 210, n2>n1 is preferable. In order to achieve a large difference in the refractive index within the range meeting n1>n2 to enhance light scattering properties, for example, as the nanoparticles 212, it is possible to adopt hollow silica, mesoporous silica, gas typified by inert gas, liquid typified by ion liquid and the like. On the other hand, in order to achieve a large difference in the refractive index within the range meeting n2>n1 to enhance light scattering properties, for example, as the nanoparticles 212, it is possible to adopt metal nanoparticles, metal-oxide nanoparticles, organic-inorganic hybrid nanoparticles and the like. Particularly, in the case of meeting the relationship of n1>n2, by providing a concavo-convex structure on the light output surface 211b of the light extraction product 211, it is possible to suppress reflection of the extracted light in the light output surface 211b, and therefore, such a structure is preferable. Such a concavo-convex structure on the light output surface 211b will be described later.

In addition, in the present Description, "refractive indexes are substantially equal" is the case where an absolute value ($|nA-nB|$) of a difference in the refractive index between a medium (A) with the refractive index (nA) and a medium (B) with the refractive index (nB) is less than 0.1, and "refractive indexes are equal" is the case where the absolute value ($|nA-nB|$) of the difference in the refractive index between the medium (A) with the refractive index (nA) and the medium (B) with the refractive index (nB) is 0. When the refractive indexes are substantially equal, it is possible to control reflection of light in the interface between the medium (A) having the refractive index (nA) and the medium (B) having the refractive index (nB) to within 0.1% or less, and the light does almost not recognize the interface between the medium with the refractive index (nA) and the medium with the refractive index (nB). Therefore, the case where the absolute value ($|nA-nB|$) of the difference in the refractive index is less than 0.1 is defined as "refractive indexes are substantially equal".

The medium having the first refractive index (n1) will be described next. The medium having the first refractive index (n1) is preferably an optically transparent medium, because it is possible to suppress absorption attenuation of the light propagating inside the medium having the first refractive index (n1). Herein, optically transparent is defined as that an extinction coefficient (k) is zero. By k=0, it is possible to make an absorption coefficient zero. Therefore, it is possible to suppress that the emitted light guided inside the light extraction product 211 from the light input surface 211a of the light extraction product 211 is absorbed and attenuates inside the light extraction product 211 until the emitted light passes through the light output surface 211b of the light extraction product 211. Herein, the case where the extinction coefficient is zero is defined as the range meeting $k \leq 0.01$. Meeting the range enables the above-mentioned effect to be obtained and is preferable. Particularly, from the viewpoint of suppressing multiple reflection, it is more preferable that $k \leq 0.001$. In addition, smaller k is more preferable.

Materials forming the medium having the first refractive index (n1) are not particularly limited, as long as the materials meet the above-mentioned relationship between refractive indexes and extinction coefficient k. As the materials forming the medium having the first refractive index (n1), for example, it is possible to adopt an optically transparent resin, optically transparent dielectric and the like.

In addition, the medium with the first refractive index (n1) is capable of containing an other medium with the refractive index substantially equal to the first refractive index (n1). Also when a medium having another refractive index (nK) is contained inside the medium with the first refractive index (n1), since nk and n1 are substantially equal, the media behave so that only the medium of n1 exists optically. Therefore, it is possible to contain a plurality of types of other media having the refractive index substantially equal to the first refractive index (n1). By containing such another medium with the refractive index substantially equal to the first refractive index (n1), it is possible to improve physical strength and strength against a use environment of the light extraction product.

The nanoparticles 212 having the second refractive index (n2) will subsequently be described. The nanoparticles 212 having the second refractive index (n2) are not limited particularly, as long as the nanoparticles meet the relationship between refractive indexes, shape and size as described above.

Further, the nanoparticle 212 having the second refractive index (n2) may be a multilayer nanoparticle. Herein, the multilayer nanoparticle is a nanoparticle layered in the film thickness direction M of the light extraction product. For example, the case is considered that one nanoparticle 212 is constructed by layering a layer with the refractive index (nA), a layer with the refractive index (nB), and a layer with the refractive index (nC) from the light output surface 211b to the light input surface 211a side of the light extraction layer 211. In this case, when the refractive index (nC) closest to the light input surface 211a meets the above-mentioned second refractive index (n2), the other refractive indexes (nA) and (nB) do not need to meet the relationship between the second refractive index (n2) and the first refractive index (n1). In other words, as the nanoparticle 212 having the second refractive index (n2), it is essential only that the light input surface 211a side of the light extraction product 211 has the second refractive index (n2), and a layer with the refractive index different from the second refractive index (n2) may be formed on the light output surface 211b side.

The extinction coefficient of the nanoparticle 212 having the second refractive index (n2) is not limited particularly. When the nanoparticle 212 having the second refractive index (n2) is formed of dielectric such as metal oxide, being optically transparent is preferable. In other words, as the nanoparticle 212 having the second refractive index (n2), it is also possible to select a substance such as metal having absorption.

The arrangement of the nanoparticles 212 of the light extraction product 211 will specifically be described next. The arrangement of the nanoparticles 212 is defined with respect to the surface on the light input surface 211a side of the light extraction product 211 that is exposed in slicing the light extraction product 211 with the center surface 211c.

The arrangement of the nanoparticles 212 inside the center surface 211c is not limited particularly, as long as the arrangement meets the above-mentioned range of the average pitch. Further, as the arrangement of the nanoparticles 212, by adopting either the arrangement LP or the arrangement α as described below, it is possible to improve light extraction efficiency with scattering properties developed strongly. The arrangement LP and the arrangement α as described below are an example of meeting the range of standard deviation/arithmetical mean with respect to the pitch as described above. Particularly, in the case of the arrangement LP, from the principles thereof, in applying the light extraction product of the present invention to an organic EL device, it is presumed that it is possible to improve light extraction efficiency of the organic EL device, and to further adjust the color temperature.

<Arrangement of Concavo-Convex Structure>

The arrangement of the concavo-convex structure 11a of the concavo-convex structure layer 11 in the light extraction product 1 according to the above-mentioned first aspect will specifically be described next. In addition, unless otherwise specified, it is possible to use the same configuration as that of the light extraction product 1 in the light extraction product 2 according to the second aspect, the light extraction product 140 according to the third aspect, and the light extraction product 211 according to the fourth aspect.

Further, in the case where the fine structure of the concavo-convex structure layer 11 in the light extraction product 1 is comprised in the shape of palisades or in the shape of a lattice as described previously, the long-axis direction of the line is defined as the first direction D1. In a plurality of line lines arranged in the second direction D2 orthogonal to the first direction D1, the shortest distance between the center lines of adjacent lines corresponds to the pitch Px. In other words, in the description of the shape of dots as described later, the structure in the shape of palisades corresponds to a state in which the pitch Py of dot lines arranged with the pitch Py in the first direction D1 asymptotically approaches zero and adjacent dots are connected.

Further, the arrangement of the nanoparticles 212 in the light extraction product 211 according to the fourth aspect is defined with respect to the surface on the light input surface 211a side of the light extraction product 211 that is exposed in slicing the light extraction product 211 with the center surface 211c, and is defined by replacing the dot and light extraction layer with nanoparticles, the dot diameter with a nanoparticle short diameter and the dot height with a nanoparticle long diameter to read.

The concavo-convex structure 11a of the concavo-convex structure layer 11 as shown in FIG. 1 is not limited particularly, as long as the above-mentioned shape and structure enable the oozing light propagating inside the flattened layer 13 to be extracted with the light extraction layer 12 and concavo-convex structure layer 11, and it is possible to adopt a hexagonal arrangement, quasi-hexagonal arrangement, tetragonal arrangement, quasi-tetragonal arrangement and the like. Further, as the arrangement of the concavo-convex structure 11a, by adopting one of the arrangement LP, the arrangement α and the distribution DF as described below, since it is possible to develop light scattering properties more strongly in extracting the oozing light propagating inside the flattened layer 13, light extraction efficiency is improved. Furthermore, since it is possible to strengthen light scattering properties developed by controlling disturbance of the shape and arrangement of the concavo-convex structure relative to light extraction by diffraction, the color shift decreases, and it is also possible to make the semiconductor light emitting device nearer natural light. In addition, it is also possible to use the configurations shown in the arrangement LP, the arrangement α and the distribution DF as described below in the arrangement of the light extraction layer 12.

<Arrangement LP>

In the following description, the description is given by referring a plurality of convex portions 101b in the first concavo-convex structure 101a, a plurality of concave portions 111b in the second concavo-convex structure 111a and the nanoparticles 212 in the light extraction product 211 according to the fourth aspect as described above all to as "dots 230". In other words, it is possible to reflect the "dots 230" used in the following description in the arrangement of the first concavo-convex structure 101a, the arrangement of the second concavo-convex structure 111a and the arrangement of the fourth nanoparticles 212 by replacing with a plurality of convex portions 101b in the first concavo-convex structure 101a, a plurality of concave portions 111b in the second concavo-convex structure 111a or the fourth nanoparticles 211 to read.

Figure 18:
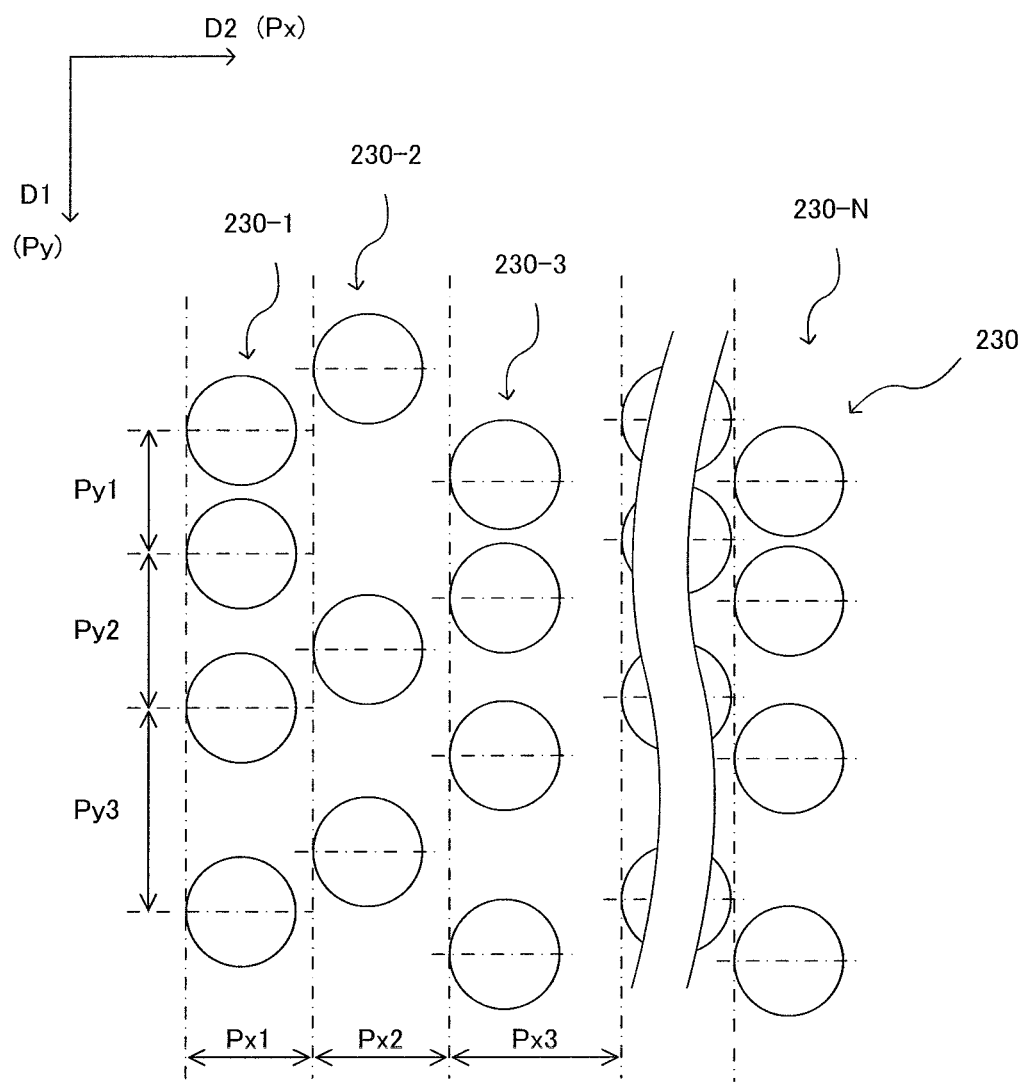
FIG. 18 is a schematic diagram illustrating an arrangement LP of a concavo-convex structure of the light extraction product according to the first aspect.

FIG. 18 is a schematic diagram illustrating the arrangement LP of the concavo-convex structure according to the first aspect, and shows a state in viewing the concavo-convex structure from the top surface. As shown in FIG. 18, dots 230 form a plurality of dot lines 230-1 to 231-N in which a plurality of dots 230 is arranged at inconstant intervals (Py) (pitch (Py)1, pitch (Py)2, pitch (Py)3, . . . ) in the first direction D1 inside the main surface of the light extraction product 1. Further, the dot lines are disposed at inconstant intervals (Px) (pitch (Px)1, pitch (Px)2, pitch (Px)3, . . . ) in the second direction D2 orthogonal to the first direction D1 inside the main surface of the light extraction product 1.

Figure 19:
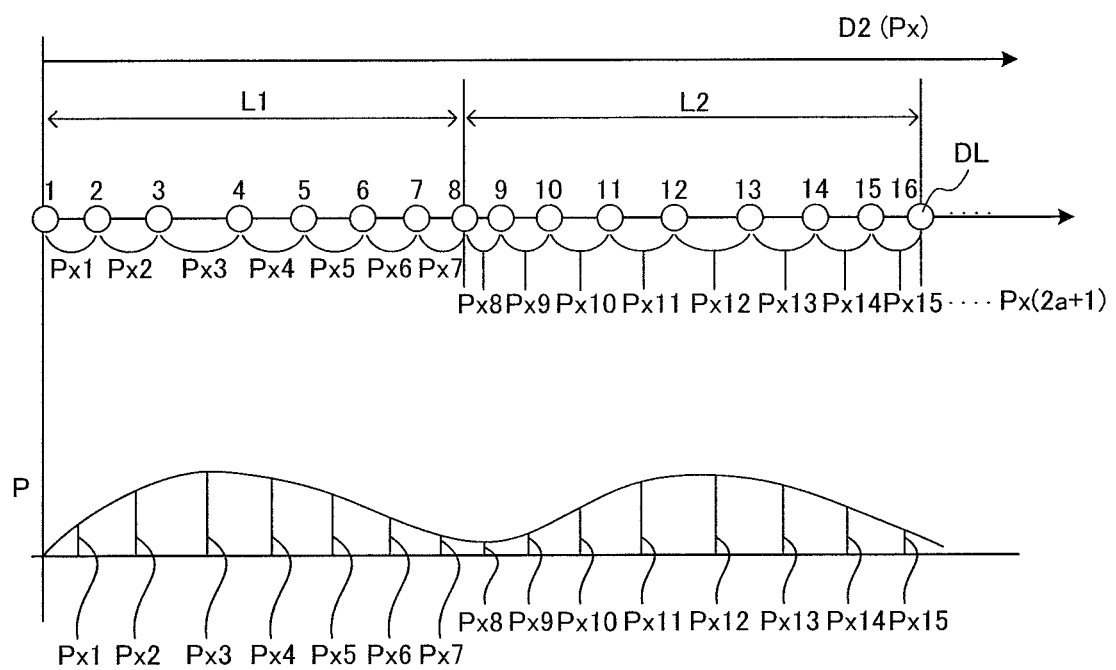
FIG. 19 is a schematic diagram showing an arrangement example of dot lines in a second direction of the concavo-convex structure of the light extraction product according to the first aspect.

Described herein is an arrangement example of dot lines in the second direction D2 disposed at inconstant intervals with mutually different pitches (Px). FIG. 19 is a schematic diagram showing an arrangement example of dot lines in the second direction D2 of the concavo-convex structure according to the first aspect. As shown in FIG. 19, in the dot lines DL in the second direction D2, eight lines are disposed at particular intervals (pitches (Px)) and eight-line dot lines DL are repeated arranged. A unit comprised of eight dot lines is referred to as along period Lz (in addition, z is a positive integer.) In addition, dots disposed at inconstant intervals with mutually different pitches (Py) in the first direction D1 are also capable of being disposed as in the following description.

The pitch (Px) is a distance between adjacent dot lines. Herein, the relationship of the following equation holds for the pitch (Px)n among at least adjacent four or more to m or less dot lines ($3 \leq n \leq 2a$ or $3 \leq n \leq 2a+1$. In addition, m and a are positive integers and n=m−1.) in the long period Lz.

$$(Px)1 < (Px)2 < (Px)3 < \ldots < (Px)a > \ldots > (Px)n$$

In addition, the diameter (bottom-portion diameter of the convex portion or the opening-portion diameter of the concave portion) of each dot 230 is smaller than the pitch (Px)n. The length from the pitches (Px)1 to (Px)n forms the long period Lz. FIG. 19 shows the case where the long-period unit Lz is comprised of eight dot lines i.e. the case of m=8. In this case, since n=7 and a=3, in the long period L1, the relationship of the following equation holds for the pitch (Px)n among dot lines.

$$(Px)1 < (Px)2 < (Px)3 > (Px)4 > (Px)5 > (Px)6 > (Px)7$$

Further, the pitches Px in the long period Lz are set so that the maximum phase deviation δ expressed by a difference between the maximum value ((Px)(max)) and the minimum value ((Px)(min)) of the pitch (Px) meets ((Px)(min))×0.01<δ<((Px)(min))×0.66, preferably ((Px)(min))×0.02<δ<((Px)(min))×0.5, and more preferably ((Px)(min))×0.1<δ<((Px)(min))×0.4.

For example, in the long-period unit L1 as shown in FIG. 19, the pitch (Px)n between dot lines is expressed as described below.

$$(Px)1 = (Px)(min)$$

$$(Px)2 = (Px)(min) + \delta a$$

$$(Px)3 = (Px)(min) + \delta b = (Px)(max)$$

$$(Px)4 = (Px)(min) + \delta c$$

$$(Px)5 = (Px)(min) + \delta d$$

$$(Px)6 = (Px)(Min) + \delta e$$

$$(Px)7 = (Px)(min) + \delta f$$

In addition, values of δa to δf meet (Px) (min)×0.01<(δa~δf)<(Px)(min)×0.5.

Further, the maximum value of z in the long period Lz is set so as to meet $4 \leq z \leq 1000$, preferably $4 \leq z \leq 100$, and more preferably $4 \leq z \leq 20$. In addition, the long periods Lz in the first direction D1 and the second direction D2 do not need to be the same as each other.

A plurality of dot lines having the relationship of the pitch (Px)n between respective dot lines as described above is defined as a dot line group, and corresponds to a dot line group having the long period L1 and a dot line group having the long period L2 as shown in FIG. 19. It is preferable that at least one or more dot line groups are arranged.

The arrangement of inconstant intervals of the pitch (Py) is defined by replacing dot lines with dots, and a plurality of dots having the relationship of the (Py)n between respective dots with a dot group to read in the arrangement example of dot lines in the second direction D2 disposed at inconstant intervals with mutually different pitches (Px) as described above. It is also preferable that at least one or more dot groups are arranged.

Further, it is preferable that when the pitch (Py) is an inconstant interval, pitches (Py)n among at least adjacent four or more to m or less dots ($3 \leq n \leq 2a$ or $3 \leq n \leq 2a+1$. In addition, m and a are positive integers and n=m−1.) meet the relationship of following equation (13), while a dot group formed with the pitches (Py)1 to (Py)n is repeatedly arranged with a long period Pyz in the first direction D1, and that when the pitch (Px) is an inconstant interval, pitches (Px)n among at least adjacent four or more to m or less dot lines ($3 \leq n \leq 2a$ or $3 \leq n \leq 2a+1$. In addition, m and a are positive integers and n=m−1.) meet the relationship of following equation (14), while a dot line group formed with the pitches (Px)1 to (Px)n is repeatedly arranged with a long period Lxz in the second direction D2.

$$(Py)1 < (Py)2 < (Py)3 < \ldots < (Py)a > \ldots > (Py)n \qquad \text{Eq. (13)}$$

$$(Px)1 < (Px)2 < (Px)3 < \ldots < (Px)a > \ldots > (Px)n \qquad \text{Eq. (14)}$$

It is preferable that each of the pitch (Px) and pitch (Py) is nano-order and ranges from 50 nm to 5000 nm. When the pitch (Px) and pitch (Py) are in this range, it is possible to extract the oozing light propagating inside the flattened layer with the concavo-convex structure layer 11 and light extraction layer 12 as scattered light and diffracted light, and it is possible to improve light extraction efficiency. In addition, each of the pitch (Px) and pitch (Py) more preferably ranges from 100 nm to 1000 nm, and most preferably ranges from 100 nm to 800 nm.

In addition, the arrangement example of dots in the first direction D1 disposed at inconstant intervals with mutually different pitches (Py) is defined by replacing dot lines with dots to read in the arrangement example of dot lines in the second direction D2 disposed at inconstant intervals with mutually different pitches (PX) as described above. The diameter (bottom-portion diameter of the convex portion or the opening-portion diameter of the concave portion) of each dot 230 is smaller than the pitch (Px) and pitch (Py).

Figure 20:
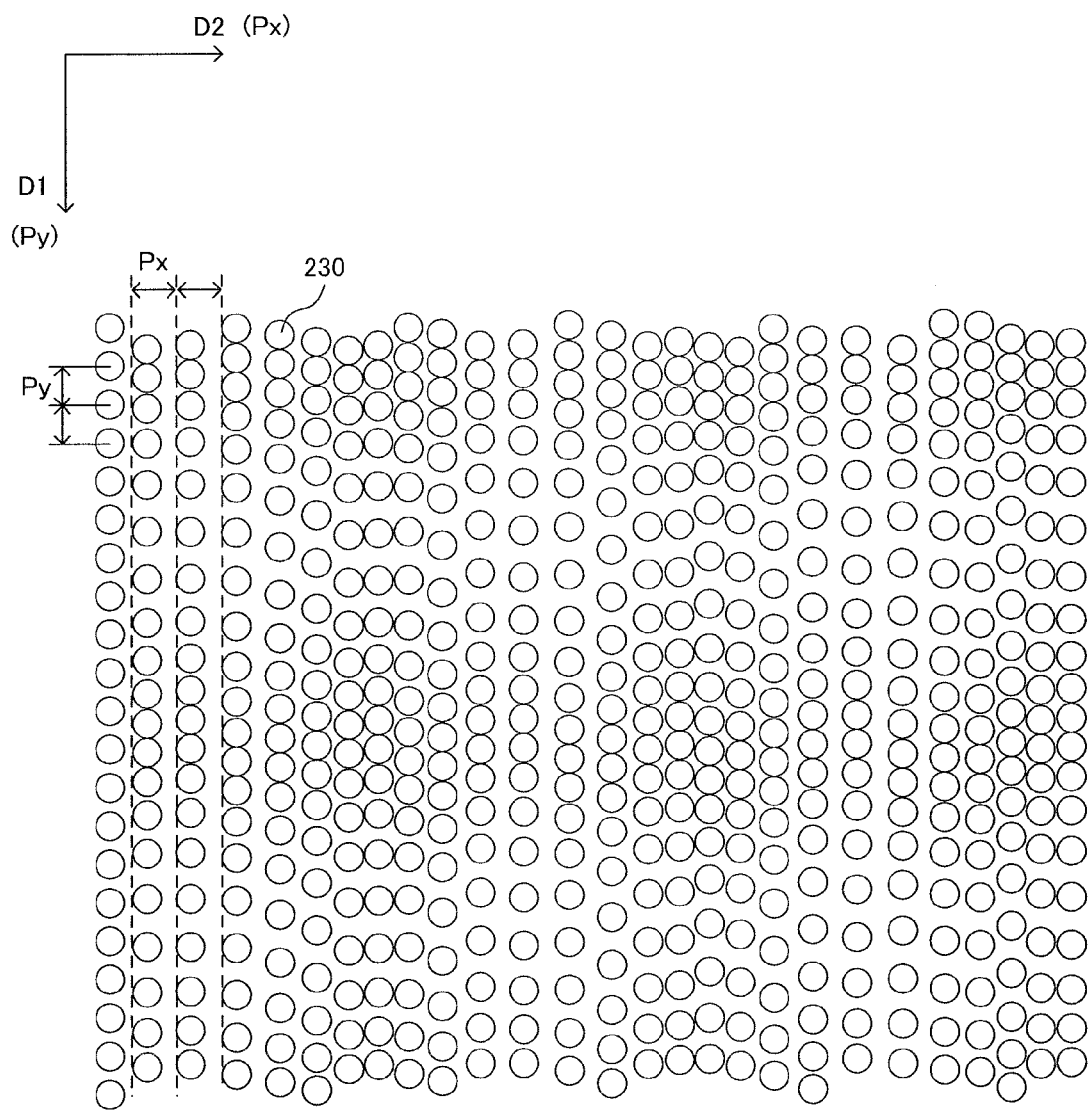
FIG. 20 is a schematic diagram illustrating another arrangement LP of the concavo-convex structure of the light extraction product according to the first aspect.
Figure 21:
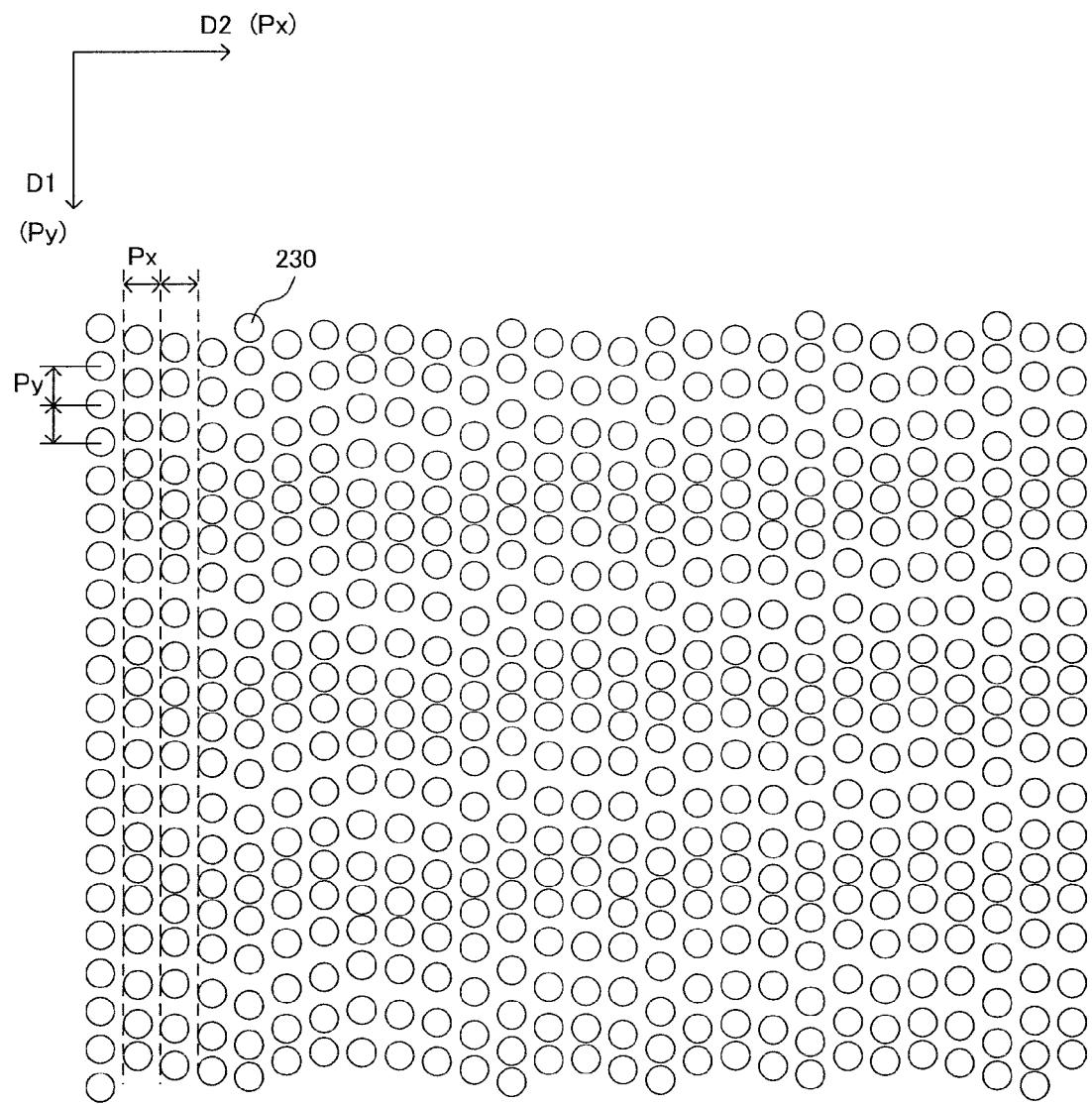
FIG. 21 is a schematic diagram illustrating still another arrangement LP of the concavo-convex structure of the light extraction product according to the first aspect.

FIGS. 20 and 21 are schematic diagrams illustrating the arrangements LP of the concavo-convex structures according to the first and second aspects. In the arrangements LP of the concavo-convex structures 101a and 111a, the arrangement may be made with pitch (Px) and pitch (Py) of inconstant intervals as described above in both the first direction D1 and the second direction D2 (see FIG. 20), or it is also possible to arrange with the pitch of the inconstant interval as described above in only either the first direction D1 or the second direction D2, and arrange with the pitch of the constant interval in the other direction (see FIG. 21). In addition, in FIG. 21, dots in the first direction D1 are arranged at inconstant intervals, and dot lines in the second direction D2 are arranged at constant intervals.

Further, when the distance between dots in the first direction or the distance between dot lines in the second direction D2 is provided at constant intervals, it is preferable that the ratio of the pitch with the inconstant interval to the pitch with the constant interval is in a particular range.

Furthermore, it is preferable that the pitch (Py) with the inconstant interval is equal to the distance between centers of respective dots, the pitch (Px) with the inconstant interval is equal to the distance among a plurality of dot lines, and that each of the pitch (Py) and the pitch (Px) is larger than the diameter of each dot.

Still furthermore, in the above-mentioned fourth concavo-convex structure 131a as shown in FIG. 12, it is preferable that the pitch (Py) with the inconstant interval is equal to the distance between center lines of palisade bodies 131c, the pitch (Px) with the inconstant interval is equal to the distance between center lines of palisade bodies 131b, and that each of the pitch (Py) and the pitch (Px) is larger than a line width of each of the palisade bodies 131b and 131c.

Moreover, in the above-mentioned third concavo-convex structure 121a as shown in FIG. 11, it is preferable that the pitch (Px) with the inconstant interval is equal to the distance between center lines of palisade bodies 121b, and that the pitch (Px) is larger than a line width of each palisade body 121b.

Described herein is an example in which dots in the first direction D1 are arranged at constant intervals (Py)c, and dot lines in the second direction D2 are arranged at inconstant intervals (Px). In this case, the ratio of the pitch (Px) with the inconstant interval to the pitch (Py)c with the constant interval is preferably in a range of 85% to 100%. When the ratio of the pitch (Px) with the inconstant interval to the pitch (Py)c with the constant interval is 85% or more, overlapping between adjacent dots is small. Further, when the ratio of the pitch (Px) with the inconstant interval to the pitch (Py)c with the constant interval is 100% or less, the filling rate of convex portions or concave portions forming the dots is improved. In addition, the ratio of the pitch (Px) with the inconstant interval to the pitch (Py)c with the constant interval is more preferably in a range of 90% to 95%.

Further, when one long period Lz is comprised of five or more dots or dot lines (in the case where the number of belonging pitches (Px) or pitches (Py) is 4 or more), variations in the long period of the refractive index in the in-plane direction of the light extraction product 1 are away from nano-order, and light scattering tends to occur. On the other hand, in order to obtain the effect of improving light extraction efficiency due to sufficient light scattering properties, long period Lz is preferably comprised of 1001 or less dots or dot lines (in the case where the number of belonging pitches (Px) or pitches (Py) is 1000 or less).

In the concavo-convex structures 101a and 111a, by repeatedly arranging the long period Lz comprised of a plurality of dots, the refractive index varies for each long period Lz, and the same effect occurs as in the case where a plurality of dots forming the long period Lz is repeated as one unit. In other words, in the case of a plurality of dots with the pitch equal to the wavelength or less, since it is possible to describe behavior of the light in the average refractive index distribution (effective medium approximate), when the spatial average refractive index distribution is calculated, the light is acted as if a plurality of dots with the long period Lz is repeated as one unit. The plurality of dots thus arranged with the long period Lz exhibits the light scattering effect. On the other hand, in the case of a plurality of dots with the pitch equal to the wavelength or more, it is conceivable that light diffraction corresponding to the pitch occurs, but the pitch is modulated in the range of the long period Lz in the dots, the diffraction angle of light diffraction for each dot is disturbed, and that scattering properties corresponding to the long period Lz are exhibited.

Furthermore, since concavities and convexities of nano-order are provided, by using diffraction in harmony with the interval of the concavities and convexities, it is possible to extract the oozing light propagating inside the flattened layer 13 in the light extraction product 1 according to the first aspect. In other words, in a local view, the oozing light propagating inside the flattened layer 13 is extracted as the diffracted light with the concavo-convex structure 101a or 111a and the light extraction layer 12. Accordingly, in terms of a wider range, it is conceivable that the light extracted by these diffraction phenomena has light scattering properties derived from the long period Lz having the averaged refractive index distribution. In other words, since it is possible to suppress output to the predetermined angle specific to the diffracted light while improving light extraction efficiency, the color shift decreases, and it is possible to obtain the emitted light nearer natural light.

Still furthermore, by making the concavo-convex structures 101a and 111a nano-order and further making both or either of the pitch (Py) and the pitch (Px) inconstant intervals, periodicity of nano-order of the concavo-convex structures 101a and 111a is disturbed, and it is possible to cause the oozing light from the light emitting layer surface (for example, transparent conductive layer) of the semiconductor light emitting device to strongly develop light scattering properties to extract. By the light scattering properties, it is possible to enhance light extraction efficiency. In addition, since uniformity of nano-order of concavities and convexities is disturbed, it is possible to reduce the color shift, and to obtain light-emitting characteristics nearer natural light, and it is thereby possible to suppress glare.

Moreover, in the case of making both the pitch (Py) and the pitch (Px) inconstant intervals, periodicity of nano-order of the concavo-convex structures 101a and 111a is disturbed, and it is possible to extract the oozing light derived from the waveguide mode oozing from the interface between the flattened layer 13 in the light extraction product 1 according to the first aspect and the light emitting layer of the semiconductor light emitting device by strong light scattering. By this means, it is possible to reduce the color shift of the emitted light extracted by diffraction, and to suppress glare.

On the other hand, when one of the pitch (Py) and the pitch (Px) is the inconstant interval, while the other one is the constant interval, as compared with the case where both the pitch (Py) and the pitch (Px) are inconstant intervals, disturbance of periodicity is decreased, and the scattering effect is reduced. Therefore, light-emitting characteristics near natural light decrease, while light extraction efficiency due to diffraction is improved.

With respect to whether to make both the pitch (Py) and the pitch (Px) inconstant intervals or one of the pitch (Py) and the pitch (Px) an inconstant interval, it is possible to select an optimal structure by selecting various manners corresponding to characteristics, use and the like of the semiconductor light emitting device. For example, in the case of general illumination uses with the color shift relatively hard to be the problem, in order to more enhance the effect of improving light extraction efficiency by diffraction, the structure may be adopted to make one of the pitch (Py) and the pitch (Px) an inconstant interval. Conversely, in the case of display uses with color characteristics and angle dependency tending to be problems, the structure may be adopted to make both the pitch (Py) and the pitch (Px) inconstant intervals.

Figure 22:
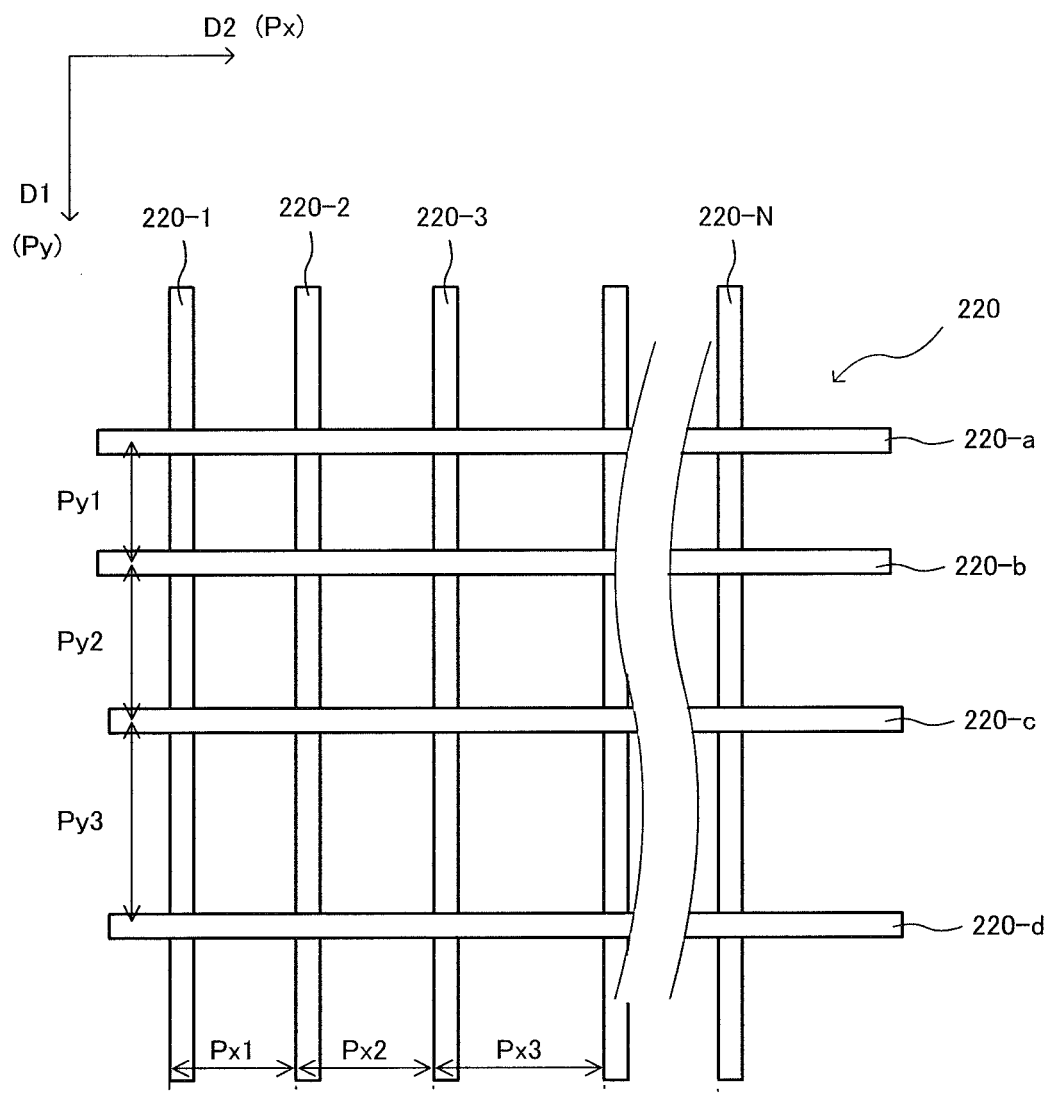
FIG. 22 is a schematic diagram illustrating a concavo-convex structure layer of the light extraction product according to the first aspect.

FIG. 22 is a schematic diagram illustrating a concavo-convex structure layer of the light extraction product according to the first aspect. FIG. 22 illustrates the concavo-convex structure layer in the case where the fine structure of the concavo-convex structure layer 11 is in the shape of a lattice as described previously, and illustrates a state of viewing the concavo-convex structure layer from the top surface. As shown in FIG. 22, palisade convex portions 220 include palisade convex portions 220-1 to 220-N extending in the first direction D1 inside the main surface of the light extraction product 1 according to the first aspect, and palisade convex portions 220-*a* to 220-*d* extending in the second direction D2 orthogonal to the first direction D1. The palisade convex portions 220-1 to 220-N extending in the first direction D1 are arranged at inconstant intervals (Px) (pitches (Px)1, (Px)2, (Px(3), . . . ) in the second direction D2. Further, the palisade convex portions 220-*a* to 220-*d* extending in the second direction D2 are arranged at inconstant intervals (Py) (pitches (Py)1, (Py)2, (Py(3), . . . ) in the first direction D1.

Herein, also in the arrangement of palisade convex portions (in FIG. 22, 220-*a* to 220-*d*) extending in the second direction D2 arranged at inconstant intervals with mutually different pitches (Px), it is possible to adopt the pitches (Py) and (Px) as shown in FIG. 22 as described previously, and it is possible to make the arrangement represented by equations (13) and (14).

In the first concavo-convex structures 101*a* and 111*a* according to Embodiments 1 and 2, it is preferable that the diameter of each of dots increases/decreases corresponding to the pitch (Py) and/or the pitch (Px). In addition, in the present invention, the diameter of each of dots increasing/decreasing corresponding to the pitch (Py) and/or the pitch (Px) refers to either of the facts that the diameter of each of dots increases or decreases as the pitch (Py) or the pitch (Px) increases.

The example in which the diameter of the dot increases or decreases corresponding to the pitch will specifically be described below.

In the light extraction product 1 according to the first aspect, it is preferable that when the pitch (Py) is the inconstant interval, dot diameters Dyn of at least adjacent four dots to m dots or less ($3 \leq n \leq 2a$ or $3 \leq n \leq 2a+1$, in addition, m and a are positive integers and n=m−1) forming the pitch meet the relationship of following equation (15) while at least one or more dot groups formed with the dot diameters Dy1 to Dyn are arranged in the first direction D1, and that when the pitch (Px) is the inconstant interval, dot diameters Dxn of at least adjacent four dots to m dots or less ($3 \leq n \leq 2a$ or $3 \leq n \leq 2a+1$, in addition, m and a are positive integers and n=m−1) forming the pitch meet the relationship of following equation (16) while at least one or more dot line groups formed with the dot diameters Dx1 to Dxn are arranged in the second direction D2.

$$Dy1 < Dy2 < Dy3 < \ldots < Dya > \ldots > Dyn \quad \text{Eq. (15)}$$

$$Dx1 < Dx2 < Dx3 < \ldots < Dxa > \ldots > Dxn \quad \text{Eq. (16)}$$

Further, in the light extraction product 1 according to the first aspect, it is preferable that when the pitch (Py) is the inconstant interval, dot diameters Dyn of at least adjacent four dots to m dots or less ($3 \leq n \leq 2a$ or $3 \leq n \leq 2a+1$, in addition, m and a are positive integers and n=m−1) forming the pitch meet the relationship of above-mentioned equation (15) while dot groups formed with the dot diameters Dy1 to Dyn are repeatedly arranged in the long-period unit Lyz in the first direction D1, and that when the pitch (Px) is the inconstant interval, dot diameters Dxn of at least adjacent four dots to m dots or less ($3 \leq n \leq 2a$ or $3 \leq n \leq 2a+1$, in addition, m and a are positive integers and n=m−1) forming the pitch meet the relationship of above-mentioned equation (16) while dot line groups formed with the dot diameters Dx1 to Dxn are repeatedly arranged in the long-period unit Lxz in the second direction.

Figure 23:
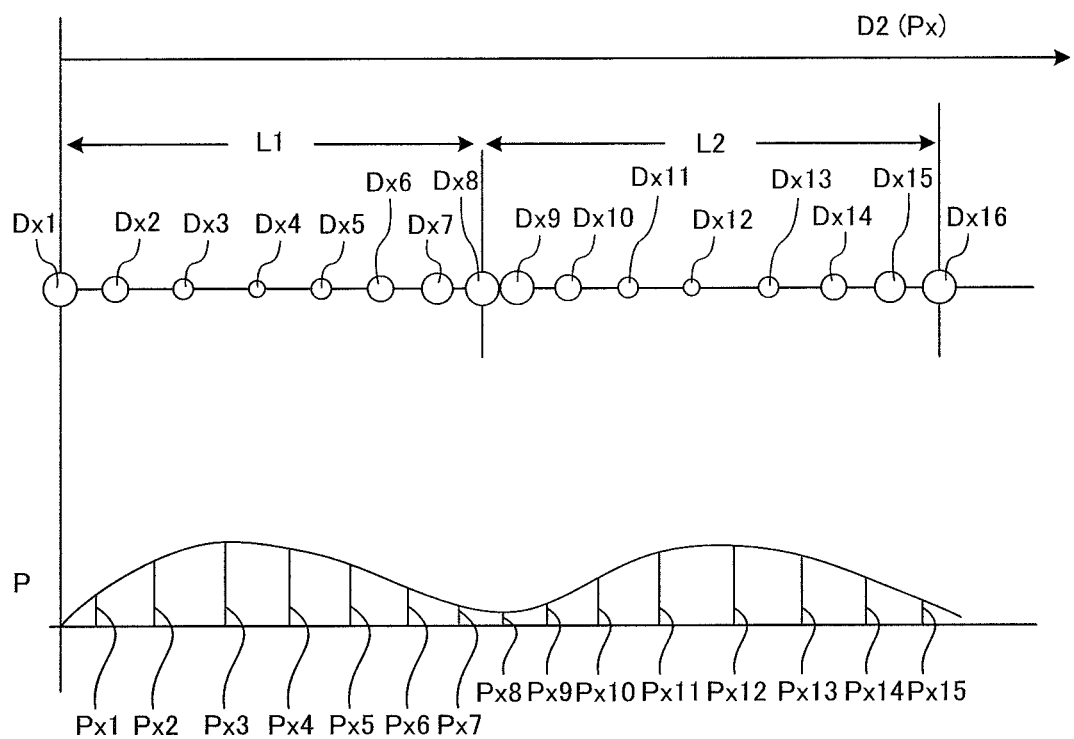
FIG. 23 is a schematic diagram showing an arrangement example of dot lines having different dot diameters in the second direction of the concavo-convex structure of the light extraction product according to the first aspect.

FIG. 23 is a schematic diagram showing an arrangement example of dot lines in the second direction D2 of the concavo-convex structure of the light extraction product according to the first aspect. FIG. 23 shows the case where the long-period unit Lxz is comprised of eight dot lines i.e. the case of m=8. In this case, since n=7 and a=3, in the long period L1, the relationship of above-mentioned equation (16) holds for the diameter Dxn of each of dots forming the dot line.

In FIG. 23, when the interval between adjacent dots widens, the dot diameter decreases, and when the dot interval narrows, the dot diameter increases. In the increase/decrease range in which the dot diameter increases and decreases, in the case of too large, adjacent dots contact each other, and such a case is not preferable. In the case of too small, light extraction efficiency is decreased, and such a case is not preferable. In the case of within ±20% with respect to the average diameter of dots in the same long-period unit Lxz, light extraction efficiency is increased, and such a case is preferable.

The above-mentioned description is given on the example where the dot diameter increases when the pitch forming the dots decreases, and similarly, when the pitch forming dots decreases, the dot diameter may decrease corresponding to the decrease. In either case, it is preferable that the long period of the decrease/increase of the dot diameter coincides with the long period of the increase/decrease of the pitch forming dots.

By the above-mentioned configuration, disturbance of periodicity due to dots with respect to emitted light is large, and light extraction efficiency is increased in the semiconductor light emitting device.

Further, in the dot shape (concavo-convex structure) constituting the fine structure of the first concavo-convex structures 101*a*, 111*a*, it is preferable that the height of each of dots increases/decreases corresponding to the pitch (Py) and/or the pitch (Px).

The example in which the height of the dot increases or decreases corresponding to the pitch will specifically be described below.

In the light extraction product 1 according to the first aspect, it is preferable that when the pitch (Py) is the inconstant interval, dot heights Hyn of at least adjacent four dots to m dots or less ($3 \leq n \leq 2a$ or $3 \leq n \leq 2a+1$, in addition, m and a are positive integers and n=m−1) forming the pitch meet the relationship of following equation (17) while at least one or more dot groups formed with the dot heights Hy1 to Hyn are arranged in the first direction D1, and that when the pitch (Px) is the inconstant interval, dot heights Hxn of at least adjacent four dots to m dots or less ($3 \leq n \leq 2a$ or $3 \leq n \leq 2a+1$, in addition, m and a are positive integers and n=m−1) forming the pitch meet the relationship of following equation (18) while at least one or more dot line groups formed with the dot heights Hx1 to Hxn are arranged in the second direction D2.

$$Hy1 < Hy2 < Hy3 < \ldots < Hya > \ldots > Hyn \quad \text{Eq. (17)}$$

$$Hx1 < Hx2 < Hx3 < \ldots < Hxa > \ldots > Hxn \quad \text{Eq. (18)}$$

Further, in light extraction product 1 according to the first aspect, it is preferable that when the pitch (Py) is the inconstant interval, dot heights Hyn of at least adjacent four dots to m dots or less ($3 \leq n \leq n2a$ or $3 \leq n \leq 2a+1$, in addition, m and a are positive integers and n=m−1) forming the pitch meet the relationship of above-mentioned equation (17) while dot groups formed with the dot heights Hy1 to Hyn are repeatedly arranged in the long-period unit Lyz in the first direction D1, and that when the pitch (Px) is the inconstant interval, dot heights Hxn of at least adjacent four dots to m dots or less ($3 \leq n \leq 2a$ or $3 \leq n \leq 2a+1$, in addition, m and a are positive integers and n=m−1) forming the pitch meet the relationship of above-mentioned equation (18) while dot line groups formed with the dot heights Hx1 to Hxn are repeatedly arranged in the long-period unit Lxz in the second direction D2.

Figure 24:
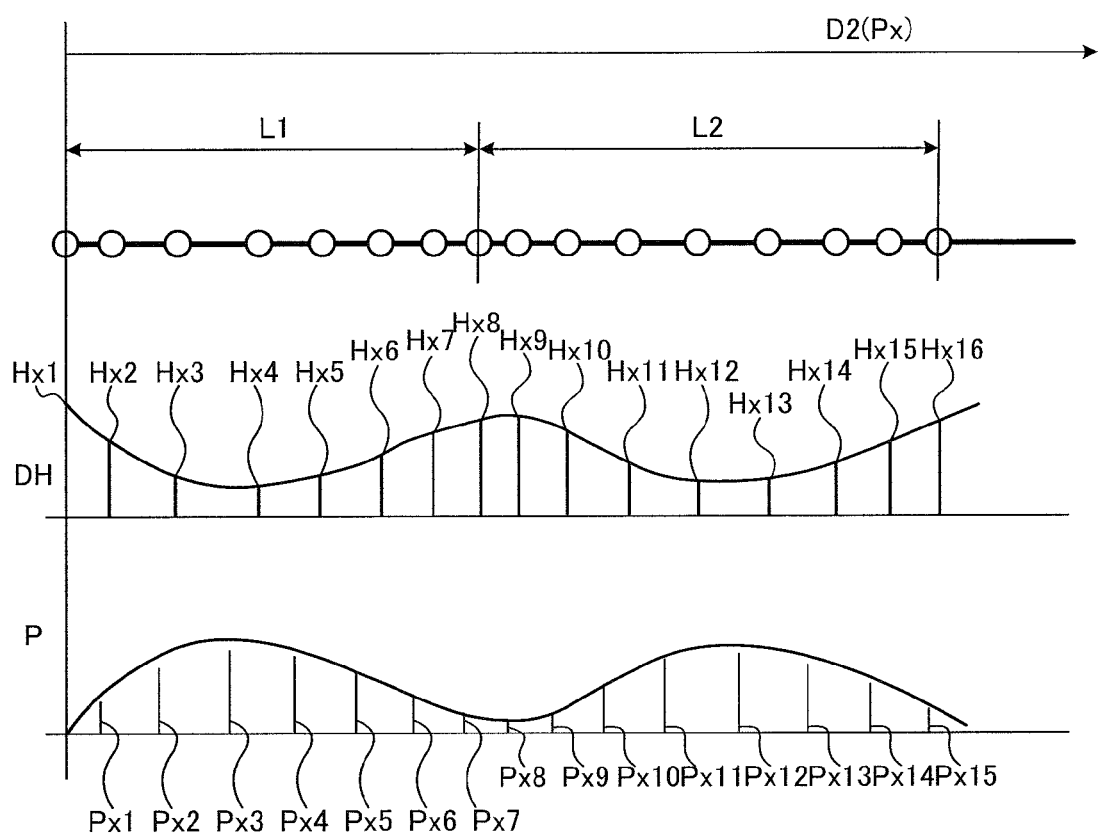
FIG. 24 is a schematic diagram showing an arrangement example of dot lines having different dot heights in the second direction of the concavo-convex structure of the light extraction product according to the first aspect.

FIG. 24 is a schematic diagram showing an arrangement example of dot lines in the second direction D2 of the concavo-convex structure of the light extraction product according to the first aspect. FIG. 24 shows the case where the long-period unit Lxz is comprised of eight dot lines i.e. the case of m=8. In this case, since n=7 and a=3, in the long period L1, the relationship of above-mentioned equation (18) holds for the height Hxn of each of dots forming the dot line.

In FIG. 24, when the interval P between adjacent dots widens, the dot height DH decreases, and when the dot interval P narrows, the dot height DH increases. In the increase/decrease range in which the dot height DH increases and decreases, in the case of too large, fluctuations in light extraction efficiency are large in the portion, and such a case is not preferable. In the case of too small, the effect of enhancing light extraction efficiency due to increase/decrease in the dot height DH decreases, and such a case is not preferable. In the case of within ±20% with respect to the average height of dots in the same long-period unit Lxz, light extraction is efficiency increases without fluctuations, and such a case is preferable.

By the above-mentioned configuration, disturbance of periodicity due to dots with respect to emitted light is large, and light extraction efficiency increases in the organic EL light emitting device.

<Arrangement α>

In the following description, the description is given by referring a plurality of convex portions $11b$ in the first concavo-convex structure $11a$, a plurality of concave portions $111b$ in the second concavo-convex structure $111a$ and the fourth nanoparticles 212 as described above all to as "dots 230". In other words, it is possible to reflect the "dots 230" used in the following description in the arrangement of the first concavo-convex structure $101a$, the arrangement of the second concavo-convex structure $111a$ and the arrangement of the fourth nanoparticles 212 by replacing with a plurality of convex portions $101b$ in the first concavo-convex structure $101a$, a plurality of concave portions $111b$ in the second concavo-convex structure $111a$ or the fourth nanoparticles 212 to read.

Figure 25A:
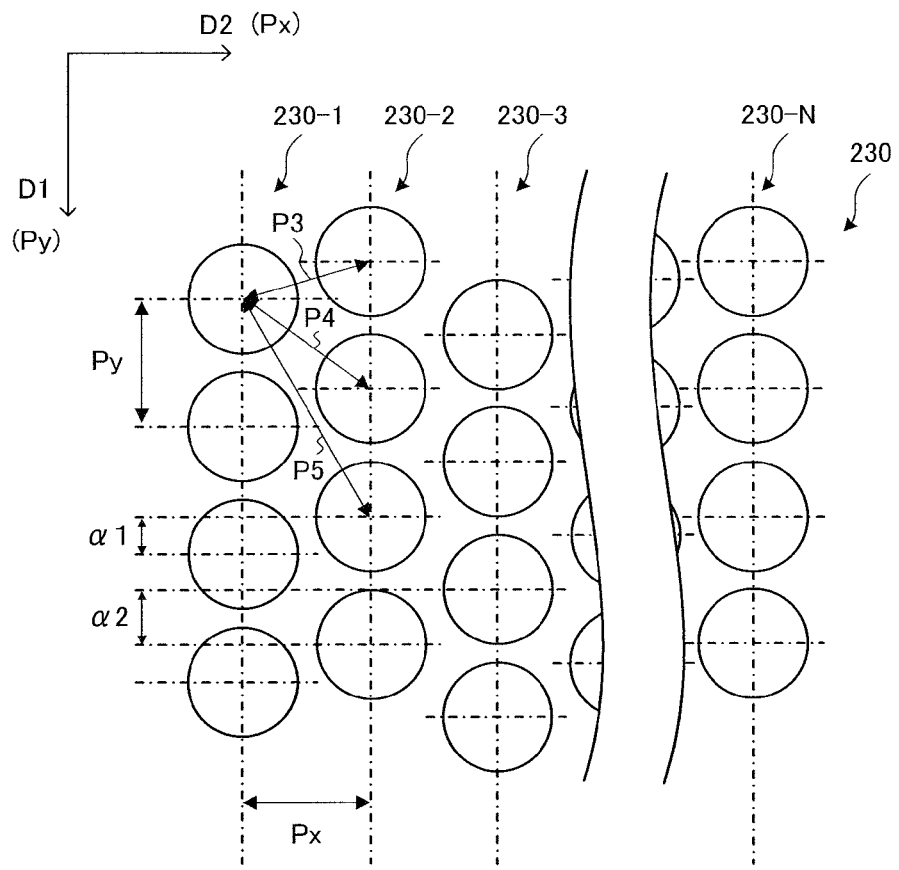
FIG. 25 contains schematic diagrams illustrating an arrangement α of a plurality of convex portions or concave portions in concavo-convex structures according to Embodiments 1 and 2.

FIG. 25 contains schematic diagrams illustrating an arrangement α of a plurality of convex portions or concave portions in the concavo-convex structures according to Embodiments 1 and 2. FIG. 25 contains explanatory diagrams illustrating the arrangement α of a plurality of convex portions $101b$ (or plurality of concave portions $111b$) in the concavo-convex structure $101a$ ($111a$), and schematically illustrates the top surface of the light extraction product 1 (2). As shown in FIG. 25A, dots 230 (convex portions $101b$ or concave portions $111b$) form a plurality of dot lines 230-1 to 230-N in which a plurality of dots 230 is arranged at inconstant intervals (Py) (pitches (Py)1, (Py)2, (Py)3, . . . ) in the first direction D1 inside the main surface of the light extraction product 1. Further, the dot lines are disposed with a pitch (Px) of a constant interval in the second direction D2 orthogonal to the first direction D1 inside the main surface (substrate main surface) of the light extraction product 1 so that a shift amount α (position difference) occurs between adjacent dot lines in the first direction D1.

In FIG. 25A, a shift amount α1 in the first direction D1 between adjacent dot lines 230-1 and 230-2 and a shift amount α2 in the first direction D1 between adjacent dot lines 230-2 and 230-3 are provided to be mutually different. According to this configuration, pitches (pitches P3 to P5 and the like) among a plurality of dots in slanting directions inside the first direction D1-second direction D2 plane are irregular (random), periodicity of the repetition pattern is decreased, and the light scattering effect is thereby exhibited. By this means, since it is possible to make extraction due to light scattering relatively larger than extraction due to diffraction, in extracting the oozing light oozing from the interface between the flattened layer 13 of the light extraction product 1 and the light emitting layer surface (for example, transparent conductive layer) of the semiconductor light emitting device, it is possible to suppress the color shift, and it is possible to obtain the emitted light nearer natural light with glare suppressed.

Further, in the light extraction product 1 according to the first aspect, it is preferable that a difference between the shift amount α1 and shift amount α2 is not constant. According to this configuration, periodicity of the repetition pattern due to a plurality of dots is further reduced, and it is possible to further exert the above-mentioned effects.

In addition, in the above-mentioned first concavo-convex structure $101a$ or second concavo-convex structure $111a$, the convex portions $101b$ and concavo portions $111b$ may be provided to coexist.

In the example as shown in FIG. 25A, the pitch (Px) refers to a distance between dot lines (convex portions $101b$ or concave portions $111b$) provided adjacently in the second direction D2. Similarly, the pitch (Py) refers to a distance between dots 230 (convex portions $101b$ or concave portions $111b$) provided adjacently in the first direction D1. In other words, the pitch (Px) and the pitch (Py) are defined by the distance between center points of the tops of the convex-portions or the distance between center point of the opening portions of the convex-portions. Herein, the center is defined as described next. When the convex-portion shape in a plan view is point symmetry, the center points of the top of the convex-portion is the center point thereof, and in the case of asymmetry, is defined by a position of the center of gravity of the convex portion in a plan view. When the concave-portion shape in a plan view is point symmetry, the center point of the opening portion of the convex-portion is the center point thereof, and in the case of asymmetry, is defined by a position of the center of gravity of the concave portion in a plan view.

In the example as shown in FIG. 25A, the shift amount α1 is defined by a difference in the position (difference in the distance) in the first direction D1 between dots, adjacently arranged in the second direction D2, forming the dot lines 230-1 to 230-N 2.

In the light extraction product 1 according to the first aspect, the pitch (Px) is preferably smaller than the pitch (Py). In the light extraction product 1, the shift amounts a in the first direction D1 among the dot lines 230-1 to 230-N are in the range of phases (0 to ±n) of the pitch (Py). Therefore, when the pitch (Px) is smaller than the pitch (Py), since the distance between dots 230 arranged adjacently is small, the filling rates of the convex portions $101b$ and concave portions $111b$ in the first and second concavo-convex portions $101a$ and $111b$ are increased.

Figure 25B:
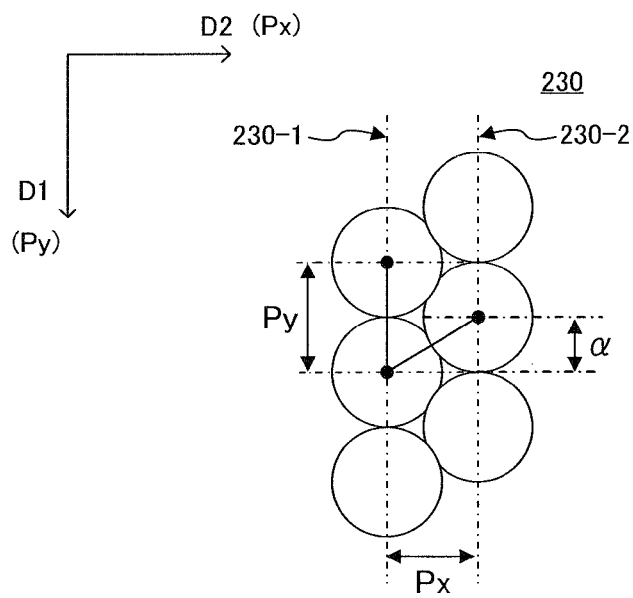

FIG. 25B shows a state in which the shift amount α is deviated at the maximum. In this case, the relationship is $(Px)=(Py) \times \sin 60°=0.866 \times (Py)$. In the example as shown in FIG. 25B, since dots 230 do not overlap one another and the shift amount α is in a maximum state, these two dot lines 230-1 and 230-2 are hexagonal closest packing, and periodicity occurs in the arrangement of dots 230. Therefore, by determining (Px) relative to (Py) as appropriate in a range to cause overlapping of dots 230 to some extent and increase the filling rate, regularity of the pattern is reduced, the light scattering properties are improved, and it is thereby possible to suppress glare by diffracted light.

In the light extraction product 1 according to the first aspect, it is preferable that the ratio of the pitch (Px) to the pitch (Py) is preferably in a range of 85% to 100%. When the ratio of the pitch (Px) to the pitch (Py) is 85% or more, overlapping of adjacent dots (convex portions 11b or concave portions 21b) is small, and therefore, such a range is preferable. When the ratio is 100% or less, the filling rate of dots (convex portions 11b or concave portions 21b) is improved, and therefore, such a range is preferable. The ratio of the pitch (Px) to the pitch (Py) is more preferably in a range of 90% to 95%.

<Distribution DF>

Figure 26:
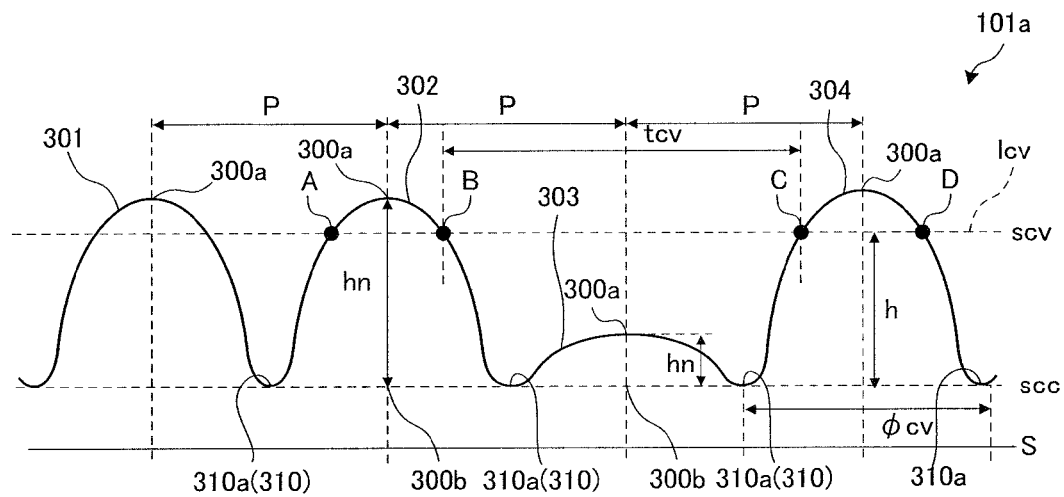
FIG. 26 is a perpendicular cross-sectional diagram along alternate long and short dashed lines VII-VII of FIG. 7.
Figure 27:
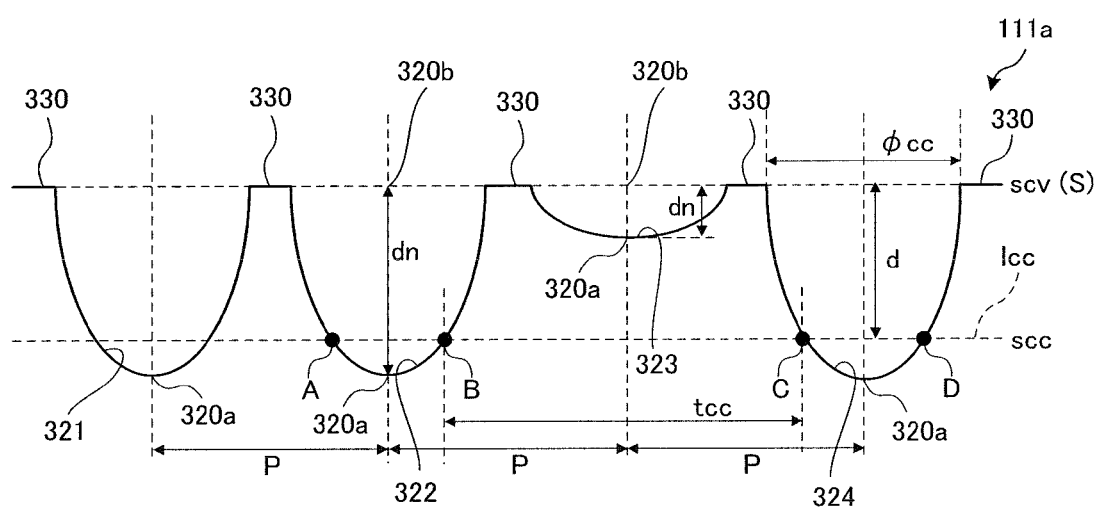
FIG. 27 is a perpendicular cross-sectional diagram along alternate long and short dashed lines IX-IX of FIG. 9.

The distribution DF will be described next with reference to FIGS. 26 and 27. FIG. 26 is a perpendicular cross-sectional diagram along alternate long and short dashed lines VII-VII of FIG. 7, and FIG. 27 is a perpendicular cross-sectional diagram along alternate long and short dashed lines IX-IX of FIG. 9. FIGS. 26 and 27 schematically illustrate configurations of the first concavo-convex structure 101a and second concavo-convex structure 111a.

The first concavo-convex structure 101a will be described first. As shown in FIG. 26, in the cross section, a plurality of convex portions 301, 302, 303 and 304 is lined at a distance away from one another. Portions among the convex portions 301 to 304 are continuously connected by a concave portion 310 (that corresponds to the concave portion 11c in FIG. 1). Definitions of various symbols and terms as shown in FIG. 26 will be described below.

First, a symbol scv as shown in FIG. 26 represents a convex-portion average position. The convex-portion average position scv means an in-plane average position of tops 300a of the convex-portions of the convex portions 301 to 304 of the first concavo-convex structure 101a. In other words, in the description herein, in the perpendicular direction to the main surface S of the concavo-convex structure layer 101, the convex-portion average position scv is defined by a position that corresponds to an average of distances from the main surface S of the concavo-convex structure layer 101 to the top 300a of the convex-portion that is the farthest position of each of the convex portions 301 to 304. The convex-portion average position scv is preferably obtained by an average of 30 or more tops 300a of the convex-portions.

As shown in FIG. 26, heights of a plurality of convex portions 301 to 304 are almost the same heights but are not uniform, and the convex portion 303 with a low height coexists in places. Therefore, the convex-portion average position scv of the convex portions 301 to 304 is a lower position than the tops 300a of the convex-portions of the convex portions 301, 302 and 304.

On the other hand, a symbol scc as shown in FIG. 26 represents a concave-portion average position. The concave-portion average position scc means an in-plane average position of tops 310a of the concave-portions of the concave portion 310 of the first concavo-convex structure 101a. In other words, in the description herein, in the perpendicular direction to the main surface S of the concavo-convex structure layer 101, the concave-portion average position scc is defined by a position that corresponds to an average of distances from the main surface S of the concavo-convex structure layer 101 to the tops 310a of the concave-portions that is the closest position of the concave portion 310.

Further, a symbol lcv as shown in FIG. 26 represents a line segment on a plane formed of the convex-portion average position scv. Accordingly, the line segment lcv is parallel to the main surface S of the concavo-convex structure layer 101. In addition, in the case of the third concavo-convex structure 121a, lcv is defined by a line segment that is parallel to the extending direction of each palisade body (convex portion) 121b, is disposed on each palisade body 121 and that is on the plane formed of the convex-portion average position.

Furthermore, a symbol h as shown in FIG. 26 represents a convex-portion average height. The convex-portion average height h is a distance between the convex-portion average position scv and the concave-portion average position scc. Accordingly, the convex-portion average height h corresponds to an average value of convex-portion heights hn of a plurality of convex portions 301 to 304 of the concavo-convex structure 111a.

Still furthermore, a symbol $\Phi cv$ as shown in FIG. 26 represents a width of the bottom of each of the convex portions 301 to 304 in the concave-portion average position scc.

A symbol tcv as shown in FIG. 26 represents the shortest distance between contours of adjacent convex portions 302 and 304 on the line segment lcv. In other words, in FIG. 26, (1) first, the line segment lcv on the plane formed of the convex-portion average position scv crosses a plurality of convex portions 301, 302 and 304. Herein, intersection points of one convex portion 302 and the line segment lcv are shown by A and B in FIG. 26. (2) Next, intersection points of the convex portion 304 that is adjacent to the convex portion 302 on the line segment lcv and the line segment lcv are shown by C and D in FIG. 26. (3) When the line segment lcy is viewed from one direction, the intersection points are aligned in the order of A, B, C and D, and among the points, a distance between the intersection points B and C is defined as tcv.

A symbol hn as shown in FIG. 26 represents a convex-portion height of each of the convex portions 301 to 304. The convex-portion height hn means a distance between a center 300b on the bottom of each of the convex portions 301 to 304 in the concave-portion average position scc and the top 300a of the convex-portion. In other words, the convex-portion height hn corresponds to a height of the top 300a of each of the convex portions 301 to 304 with respect to the concave-portion average position scc. Accordingly, an average value of convex-portion heights hn corresponds to the convex-portion average height h as described above.

A P as shown in FIG. 26 is an interval between two mutually adjacent convex portions among a plurality of convex portions 301 to 304. The interval P will specifically be described below.

The second concavo-convex structure 111a will be described next. As shown in FIG. 27, in the cross section of the light extraction product 1 according to the first aspect, a plurality of concave portions 321 to 324 is lined mutually independently. Convex portions 330 exist among the concave portions 321 to 324, and divide the concave portions 321 to 324 into one another.

Definitions of various symbols and terms as shown in FIG. 27 will be described below. A symbol scv as shown in FIG. 27 represents a convex-portion average position of the convex portions 330. The convex-portion average position scv means an in-plane average position of tops of the convex-portions of the convex portions 330 of the concavo-convex structure 111a. In other words, in the description herein, in the perpendicular direction to the main surface S of the concavo-convex structure layer 111, the convex-portion average position scv is defined by a position that corresponds to an average of distances from the main surface S of the concavo-convex structure layer 111 to the top of the convex-portion that is the closest position of each of the convex portions 300. The convex-portion average position scv is preferably obtained by an average of 30 or more tops of the convex-portions.

In addition, in this example, the main surface S of the concavo-convex structure layer 111 forms the convex portions 330, and therefore, the main surface S is substantially the same as the surface formed of the convex-portion average position scv.

Further, a symbol scc as shown in FIG. 27 is a concave-portion average position of a plurality of concave portions 321 to 324. The concave-portion average position scc means an in-plane average position of concave-portion tops 320a of the concave portions 321 to 324 of the concavo-convex structure 111a. In other words, in the description herein, in the perpendicular direction to the main surface S of the concavo-convex structure layer 111, the concave-portion average position scc is defined by a position that corresponds to an average of distances from the main surface S of the concavo-convex structure layer 111 to the top 320a of the concave-portion that is the farthest position of each of the concave portions 321 to 324. The concave-portion average position scc is preferably obtained by an average of 30 or more tops of the concave-portions.

Further, as shown in FIG. 27, depths of a plurality of convex portions 321 to 324 are almost the same but are not uniform, and the concave portion 323 with a shallow depth coexists in places. Therefore, the concave-portion average position scc of the concave portions 321 to 324 is a shallower position than the concave-portion tops 320a of the concave portions 321, 322 and 324.

A symbol lcc as shown in FIG. 27 represents a line segment on a plane formed of the concave-portion average position scc. Accordingly, the line segment lcc is parallel to the main surface S.

A symbol d as shown in FIG. 27 represents an average concave-portion depth of the concave portions 321 to 324. The average concave-portion depth d is a distance between the convex-portion average position scv and the concave-portion average position scc. In other words, d corresponds to an average value of concave-portion depths of a plurality of concave portions 321 to 324 of the concavo-convex structure 111a.

A symbol Φcc as shown in FIG. 27 represents a width of an opening portion of each of a plurality of concave portions 321 to 324 in the convex-portion average position scv.

A symbol dn as shown in FIG. 27 represents a concave-portion depth of each of a plurality of concave portions 321 to 324. The concave-portion depth dn means a distance between a center 320b of the opening portion of each of the concave portions 321 to 324 in the convex-portion average position scv and the top 320a of the concave-portion of each of the concave portions 321 to 324. In other words, the concave-portion depth dn is a depth of each of the concave portions 321 to 324 with respect to the convex-portion average position scv. Accordingly, an average value of concave-portion depths dn corresponds to the average concave-portion depth d as described above.

A symbol tcc as shown in FIG. 27 represents the shortest distance between contours of adjacent concave portions 322 and 324 on the line segment lcc. In other words, in FIG. 27, (1) first, the line segment lcc on the plane formed of the concave-portion average position scc crosses a plurality of concave portions 321, 322 and 324. Herein, intersection points of one concave portion 322 and the line segment lcc are shown by A and B in FIG. 27. (2) Next, intersection points of the concave portion 324 that is adjacent to the concave portion 321 on the line segment lcc and the line segment lcc are shown by C and D in FIG. 27. (3) When the line segment lcc is viewed from one direction, the intersection points are aligned in the order of A, B, C and D, and among the points, a distance between the intersection points B and C is defined as tcv.

A P as shown in FIG. 27 is an interval between two mutually adjacent portions among a plurality of concave portions 321 to 324. The interval P will specifically be described below.

With respect to the convex-portion average position scv and the concave-portion average position scc as described above, arbitrary portions are selected from among the convex portions 300 and concave portions 320 of the concavo-convex structures 11a and 21a as samples, and averages thereof are obtained. In the present invention, it is preferable that the number of the convex portions 300 or concave portions 320 to select as samples in obtaining these averages is 30 or more.

The first concavo-convex structure 101a in the distribution DF will specifically be described below using the above-mentioned definitions of symbols and terms. In addition, the following description is the same as in the third concavo-convex structure 121a as shown in FIG. 11, and the fourth concavo-convex structure 131a as shown in FIG. 12. First, the pitch P meets the following condition in the distribution DF.

$$50 \text{ nm} \leq P \leq 5000 \text{ nm}$$

When the pitch P ranges from 50 nm to 5000 nm, it is possible to effectively extract the oozing light of the emitted light derived from the waveguide mode oozing from the interface between the flattened layer 13 of the light extraction product 1 according to the first aspect and the light emitting layer surface (for example, transparent conductive layer) of the semiconductor light emitting device by light diffraction or/and light scattering. Particularly, from the viewpoint of further exerting the above-mentioned effect, the pitch P preferably meets 50 nm≤P≤800 nm, and more preferably meets 100 nm≤P≤500 nm.

Further, in the first concavo-convex structure 101a according to Embodiment 1, as shown in FIG. 26, the convex-portion heights hn of a plurality of convex portions 301 to 304 are not uniform, and like the convex portion 303 as shown in FIG. 26, the convex portion (hereinafter, referred to as a minimum convex portion) with the convex-portion height hn lower than the convex portions 301, 302 and 304 having almost the same convex-portion heights i.e. with the convex-portion height hn lower than the convex-portion average height h exists with a predetermined probability. In other words, the convex-portion height hn of the minimum convex portion meets following equation (19) with respect to the convex-portion average height h that corresponds to the distance between the convex-portion average position scv and the concave-portion average position scc of the first concavo-convex structure 101a, and the probability Z (hereinafter, also referred to as an existence probability) with which the minimum convex portion exists meets following equation (20).

$$0.9h \geq hn \qquad \text{Eq. (19)}$$

$$1/10000 \leq Z \leq 1/5 \qquad \text{Eq. (20)}$$

Herein, as the probability Z, for the first concavo-convex structure 101a, convex-portion heights hn of a plurality of convex portions 300 existing in some range are measured, and convex portions 300 with the convex-portion height hn meeting the condition of Eq. (19) are judged as minimum convex portions. Next, the total number of convex portions 300 and the total number of minimum convex portions are counted, and it is possible to obtain the probability Z with the total number of convex portions 320 as the denominator and the total number of minimum convex portions as the numerator.

By the existence of the minimum convex portions with the convex-portion height hn meeting Eq. (19), it is conceivable that it is possible to provide extraction due to light diffraction with light scattering properties. As the convex-portion height hn of the minimum convex portion, from the viewpoint of more exerting light scattering properties, it is preferable to meet 0.8h≥hn, it is more preferable to meet 0.6h≥hn, and it is the most preferable to meet 0.3h≥hn.

Particularly, by the existence probability Z of the minimum convex portion meeting Eq. (19) meeting Eq. (20), it is possible to achieve improvements in light extraction efficiency based on addition of scattering properties. From the viewpoint of addition of light scattering properties, the existence probability Z preferably meets 1/3000≤Z≤1/10, more preferably meets 1/1000≤Z≤1/10, and most preferably meets 1/500≤Z≤1/10.

Further, it is preferable that the above-mentioned distance tcv meets following equation (21) with respect to the pitch P of the convex portions 301 to 304.

$$1.0P<tcv≤9.5P \qquad \text{Eq. (21)}$$

As shown in FIG. 26, since the distance tcv represents the shortest distance between contours of the convex portion 302 and convex portion 304 adjacent on the line segment lcv, it is meant that the number and size of the minimum convex portion (303 in FIG. 26) existing between the portions are limited not to exceed the maximum value of 9.5P.

By the distance tcv meeting Eq. (21), it is conceivable that it is possible to significantly provide light extraction with light scattering properties and to suppress reflection of the oozing light of the emitted light derived from the waveguide mode, and that light extraction efficiency is thereby further improved. As the distance tcv, from the viewpoint of further exerting the effect, it is more preferable to meet 1.0P<tcv≤4.5P, and it is the most preferable to meet 1.0P<tcv≤1.5P.

Further, it is preferable that the convex-portion height hn of the minimum convex portion meets following equation (22), the existence probability Z meets following equation (23), and that the distance tcv meets following equation (24). In this case, by the convex-portion height hn of the minimum convex portion meeting equation (22), it is possible to add strong scattering properties on a nanoscale, and by the existence probability Z meeting equation (23) at the same time, since the degree of comprehensive scattering properties is improved, the light extraction power is increased. Furthermore, by the distance tcv meeting equation (24), it is conceivable that it is possible to suppress reflection of the oozing light of the emitted light derived from the waveguide mode, and that light extraction efficiency is further improved.

$$0.6h≥hn \qquad \text{Eq. (22)}$$

$$1/3000≤Z≤1/10 \qquad \text{Eq. (23)}$$

$$1.0P<tcv≤4.5P \qquad \text{Eq. (24)}$$

Furthermore, in this case, from the viewpoint of adding light scattering properties on a nanoscale, it is preferable that the height hn of the minimum convex portion meets following equation (25). Also in this case, since the ranges of the existence provability shown in Eq. (23) and the distance tcv shown in Eq. (24) are met, it is presumed that it is possible to perform light extraction by comprehensive light scattering properties due to strengthened scattering properties on a nanoscale.

$$0.1h≥hn \qquad \text{Eq. (25)}$$

Still furthermore, the aspect ratio hn/Φcv of each of the convex portions 301 to 304 is the ratio hn/Φcv between the width Φcv of the bottom and the convex-portion height hn of each of the convex portions 301 to 304 of the concave-convex structure 101a. From the viewpoints of light diffraction, light scattering properties, and physical stability of the light extraction layer, the aspect ratio hn/Φcv is preferably in the range of 0.1 to 3.0. Particularly, from the viewpoint of further exerting this effect more, the aspect ratio hn/Φcv preferably ranges from 0.5 to 2.5. In addition, in the third concavo-convex structure 121a and fourth concavo-convex structure 131a, the aspect ratio is similarly defined as hn/Φcv, and Φcv is defined as a width of the bottom of the palisade body.

The second concavo-convex structure 111a in the distribution DF will specifically be described next. First, the interval (pitch) P of the concave portions 111b (320) meets the following condition.

$$50\text{ nm}≤P≤5000\text{ nm}$$

When the pitch p ranges from 50 nm to 5000 nm, it is possible to effectively extract the oozing light of the emitted light derived from the waveguide mode oozing from the interface between the flattened layer 13 of the light extraction product 1 according to the first aspect and the light emitting layer surface (for example, transparent conductive layer) of the semiconductor light emitting device by light diffraction or/and light scattering. Particularly, from the viewpoint of further exerting the above-mentioned effect, the pitch P preferably meets 50 nm≤P≤800 nm, and more preferably meets 100 nm≤P≤500 nm.

Further, in the second concavo-convex structure 111a, as shown in FIG. 27, the concave-portion depths dn of a plurality of concave portions 321 to 324 are not uniform, and like the concave portion 323 as shown in FIG. 27, the concave portion (hereinafter, referred to as a minimum concave portion) with the concave-portion depth dn lower than a plurality of concave portions 321, 322 and 324 having almost the same concave-portion depths i.e. with the concave-portion depth dn lower than the average concave-portion depth d exists with a predetermined probability. In other words, it is a feature that the concave-portion depth dn of the minimum concave portion meets following equation (26) with respect to the concave-portion average depth d that corresponds to the distance between the convex-portion average position scv and the concave-portion average position scc of the second concavo-convex structure 111a, and that the probability Z (hereinafter, also referred to as an existence probability) with which the minimum concave portion exists meets following equation (20).

$$1/10000≤Z≤1/5 \qquad \text{Eq. (20)}$$

$$0.9d≥dn \qquad \text{Eq. (26)}$$

Herein, as the probability Z, for the second concavo-convex structure 111a, concave-portion depths dn of a plurality of concave portions 320 existing in some range are measured, and concave portions 320 with the concave-portion depth dn meeting the condition of Eq. (26) are judged as minimum concave portions. Next, the total number of concave portions 320 and the total number of minimum concave portions are counted, and it is possible to obtain the probability Z with the total number of concave portions 320 as the denominator and the total number of minimum concave portions as the numerator.

By the existence of the minimum concave portions with the concave-portion depth dn meeting Eq. (26), it is possible to provide extraction due to light diffraction with light scattering properties. From the viewpoint of more exerting light scattering properties, the concave-portion depth dn preferably meets 0.8d≥dn, more preferably meets 0.6d≥dn, and most preferably meets 0.3d≥dn.

Particularly, by the probability Z with which the minimum convex portions meeting Eq. (26) exist meeting Eq. (20), it is possible to achieve improvements in light extraction efficiency based on addition of scattering properties. From the viewpoint of addition of light scattering properties, the probability Z preferably meets $1/3000 \le Z \le 1/10$, more preferably meets $1/1000 \le Z \le 1/10$, and most preferably meets $1/500 \le Z \le 1/10$.

Further, in the second concavo-convex structure 111a, it is preferable that the above-mentioned distance tcc meets following equation (27) with respect to the interval (pitch) P of the concave portions 320.

$$1.0P < tcc \le 9.5P \qquad \text{Eq. (27)}$$

As shown in FIG. 27, since the distance tcc represents the shortest distance between contours of the concave portion 322 and concave portion 324 adjacent on the line segment lcc, it is meant that the number and size of the minimum concave portion (323 in FIG. 27) existing between the portions are limited not to exceed the maximum value of 9.5P.

By the distance tcc meeting Eq. (27), it is conceivable that it is possible to significantly provide light extraction with light scattering properties and to suppress reflection of the oozing light of the emitted light derived from the waveguide mode, and that light extraction efficiency is thereby further improved. As the distance tcc, from the viewpoint of further exerting this effect, it is more preferable to meet $1.0P < tcc \le 4.5P$, and it is the most preferable to meet $1.0P < tcc \le 1.5P$.

Further, it is preferable that the concave-portion depth dn of the minimum concave portion meets following equation (28), the existence probability Z meets following equation (29), and that the distance tcc meets following equation (30). In this case, by the concave-portion depth do of the minimum concave portion meeting equation (28), it is possible to add strong scattering properties on a nanoscale, and by the existence probability Z meeting equation (29) at the same time, since the degree of comprehensive scattering properties is improved, it is presumed that it is possible to perform light extraction by comprehensive light scattering properties due to strengthened scattering properties on a nanoscale.

$$0.6d \ge dn \qquad \text{Eq. (28)}$$

$$1/3000 \le Z \le 1/10 \qquad \text{Eq. (29)}$$

$$1.0P < tcc \le 4.5P \qquad \text{Eq. (30)}$$

Furthermore, in this case, from the viewpoint of adding light scattering properties on a nanoscale, it is preferable that the concave-portion depth dn of the minimum concave portion meets following equation (31). Also in this case, since the ranges of the existence provability Z shown in Eq. (29) and the distance tcc shown in Eq. (30) are met, it is presumed that it is possible to perform light extraction by comprehensive light scattering properties due to strengthened scattering properties on a nanoscale.

$$0.1d \ge dn \qquad \text{Eq. (31)}$$

Still furthermore, the aspect ratio $d/\Phi cc$ of the concave portion 320 is the ratio between the width $\Phi cc$ of the opening portion and the concave-portion depth dn of the concave portion 320 of the concave-convex structure 111a. From the viewpoints of light diffraction, light scattering properties, and physical stability of the light extraction layer, the aspect ratio $d/\Phi cc$ is preferably in the range of 0.1 to 3.0. Particularly, from the viewpoint of further exerting this effect more, the aspect ratio $hn/\Phi cc$ preferably ranges from 0.5 to 2.5.

The shape distribution of the nanoparticles 212 will specifically be described next. Also in the nanoparticles 212, by adopting the distribution DF described below, it is possible to improve light extraction efficiency with scattering properties strongly developed.

Figure 28:
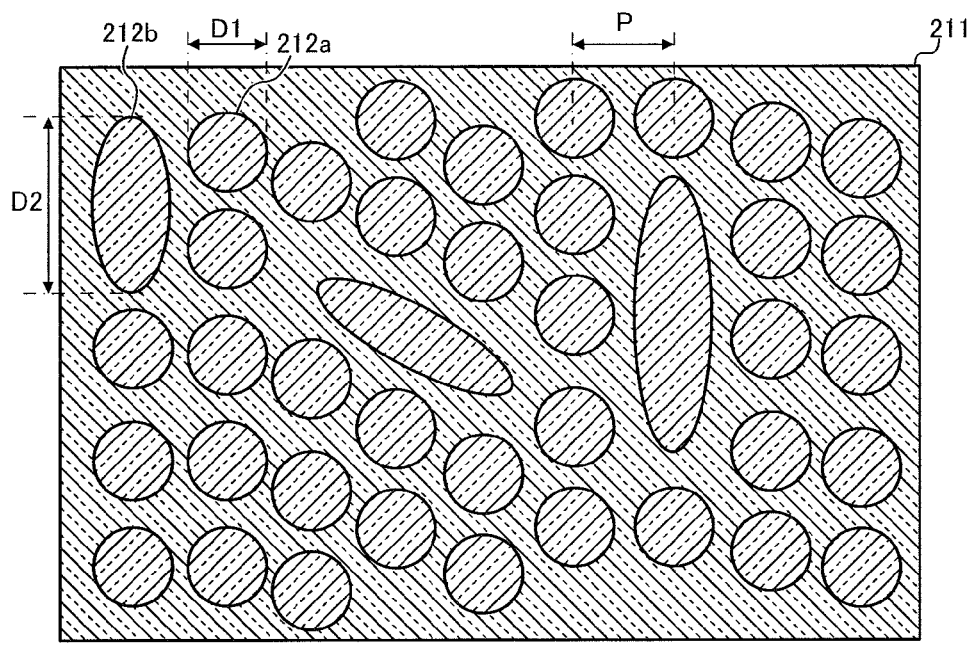
FIG. 28 is a cross-sectional schematic diagram illustrating a shape distribution DF of nanoparticles of the light extraction product according to the fourth aspect.

FIG. 28 is a cross-sectional schematic diagram illustrating the shape distribution DF of the nanoparticles according to the fourth aspect, and illustrates a state of viewing, from the light input surface 211a side, a state in which the light extraction product 211 is sliced with the center surface 211c. As shown in FIG. 28, in the cross-sectional shapes cut with the center surface 211c, the nanoparticles 212 include a plurality of first nanoparticles 212a having a first diameter (D1) and a plurality of second nanoparticles 212b having a second diameter (D2) larger than the first diameter (D2). Herein, the diameters (D1, D2) mean the maximum diameters of respective nanoparticles 212a and 212b.

In the example as shown in FIG. 28, the average pitch is obtained by measuring arbitrarily 20 or more inter-center distances of adjacent nanoparticles 212a and 212b with respect to all the first nanoparticles 212a and second nanoparticles 212b, and is determined as an average value thereof. Nanoparticles having the first diameter (D1) that is a diameter (D) smaller than the average pitch are defined as the first nanoparticles 212a. Further, nanoparticles having the second diameter (D2) that is a diameter (D) larger than the average pitch are defined as the second nanoparticles 212b. The diameter of the second nanoparticle 212b having the second diameter (D2) is larger than the average pitch, and is a size 9.5 times the average pitch or less. By meeting these ranges, first, the distribution occurs in the nanoparticle diameter, the distribution in the direction of the center surface of the medium with the second refractive index (n2) is large, in terms of the light input to the medium with the first refractive index (n1) from the light input surface 211a. In other words, it is conceivable that light scattering properties are exhibited. As a result, light scattering properties are strongly exhibited, and it is presumed that it is possible to improve light extraction efficiency, and that it is possible to suppress the color shift. In addition, the diameter of the nanoparticle is defined using the maximum diameter.

In addition, when the diameter of the second nanoparticle 212b is 9.5 times the average pitch or less, it is meant that an upper limit is set on the maximum size of the second nanoparticle 212b. By limiting the size of the second nanoparticles 212, it is possible to suppress reflection of the light in the interface between the medium with the first refractive index (n1) and the nanoparticle 212 having the second refractive index (n2). In other words, it is possible to suppress the fact that the emitted light input to the medium with the first refractive index (n1) is reflected by the nanoparticle 212 having the second refractive index (n2) and returns in the direction of the light input surface 211a. From the viewpoint of further exerting this effect, the diameter of the second nanoparticle 212b is preferably 4.5 times the average pitch or less, and most preferably 1.5 time or less.

Further, the second nanoparticles 212b having the second diameter (D2) exist in a ratio ranging from $1/10000$ to $1/5$ relative to the first nanoparticles 212a having the first diameter (D1). By meeting this range, it is presumed that it is possible to increase the in-plane distribution of the second refractive index (n2) in the in-plane direction of the light extraction product 211 surface due to the second nanoparticles 212b, and that improvements in light extraction efficiency due to light scattering properties are achieved. In other words, since nanoparticles 212 with different sizes are included with the predetermined probability, the distribution in the in-plane direction of the center surface 211c and the volume distribution of the nanoparticles 212 are increased, and the effect of light scattering properties is increased. Then, due to the strengthened light scattering properties, light extraction efficiency is enhanced, it is also possible to reduce the color shift due to the light scattering effect and to obtain light-emitting characteristics nearer natural light, and it is thereby possible to suppress glare. Further, it is possible to limit the size of the nanoparticles 212 having the second diameter (D2) larger than the first diameter (D1) to the predetermined size or less, it is possible to suppress reflection of the emitted light from the semiconductor light emitting device 210 in the interface between the nanoparticle 212 and the medium having the first refractive index (n1), and it is possible to increase the emitted light output from the second surface.

From the viewpoint of further exerting the above-mentioned effect, the second nanoparticles 212b having the second diameter (D2) preferably meet a ratio ranging from 1/10 to 1/3000 relative to the first nanoparticles 212a having the first diameter (D1), more preferably meet a ratio ranging from 1/10 to 1/1000, and most preferably meet a ratio ranging from 1/10 to 1/500.

Described next is extraction operation from the semiconductor light emitting device 210 using the light extraction product 211 according to the above-mentioned Embodiment. The emitted light from the semiconductor light emitting device 210 is input from the light input surface 211a of the light extraction product 211. As the emitted light input to the inside of the light extraction product 211 from the semiconductor device, two kinds of light mainly exists i.e. the emitted light (emitted light within the critical angle) input from the interface between the light input surface 211a of the light extraction product 211 and the light emitting layer surface (for example, transparent conductive layer) of the semiconductor light emitting device 210 and the oozing light oozing from the interface in the film thickness direction M (direction from the light input surface 211a to the light output surface 211b) of the light extraction product. In order to improve light extraction efficiency of the semiconductor light emitting device 210, it is necessary to increase the rate of the emitted light within the critical angle or to extract the oozing light to the outside of the semiconductor light emitting device 210 i.e. to output from the light output surface 211b of the light extraction product 211.

As the difference between the second refractive index (n2) and the first refractive index (n1) is larger, the emitted light input to the inside of the light extraction product 211 strongly feels heterogeneity between the nanoparticles 212 having the second refractive index (n2) and the medium having the first refractive index (n1). In other words, as the difference between the second refractive index (n2) and the first refractive index (n1) is larger, the light recognizes that the nanoparticles 212 having the second refractive index (n2) are disposed inside the light extraction product 211. Therefore, light scattering occurs in the interface between the nanoparticles 212 having the second refractive index (n2) and the medium having the first refractive index (n1). By this light scattering, it is possible to extract the oozing light to output from the light output surface 211b, and it is possible to obtain light-emitting (light output) characteristics nearer natural light with the color shift reduced.

The oozing light oozing, in the film thickness direction M (direction from the light input surface 211a to the light output surface 211b) of the light extraction product 211, from the interface between the light input surface 211a of the light extraction product 211 and the light emitting layer surface (for example, transparent conductive layer) of the semiconductor light emitting device 210, decreases exponentially with distance toward the light output surface 211b from the interface. Therefore, even when the nanoparticles 212 having the second refractive index (n2) meeting the above-mentioned refractive-index range exist, unless the oozing light is propagated inside the medium with the first refractive index (n1) to the position in which the nanoparticle 212 exist, extraction efficiency of the oozing light is reduced. Herein, in order to effectively extract the oozing light with the nanoparticles 212 having the second refractive index (n2), the distance (Lort) between the average end portion position (Spt) on the light input surface 211a side of a plurality of nanoparticles 212 crossing the inside of the center surface 211a and the light input surface 211a preferably exceeds 0 nm and is 1000 nm or less. Thus, since the nanoparticles 212 crossing the center surface 211c are disposed in the region of the distance of nanoscale from the light input surface 211a, extraction efficiency of the oozing light input from the light input surface 211a is improved, and as a result, it is conceivable that it is possible to significantly increase light extraction efficiency of the semiconductor light emitting device 210.

Further, since a plurality of nanoparticles 212 crossing the center surface 211c is arranged inside the center surface 211c with predetermined intervals of nanoscale provided, it is possible to apply light scattering and light diffraction phenomena corresponding to the light emission wavelength of the semiconductor light emitting device 210, and the oozing light extraction capability is improved. In other words, by applying the light extraction product 211, in which a plurality of nanoparticles 212 is arranged at predetermined intervals inside the center surface 211c and the distance (Lort) between the average position on the light input surface 211a side of a plurality of nanoparticles 212 inside the center surface 211c and the light input surface 211a is nanoscale, to the semiconductor light emitting device 210, it is possible to more effectively extract the oozing light oozing from the interface between the light emitting layer surface (for example, transparent conductive layer) of the semiconductor light emitting device 210 and the light input surface 211a.

<Scattering Properties>

By applying the above-mentioned arrangement LP, arrangement α, and distribution DF, it is possible to provide the extracted light with scattering properties. When the wavelength of the emitted light is sufficiently larger than the concavo-convex structure and the light extraction layer, the concavo-convex structure and the light extraction layer are averaged by effective medium approximate, and function as a thin film having the effective medium approximate refractive index Nema. However, by having the arrangement LP, arrangement α, or distribution DF, it is conceivable that it is possible to provide the effective medium approximate refractive index Nema with a distribution. Therefore, it is possible to newly provide the optical phenomenon corresponding to the distribution of the effective medium approximate refractive index Nema and contrast thereof, and the extracted light exhibits scattering properties. On the other hand, when the wavelength of the emitted light is equal to or less than the sizes of the concavo-convex structure and the light extraction layer, the emitted light is extracted by light diffraction. Herein, by meeting the arrangement LP, arrangement α, or distribution D, since the number of modes of light diffraction is increased on a microscopic scale such as one by one of the concavo-convex structure, and therefore, in terms of a macroscopic scale such as several tens of micrometers, it is conceivable since it is possible to observe averaged light of a plurality of diffraction modes, scattering properties are exhibited.

The essence of such a mechanism is disturbances of the concavo-convex structure and light extraction layer. As "the concavo-convex structure (including the light extraction layer; the same in the following description) includes the disturbance", two cases are conceivable.

The first case is that at least one of factors of the concavo-convex structure has regularity or uniformity, while at least one of the other factors has irregularity and non-uniformity.

The second case refers to that the concavo-convex structure includes a portion (hereinafter, specific portion) in which the factors of the concavo-convex structure are different from those of the main portion, as well as the main portion in which at least one of the factors of the concavo-convex structure has regularity or uniformity.

In other words, "the concavo-convex structure includes the disturbance" refers to having the structure or arrangement (hereinafter, referred to as a basic structure) of convex portions or concave portion that exhibit an optical phenomenon in the intrinsic concave-convex structure, while having a portion (hereinafter, referred to as a specific structure) that is the structure or arrangement of convex portions or concave portions deviated from the basic structure and that exerts an optical phenomenon different from that of the basic structure.

For example, when the disturbance exists in the shape of the concavo-convex structure, it is possible to develop scattering properties by the above-mentioned mechanism, and the distribution DF is included in the disturbance of the shape. On the other hand, when the disturbance exists in the arrangement, it is possible to develop scattering properties by the above-mentioned mechanism, and the above-mentioned arrangement LP and arrangement α are included in the disturbance of the arrangement. It is possible to describe the shape of the convex portion of the concavo-convex structure and light extraction layer using a variable such as the convex-portion height (thickness), width of the top of the convex-portion, width of the bottom of the convex-portion, angle of the convex-portion side surface, and the number of inflection points of the convex-portion side surface. On the other hand, it is possible to describe the arrangement using the pitch as a variable. Herein, assuming that a variable is x, when the ratio (standard deviation/arithmetical mean) of the standard deviation to arithmetical mean relative to x is 0.025 or more, it is possible to strongly provide scattering properties. Herein, standard deviation/arithmetical mean is a value associated with the factors constituting the concavo-convex structure. For example, when the concavo-convex structure is comprised of three factors A, B and C, the ratio is defined as the ratio of the standard deviation to arithmetical mean relative to the same factor such as standard deviation relative to the factor A/arithmetical mean relative to the factor A.

(Arithmetical Mean)

The arithmetical mean value is defined by the following equation in the case of assuming that N measurement values of some factor (variable) X are x1, x2 . . . , xn.

$$\bar{x} = \frac{\sum_{i=1}^{N} xi}{N}$$ [Math 3]

(Standard Deviation)

In the case of assuming that N measurement values of some factor (variable) X are x1, x2 . . . , xn, the standard deviation is defined by the following equation, using the arithmetical mean value defined as described above.

$$\sigma = \sqrt{\frac{1}{N}\sum_{i=1}^{N}(xi-\bar{x})^2}$$ [Math 4]

The number N of samples in calculating the arithmetical mean is 10 or more to define. Further, the number of samples in calculating the standard deviation is determined to be the same as the number of samples in arithmetical mean calculation.

Further, standard deviation/arithmetical mean is defined as a value associated with local concavo-convex structure and light extraction layer, instead of a value inside the surface. In other words, instead of measuring N points over the surface to calculate standard deviation/arithmetical mean, local observation is performed, and standard deviation/arithmetical mean in the observation range is calculated. Herein, the local range to use in observation is defined as a range about 5 times to 50 times the average pitch P of the concavo-convex structure. For example, when the average pitch is 300 nm, observation is performed in the observation range of 1500 nm to 15000 nm. Therefore, for example, a view image of 2500 nm is taken, the standard deviation and arithmetical mean are obtained using the image, and standard deviation/arithmetical mean is calculated.

As described above, the concavo-convex structure and the light extraction layer are capable of being represented by the variable, and when standard deviation/arithmetical mean with respect to the variable is 0.025 or more, it is possible to strongly add scattering properties. From the viewpoints of more strengthening scattering properties and reducing the color shift, standard deviation/arithmetical mean is preferably 0.03 or more. On the other hand, the upper limit value is determined from the viewpoints of extraction efficiency of the oozing light and reflection suppression of the emitted light within the critical angle, and is preferably 0.5 or less. From the viewpoints of extraction efficiency of the oozing light, reflection suppression of the emitted light within the critical angle, reduction in the color shift, and controllability of the concavo-convex structure, standard deviation/arithmetical mean is preferably 0.35 or less, more preferably 0.25 or less, and most preferably 0.15 or less.

Another configuration example of the light extraction product 211 will be described next with reference to FIG. 29. In addition, the description of FIG. 29 is given with the fourth aspect, and is the same as in the first aspect, the second aspect and the third aspect.

Figure 29:
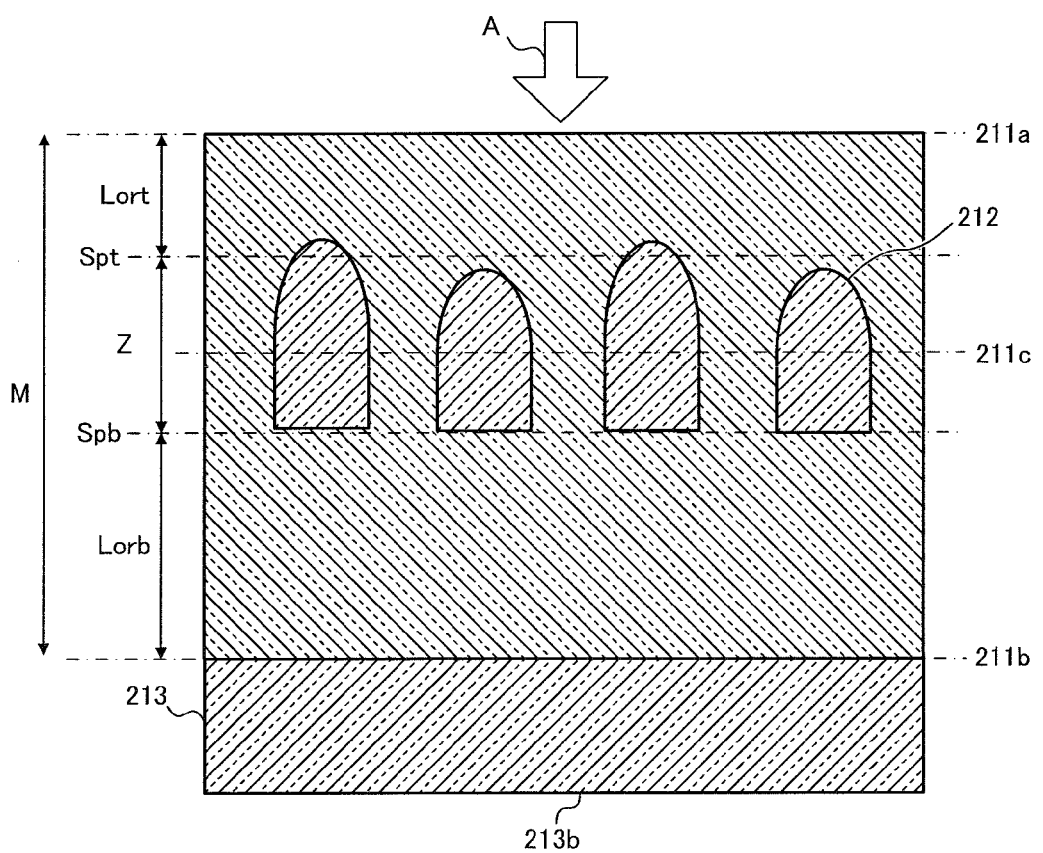
FIG. 29 is a cross-sectional schematic diagram showing another example of the light extraction product according to the fourth aspect.

FIG. 29 is a cross-sectional schematic diagram showing another example of the light extraction product 211 according to the fourth aspect. As shown in FIG. 29, this light extraction product 211 is provided with a substrate 213 having the fourth refractive index (n4) provided on the light output surface 211b. In this light extraction product 211, it is preferable that an absolute value (|n-4-n1|) of a difference between the fourth refractive index (n4) of the substrate 213 and the first refractive index (n1) constituting the light extraction product 211 is preferably 0.1 or less. According to this configuration, since the medium having the first refractive index (n1) and the substrate 213 having the fourth refractive index (n4) are of the substantially same refractive indexes, it is possible to suppress reflection in the interface between the medium constituting the light extraction product and the substrate 213, and it is thereby possible to achieve improvements in handling properties and physical durability of the light extraction product by providing the substrate 213, without impairing light extraction efficiency.

Further, in this light extraction product 211, by providing the substrate 213, throughput is improved in manufacturing the light extraction product 211, and physical strength of the light extraction product 211 is also improved. Further, it is possible to enhance accuracy (arrangement, shape, etc.) of the nanoparticles 212 of the light extraction product 211. Therefore, easiness is improved in applying the light extraction product 211 to the semiconductor light emitting device 210, and light extraction efficiency from the semiconductor light emitting device 210 is also improved.

Furthermore, it is preferable that the substrate 213 has at least one of the gas barrier function and the water vapor barrier function. By using such a substrate, it is possible to improve long-term stability of the semiconductor light emitting device 210. Particularly, such a substrate is useful in the case of the semiconductor light emitting device 210 such as an organic EL in which the light emitting layer is weak against outside air.

As the medium 213 having the fourth refractive index (n4), the medium having the fourth refractive index (n4) substantially equal or equal to the first refractive index (n1) is used. By providing the medium 213 meeting such a refractive index relationship, the emitted light extracted by the nanoparticles 212 having the second refractive index (n2) from the interface between the light input surface 211a and the light emitting layer surface (for example, transparent conductive layer) of the semiconductor light emitting device 210 and the emitted light within the critical angle in the interface is effectively extracted from the light output surface 213b side of the substrate 213 of the light extraction product 211 without undergoing the effect of reflection in the interface between the light output surface 211b of the medium having the first refractive index (n1) and the substrate 213.

Further, the concavo-convex structure (dots or holes) may be provided on the light output surface 213b of the substrate 213. It is possible to provide the emitted light output from the light output surface 213b of the substrate 213 with the optical phenomenon corresponding to the average pitch of the dots or holes. For example, in a region in which the average pitch is smaller than the wavelength of the emitted light, it is possible to increase the rate of output light, and to improve visibility. Further, when the average pitch is several tens of times the wavelength or less, since it is possible to use light diffraction, it is possible to add a tone corresponding to a diffraction color. Furthermore, when the average pitch is several tens of times the wavelength or more, since it is possible to exhibit scattering properties, it is possible to significantly reduce the color shift.

Moreover, when the average pitch of dots ranges from 50 nm to 250 nm, the bottom-portion diameter of the dot is 80% or more of the average pitch, and the aspect ratio expressed by the ratio (height/diameter) of the height to the bottom-portion diameter of the dot ranges from 0.3 to 3.5, it is possible to reduce a reflection of outside light on the light output surface 213b (surface which a user visually identifies in using the semiconductor light emitting device 210) of the substrate 213, and visibility is improved.

In addition, in the case of separately providing the concavo-convex structure (dots or holes) on the light output surface 213b of the substrate 213, it is preferable that the refractive index of the newly provided concavo-convex structure is substantially equal to the fourth refractive index (n4) of the substrate, from the viewpoints of suppressing reflection of the emitted light and reflection of light from the outside in the interface between the surface of the substrate 213 and the newly provided concavo-convex structure.

Further, an antireflection layer comprised of a single layer or multilayer may be provided on the substrate 213. Particularly, this antireflection layer is effective when a difference is large (for example, 0.1 or more) between the fourth refractive index (n4) of the substrate 213 and the refractive index of air, or the refractive index of a sealant used in the semiconductor light emitting device 210. By providing the above-mentioned concavo-convex structure or antireflection layer, also when the difference in the refractive index is 0.5 or more, or 0.7 or more and thus extremely large, it is possible to increase intensity of transmission light extracted from the light extraction product 211 and to suppress reflection of outside light. As a result, it is possible to suppress a reflection of outside light on the substrate 213 surface, and it is thereby possible to improve visibility in using the semiconductor light emitting device 210.

As described above, according to the above-mentioned light extraction product 211, a plurality of nanoparticles 212 having the second refractive index (n2) substantially different from the first refractive index (n1) is dispersed inside the medium having the first refractive index (n1), while being disposed leaning to the vicinity of the center surface 211c of the light extraction product 211, and is not dispersed randomly inside the light extraction product 211. By this means, since the light extraction function based on the nanoparticles 212 maximally develops in the vicinity of the center surface 211c, the emitted light from the semiconductor light emitting device 210 input to the inside of the light extraction product 211 is scattered by the plurality of nanoparticles 212 disposed in the vicinity of the center surface 211c, and uniformity is improved in extraction, by the nanoparticles 212, of the oozing light oozing from the interface between the light emitting layer surface side of the semiconductor light emitting device 210 and the light extraction product 211. As a result, it is possible to achieve the light extraction product 211 for enabling light extraction efficiency from the semiconductor light emitting device 210 to be improved with ease. Further, as compared with the case where the nanoparticles 212 are randomly disposed inside the light extraction product 211, since it is possible to decrease the number of nanoparticles 212, physical durability of the light extraction product 211 is improved.

<Materials>

Described next are materials of the concavo-convex structure layer 11, light extraction layer 12 and flattened layer 13 in the light extraction product 1 according to the first aspect. In addition, the materials to form the layers are not limited particularly, as long as the above-mentioned first refractive index (n1), second refractive index (n2) and third refractive index (n3) meet above-mentioned equations (7) to (9). Further, as the materials forming the concavo-convex structure layer 11, light extraction layer 12 and flattened layer 13, it is preferable that the extinction coefficient (k) is zero. By k=0, it is possible to make the absorption coefficient zero. Therefore, it is possible to suppress that the emitted light guided inside the light extraction product 1 from the light input surface 1a of the light extraction product 1 is absorbed and attenuates inside the light extraction product 1 until the emitted light passes through the light output surface 1b. Herein, the case where the extinction coefficient k is zero is defined as the range meeting k≤0.01. Meeting this range enables the above-mentioned effect to be obtained and is preferable. Particularly, from the viewpoint of suppressing multiple reflection in each layer, it is more preferable that k≤0.001. In addition, smaller k is more preferable.

Further, as the materials forming the concavo-convex structure layer 11, light extraction layer 12 and flattened layer 13 meeting above-mentioned equations (7) to (9) and the range of the extinction coefficient k, examples thereof are transparent dielectric permitting sputter and deposition, glass, quartz, sapphire, cured materials of inorganic precursors (for example, cured materials of materials that cause hydrolysis•polycondensation to be cured, by the sol-gel reaction typified by metal alkoxide), resins (cured materials of thermosetting resins, cured materials of photopolymerizable resins, thermoplastic resins), cured materials of organic-inorganic hybrid molecules, transparent dielectric fine particles, transparent dielectric fillers, and mixtures thereof. With respect to which material is used, it is possible select as appropriate with consideration given to characteristics and usage environment of a semiconductor light emitting device, manufacturing method of the light extraction product and the like. Particularly, in the case where materials forming the flattened layer 13 are formed of materials low in water absorption properties, or a layer low in water absorption properties is further provided on the exposed surface of the flattened layer 13, long-term reliability of the semiconductor light emitting device is improved, and therefore, such a case is preferable.

The light extraction product 1 according to the first aspect may further include at least one function layer selected from the group consisting of the gas barrier function, water vapor barrier function, antifriction function, reserve printing function, hydrophobic function, hydrophilic function, antistatic function, color filter function, color shift function, polarization modifying function, antireflection function, light re-directivity function, diffusion function, and optical rotation function. By further including these function layers, the device functions are improved in the semiconductor light emitting device manufactured using the light extraction product. For example, by further including gas barrier properties and water vapor barrier properties, it is possible to extend life of a light emitting portion of an organic EL device. Further, for example, by including the antifriction function, reserve printing function, hydrophobic function, hydrophilic function, antistatic function and the like on the exposed surface of the substrate, an amount of stains attached to the device is decreased, and wiping is made easy. Furthermore, for example, by adding the antireflection function onto the exposed surface of the substrate, visibility is improved. Configurations and materials to develop these functions are not limited particularly, and it is possible to select as appropriate corresponding to characteristics and uses of the semiconductor light emitting device.

<Manufacturing Method of the Light Extraction Product>

A manufacturing method of the light extraction product 1 according to the first aspect is not limited particularly, as long as it is possible to obtain the light extraction product 1 meeting the refractive indexes of above-mentioned equations (7) to (9).

From the viewpoint of manufacturing while controlling the shape of the concavo-convex structure, for example, there is a manufacturing method using a processing method of directly processing the above-mentioned transparent dielectric (glass, quartz, sapphire, thermoplastic resin and the like).

For example, as a processing method of nanoscale of an optically transparent glass surface, examples thereof are electron beam lithography, photolithography, nanoimprint lithography, thermal nanoimprint, lithography using a self-organizing film as a mask, and lithography using fine particles as a mask. In the case of thermal nanoimprint, by heating a mold having at least a concavo-convex structure on its surface, and in this state, pressing the concavo-convex structure against a substrate, it is possible to process the substrate without the lithography process.

Further, in the case of nipping a resist between a concavo-convex structure of a mold having the concavo-convex structure on its surface and a substrate, and applying thermal nanoimprint lithography, pressing is performed at a temperature higher than the glass transition temperature Tg of the resist, and the mold is peeled off at a temperature lower than Tg. In the case of applying photo nanoimprint, light is applied in a pressed state, and then, the mold is peeled off. There is a method of removing (for example, dry etching using oxygen) a residual film of a resist layer from the resist layer surface side of an obtained layered product comprised of the resist layer having a concavo-convex structure on its surface/substrate, and next, etching the substrate using the resist layer as a mask.

On the other hand, as a method of separately forming an optically transparent concavo-convex structure layer on an optically transparent substrate, there are transfer methods (photo nanoimprint method, thermal nanoimprint method, room-temperature nanoimprint method and the like). As the transfer method, there is a method of nipping a transfer target material between a mold provided with a concavo-convex structure and a substrate, peeling off the mold, and thereby forming the concavo-convex structure on the transfer target material surface. In this case, as the transfer target material, it is possible to use the above-mentioned inorganic precursors (for example, materials that cause hydrolysis•polycondensation to be cured, by the sol-gel reaction typified by metal alkoxide), resins (thermosetting resins, photopolymerizable resins, thermoplastic resins), organic-inorganic hybrid molecules, mixture particles of these materials and transparent dielectric fine particles, or transparent dielectric fillers, and the like.

Next, as a method of arranging the light extraction layer on the concavo-convex structure layer, examples thereof are a method of applying a dilute solution of the light extraction layer onto a concavo-convex structure surface of the concavo-convex structure layer, and a method of forming a film by sputter and deposition. As the coating method, it is possible to adopt a gravure coat method, micro-gravure coat method, blade coat method, wire bar coat method, air knife coat method, dip coat method, comma knife coat method, spray coat method, curtain coat, ink jet method, spin coat method, die coat method and the like. In the case of diluting the light extraction layer and coating, it is preferable to remove an excessive solvent. As the removal method, there is heat treatment, pressure reducing (vacuum) treatment, and treatment in combination thereof.

As a method of forming a film of the flattened layer 13, examples thereof are a method of applying a dilute solution of materials forming the flattened layer 13 onto a residual roughness surface of the concavo-convex structure after arranging filling materials, and a method of forming a film by sputter and deposition. As the coating method, it is possible to adopt a gravure coat method, micro-gravure coat method, blade coat method, wire bar coat method, air knife coat method, dip coat method, comma knife coat method, spray coat method, curtain coat, ink jet method, spin coat method, die coat method and the like. In the case of diluting the flattened layer and coating, it is preferable to remove an excessive solvent. As the removal method, there is heat treatment, pressure reducing (vacuum) treatment, and treatment in combination thereof.

[Manufacturing Method 1]

FIGS. 30 to 34 contain cross-sectional schematic diagrams illustrating each step of the manufacturing method of the light extraction product according to this Embodiment. In the manufacturing method of the light extraction product according to this Embodiment, among the above-mentioned manufacturing methods, it is preferable that the product is manufactured by a manufacturing method including at least steps of (1) to (3) as described below in this order. Particularly, it is useful in arranging the light extraction layer only in concave-portion inner portions of the concave-convex structure layer or in concave-portion inner portions and on convex-portion upper portions of the concave-convex structure layer. By this means, controllability of each component is improved, and throughput in manufacturing is also improved.

Figure 30A:
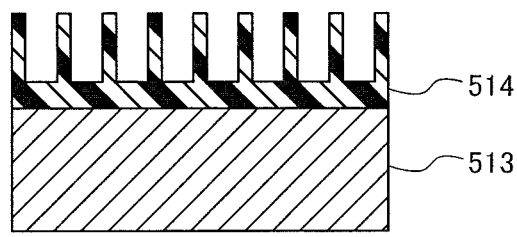
FIG. 30 contains cross-sectional schematic diagrams illustrating each step of a manufacturing method 1 of the light extraction product according to this Embodiment.

(1) Concavo-Convex Structure Layer Formation Step (See FIG. 30A)

Step of forming a concavo-convex structure layer 514 having the first refractive index ($n1$) on one main surface of a substrate 513 having the fourth refractive index ($n4$) by a transfer method.

Figure 30B:
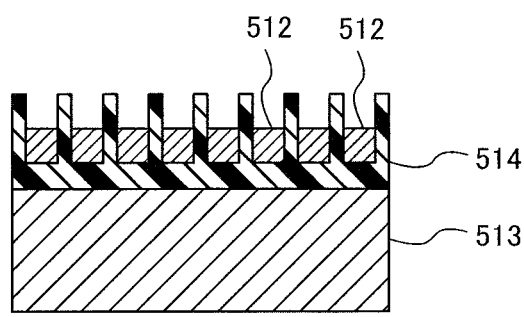

(2) Light Extraction Layer Formation Step (Nanoparticle Arrangement Step) (See FIG. 30B)

Step of applying diluted filling materials, or solution containing nanoparticle raw materials on the concavo-convex structure of the concavo-convex structure layer 514, removing an excessive solvent, and arranging a light extraction layer 512 or nanoparticles 512.

Figure 30C:
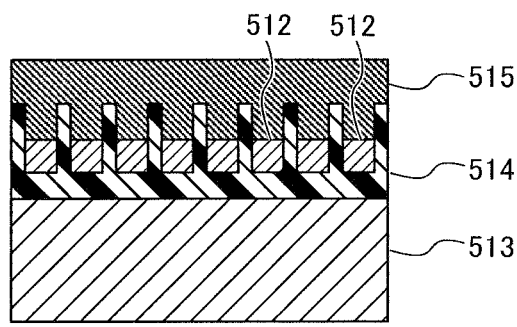
Figure 31A:
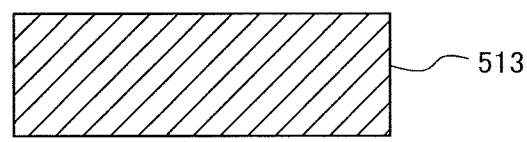
FIG. 31 contains cross-sectional schematic diagrams illustrating each step of the manufacturing method 1 of the light extraction product according to this Embodiment.
Figure 31B:
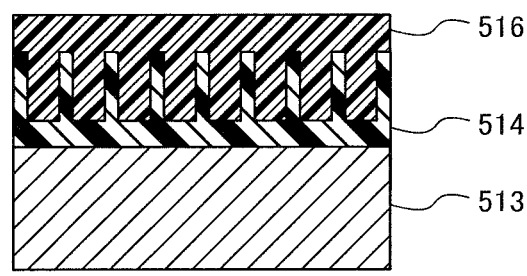
Figure 31C:
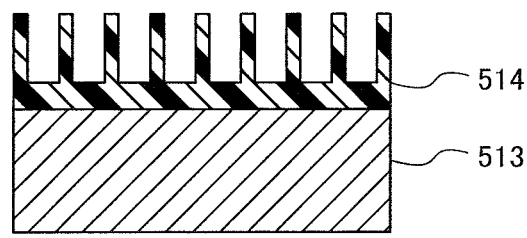
Figure 32A:
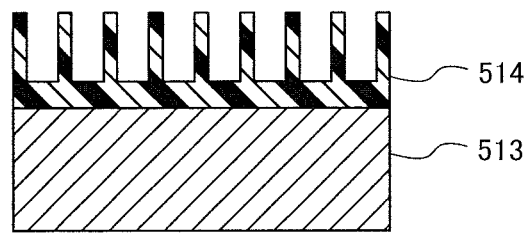
FIG. 32 contains cross-sectional schematic diagrams illustrating each step of the manufacturing method 1 of the light extraction product according to this Embodiment.
Figure 32B:
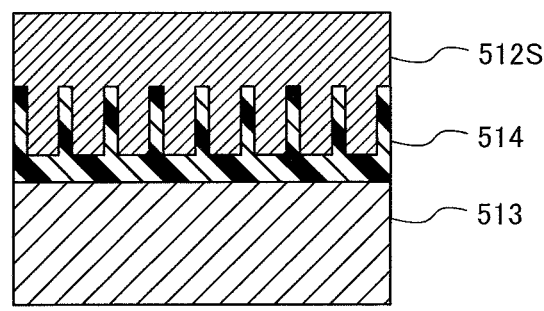
Figure 32C:
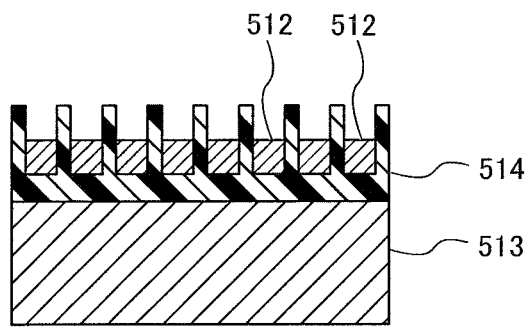

(3) Flattened Layer Formation Step (See FIG. 30C)

Step of applying diluted flattening materials on the concavo-convex structure of the concavo-convex structure layer 514 provided with the light extraction layer or nanoparticles, removing an excessive solvent, and forming a flattened layer 515 to cover the concavo-convex structure layer 514 and the light extraction layer or nanoparticles 512 upper portion.

In addition, the case of performing up to the step (2) light extraction layer formation step is the above-mentioned light extraction product 2, and the case of performing up to (3) flattened layer formation step is the above-mentioned light extraction product 1. Further, in the nanoparticle arrangement step of the step (2), the nanoparticles 512 having the second refractive index ($n2$) are arranged only inside the concave portions of the concavo-convex structure layer 514.

(1) Concavo-Convex Structure Layer Formation Step

The transfer method of the concavo-convex structure is not limited particularly, and it is possible to select as appropriate corresponding to the transfer target material. For example, when the transfer target material is a photocurable resin, the transfer target material having the first refractive index ($n1$) is nipped between a concavo-convex structure of a mold 516 having the concavo-convex structure on its surface and the substrate 513 having the fourth refractive index ($n4$) (FIGS. 31A, 31B), light is applied from either the substrate side or the mold 516 side to cure the transfer target material, and then, by peeling off the mold 516, it is possible to form the concavo-convex structure (see FIG. 31C). This transfer method is generally referred to as photo nanoimprint.

The type of light to apply is not limited particularly, and it is possible to select as appropriate corresponding to characteristics of the transfer target material. As the type of light to apply, examples thereof are X-rays, ultraviolet rays, visible light rays and infrared rays. Among the rays, by using ultraviolet rays, improved is transfer accuracy of the concavo-convex structure having the first refractive index ($n1$) by photo nanoimprint. As the ultraviolet rays, particularly, ultraviolet rays with a wavelength region of 250 nm to 450 nm are preferable. As a light source of the energy line, for example, it is possible to use various kinds of discharge lamps, xenon lamp, low-pressure mercury lamp, high-pressure mercury-vapor lamp, metal halide lamp light emitting device and laser. As the laser, for example, it is possible to use UV light LED, Ar gas laser, excimer laser, semiconductor laser and the like. From the viewpoint of improving transfer accuracy, the integral light amount is preferably in a range of 500 mJ/cm$^2$ to 5000 mJ/cm$^2$, and is more preferably in a range of 800 mJ/cm$^2$ to 2500 mJ/cm$^2$. In addition, in the case of applying light, application may be performed in an atmosphere of typified by carbon dioxide and pentafluoropropane gas, in an atmosphere of nitrogen or argon gas, or under a reduced pressure (vacuum).

Further, in irradiation of the energy line, irradiation may be performed using a plurality of line sources. By this means, it is possible to meet the above-mentioned range of the integral light amount easier and to improve transfer accuracy. Further, by including line sources with different wavelength regions in two or more line sources, it is possible to further improve transfer accuracy and stability of the concavo-convex structure having the first refractive index ($n1$). As an irradiation method using a plurality of line sources, examples thereof are a method of using two ultraviolet LEDs, setting the main wavelength of the first LED at $\lambda x$ and setting the main wavelength of the second LED at $\lambda y$ nm ($\lambda x \neq \lambda y$, $\lambda x$=365, 385, 395, 405 nm, etc., $\lambda y$=365, 385, 395, 405 nm, etc.), and another method of using a ultraviolet LED with a sharp emission spectrum and metal halide light source or high-pressure mercury-vapor light source including wavelength components of a wide range.

The shape of the substrate 513 is not limited particularly. For example, in the plate-shaped substrate 513, it is possible to form a film of the transfer target material on one main surface of the substrate by the spin coat method, cast method, ink jet method or the like, and bond and press the mold to the transfer target material. In this case, as the mold 516, it is possible to use a plate-shaped mold and film-shaped (reel-shaped) mold, and from the viewpoint of transfer accuracy, the film-shaped (reel-shaped) mold is preferable. On the other hand, when the substrate 513 is in the shape of a film (reel) typified by a glass film and resin film, since it is possible to apply roll-to-roll process, productivity is improved.

For example, when the transfer target material is an inorganic precursor, the transfer target material is nipped between the substrate 513 and the concavo-convex structure of the mold 516 having the concavo-convex structure on its surface, the transfer target material is cured by heat or light, and then, by peeling off the mold 516, it is possible to form the concavo-convex structure. Particularly, by performing heat treatment after peeling off the mold 516, it is possible to promote curing of the transfer target material, and therefore, such treatment is preferable. Further, when the transfer target material contains photopolymerizable functional groups and photoacid generator in the inorganic precursor, the transfer target material is nipped between the substrate 513 and the concavo-convex structure of the mold 516 having the concavo-convex structure on its surface, light is applied from the mold side or the substrate side, it is thereby possible to increase the curing velocity of the transfer target material, and it is possible to improve transfer accuracy and throughput properties. In the case of using such an inorganic precursor, it is preferable to use a resin mold as the mold. This is because it is possible for the resin mold to absorb or transmit a component occurring in the curing reaction of the inorganic precursor to remove. For example, it is possible to suitably use a resin mold comprised of a cured material of a photocurable resin and a resin mold comprised of polydimethyl siloxane (PDMS). As the photocurable resin, it is preferable to contain a urethane-based resin.

In addition, before (1) concavo-convex structure layer formation step, it is preferable to perform a step of forming the adhesive layer 13a on one main surface of the substrate 513, or making one main surface of the substrate hydrophilic. The adhesive layer 13a is described in the light extraction product 2 according to the second aspect as shown in FIG. 3. By performing these steps, adhesion of the above-mentioned transfer target material to the substrate is improved, and it is thereby possible to improve transfer accuracy.

As the adhesive layer 13a, the layer is not limited particularly, as long as the layer has adhesion to both the substrate and the transfer target material, and it is possible to adopt a thin film of several nanometers or more to a molecular layer of several nanometers or less. For example, it is possible to form the adhesive layer 13a by a method of exposing to vapor of end functional group-modified silane coupling agent, a method of immersing in or spray coating a solution of end functional group-modified silane coupling agent and thereby forming a single molecular layer film, or the like. Particularly, in the case where the thickness of the adhesive layer 13a is several nanometers or more, materials of the adhesive layer 13a are preferably optically transparent. In the case of several nanometers or less close to a single molecular layer, since the effects of light absorption and multiple reflections by the adhesive layer 13a are extremely small, properties in this case are not limited particularly, but optically transparent is preferable.

In addition, after (1) concave-convex structure layer formation step (before (2) light extraction layer formation step), a step of stabilizing the concavo-convex structure may be added. Herein, stabilization means decreasing unreacted portions left in the concavo-convex structure or removing water contained in the concavo-convex structure layer. In the former case, it is possible to select the stabilization method as appropriate according to properties of the transfer target material, and for example, there are heat treatment, energy line irradiation treatment and the like. As a temperature of heat treatment, it is possible to select as appropriate in a range of 40° C. to 300° C. Further, in the case of energy line irradiation treatment, it is possible to use energy lines as described above. In addition, in the case of stabilizing using an energy line, when the treatment is performed in a low-oxygen environment such as under a reduced pressure and in an atmosphere of inert gas, the effect of stabilization is enhanced, and therefore, such an environment is preferable.

(2-1) Light Extraction Layer Formation Step

The coating method of the light extraction layer is not limited particularly, and it is possible to use a gravure coat method, micro-gravure coat method, blade coat method, wire bar coat method, air knife coat method, dip coat method, comma knife coat method, spray coat method, curtain coat, ink jet method, spin coat method, die coat method and the like. It is possible to arrange the light extraction layer by setting coating conditions that a coating film thickness (hc) of a dilute solution in coating, volume concentration (C) of the dilute solution of light extraction layer materials and concave-portion volume (Vc) of the concavo-convex structure existing in a region of a unit area (Sc) meet Sc·hc·C<Vc, and removing an excessive solvent after coating. The method of removing the solvent is not limited particularly, and there is heat treatment, pressure reducing (vacuum) treatment, and treatment in combination thereof. Particularly, in the case of arranging the light extraction layer in only concave-portion inner portions of the concavo-convex structure layer, by making the concavo-convex structure layer surface hydrophobicity and setting the aperture ratio at 65% or more, arrangement accuracy is improved. Herein, hydrophobicity is defined as a state in which the contact angle of water on the concavo-convex structure surface is 90 degrees or more. Further, by making a dilute solvent of a raw material solution of the light extraction layer an aqueous (hydrophilic) solvent, arrangement accuracy is improved in arranging the light extraction layer in only concave-portion inner portions of the concavo-convex structure layer.

The temperature and time in the case of heat treatment is not limited particularly, and it is possible to set as appropriate corresponding to vapor pressure, boiling point and the like of the solvent used in preparing a dilute solution of materials used as the light extraction layer, and coating film thickness (hc). As conditions of the heat treatment, when substantially the temperature is in a range of 20° C. to 300° C. and the time is in a range of 30 seconds to 1 hour, arrangement accuracy of the light extraction layer is enhanced, and therefore, such conditions are preferable. Further, in assuming that the boiling point of the used solvent is Ts, inclusion of a solvent removing step (1) in which the temperature (T) meets T<Ts more improves arrangement accuracy of the light extraction layer and is preferable, and it is more preferable to meet T<Ts/2. Furthermore, when a solvent removing step (2) meeting T≈Ts is included after the solvent removing step (1), it is possible to further exert the above-mentioned effect, and therefore, such a step is preferable. In addition, T≈Ts is substantially T=Ts±20%.

For example, in the case of using a plate-shaped substrate, it is possible to undergo a step of forming a film of the dilute solution of the light extraction layer on the concavo-convex structure surface of the concavo-convex structure layer by the spin coat method, cast method, ink jet method or the like, and removing an excessive solvent. Particularly, in the case of the spin coat method, it is preferable to use a solvent with low vapor pressure. On the other hand, when the substrate is in the shape of a film (reel) typified by a glass film and resin film, since it is possible to apply roll-to-roll process, productivity is improved. In addition, before (2) light extraction layer formation step, treatment to the concavo-convex structure surface of the concavo-convex structure layer may be added. As the treatment, there is oxygen plasma treatment, UV-$O_3$ treatment and the like.

In addition, after (2-1) light extraction layer formation step (before (3) flattened layer formation step), a step of stabilizing may be added. Herein, stabilization means decreasing unreacted portions left in the concavo-convex structure layer and light extraction layer or removing water contained in the concavo-convex structure layer and light extraction layer. In the former case, it is possible to select as appropriate according to properties of the transfer target material and light extraction layer, and for example, there is heat treatment and energy line irradiation treatment. As the temperature of heat treatment, it is preferable to select as appropriate in a range of 40° C. to 300° C. Further, in the case of energy line irradiation treatment, it is possible to use energy lines as described above. In addition, in the case of stabilizing using an energy line, when the treatment is performed in a low-oxygen environment such as under a reduced pressure and in an atmosphere of inert gas, the effect of stabilization is enhanced, and therefore, such an environment is preferable.

(2-2) Nanoparticle Arrangement Step

The coating method of a dilute solution of nanoparticle raw materials is not limited particularly, and it is possible to use a gravure coat method, micro-gravure coat method, die coat method, blade coat method, wire bar coat method, air knife coat method, dip coat method, comma knife coat method, spray coat method, curtain coat, ink jet method, spin coat method, and the like. It is possible to arrange the nanoparticles 512 in concave-portion inner portions of the concavo-convex structure layer 514 by setting coating conditions that a coating film thickness (hc) of the dilute solution of nanoparticle raw materials in coating, volume concentration (C) of the dilute solution of nanoparticle raw materials and concave-portion volume (Vc) of the concavo-convex structure existing in a region of a unit area (Sc) meet $Sc \cdot hc \cdot C < Vc$, applying the dilute solution 512S of nanoparticle raw materials on the concavo-convex structure surface of the concavo-convex structure layer 514 prepared in (A) concavo-convex structure formation step (see FIGS. 32A and 32B), and then, removing an excessive solvent (see FIG. 32C).

In order to arrange the nanoparticles 512 in only concave-portion inner portions of the concavo-convex structure layer 514, it is preferable to meet the following requirements. By meeting the following requirements, since it is made easy to arrange the nanoparticles 512 in concave-portion inner portions of the concavo-convex structure layer 514, a margin in manufacturing is enlarged, and management is made easy. Further, since it is possible to improve arrangement accuracy of the nanoparticles 512, improved is the light extraction capability using the light extraction product 211 according to the fourth aspect.

It is preferable that the contact angle of a water droplet with respect to the concavo-convex structure is 60 degrees or more and less than 180 degrees, and that the average aperture ratio of the concavo-convex structure is 45% or more and less than 100%. First, when the contact angle of a water droplet is 60 degrees or more, arrangement accuracy is improved in the nanoparticles 512 with respect to the concavo-convex structure of the concavo-convex structure layer 514. From the same effect, the contact angle is more preferably 70 degrees or more, and most preferably 80 degrees or more. Further, from the viewpoints of further reducing surface energy of the concavo-convex structure of the concavo-convex structure layer 514 and suppressing arrangement of the nanoparticles 512 on tops of the convex-portions of the concavo-convex structure layer 514, the contact angle is preferably 85 degrees or more, more preferably 90 degrees or more, and most preferably 95 degrees or more. In addition, in a range meeting the upper limit value as described later, a larger contact angle is more preferable. As surface energy of the concavo-convex structure of the concavo-convex structure layer 514 decreases, coating accuracy is reduced in the dilute solution 512S of nanoparticle raw materials on the concavo-convex structure of the concavo-convex structure layer 514. This is because the dilute solution 512S of nanoparticle raw materials changes the shape so as to minimize the contact area of the dilute solution 512S of nanoparticle raw materials and the concavo-convex structure of the concavo-convex structure layer 514. From the viewpoint of improving film formation properties in the step (3) flattened layer formation step described later, the contact angle is more preferably 160 degrees or less, and most preferably 140 degrees or less. In addition, when the contact angle is 120 degrees or less, a surface free energy margin is increased in the dilute solution 512S of nanoparticle raw materials, and such a range is more preferable.

When surface energy of the concavo-convex structure of the concavo-convex structure layer 514 is low, since the dilute solution 512S of nanoparticle raw materials behaves to decrease the contact area with the concavo-convex structure of the concavo-convex structure layer 514, coating accuracy of the dilute solution 512S of nanoparticle raw materials is reduced. As the relationship between the dilute solution 512S of nanoparticle raw materials and the concavo-convex structure of the concavo-convex structure layer 514, in consideration of pressure in dislocation from the Cassie-Baxter mode to Wenzel mode, inverse-dislocation from the Wenzel mode to Cassie-Baxter mode caused by potential applied to the convex portion of the concavo-convex structure from the inside of the concavo-convex structure, the level relationship between the level for stabilizing the dilute solution 512S of nanoparticle raw materials and the concavo-convex structure, and conditions such that the physical phenomenon started with coating of the dilute solution 512S of nanoparticle raw materials is absolutely made the Wenzel mode eventually, even when energy of the concavo-convex structure surface of the concavo-convex structure layer 514 is low, by the concavo-convex structure meeting a predetermined aperture ratio, it is possible to significantly improve arrangement accuracy of the nanoparticles 512 on the concavo-convex structure. From these viewpoints, it is preferable that the average aperture ratio of the concavo-convex structure of the concavo-convex structure layer 514 is 45% or more and less than 100%. By being in this range, it is possible to improve arrangement accuracy of the nanoparticles 512 with respect to the concavo-convex structure i.e. filling arrangement accuracy of the nanoparticles 512 in only concave-portion inner portions. Herein, the average aperture ratio of the concavo-convex structure of the concavo-convex structure layer 514 is more preferably 50% or more, and most preferably 55% or more. From the viewpoint of increasing a margin of surface free energy of the dilute solution 512S of nanoparticle raw materials, the average aperture ratio is preferably 65% or more, more preferably 70% or more, and most preferably 75% or more. Further, in order to more extend margins of the temperature and vibration in arranging the nanoparticles 512, the ratio is more preferably 80% or more. In addition, the aperture ratio is defined as a ratio of holes (concave-portion opening portion area) included in a unit area inside the surface formed of vertex surfaces of the convex portions of the concavo-convex structure of the concavo-convex structure layer 514. In addition, as the contact angle, the contact angle measurement method established in JISR3257 (1999) as "Wettability test method of substrate glass surface" is adopted, and as a substrate that is a contact angle measurement target, it is determined to use the concavo-convex structure surface of the concavo-convex structure layer 514 according to this Embodiment.

Further, while meeting the above-mentioned ranges of the contact angle and aperture ratio, by making the solvent used in the dilute solution 512 of nanoparticle raw materials an aqueous (hydrophilic) solvent, it is possible to improve coating properties of the dilute solution 512 of nanoparticle raw materials on the concavo-convex structure of the concavo-convex structure layer 514 and arrangement accuracy of the nanoparticles 512 in only concave-portion inner portions of the concavo-convex structure layer 514. The aqueous solvent is not limited particularly, and there are alcohol, ether, ketones solvent and the like. Further, as the solvent used in the dilute solution 512S of nanoparticle raw materials, when a solvent with the radius of inertia of 5 nm or less is selected in the case of dissolving nanoparticle raw materials in the solvent in a concentration of 3 weight %, arrangement accuracy of the nanoparticles 512 is improved in concave-portion inner portions of the concavo-convex structure layer 514, and therefore, such a solvent is preferable. Particularly, the radius of inertia is preferably 3 nm or less, more preferably 1.5 nm or less, and most preferably 1 nm or less. Herein, the radius of inertia is assumed to be a radius calculated by applying Gunier plot on the measurement result obtained from measurement by small angle X-ray scattering using X-ray with a wavelength of 0.154 nm.

The solvent removing method is not limited particularly, and there is heat treatment, pressure reducing (vacuum) treatment and treatment in combination thereof.

In addition, among the nanoparticle raw materials are materials inducing the sol-gel reaction typified by metal alkoxide, organic-inorganic hybrid molecules having an organic domain and an inorganic domain in one molecule, metal fine particles, metal oxide fine particles, mixtures thereof, and the like.

Particularly, when the dilute solution 512 of nanoparticle raw materials contains nanoparticle raw materials that change the form in the solvent vaporization step after diluent coating, since it is presumed that the driving force to decrease the area of nanoparticle raw materials themselves works at the same time, the nanoparticles 512 are more effectively packed and arranged in concave-portion inner portions of the concavo-convex structure layer 512, and therefore, such materials are preferable. As the change in the form, examples thereof are a heating reaction, and a change that the viscosity increases. For example, when the sol-gel material typified by metal alkoxide is contained, the material reacts with water vapor in air in the solvent vaporization step, and the sol-gel material undergoes polycondensation. By this means, since energy of the sol-gel material becomes unstable, the driving force works to move away from the solvent liquid surface (interface between the solvent and air) decreasing in association with solvent drying, as a result the sol-gel material is packed in concavo-portion inner portions of the concavo-convex structure layer 514 with excellence, and a state is formed in which the nanoparticles 512 are filled and arranged in only concave-portion inner portions of the concavo-convex structure layer 514.

Particularly, when the nanoparticle raw materials contain the metalloxane bond (-Me-O-Me-) that metal elements Me are connected via oxygen, the density as the dilute solution 512S of nanoparticle raw materials is improved, and the reactivity is decreased. Therefore, arrangement accuracy of the nanoparticles 512 is improved with respect to concave-portion inner portions of the concavo-convex structure layer 514. Further, when the ratio (CpM1/CpSi) between the Si element concentration (CpSi) and the element concentration (CpM1) of the metal element M1 except Si in the nanoparticle raw materials is 0.02 or more, since a solution containing the metalloxane bond is formed within a range of a predetermined metal element concentration ratio, adjustment of the density is made easy, filling arrangement accuracy of the nanoparticles 512 is improved in concave portions of the concavo-convex structure layer 514, and it is also made easy to control the refractive index of the nanoparticles 512. From the same effects, the ratio is preferably 0.05 or more, and most preferably 0.1 or more. Further, from the viewpoint of improving physical stability (hardness) of the nanoparticles 512, the ratio is preferably 0.3 or more, and most preferably 0.5 or more. In addition, it is possible to contain a plurality of metal elements M1 except Si. For example, when two or more kinds of metal elements are contained, the total concentration of these metal elements is determined to be the element concentration (CpM1) of metal elements M1 except Si.

Further, since the metal element M1 except Si is selected from the group consisting of Ti, Zr, Zn, Sn, B, In and Al, stability of the metalloxane bond is improved, and therefore, arrangement accuracy of the nanoparticles 512 is improved with respect to concave-portion inner portions of the concavo-convex structure layer 514. Particularly, from the viewpoint of more exerting the effects, the metal element M1 except Si is more preferably selected from the group consisting of Ti, Zr, Zn, and B, and is most preferably selected from Ti and Zr.

In addition, the above-mentioned metalloxane bond (-Me-O-Me-) is defined as a state in which at least four or more metal elements are coupled through oxygen atoms i.e. defined as a state in which metal elements are condensed more than —O—Ma—O—Mb—O—Mc—O—Md—O— (in addition, Ma, Mb, Mc and Md may be all the same elements or may be different.) For example, when the metalloxane bond comprised of Si—O—Ti—O—Si—O— is contained, the metalloxane bond according to the present invention is defined in the range of $n \geq 2$ in a general formula of $[—Ti—O—Si—O—]_n$. In addition, the bond is not always alternately arranged mutually as —O—Ti—O—Si—. Therefore, in a general formula of —O—Ma-O-Mb-O-Mc-O-Md-O—, it is assumed that Ma, Mb, Mc and Md may be mutually different or be the same. In addition, from the viewpoint of controllability of the refractive index as described already, it is preferable to contain at least one or more Si. In the case where the metalloxane bond is the general formula $[\text{-Me-O-}]_n$ (in addition, Me is Si or metal element M1 except Si), when n is 10 or more, improved more is arrangement accuracy of the nanoparticles 512 and controllability of the refractive index. From the same effects, n is preferably 15 or more.

Further, as well as the above-mentioned metalloxane bond, it is preferable to contain a siloxane bond. Herein, the siloxane bond is defined as $[—Si—O—]_n$ (in addition, $n \geq 10$). By $n \geq 10$, leveling properties specific to the siloxane bond develop, and it is possible to improve filling arrangement accuracy of the nanoparticles 512 in concave-portion inner portions of the concavo-convex structure layer 514. Further, by containing the siloxane bond, since it is possible to increase the distance between the metal elements M1, it is possible to improve environmental (humidity) stability as the dilute solution 512S of nanoparticle raw materials, and arrangement accuracy of the nanoparticles 512 is thereby improved. From the viewpoint of more exerting these effects, $n \geq 30$ is preferable, $n \geq 50$ is more preferable, and $n \geq 100$ is the most preferable. Further, from the viewpoint of more exerting leveling properties in concave-portion inner portions of the concavo-convex structure layer 514, $n \geq 200$ is preferable, and $n \geq 500$ is more preferable. On the other hand, from the viewpoint keeping the refractive index of the nanoparticles 512 high, $n \geq 100{,}000$ is preferable, $n \geq 10{,}000$ is more preferable, and $n \geq 8{,}000$ is the most preferable.

Further, when Me-OR (in addition, R is a chemical structure being an alcohol when described as HOR) is contained, it is possible to use the change in the form in coating the concavo-convex structure of the concavo-convex structure layer 514 with the dilute solution 512S of nanoparticle raw materials, and it is also possible to improve the density of the nanoparticles 512. In other words, improved is arrangement accuracy of the nanoparticles 512 in concave-portion inner portions of the concavo-convex structure layer 514, and it is also made easy to highly control the refractive index of the nanoparticles 512. As R in the case of describing as Me-OR, examples thereof an ethoxy group, methoxy group, propyl group, and isopropyl group.

From the viewpoint of filling arrangement accuracy of the nanoparticles 512 in concave-portion inner portions of the concavo-convex structure layer 514, in the nanoparticle raw materials, the viscosity at 25° C. preferably ranges from 30 cP to 10,000 cP. Particularly, from the viewpoint of highly controlling the refractive index with ease, the viscosity is preferably 50 cP or more, more preferably 100 cP or more, and most preferably 150 cP or more. From the viewpoint of filling arrangement accuracy in concave-portion inner portions of the concavo-convex structure layer 514, the viscosity is more preferably 8,000 cP or less, and most preferably 5,000 cP or less. In addition, the viscosity is a value measured in the case where the solvent content is 5% or less.

In addition, in the above-mentioned description, the chemical composition is represented as -A-B-. The description is an expression to explain a bond between an element A and an element B, and for example, also in the case where an element A has three or more bonding groups, the same expression is used. In other words, the description of -A-B- represents at least that the element A chemically reacts with the element B, and includes that the element A forms a chemical bond with an element other than the element B.

Further, the second refractive index (n2) of the nanoparticles 512 arranged in concave-portion inner portions of the concavo-convex structure layer 514 in the nanoparticle arrangement step sometimes changes in the subsequent step, and including the change in the refractive index, the particles are referred to as the nanoparticles 512 having the second refractive index (n2).

In heat treatment in removing an excessive solvent, the temperature and time is not limited particularly, and it is possible to set as appropriate corresponding to vapor pressure, boiling point and the like of the solvent used in preparing the dilute solution of materials used as the nanoparticle raw materials, and coating film thickness (hc). As conditions of the heat treatment, when substantially the temperature is in a range of 20° C. to 300° C. and the time is in a range of 30 seconds to 1 hour, arrangement accuracy of the nanoparticle raw materials is improved, and therefore, such conditions are preferable. Further, in assuming that the boiling point of the used solvent is Ts, inclusion of a solvent removing step (1) in which the temperature (T) meets T<Ts more improves arrangement accuracy of the nanoparticle raw materials and is preferable, and it is more preferable to meet T<Ts/2. Furthermore, when a solvent removing step meeting T≈Ts is included after the solvent removing step, it is possible to further exert the above-mentioned effect, and therefore, such a step is preferable. In addition, T≈Ts is substantially T=Ts±20%.

For example, in the case of using a plate-shaped substrate as the substrate 513, it is possible to undergo a step of forming a film of the dilute solution 512S of nanoparticle raw materials on the concavo-convex structure surface by the spin coat method, cast method, ink jet method or the like, and removing an excessive solvent. Particularly, in the case of the spin coat method, it is preferable to use a solvent with low vapor pressure. Further, in the case of the spin coat method, when the dilute solution 512S of nanoparticle raw materials is cast, and rotation is performed after the concavo-convex structure surface is coated with the dilute solution 512S to form a thin film, arrangement accuracy of the nanoparticles 512 is improved, being preferable. On the other hand, when the substrate is in the shape of a film (reel) typified by a glass film and resin film, since it is possible to apply roll-to-roll process, productivity is improved. In addition, before the nanoparticle arrangement step, treatment may be added to the concavo-convex structure surface. As such treatment, there is oxygen plasma treatment, UV-$O_3$ treatment and the like.

In addition, after (2-2) nanoparticle arrangement step, a step of stabilizing the concavo-convex structure layer 514 and nanoparticles 512 may be added before (3) flattened layer formation step. Herein, stabilization means decreasing unreacted portions left in raw materials of the concavo-convex structure layer 514 and nanoparticles 512 or removing water contained in the raw materials of the concavo-convex structure layer 514 and nanoparticles 512. In the former case, it is possible to select as appropriate according to properties of raw materials of the medium having the first refractive index (n1) and nanoparticle raw materials, and for example, there is heat treatment and energy line irradiation treatment. As the temperature of heat treatment, it is preferable to select as appropriate in a range of 40° C. to 300° C., and in the case of energy line irradiation treatment, it is possible to adopt UV, IR, X-ray and the like. In the case of using an energy line, the type of light to apply is not limited particularly, and it is possible to select as appropriate corresponding to properties of the concavo-convex structure layer and nanoparticle layer. As the type of light to apply, for example, there is UV, IR, X-ray and the like. In the case of UV, as the light source, it is possible to use a UV-LED light source, metal halide light source, high-pressure mercury-vapor lamp light source and the like. Further, from the viewpoint of stabilization i.e. reactivity of unreacted groups, the integral light amount is preferably in a range of 500 mJ/$cm^2$ to 3000 mJ/$cm^2$, and is more preferably in a range of 800 mJ/$cm^2$ to 2500 mJ/$cm^2$. In addition, as the light source used in light irradiation, two or more or a plurality of light sources may be used together. By using a plurality of sources together, light irradiation is performed using wavelengths of different spectra for each light source. In this case, reactivity of unreacted groups is improved, and stability is improved. Furthermore, in the case of using two or more light sources, it is also possible to select similar light sources. In this case, it is possible to achieve the above-mentioned integral light amount easier, and stability is improved. In addition, in the case of applying light, application may be performed in an atmosphere of compressible gas typified by carbon dioxide and pentafluoropropane gas, in an atmosphere of nitrogen or argon gas, or under a reduced pressure (vacuum).

(3) Flattened Layer Formation Step

Figure 33A:
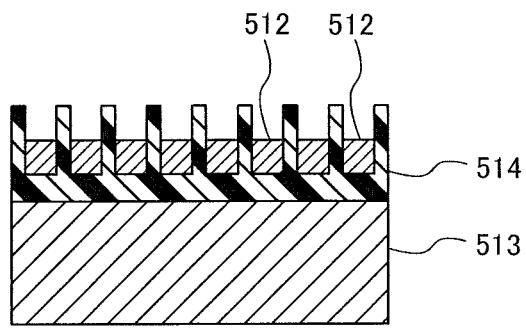
FIG. 33 contains cross-sectional schematic diagrams illustrating each step of the manufacturing method 1 of the light extraction product according to this Embodiment.
Figure 33B:
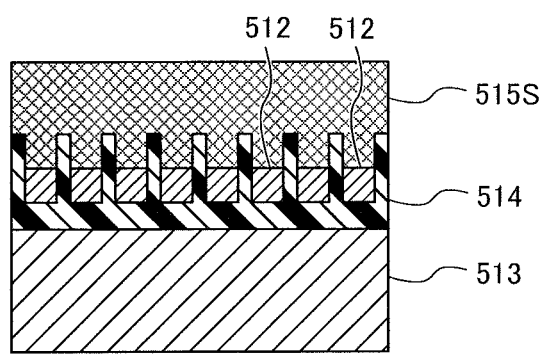
Figure 33C:
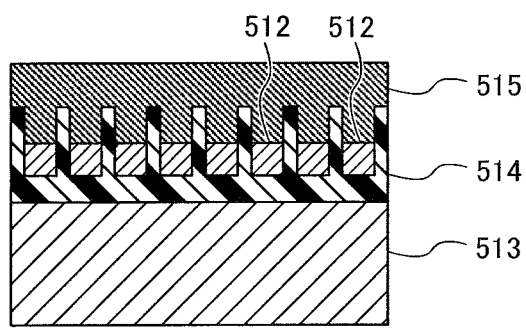

It is possible to form a flattened layer 515 covering the concavo-convex structure layer 514 and light extraction layer or nanoparticles 512 upper portions, by applying a dilute solution 515S of flattened layer materials on the concavo-convex structure surface of the concavo-convex structure layer 514 in which the concavo-convex structure layer 514 is formed on the substrate 513 surface and the light extraction layer or nanoparticles 512 are disposed, and removing an excessive solvent (see FIGS. 33A to 33C). The coating method is not limited particularly, and it is possible to use a gravure coat method, micro-gravure coat method, blade coat method, wire bar coat method, air knife coat method, dip coat method, comma knife coat method, spray coat method, curtain coat, ink jet method, spin coat method, bar coat method and the like. The solvent removing method is not limited particularly, and there is heat treatment, pressure reducing (vacuum) treatment and treatment in combination thereof.

The temperature and time in the case of heat treatment is not limited particularly, and it is possible to set as appropriate corresponding to vapor pressure, boiling point and the like of the solvent used in preparing the dilute solution of flattened layer materials, and coating film thickness. As conditions of the heat treatment, from the viewpoint of enhancing arrangement accuracy of the flattened layer, it is preferable that substantially the temperature is in a range of 20° C. to 300° C. and that the time is in a range of 30 seconds to 1 hour.

Further, in assuming that the boiling point of the used solvent is Ts, inclusion of a solvent removing step (1) in which the temperature (T) meets T<Ts more improves arrangement accuracy of the flattened layer and is preferable, and it is more preferable to meet T<Ts/2. Furthermore, when a solvent removing step (2) meeting T≈Ts is included after the solvent removing step (1), it is possible to further exert the above-mentioned effect, and therefore, such a step is preferable. In addition, T≈Ts is substantially T=Ts±20%. For example, in the case of applying the light extraction product to a bottom emission type organic EL device, since surface accuracy of the flattened layer surface is required, it is preferable to control a solvent to use and heat treatment appropriately to improve leveling properties. Moreover, as a method of flattening the exposed surface of the flattened layer, there is a method of laminating and pressing a wafer or reel provided with a mirror surface on its surface onto the exposed surface of the flattened layer after forming the flattened layer.

For example, in the case of using a plate-shaped substrate, it is possible to undergo a step of forming a film of the dilute solution of the flattened layer on the roughness surface of the left surface of the concavo-convex structure layer with the light extraction layer disposed by the spin coat method, cast method, ink jet method or the like, and removing an excessive solvent. Particularly, in the case of the spin coat method, it is preferable to use a solvent with low vapor pressure. On the other hand, when the substrate is in the shape of a film (reel) typified by a glass film and resin film, since it is possible to apply roll-to-roll process, productivity is improved.

In addition, before (3) flattened layer formation step, treatment may be added to the roughness surface of the concavo-convex structure layer with the light extraction layer or nanoparticles 512 disposed. As such treatment, there is oxygen plasma treatment, UV-$O_3$ treatment and the like.

Figure 34A:
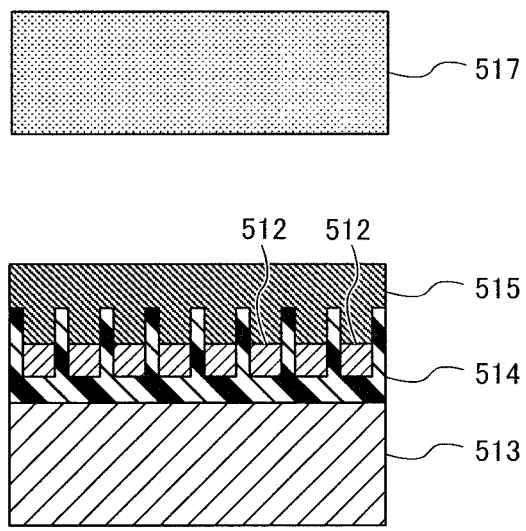
FIG. 34 contains cross-sectional schematic diagrams illustrating each step of the manufacturing method 1 of the light extraction product according to this Embodiment.
Figure 34B:
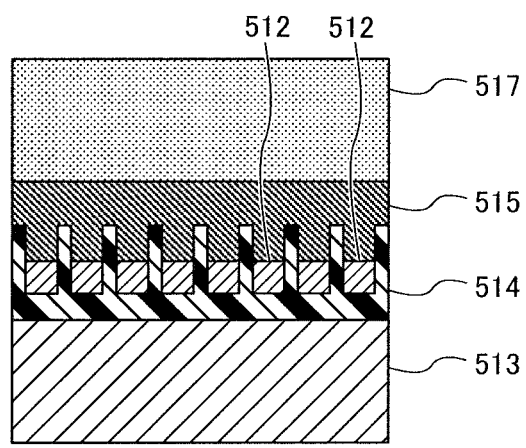
Figure 34C:
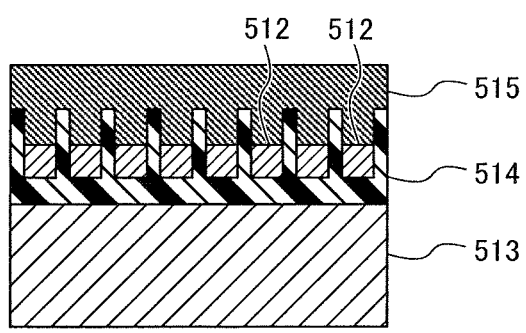

In addition, after (3) flattened layer formation step, the product may undergo a step of laminating and pressing a wafer or reel provided with a mirror surface on its surface to the exposed surface of the flattened layer 515. By undergoing this step, it is possible to improve surface accuracy of the flattened layer 515, and improved is arrangement accuracy in placing a transparent conductive film or the like on the flattened layer (light input surface 1a) of the light extraction product 1 according to the first aspect, and reliability of the semiconductor light emitting device 10. As the flattening method, for example, as shown in FIGS. 34A to 34C, there is a method of laminating and pressing a wafer 517 (or reel, the same in the following description) provided with a mirror surface on its surface onto the surface of the flattened layer 515 after forming the flattened layer 515, and then, peeling off the wafer 517.

Figure 35A:
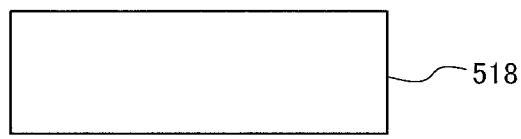
FIG. 35 contains cross-sectional schematic diagrams illustrating one step of the manufacturing method 1 of the light extraction product according to this Embodiment.
Figure 35A:
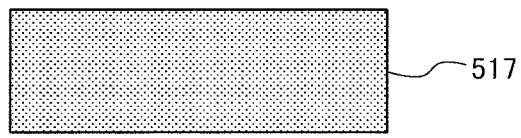
Figure 35B:
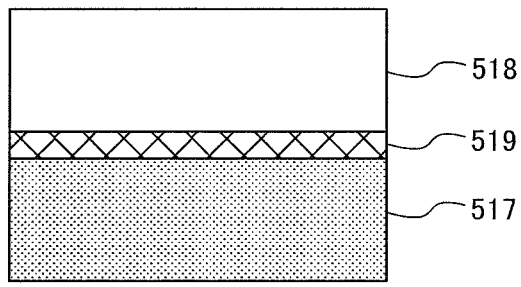
Figure 35C:
Figure 35C:
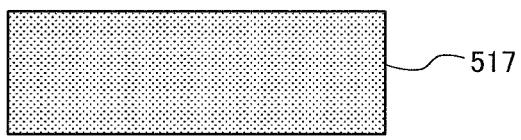

In addition, it is possible to prepare a reel provided with a mirror surface on its surface by transferring a wafer (for example, silicon wafer) provided with a mirror surface on its surface to the reel to form. FIG. 35 contains cross-sectional schematic diagrams illustrating one step of the manufacturing method of the light extraction product according to this Embodiment. For example, as shown in FIGS. 35A to 35C, a surface of the wafer 517 provided with a mirror surface on the surface and a reel 518 are nipped via a transfer material 519 (photocurable resin or the like), and then, an energy line is applied to cure the transfer material. Finally, by separating the wafer 517 and reel 518, it is possible to manufacture the reel 518 having the mirror surface (surface of the transfer material 519) on the surface. Alternatively, it is also possible to prepare a mirror surface continuously on the reel 518 surface by a transfer method using a photocurable resin with mirror-polished cylinder surface accuracy. Particularly, from the viewpoint of obtaining the flattened layer 515 having a flattened surface continuously, it is preferable that the flattened layer material is a photocurable substance, and that a method is to perform light irradiation with the wafer 517 or reel 518 provided with the mirror surface on their surface laminated and pressed onto the surface of the flattened layer 515 to cure the flattened layer 515, and then peel off the mirror surface body.

In addition, after the flattened layer formation step, a step of stabilizing may be added. Herein, stabilization means decreasing unreacted portions left in the concavo-convex structure layer, light extraction layer or nanoparticle raw materials and the flattened layer or removing water contained in the concavo-convex structure layer, light extraction layer or nanoparticle raw materials and the flattened layer. In the former case, it is possible to select as appropriate according to properties of raw materials of the medium having the first refractive index (n1) and nanoparticle raw materials, and for example, there is heat treatment and energy line irradiation treatment. As the temperature of heat treatment, it is preferable to select as appropriate in a range of 40° C. to 300° C., and in the case of energy line irradiation treatment, it is possible to adopt UV, IR, X-ray and the like.

In the case of using an energy line, the type of light to apply is not limited particularly, and it is possible to select as appropriate corresponding to properties of the concavo-convex structure layer, light extraction layer or nanoparticles and the flattened layer. As the type of light to apply, for example, there is UV, IR, X-ray and the like. In the case of UV, as the light source, it is possible to use a UV-LED light source, metal halide light source, high-pressure mercury-vapor lamp light source and the like. Further, from the viewpoint of stabilization i.e. reactivity of unreacted groups, the integral light amount is preferably in a range of 500 mJ/cm$^2$ to 3000 mJ/cm$^2$, and is more preferably in a range of 800 mJ/cm$^2$ to 2500 mJ/cm$^2$. In addition, as the light source used in light irradiation, two or more or a plurality of light sources may be used together. By using a plurality of sources together, light irradiation is performed using wavelengths of different spectra for each light source. In this case, reactivity of unreacted groups is improved, and stability is improved. Furthermore, in the case of using two or more light sources, it is also possible to select similar light sources. In this case, it is possible to achieve the above-mentioned integral light amount easier, and stability is improved. In addition, in the case of applying light, application may be performed in an atmosphere of compressible gas typified by carbon dioxide and pentafluoropropane gas, in an atmosphere of nitrogen or argon gas, or under a reduced pressure (vacuum).

Further, a thin film made of a material low in water absorption properties may be further formed on the flattened layer after forming the flattened layer. As a refractive index of such a newly provided layer, it is preferable that the refractive index is substantially equal or equal to the refractive index (n3) of the flattened layer. As such materials, examples thereof are sol-gel materials typified by metal alkoxide, spin-on glass and hydrogen silsesquioxane.

In addition, as the mold in the above-mentioned manufacturing method of the light extraction product, from the viewpoint of improving productivity and transfer accuracy, it is preferable to adopt a reel-shaped mold as described below.

[Manufacturing Method 2]

FIG. 36 contains cross-sectional schematic diagrams illustrating each step of the manufacturing method 2 of the light extraction product according to this Embodiment. In another manufacturing method of the light extraction product according to this Embodiment, among the above-mentioned manufacturing methods, it is preferable that the product is manufactured by a manufacturing method including at least steps of (1) to (4) as described below in this order. Particularly, it is useful in arranging the light extraction layer only in convex-portion upper portions of the concave-convex structure layer.

By this means, controllability of each component is improved, and throughput in manufacturing is also improved.

(1) Reel-Shaped Mold Formation Step

Step of transferring a concavo-convex structure of a cylindrical master mold provided with the concavo-convex structure on its surface to a film-shaped substrate 661 surface continuously by a light transfer method, and obtaining a reel-shaped mold 520 provided with a concavo-convex structure 662 on its surface (see FIG. 36A).

(2) Light Extraction Layer (Nanoparticle) Filling Step

Step of applying a dilute solution of the light extraction layer (nanoparticle raw materials) on the concavo-convex structure surface of the reel-shaped mold 520, removing an excessive solvent, and arranging a light extraction layer (nanoparticles) 512 in concave-portion inner portions of the reel-shaped mold 520 (see FIG. 38B).

(3) Light Extraction Layer (Nanoparticles) Transfer Step

Step of laminating the concavo-convex structure surface of the reel-shaped mold 520 with the light extraction layer (nanoparticles) disposed onto the surface of a substrate 513 having the fourth refractive index (n4) via concavo-convex layer raw materials having the first refractive index (n1), applying an energy line, then peeling off the reel-shaped mold 520, and obtaining the light extraction product comprised of <substrate 513 having the fourth refractive index (n4)>/<concavo-convex structure layer 514 having the first refractive index (n1)>/<Light extraction layer (nanoparticles 512) having the second refractive index (n2) provided on tops of the convex-portions of the concavo-convex structure layer> (see FIG. 36C).

(4) Flattened Layer Formation Step

Step of applying a dilute solution of medium raw materials having the first refractive index (n1) on the concavo-convex structure layer 514 and the light extraction layer (nanoparticles) 512, and forming the flattened layer 515 having the first refractive index (n1) to cover the light extraction layer (nanoparticles) 512 and the concavo-convex structure layer 514 (see FIG. 36D).

(1) Reel-Shaped Mold Formation Step

Figure 37:
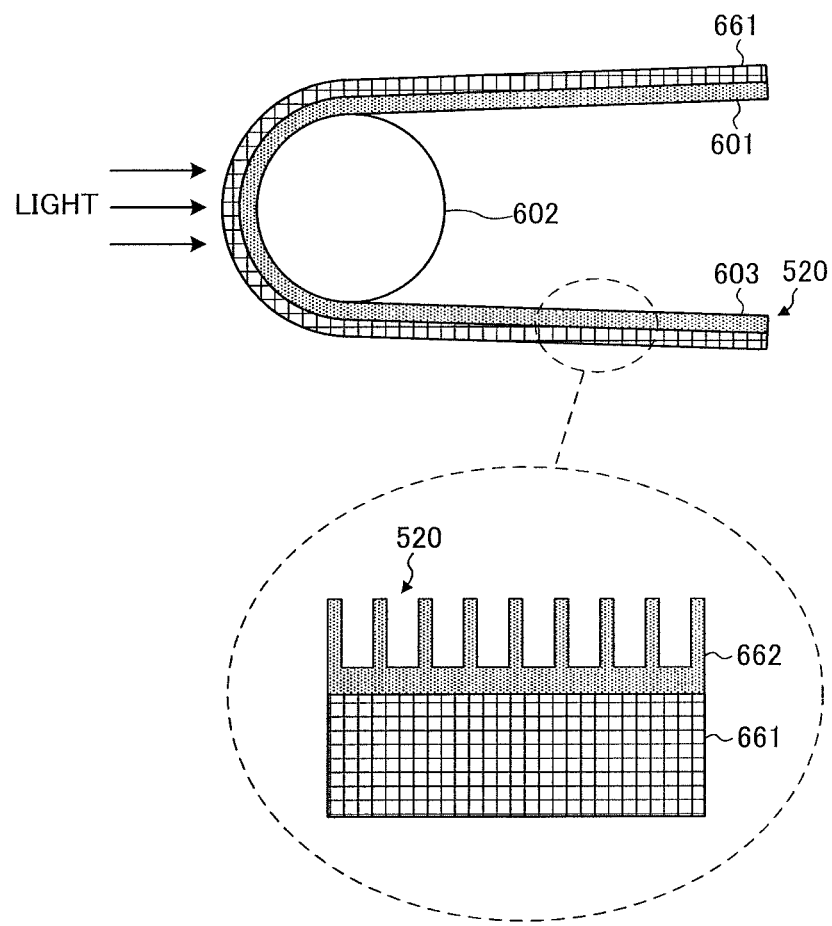
FIG. 37 is a schematic diagram showing an example of a light transfer method in the manufacturing method 2 of the light extraction product according to this Embodiment.

A transfer formation method of the reel-shaped mold 520 is not limited particularly, and it is preferable to apply a light transfer method capable of being performed with roll-to-roll. As the light transfer method, for example, there is a method (continuous process) as shown in FIG. 37. FIG. 37 is a schematic diagram showing an example of the light transfer method in the manufacturing method of the light extraction product according to this Embodiment.

(1-1): Step of applying a photocurable resin composition (hereinafter, simply referred to as a resin also) 601 on a film-shaped substrate 661 (step of applying a resin)

(1-2): Step of bringing the applied resin 601 into contact with a cylindrical master mold (hereinafter, simply referred to as a master mold) 602 provided with mold release treatment (step of pressing the resin against the mold)

(1-3): Step of performing light irradiation from the film-shaped substrate 661 to photo-radical-polymerize the resin 601, and obtaining a cured material 603 (step of photo-curing the resin)

(1-4): Step of peeling off the cured material 603 from the master mold 602, and obtaining a concavo-convex structure provided with an inverse shape of a pattern shape of the master mold 602 (step of peeling off the cured material from the mold)

As a result, the reel-shaped mold 520 is obtained which has the concavo-convex structure 662 on the film-shaped substrate 661.

Figure 38:
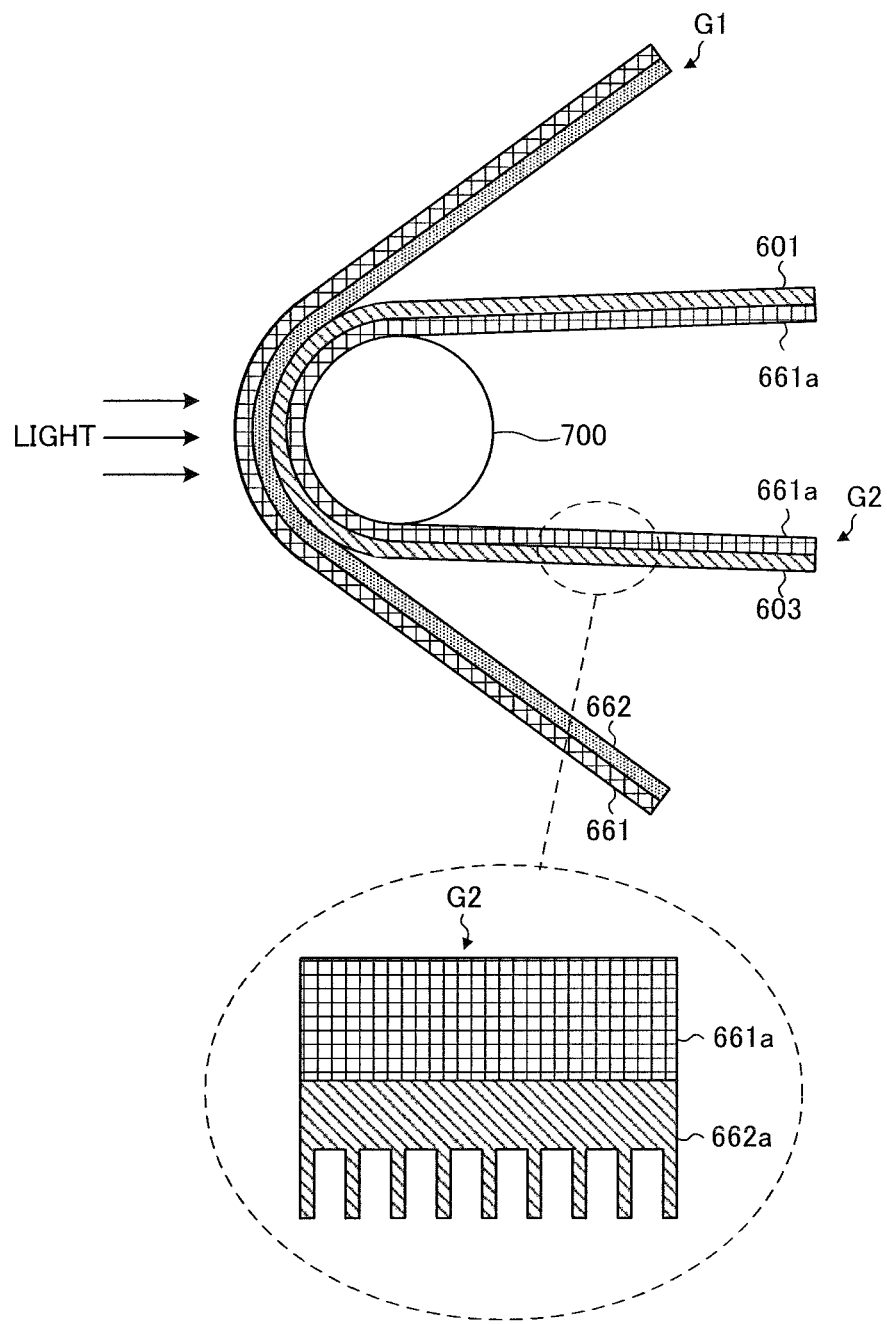
FIG. 38 is a schematic diagram illustrating a manufacturing step of a reel-shaped mold G2 in the manufacturing method 2 of the light extraction product according to this Embodiment.

In addition, a reel-shaped mold G2 may be prepared using the reel-shaped mold 520 obtained in the step (1-4) as a mold G1 to perform (2) light extraction layer (nanoparticles) filling step and subsequent steps using the reel-shaped mold G2. For example, it is possible to manufacture such a reel-shaped mold G2 by the following steps (1-5) to (1-8) as shown in FIG. 38. FIG. 38 is a schematic diagram illustrating a manufacturing step of the reel-shaped mold G2 in the manufacturing method 2 of the light extraction product according to this Embodiment.

(1-5): Step of applying the resin 601 onto a film-shaped substrate 661a (step of applying a resin)

(1-6): Step of bringing the applied resin 601 into contact with the reel-shaped mold G1 to press with a laminate roll 703 (step of pressing the resin against the mold)

(1-7): Step of performing light irradiation from both or one of the substrate side of the reel-shaped mold G1 and the substrate side of the reel-shaped mold G2 to photo-radical-polymerize the resin 601, and obtaining the cured material 603 (step of photo-curing the resin)

(1-8): Step of peeling off the cured material 603 from the reel-shaped mold G1, and obtaining a concavo-convex structure provided with the same shape as a pattern shape of the master mold 602 as shown in FIG. 38 (step of peeling off the cured material from the mold, step of obtaining the reel-shaped mold G2).

The reel-shaped mold G2 obtained as a result has a concavo-convex structure 662a on the film-shaped substrate 661a as shown in FIG. 38.

As the coating method in the steps (1-1) and (1-5), it is possible to apply a roller coat method, bar coat method, die coat method, gravure coat method, micro-gravure coat method, inkjet method, spray coat method, air knife coat method, flow coat method, curtain coat method, and the like.

A coating improvement structure may be contained in the concavo-convex structure prepared in the step (1). The coating improvement structure is disposed to sandwich a base structure to prepare a desired light extraction layer (nanoparticles) arrangement, and a pitch of the coating improvement structure is preferably larger than that of the basic structure. Particularly, it is preferable that the pitch of the coating improvement structure gradually increases from the basic structure side to the film end portion.

In the steps (1-3) and (1-7), the type of light to apply is not limited particularly, and it is possible to select as appropriate corresponding to properties of the photocurable resin composition. As the type of light to apply, for example, there is UV, IR, X-ray and the like. In the case of UV, as the light source, it is possible to use a UV-LED light source, metal halide light source, high-pressure mercury-vapor lamp light source and the like. Further, from the viewpoint of improving transfer accuracy, the integral light amount is preferably in a range of 500 mJ/cm$^2$ to 3000 mJ/cm$^2$, and is more preferably in a range of 800 mJ/cm$^2$ to 2500 mJ/cm$^2$. In addition, in the case of applying light, application may be performed in an atmosphere of compressible gas typified by carbon dioxide and pentafluoropropane gas, in an atmosphere of nitrogen or argon gas, or under a reduced pressure (vacuum). Further, as the light source used in light irradiation, two or more or a plurality of light sources may be used together. By using a plurality of sources together, light irradiation is performed using wavelengths of different spectra for each light source. In this case, reactivity (reaction rate) of the photocurable resin composition is improved, and transfer accuracy and stability is improved. Further, in the case of using two or more light sources, it is also possible to select similar light sources. In this case, it is possible to achieve the above-mentioned integral light amount easier, and stability is improved.

In a manner to manufacture the reel-shaped mold G2 from the reel-shaped mold G1, it is possible to manufacture a reel-shaped mold G3 from the reel-shaped mold G2 and a reel-shaped mold G4 from the reel-shaped mold G3. In other words, a reel-shaped mold (GN+1) is prepared from a reel-shaped mold GN, and regarding the mold (GN+1) as the above-mentioned reel-shaped mold (G1), (2) nanoparticles filling step and subsequent steps may be performed.

In addition, when a pattern of the reel-shaped mold (GN) is comprised of the photocurable resin (GN), and a pattern of the reel-shaped mold (GN+1) is also comprised of the photocurable resin (GN+1), both of the photocurable resins (GN, GN+1) are preferably fluorine-containing photocurable resins. By being the fluorine-containing photocurable resins, it is possible to cause segregation of fluorine components to the pattern portion surface of the photocurable resin (GN). By this means, the reel-shaped mold (GN) is provided with mold release properties of the pattern portion, and is capable of also ensuring adhesion to the substrate, and it is thereby possible to obtain the reel-shaped mold (GN+1) with excellence. In such a reel-shaped mold (GN) or reel-shaped mold (GN+1), it is preferable that the fluorine element concentration (Es) in the surface portion is higher than the average fluorine element concentration (Eb) in the resin forming the pattern.

When a ratio (Es/Eb) between the average fluorine element concentration (Eb) in the resin layer forming the reel-shaped mold (GN) and/or reel-shaped mold (GN+1) and the fluorine element concentration (Es) in the fine pattern surface portion of the resin layer forming the reel-shaped mold (GN) and/or reel-shaped mold (GN+1) meets 1≤Es/Eb≤30000, it is possible to more exert the above-mentioned effects, and therefore, such a range is preferable. Particularly, the ranges of from 3≤Es/Eb≤1500 to 10≤Es/Eb≤100 further improve mold release properties, and are preferable.

In addition, when the ratio is in the range of 20≤Es/Eb≤200 within the aforementioned widest range (1<Es/Eb≤30000), the fluorine element concentration (Es) in the resin layer surface portion forming the reel-shaped mold (GN) and/or reel-shaped mold (GN+1) is sufficiently higher than the average fluorine concentration (Eb) in the resin layer, free energy on the reel-shaped mold (GN) and/or reel-shaped mold (GN+1) surface decreases effectively, and mold release properties from the medium having the first refractive index (n1) and nanoparticles 512 are thereby improved. Further, by lowering the average fluorine element concentration (Eb) in the resin layer forming the reel-shaped mold (GN) and/or reel-shaped mold (GN+1) relative to the fluorine element concentration (Es) in the resin layer surface portion forming the reel-shaped mold (GN) and/or reel-shaped mold (GN+1), the strength of the resin itself is improved, while free energy can be kept high near the film-shaped substrate (support film), and therefore, adhesion to the film-shaped substrate (support film) is improved. By this means, it is possible to obtain the reel-shaped mold (GN) and/or reel-shaped mold (GN+1) which is excellent in adhesion to the film-shaped substrate (support film), excellent in mold release properties from the medium having the first refractive index (n1) and nanoparticles 512 having the second refractive index (n2), and which enables the concave-convex shape of the nanometer size to be transferred repeatedly from resin to resin, being particularly preferable.

Further, in the range of 2 (Es/Eb) it is possible to further lower free energy on the resin layer surface forming the reel-shaped mold (GN) and/or reel-shaped mold (GN+1), repetition transfer properties are excellent, and therefore, the range is preferable. Furthermore, in the range of 30≤(Es/Eb)≤160, it is possible to maintain the strength of the resin while decreasing free energy on the resin layer surface forming the reel-shaped mold (GN) and/or reel-shaped mold (GN+1), repetition transfer properties are further improved, the range is thereby preferable, and the range of 31≤(Es/Eb)≤155 is more preferable. The range of 46≤(Es/Eb)≤155 enables the aforementioned effects to be further exerted, and is preferable.

For example, the pattern surface side region of the resin layer forming the reel-shaped mold (GN) and/or reel-shaped mold (GN+1) means an intrusion portion of approximately 1% to 10% in the film thickness direction or an intrusion portion of 2 nm to 20 nm in the film thickness direction, from the pattern surface side surface of the resin layer forming the reel-shaped mold (GN) and/or reel-shaped mold (GN+1) toward the film-shaped substrate (support film) side. In addition, it is possible to quantify the fluorine element concentration (Es) in the pattern surface side region of the resin layer forming the reel-shaped mold (GN) and/or reel-shaped mold (GN+1) by an XPS method. The penetration length of X-rays of the XPS method is several nanometers, thus shallow, and therefore, is suitable for quantifying the Es value. As another analysis method, it is also possible to calculate Es/Eb using energy dispersive X-ray spectroscopy (TEM-EDX) using a transmission electron microscope. Further, it is possible to calculate the average fluorine concentration (Eb) in the resin constituting the resin layer forming the reel-shaped mold (GN) and/or reel-shaped mold (GN+1) from the amount of charge, or to measure with a gas chromatograph mass spectrometer (GC/MS). For example, it is possible to identify the average fluorine element concentration by physically peeling off the resin layer forming the reel-shaped mold (GN) and/or reel-shaped mold (GN+1), and applying gas chromatograph mass spectroscopy to the resultant. On the other hand, it is possible to identify the average fluorine element concentration (Eb) in the resin by decomposing a slice obtained by physically peeling off the resin layer forming the reel-shaped mold (GN) and/or reel-shaped mold (GN+1) by a flask combustion method, and then, applying ion chromatography analysis to the resultant.

In addition, from the viewpoints of meeting the range of Es/Eb as described above and exerting the effects, the photocurable resin composition preferably contains at least photocurable acrylic monomer, fluorine-containing (meth)acrylate and photopolymerization initiator. When the fluorine-containing (meth)acrylate is fluorine-containing urethane(meth) acrylate expressed by following chemical formula (1), it is possible to effectively increase the fluorine element concentration (Es) of the surface portion with the average fluorine element concentration (Eb) in the resin lowered, and to more effectively develop adhesion to the substrate and mold release properties, and therefore, the fluorine-containing urethane (meth)acrylate is preferable. As such an urethane (meta)acrylate, for example, it is possible to use "OPTOOL DAC" made by Daikin Industries, Ltd.

Chemical formula (1)

[Chemistry 1]

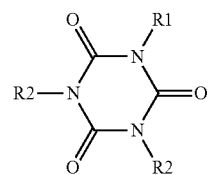

(In chemical formula (1), R1 represents following chemical formula (2), and R2 represents following chemical formula (3).)

Chemical formula (2)

[Chemistry 2]

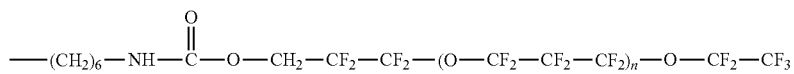

(In chemical formula (2), n is an integer of from 1 to 6.)

Chemical formula (3)

[Chemistry 3]

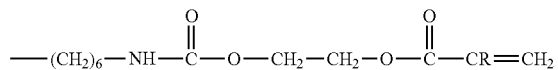

(In chemical formula (3), R is H or $CH_3$.)

(2) Light Extraction Layer (Nanoparticles) Filling Step

Figure 39A:
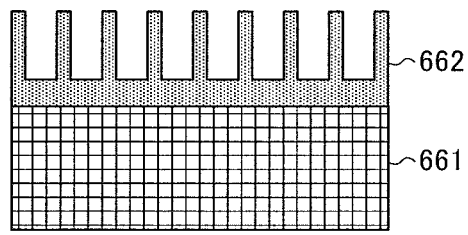
FIG. 39 contains schematic diagrams illustrating a light extraction layer filling step in the manufacturing method 2 of the light extraction product according to this Embodiment.
Figure 39B:
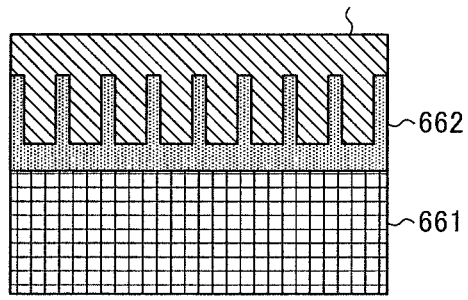
Figure 39C:
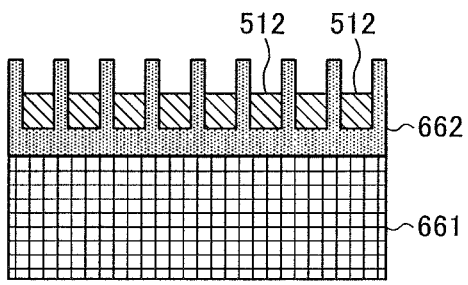

The coating method of the light extraction layer (nanoparticle raw materials) is not limited particularly, and it is possible to use a gravure coat method, micro-gravure coat method, die coat method, blade coat method, wire bar coat method, air knife coat method, dip coat method, comma knife coat method, spray coat method, curtain coat, inkjet method, spin coat method, and the like. FIG. 39 contains schematic diagrams illustrating the light extraction layer filling step in the manufacturing method 2 of the light extraction product according to this Embodiment. It is possible to arrange the light extraction layer (nanoparticles) 512 by setting coating conditions that a coating film thickness (hc) of a dilute solution in coating, volume concentration (C) of the dilute solution of nanoparticle raw materials, and concave-portion volume (Vc) of the concavo-convex structure existing in a region of a unit area (Sc) meet Sc·hc·C<Vc, applying the dilute solution 512S of the light extraction layer (nanoparticle raw materials) onto the concavo-convex structure (662) surface of the reel-shaped mold 520 provided with the film-shaped substrate 661 and concavo-convex structure 662 (see FIGS. 39A, 39B), and removing an excessive solvent after coating (FIG. 39C). The method of removing the solvent is not limited particularly, and there is heat treatment, pressure reducing (vacuum) treatment, and treatment in combination thereof.

In addition, in order to enlarge accuracy and margin in filling and arranging the light extraction layer (nanoparticles) 512 in only concave-portion inner portions of the concavo-convex structure layer 514 (see FIG. 30), it is possible to use, from the same effects, the contact angle with respect to the concavo-convex structure of the concavo-convex structure layer 514, aperture ratio of the concavo-convex structure 662 of the concavo-convex structure layer 514, nanoparticle raw materials, and solvents to dilute nanoparticle raw materials as described in (2) light extraction layer (nanoparticles) arrangement step of above-mentioned [Manufacturing method 1]. In addition, when the nanoparticle raw materials contain one of an acrylic group, methacrylic group, acryloyl group, methacryloyl group, acryloxy group, methacryloxy group, vinyl group, epoxy group and oxetane group, and further, a photo-polymerization initiator, it is possible to improve transfer accuracy of the light extraction layer (nanoparticles) 512 in (3) light extraction layer (nanoparticles) transfer step as described later. From the viewpoint of further exerting the above-mentioned effects, it is more preferable to contain an acrylic group, methacrylic group, acryloyl group, methacryloyl group, acryloxy group, methacryloxy group, and vinyl group.

Further, the second refractive index (n2) of the light extraction layer (nanoparticles) 512 arranged in concave-portion inner portions of the concavo-convex structure in the light extraction layer (nanoparticle) filling step sometimes changes in the subsequent step, and including the change in the refractive index, the layer is referred to as the light extraction layer (nanoparticles) 512 having the second refractive index (n2).

The temperature and time in the case of heat treatment is not limited particularly, and it is possible to adopt the conditions as described in (2) light extraction layer (nanoparticles) arrangement step of above-mentioned [Manufacturing method 1] from the same effects.

In addition, after (2) light extraction layer (nanoparticles) filling step (before (3) light extraction layer (nanoparticles) transfer step), a step of stabilizing the light extraction layer (nanoparticles) 512 may be added in the same manner as described in (2) light extraction layer (nanoparticles) arrangement step of above-mentioned [Manufacturing method 1].

(3) Light Extraction Layer (Nanoparticles) Transfer Step

Figure 40:
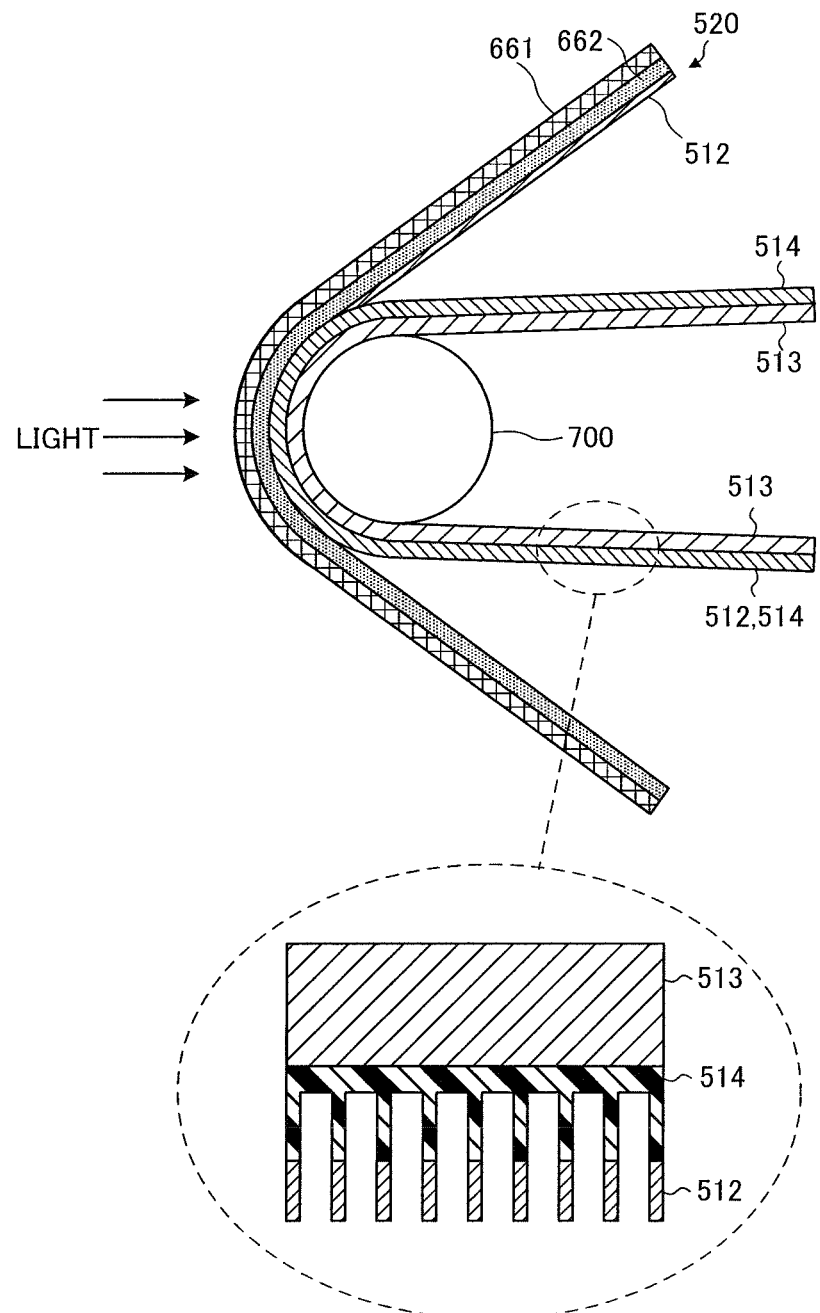
FIG. 40 is a schematic diagram illustrating a light extraction layer transfer step in the manufacturing method 2 of the light extraction product according to this Embodiment.

FIGS. 40 and 41 contain schematic diagrams illustrating the light extraction layer transfer step in the manufacturing method 2 of the light extraction product according to this Embodiment. When the substrate 513 is a film-shaped substrate, as shown in FIG. 40, medium raw materials with the first refractive index (n1) are applied on one main surface of the substrate 513 to provide the concavo-convex structure layer 514. The nanoparticle surface side of the reel-shaped mold 520 with the light extraction layer (nanoparticles) 512 disposed and medium raw materials forming the concavo-convex structure layer 514 are laminated using a laminate roll 700, while an energy line is applied, then the reel-shape mold 520 is peeled off, and it is thereby possible to transfer and arrange the light extraction layer (nanoparticles) 512.

The coating method is not limited particularly, and it is possible to use a gravure coat method, micro-gravure coat method, die coat method, blade coat method, wire bar coat method, air knife coat method, dip coat method, comma knife coat method, spray coat method, curtain coat, ink jet method and the like.

Figure 41A:
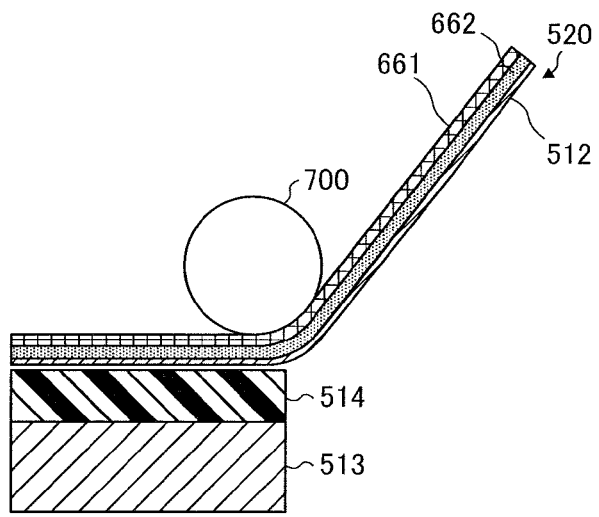
FIG. 41 contains schematic diagrams illustrating the light extraction layer transfer step in the manufacturing method 2 of the light extraction product according to this Embodiment.
Figure 41B:
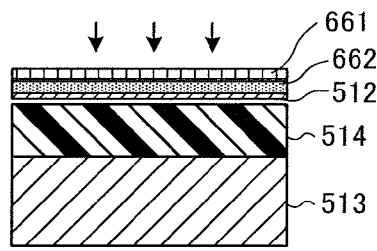
Figure 41C:
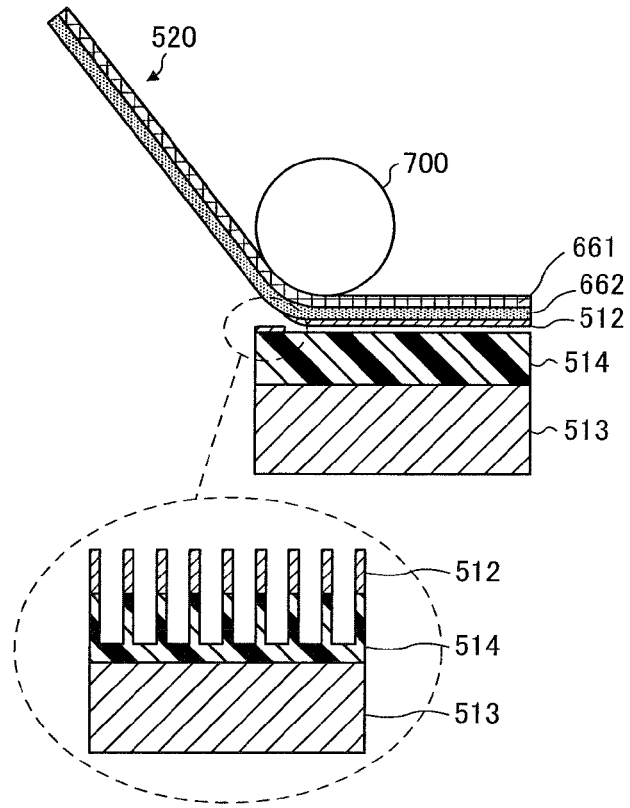

When the substrate 513 is a plate-shaped substrate, as shown in FIG. 41, medium raw materials having the first refractive index (n1) are applied on one main surface of the substrate 513 to provide the concavo-convex structure layer 514. The nanoparticle surface side of the reel-shaped mold 520 with the light extraction layer (nanoparticles) 512 disposed and medium raw materials forming the concavo-convex structure layer 514 are laminated using the laminate roll 700 (see FIG. 41A), while an energy line is applied (see FIG. 41B), then the reel-shape mold 520 is peeled off (see FIG. 41C), and it is thereby possible to transfer and arrange the light extraction layer (nanoparticles) 512.

The coating method is not limited particularly, and it is possible to use a spin coat method, ink jet method and the like. In addition, it is also possible to transfer and arrange the light extraction layer (nanoparticles) 512 by the following method. In other words, the medium raw materials having the first refractive index (n1) are applied on the nanoparticle surface side of the reel-shaped mold 520 with the light extraction layer (nanoparticles) 512 disposed. Then, one main surface of the substrate 513 and medium raw materials are laminated using the laminate roll 700, and an energy line is applied. Subsequently, the reel-shaped mold 520 is peeled off.

The coating method is not limited particularly, and it is possible to use a gravure coat method, micro-gravure coat method, die coat method, blade coat method, wire bar coat method, air knife coat method, comma knife coat method, spray coat method, curtain coat method, inkjet method and the like.

In the case where the medium raw materials having the first refractive index (n1) to apply on one main surface of the substrate 513 contain a solvent, the solvent may be removed before laminating. In this, there is heat treatment. The temperature and time is not limited particularly, and it is possible to set as appropriate corresponding to vapor pressure, boiling point and the like of the solvent, and coating film thickness. As conditions of the heat treatment, when substantially the temperature is in a range of 20° C. to 300° C. and the time is in a range of 30 seconds to 1 hour, transfer formation accuracy of the structuring layer having the first refractive index is enhanced, and therefore, such conditions are preferable. Further, in assuming that the boiling point of the used solvent is Ts, inclusion of a solvent removing step (1) in which the temperature (T) meets T<Ts more improves coating accuracy and is preferable, and it is more preferable to meet T<Ts/2. Furthermore, when a solvent removing step (2) meeting T≈Ts is included after the solvent removing step (1), it is possible to further exert the above-mentioned effect, and therefore, such a step is preferable. In addition, T≈Ts is substantially T=Ts±20%.

The type of light to apply is not limited particularly, and it is possible to select as appropriate corresponding to properties of the transfer target material. As the type of light to apply, for example, there is UV, IR, X-ray and the like. In the case of UV, as the light source, it is possible to use a UV-LED light source, metal halide light source, high-pressure mercury-vapor lamp light source and the like. Further, from the viewpoint of improving transfer accuracy, the integral light amount is preferably in a range of 500 mJ/cm$^2$ to 3000 mJ/cm$^2$, and is more preferably in a range of 800 mJ/cm$^2$ to 2500 mJ/cm$^2$. In addition, in the case of applying light, application may be performed in an atmosphere of compressible gas typified by carbon dioxide and pentafluoropropane gas, in an atmosphere of nitrogen or argon gas, or under a reduced pressure (vacuum). Further, as the light source used in light irradiation, two or more or a plurality of light sources may be used together. By using a plurality of sources together, light irradiation is performed using wavelengths of different spectra for each light source. In this case, reactivity (reaction rate) of the photocurable resin composition is improved, and transfer accuracy and stability is improved. Furthermore, in the case of using two or more light sources, it is also possible to select similar light sources. In this case, it is possible to achieve the above-mentioned integral light amount easier, and stability is improved.

It is preferable to perform pretreatment on the substrate 513, before the above-mentioned step (3) light extraction layer (nanoparticles) transfer step. As the pretreatment, there is formation of an adhesive layer and making of hydrophilicity.

The adhesive layer is not limited particularly, as long as the layer has adhesion to both the substrate 513 and the medium having the first refractive index (n1), and it is possible to adopt from a thin film with several nanometers or more to a molecular layer with several nanometers or less. For example, it is possible to form the adhesive layer by a method of exposing to vapor of end functional group-modified silane coupling agent, a method of immersing in or spray coating a solution of end functional group-modified silane coupling agent and thereby forming a single molecular layer film, or the like. Particularly, in the case where the thickness of the adhesive layer is several nanometers or more, materials of the adhesive layer are preferably optically transparent. In the case of several nanometers or less close to a single molecular layer, since the effects of light absorption and multiple reflection by the adhesive layer are extremely small, properties in this case are not limited particularly, but optically transparent is preferable.

(4) Flattened Layer Formation Step

After the above-mentioned step (3) light extraction layer (nanoparticles) transfer step, by undergoing a flattened layer formation step of forming the flattened layer 515 having the first refractive index (n1) to cover the light extraction layer (nanoparticles) raw materials and concavo-convex structure layer 514, it is possible to manufacture the light extraction product of the present invention.

In addition, before the flattened layer formation step, treatment may be added to the roughness surface of the concavo-convex structure layer 514 with the light extraction layer (nanoparticles) 512 disposed. As such treatment, there is oxygen plasma treatment, UV-O$_3$ treatment and the like.

Figure 42A:
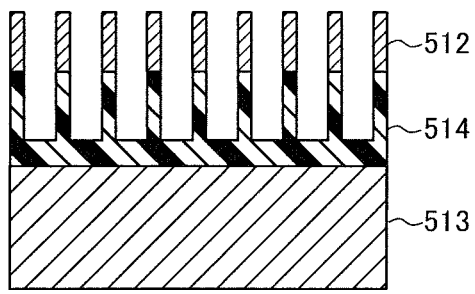
FIG. 42 contains schematic diagrams illustrating a flattened layer formation step in the manufacturing method 2 of the light extraction product according to this Embodiment.
Figure 42B:
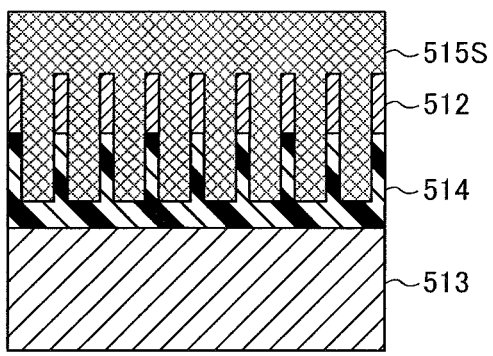
Figure 42C:
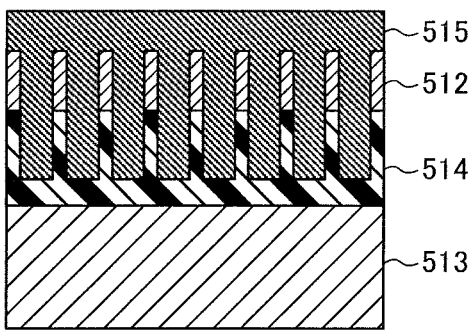

FIG. 42 contains schematic diagrams illustrating the flattened layer formation step in the manufacturing method 2 of the light extraction product according to this Embodiment. The flattened layer formation step is a step of applying a dilute solution 515S of flattened layer materials on the concavo-convex structure surface of the concavo-convex structure layer 514 with the light extraction layer (nanoparticles) 512 disposed (FIGS. 42A, 42B), removing an excessive solvent, and thereby forming the flattened layer 515 covering the concavo-convex structure layer 514 and upper portions of light extraction layer (nanoparticles) 512 (FIGS. 42A, 42B, 42C). The coating method is not limited particularly, and it is possible to use a gravure coat method, micro-gravure coat method, die coat method, blade coat method, wire bar coat method, air knife coat method, dip coat method, comma knife coat method, spray coat method, curtain coat, ink jet method, spin coat method and the like. The solvent removing method is not limited particularly, and there is heat treatment, pressure reducing (vacuum) treatment and treatment in combination thereof.

The temperature and time in the case of heat treatment is not limited particularly, and it is possible to set as appropriate corresponding to vapor pressure, boiling point and the like of the solvent used in preparing the dilute solution 515S of flattened layer materials, and coating film thickness. As conditions of the heat treatment, from the viewpoint of enhancing arrangement accuracy of the flattened layer 515, it is preferable that substantially the temperature is in a range of 20° C. to 300° C. and that the time is in a range of 30 seconds to 1 hour.

Further, in assuming that the boiling point of the used solvent is Ts, inclusion of a solvent removing step (1) in which the temperature (T) meets T<Ts more improves arrangement accuracy of the flattened layer 515 and is preferable, and it is more preferable to meet T<Ts/2. Furthermore, when a solvent removing step (2) meeting T≈Ts is included after the solvent removing step (1), it is possible to further exert the above-mentioned effect, and therefore, such a step is preferable. In addition, T≈Ts is substantially T=Ts±20%. For example, in the case of applying the light extraction product 1 to a bottom emission type organic EL device, since surface accuracy of the flattened layer surface is required, it is preferable to control a solvent to use and heat treatment appropriately to improve leveling properties. Moreover, as a method of flattening the exposed surface of the flattened layer 515, there is a method of laminating and pressing a wafer or reel provided with a mirror surface on its surface onto the exposed surface of the flattened layer 515 after forming the flattened layer.

Figure 43A:
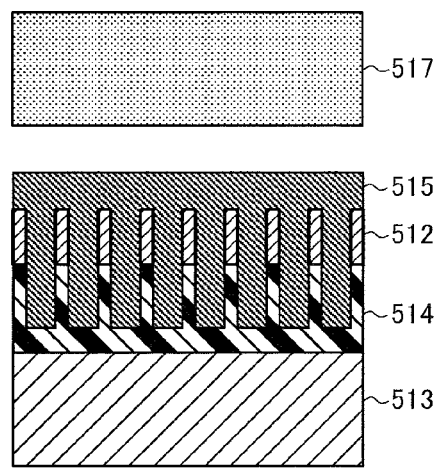
FIG. 43 contains schematic diagrams illustrating a step after forming the flattened layer in the manufacturing method 2 of the light extraction product according to this Embodiment.
Figure 43B:
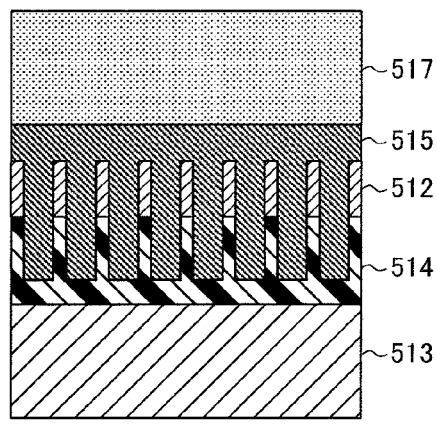
Figure 43C:
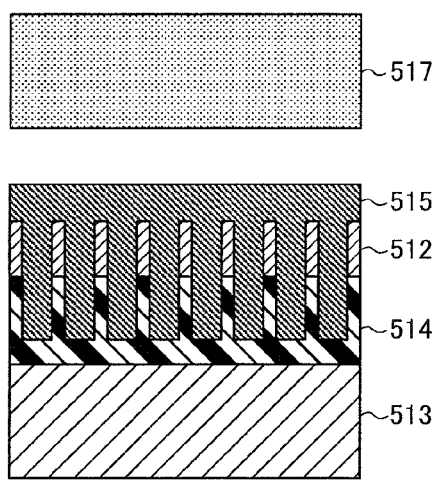

In addition, after (3) flattened layer formation step, the product may undergo a step of laminating and pressing a wafer or reel provided with a mirror surface on its surface onto the exposed surface of the flattened layer. By undergoing this step, it is possible to improve surface accuracy of the flattened layer, and improved is arrangement accuracy in placing a transparent conductive film or the like on the flattened layer 515 of the light extraction product, and reliability of the semiconductor light emitting device 10. FIG. 43 contains schematic diagrams illustrating a step after forming the flattened layer in the manufacturing method 2 of the light extraction product according to this Embodiment. As the flattening method, for example, as shown in FIGS. 43A to 43C, there is a method of laminating and pressing the wafer 517 (or reel) provided with a mirror surface on its surface onto the surface of the flattened layer 515 (see FIGS. 43A, 43B) after forming the flattened layer 515, and then, peeling off the wafer 517 (or reel) (see FIG. 43C). In addition, it is possible to prepare a reel provided with a mirror surface on its surface by transferring the surface of a wafer (for example, silicon wafer) provided with a mirror surface on its surface to the reel to form. For example, as shown in FIG. 35, a surface of the wafer 517 provided with a mirror surface on the surface and a reel 518 are nipped via the transfer material 519 (photocurable resin or the like), and then, an energy line is applied to cure the transfer material 519. Finally, by separating the wafer 517 and reel 518, it is possible to manufacture the reel 518 having the mirror surface (surface of the transfer material 519) on the surface. Alternatively, it is also possible to prepare a mirror surface continuously on the surface of the reel 518 by a transfer method using a photocurable resin with mirror-polished cylinder surface accuracy.

Particularly, from the viewpoint of obtaining the flattened layer 515 having a flattened surface continuously, it is preferable that the flattened layer material is a photocurable substance, and that a method is to perform light irradiation with the wafer 517 or reel 518 provided with the mirror surface on their surface laminated and pressed onto the surface of the flattened layer 515 to cure the flattened layer 515, and then peel off the mirror surface body.

In addition, after the flattened layer formation step, a step of stabilizing may be added. Herein, stabilization means decreasing unreacted portions left in the concavo-convex structure layer 514, light extraction layer (nanoparticle raw materials) 512 and the flattened layer 515 or removing water contained in the concavo-convex structure layer 514, light extraction layer (nanoparticle raw materials) 512 and the flattened layer 515. In the former case, it is possible to select as appropriate according to properties of the transfer material, nanoparticle raw materials and the flattened layer 515, and for example, there is heat treatment and energy line irradiation treatment. As the temperature of heat treatment, it is preferable to select as appropriate in a range of 40° C. to 300° C., and in the case of energy line irradiation treatment, it is possible to adopt UV, IR, X-ray and the like. In the case of using an energy line, the type of light to apply is not limited particularly, and it is possible to select as appropriate corresponding to properties of the concavo-convex structure layer 514, light extraction layer (nanoparticles) and the flattened layer 515. As the type of light to apply, for example, there is UV, IR, X-ray and the like. In the case of UV, as the light source, it is possible to use a UV-LED light source, metal halide light source, high-pressure mercury-vapor lamp light source and the like. Further, from the viewpoint of stabilization i.e. reactivity of unreacted groups, the integral light amount is preferably in a range of 500 mJ/cm$^2$ to 3000 mJ/cm$^2$, and is more preferably in a range of 800 mJ/cm$^2$ to 2500 mJ/cm$^2$. In addition, as the light source used in light irradiation, two or more or a plurality of light sources may be used together. By using a plurality of sources together, light irradiation is performed using wavelengths of different spectra for each light source. In this case, reactivity of unreacted groups is improved, and stability is improved. Furthermore, in the case of using two or more light sources, it is also possible to select similar light sources. In this case, it is possible to achieve the above-mentioned integral light amount easier, and stability is improved. In addition, in the case of applying light, application may be performed in an atmosphere of compressible gas typified by carbon dioxide and pentafluoropropane gas, in an atmosphere of nitrogen or argon gas, or under a reduced pressure (vacuum).

Further, a thin film made of a material low in water absorption properties may be further formed on the flattened layer 5151 after forming the flattened layer. As a refractive index of such a newly provided layer, it is preferable that the refractive index is substantially equal or equal to the refractive index (n3) of the flattened layer 515. As such materials, examples thereof are sol-gel materials typified by metal alkoxide, spin-on glass and hydrogen silsesquioxane.

<Semiconductor Light Emitting Device>

It is possible to suitably use the semiconductor light emitting device according to the above-mentioned Embodiment as a semiconductor light emitting device of an LED, organic EL and the like.

Described next is an organic EL device using the above-mentioned layered product. As a light extraction scheme of the organic EL device, there are a top emission scheme (hereinafter, referred to as "top emission type organic EL device"), and a bottom emission scheme (hereinafter, referred to as "bottom emission type EL organic device"). As the top emission type organic EL device, it is possible to obtain an organic EL device with light extraction improved by laminating the flattened layer 13 of the light extraction product 1 according to the above-mentioned first aspect onto a light emission layer surface (for example, transparent conductive layer typified by ITO) of the organic EL device. Further, it is possible to obtain the organic EL device with light extraction improved by laminating the light extraction layer surface side of the light extraction product 2 according to the second aspect onto a light emission layer surface (for example, transparent conductive layer typified by ITO) of the organic EL device via the adhesive layer 13a. In addition, in the case of using the light extraction product 2 according to the second aspect, the adhesive layer 13a is preferably a sealant because reliability of the organic EL device is further improved. Herein, as the light emitting layer surface of the organic EL device, there is the transparent conductive film surface typified by ITO. Since it is possible to exert the effects when the range of the above-mentioned average distance Lor is met, higher flatness of the flattened layer 13 is more preferable, but is not limited particularly. Further, because of being used by laminating, it is preferable that adhesion between the light emission layer surface (for example, transparent conductive layer typified by ITO) of the organic EL device and the flattened layer 13 is higher. For example, when materials forming the flattened layer 13 contain at least a binder resin, reactive dilute material, and initiator, it is possible to crimp (laminate•adhere) by heat. After crimping, light and heat is applied to cause the initiator active, the reactive dilute material is thereby caused to react, and it is thereby possible to bond strongly.

In the case of the bottom emission scheme, by providing at least the transparent conductive layer and light emitting layer in this order on the flattened layer 13 of the light extraction product 1 according to the first aspect, it is possible to manufacture an organic EL device with light extraction efficiency improved. In this case, in order to control a short circuit of the organic EL device and improve reliability of the organic EL device, it is necessary to decrease the film thickness distribution of the transparent conductive layer in the layered direction of the organic EL device. Therefore, as the surface of the flattened layer 13 of the light extraction product 1 according to the first aspect, the smoother surface is more preferable. For example, using Ra (5 μcm×5 μm) obtained with an atomic force microscope, although Ra closer to 0 nm is preferable, substantially Ra≤10 nm or less is preferable, Ra≤5 nm or less is more preferable, and Ra≤2.5 nm or less is the most preferable. In other words, in the case of applying the light extraction product 1 according to the above-mentioned first aspect to the bottom emission type organic EL device, in order to control the flatness of the surface of the flattened layer 13, it is preferable to undergo leveling control in drying the solvent in the flattened layer 13 formation step, or the step of laminating and pressing a wafer or reel provided with a mirror surface on its surface onto the surface of the flattened layer 13 and the like after the flattened layer 13 formation step.

The type of the substrate of the light extraction product 1 according to first aspect is not limited particularly, but it is preferable that the substrate is an optically transparent flexible substrate or optically transparent inorganic substrate, and it is more preferable that the substrate is the substrate further having water vapor barrier properties and gas barrier properties typified by glass. In the case of using the light extraction product 1 according to the first aspect in manufacturing the top emission type organic EL device as descried above, when the substrate is a flexible substrate, laminating properties of the layered product is improved. Further, by using the flexible substrate, continuous productivity of the layered product is improved. Materials of the flexible substrate are not limited particularly, and in the case of using in a heat resistant environment, there are glass (glass film), transparent polyimide and the like. In the other case, there are optically transparent resin films such as PET, TAC, PEN, and COP. In addition, in order to improve long-term reliability of the organic EL device, it is also possible to use a glass plate, glass film, and a layered product of a glass film and a resin film as the substrate.

On the other hand, in the case of applying to the bottom emission type organic EL device, when the substrate is an optically transparent inorganic substrate or heat resistant substrate, it is made easy to placing the transparent conductive film onto the flattened surface layer of the layered product. Materials thereof are not limited particularly, and examples are glass, quartz, quartz crystal, sapphire and transparent polyimide. Particularly, from the viewpoints of continuous productivity and long-term reliability, it is also possible to use a glass plate, glass film, and a layered product of a glass film and a resin film as the substrate.

In addition, the above-mentioned optically transparent is defined as the case where an extinction coefficient (imaginary part of the refractive index) is zero. When a complex refractive index is N, it is possible to express N=n−ik. Herein, i is an imaginary number and means that $i^2=-1$. In this case, n is referred to as (the real part of) the refractive index, and k is referred to as the extinction coefficient (imaginary part of the refractive index). In other words, a medium of k=0 is defined as an optically transparent medium. In addition, k is an index indicative of absorption of light to the medium, and meets the relationship with an absorption coefficient α of $\alpha=4\pi k/\lambda$. λ is a wavelength. In other words, when k=0, the absorption coefficient is zero, and such a medium is a medium that does not develop light absorption. Herein, the case of k=0 is defined as the case where k is 0.01 or less. By meeting this range, optical transparent properties are improved, and therefore, such a range is preferable.

EXAMPLES

Examples performed to clarify the effects of the present invention will be described below. In addition, the present invention is not limited by the following Examples at all.
<Light Extraction Product A: Dot-Shaped Concavo-Convex Structure>
(Preparation of a Cylindrical Mold)

Used as a substrate of a cylindrical mold was a cylindrical quartz glass roll with a diameter of 80 mm and a length of 50 mm. A resist layer was deposited on the quartz glass roll surface, and a concavo-convex structure was formed on the surface of the resist layer by a direct-write lithography method using a semiconductor pulse laser. A plurality of types of concavo-convex structures was prepared, and a concavo-convex structure (arrangement LP) having a long period structure will be described as a representative.

First, the resist layer was deposited on the surface of the quartz glass roll by a sputtering method. Next, the quartz glass roll with the resist layer deposited was exposed on the following conditions while rotating at linear speed s=1.0 m/sec.

Exposure semiconductor laser wavelength: 405 nm
Exposure laser power: 3.6 mV
X-axis direction pitch (Px): 433 nm
Variable width δ2 with respect to the X-axis direction pitch (Px): 108 nm
Long period (Px)L in the X-axis direction of the variable width δ2: 5000 nm
Y-axis direction pitch (Py): 500 nm
Variable width δ1 with respect to the Y-axis direction pitch (Py): 125 nm
Long period (Py)L in the Y-axis direction of the variable width δ1: 5000 nm The Y-axis direction pitch (Py) is determined as described below. Time T required for one circumference is measured using a Z-phase signal of a spindle motor as a reference, a circumferential length L is calculated from the linear speed s, and the following equation (A) is obtained.

$$L = T \times s \qquad \text{Eq. (A)}$$

Assuming a target pitch as (Py), a value of 0.1% or less of the target pitch (Py) is added to adjust so that L/(Py) is an integer, and an effective pitch (Py)' is obtained by the following equation (B).

$$L/(Py)' = m \ (m \text{ is an integer}) \qquad \text{Eq. (B)}$$

With respect to the target pitch (Py) and effective pitch (Py)', although strictly (Py)≠(Py)', since L/(Py)≈$10^7$, the equation of $|(Py)-(Py)'|/(Py)'\approx10^{-7}$ holds, and it is possible to handle so that (Py) and (Py)' are substantially equal. Similarly, with respect to the long period (Py)L, an effective long period (Py)L' is obtained by the following equation (C) so that L/(Py)L is an integer.

$$L/(Py)L'=n \text{ (}n\text{ is an integer)} \qquad \text{Eq. (C)}$$

Also in this case, although strictly $(Py)L\ne(Py)L'$, since $L/(Py)L\approx10^5$, the equation of $|(Py)L-(Py)L'|/(Py)L\approx10^{-5}$ holds, and it is possible to handle so that (Py)L and (Py)L' are substantially equal.

Next, from the effective pitch (Py)', a reference pulse frequency fy0 and modulation frequency fyL are calculated by the following equations (D) and (E).

$$fy0=s/(Py)' \qquad \text{Eq. (D)}$$

$$fyL=s/(Py)L' \qquad \text{Eq. (E)}$$

Finally, from the above-mentioned Eq. (D) and Eq. (E), a pulse frequency fy at elapsed time t from the Z-phase signal of the spindle motor is determined as in the following equation (F).

$$fy=fy0+\delta1\times\sin(t\times(fyL/fy0)\times2\pi) \qquad \text{Eq. (F)}$$

An axis feed velocity in the X-axis direction is determined as described next. The time T required for one circumference is measured using the Z-phase signal of the spindle motor as a reference, and a reference feed velocity Vx0 in the axis direction is determined from the X-axis direction pitch (Px) as in the following equation (G).

$$Vx0=(Px)/T \qquad \text{Eq. (G)}$$

The axis feed velocity Vx at time t is determined from the long period (Px)L in the X-axis direction by the following equation (H) and scanning is performed.

$$Vx=Vx0+V\delta2\cdot\sin((Px)/(Px)L\times t\times2\pi) \qquad \text{Eq. (H)}$$

Herein, $V\delta2$ is a velocity variable width in the long period (Px)L in the X-axis direction, and is expressed with the pitch variable width $\delta2$ of the long period (Px)L, (Px)L and Vx0 by the following equation (I).

$$V\delta2=\delta2\times Vx0/(Px)L \qquad \text{Eq. (I)}$$

After performing exposure by the above-mentioned operation, the resist layer was developed, and using the developed resist layer as a mask, etching of the quartz glass was performed by dry etching. Next, only the residual resist layer was peeled off from the quartz glass roll provided with the concavo-convex structure on the surface to prepare a cylindrical mold (mold for transfer).

(Preparation of the Reel-Shaped Mold G1)

The obtained cylindrical mold was coated with Durasurf HD-1101Z (made by Daikin Industries, Ltd.), heated at 60° C. for 1 hour, and then, allowed to stand at room temperature for 24 hours to fix. Then, cleaning was performed three times using Durasurf HD-ZV (made by Daikin Industries, Ltd.), and mold release treatment was performed.

Next, a photocurable resin was prepared by mixing a fluorine-containing additive (made by Daikin Industries, Ltd. OPTOOL DAC HP), trimethylolpropane (EO-modified) triacrylate (made by TOAGOSEI Co., Ltd. M350), 1-hydroxy-cyclohexyl-phenyl-ketone (made by BASF Company Irgacure (Registered Trademark) 184), and 2-benzyl-2-dimethylamino-1-(4-morpholino phenyl)-butanone-1 (made by BASF Company Irgacure (Registered Trademark) 369) in a ratio of 15:100:5.5:2.0 in parts by weight. Next, the photocurable resin was applied on an easy adhesion surface of a PET film (A4100, made by Toyobo Co., Ltd.: width 300 mm, thickness 100 µm) by Micro Gravure coating (made by Yasui Seiki Co., Ltd.) so that the coating film thickness was 6 µm.

Next, the PET film coated with the photocurable resin was pressed against the cylindrical mold with a nip roll (0.1 MPa), and was irradiated with ultraviolet rays at a temperature of 25° C. and humidity of 60% under atmospheric pressure using a UV exposure apparatus (made by Fusion UV Systems Japan Co., Ltd., H bulb) so that the integral amount of exposure below the center of the lamp was 1000 mJ/cm$^2$, photo-curing was carried out successively, and obtained was a reel-shaped mold G1 with the concavo-convex structure inversely transferred to the surface. The reel-shaped mold G1 was 200 m length, and 300 mm width.

When the reel-shaped mold G1 was observed with a scanning electron microscope described below, convex portions of cross-sectional shape of Φ450 nm and h800 nm were formed in periodical structure having the following long period structure.

X-axis direction pitch (Px): 433 nm
    Variable width δ2 with respect to the X-axis direction pitch (Px): 108 nm
    Long period (Px)L in the X-axis direction of the variable width δ2: 5000 nm
    Y-axis direction pitch (Py): 500 nm
    Variable width δ1 with respect to the Y-axis direction pitch (Py): 125 nm
    Long period (Py)L in the Y-axis direction of the variable width δ1: 5000 nm
    (Scanning electron microscope)
    Apparatus; HITACHI s-5500
    Acceleration voltage; 10 kV
    MODE; Normal (Preparation of the Reel-Shaped Mold G2)

Next, the above-mentioned photocurable resin was applied on an easy adhesion surface of the PET film (A4100, made by Toyobo Co., Ltd.: width 300 mm, thickness 100 µm) by Micro Gravure coating (made by Yasui Seiki Co., Ltd.) so that the coating film thickness was 2 µm.

Next, the PET film coated with the photocurable resin was pressed against the above-mentioned reel-shaped mold G1 with the nip roll (0.1 MPa), and was irradiated with ultraviolet rays at a temperature of 25° C. and humidity of 60% under atmospheric pressure using the UV exposure apparatus (made by Fusion UV Systems Japan Co., Ltd., H bulb) so that the integral amount of exposure below the center of the lamp was 1000 mJ/cm$^2$, photo-curing was carried out successively, and obtained was a reel-shaped mold G2 with the concavo-convex structure inversely transferred to the surface. The reel-shaped mold G2 was 200 mm length, and 300 mm width.

When the reel-shaped mold G2 was observed with the scanning electron microscope described below, concave portions of cross-sectional shape of Φ450 nm and concave-portion depth h 800 nm were formed in periodical structure having the following long period structure.

X-axis direction pitch (Px): 433 nm
    Variable width δ2 with respect to the X-axis direction pitch (Px): 108 nm
    Long period (Px)L in the X-axis direction of the variable width δ2: 5000 nm
    Y-axis direction pitch (Py): 500 nm
    Variable width δ1 with respect to the Y-axis direction pitch (Py): 125 nm
    Long period (Py)L in the Y-axis direction of the variable width δ1: 5000 nm
    (Scanning Electron Microscope)
    Apparatus; HITACHI s-5500
    Acceleration voltage; 10 kV
    MODE; Normal In addition, XPS measurement as described below was performed on the concavo-convex structure surface of each of obtained reel-shaped molds G1 and G2, the surface layer fluorine element concentration Es was obtained, and was divided by the average fluorine element concentration Eb in the resin forming the concavo-convex structure layer to calculate Es/Eb, and the values were varied with the structure, and ranged approximately between 40 and 80.
(Fluorine Element Concentration Measurement)

The reel-shaped mold was cut into small pieces of about 2 mm square, and the piece was covered with a 1 mm×2 mm slot type mask and underwent XPS measurement on the following conditions.

XPS Measurement Condition
  Used apparatus; Thermo Fisher ESCALAB 250
  Excitation source; mono. AlKα15 kV×10 mA
  Analysis size; About 1 mm (shape was an ellipse)
Retrieve Region
  Survey scan; 0~1, 100 ev
  Narrow scan; F 1s, C 1s, O 1s, N 1s
Pass Energy
  Survey scan; 100 ev
  Narrow scan; 20 eV Examples 1 to 5

Preparation of the Concavo-Convex Structure Layer

The above-mentioned reel-shaped mold G1 was cut to the length of 50 cm. Next, the following material (1) diluted with propylene glycol monomethyl ether was applied on a glass film (refractive index 1.52) with a width of 300 mm and a length of 600 mm by a bar coating method. In addition, the main surface of the glass film was beforehand treated with a silane coupling agent with an acryloxy terminal (3-acryloxypropyl trimethoxysilane) and was used. The coating film thickness was set so that the solid film thickness subsequent to solvent evaporation was 800 nm. After coating, the film was allowed to stand at room temperature for 2 minutes, and then, the concavo-convex structure formation surface side of the cut reel-shaped mold G1 was laminated to the surface coated with the following material (1) of the glass film at a pressure of 0.01 Mpa. Subsequently, UV light with an integral amount of exposure was 1000 mJ/cm² was applied from the reel-shaped mold G1 side, and after heating at 105° C. for 2 minutes, the reel-shaped mold G1 was peeled off. After peeling, the obtained layered product comprised of concavo-convex structure layer/substrate was heated at 200° C. for 30 minutes in a vacuum.

Material (1) . . . Material obtained by mixing 3-acryloxypropyl trimethoxysilane (made by Shin-Etsu silicone corporation, KBM-5103): tricyclodecane dimethyl diacrylate: fluorine-based additive (made by Daikin Industries, Ltd. OPTOOL DAC HP)=20 g:80 g: 5 g to perform partially polycondensation in an atmosphere of 80° C., and adding 2 parts by weight of 1-hydroxy-cyclohexyl-phenyl-ketone (made by BASF Company Irgacure (Registered Trademark) 184) to 100 parts by weight of the mixed material.
(Formation of the Light Extraction Layer)

One of the above-mentioned material (1), the following material (2) and the following material (3) was diluted with propylene glycol monomethyl ether, and was applied on the concavo-convex structure of the concavo-convex structure layer of the layered product comprised of concavo-convex structure layer/substrate by a bar coat method. Herein, it was set that the volume of the concavo-convex structure in a unit area was larger than the solid amount per unit area. After coating, the resultant was allowed to stand for 3 minutes in an environment of a temperature of 25° C. and humidity of 50%, and further, was heated at 80° C. for 60 seconds. Subsequently, the resultant was subjected to heat treatment for 30 minutes in an atmosphere of 200° C. in a vacuum. The light extraction product obtained by the operation was the light extraction product 2 according to the second aspect as shown in FIG. 3 comprised of the substrate, the concavo-convex structure layer having the first refractive index and the light extraction layer having the second refractive index.

Material (2) . . . Tetra-n-butoxy zirconium:tetraethoxysilane=90 g:10 g were mixed, and the mixture was stirred in an environment of a temperature of 25° C. and humidity of 50%. Next, water diluted with ethanol to 3.25% was dropped to promote hydrolysis. Subsequently, polycondensation was promoted in an atmosphere of 80° C., and finally excessive alcohol was removed by evacuating to obtain the material.

Material (3) . . . Material with tetra-n-butoxy zirconium: tetraethoxysilane=52 g:48 g in the material (2).
(Formation of the Flattened Layer)

A silicon wafer surface of 4-inch Φ was treated with UV-$O_3$ for 15 minutes. Next, a film of Durasurf 1101Z was formed by spin coating, and was allowed to stand in an atmosphere of a temperature of 25° C. and humidity of 50% for 12 hours. Then, using a Durasurf HD-ZV solution, spin coat cleaning was performed three times.

One of the above-mentioned materials (1) to (3) diluted with propylene glycol monomethyl ether and methyl isobutyl ketone was applied on the light extraction layer of the layered product of concavo-convex structure layer with the light extraction layer formed/substrate by the bar coat method. After coating, the resultant was allowed to stand for 1 minute at room temperature (25° C.), and then, was heated at 80° C. for 30 seconds.

Next, in the case where the above-mentioned material (1) was used as the flattened layer, the treated surface of a silicon wafer subjected to surface treatment was disposed on the surface coated with the above-mentioned material (1) and was pressed at a pressure of 0.01 Mpa, while UV light was applied from the substrate surface side so that the integral amount of exposure was 1000 mJ/cm². After UV irradiation, the silicon wafer was removed to obtain the light extraction product 1 according to the first aspect.

On the other hand, in the case where the above-mentioned material (2) or the following material (4) was used as the flattened layer, the treated surface of a silicon wafer subjected to surface treatment was disposed on the surface coated with the above-mentioned material (2) or the following material (4) and was pressed at a pressure of 0.01 Mpa for 3 minutes. After pressing, the pressure was released, and the resultant was allowed to stand for 1 hour in an environment of a temperature of 25° C. and humidity of 50%. Subsequently, the silicon wafer was removed, and the resultant was subjected to heat treatment for 30 minutes in an atmosphere of 200° C. in a vacuum to prepare the light extraction product 1. Surface accuracy of the flattened layer was measured in a range of 5 μm×5 μm with an atomic force microscope, and Ra was 5 nm or less in all the samples. The configurations of the light extraction products prepared in Examples 1 to 5 are shown in following Table 1.

Material (4) . . . Material obtained by mixing titanium tetrabutoxide:diethoxy-diphenyl-silane: tetraethoxysilane: end-OH-modified silicone (made by Shin-Etsu silicone corporation X21-5841): phenyl-modified silicone ((made by Dow Corning Toray Co., Ltd. SH710)=65 g:22.4 g:4.2 g:4.2 g:4.2 g, dropping 2260 ul of water diluted with ethanol to 3.25% to the mixed material while stirring, and promoting polycondensation in an atmosphere of 80° C.

Examples 6 and 7

Preparation of a Film-Shaped Mold Filled with the Light Extraction Layer

The reel-shaped mold G2 (L 200 m, W 300 mm) obtained as described above was wound off, and using the above-mentioned material (2) diluted with propylene glycol monomethyl ether as a coating solution, coating was made on the concavo-convex structure by micro-gravure. The coating film thickness was set so that the volume of the concavo-convex structure in a unit area was larger than the solid amount per unit area. After coating, while transporting the reel-shaped mold G2, the resultant was dried for 2 minutes in an environment of humidity of 50% and a temperature of 80° C., reeled and collected.

(Transfer of the Light Extraction Layer)

The above-mentioned reel-shaped mold G2 filled with the light extraction layer was cut to the length of 50 cm. Next, the following material (5) diluted with propylene glycol monomethyl ether was applied on a glass film (refractive index 1.52) with a width of 300 mm and a length of 600 mm by the bar coating method. In addition, the main surface of the glass film was beforehand treated with the silane coupling agent with an acryloxy terminal (3-acryloxypropyl trimethoxysilane) and was used. The coating film thickness was set so that the solid film thickness subsequent to solvent evaporation was 800 nm. After coating, the film was allowed to stand at room temperature for 2 minutes, and then, the concavo-convex structure formation surface side of the cut reel-shaped mold G2 filled with the light extraction layer was laminated to the surface coated with the following material (5) of the glass film at a pressure of 0.01 Mpa. Subsequently, UV light with an integral amount of exposure of 1000 mJ/cm$^2$ was applied from the reel-shaped mold G2 filled with the light extraction layer side, and after heating at 105° C. for 2 minutes, the reel-shaped mold G2 was peeled off. After peeling, the obtained light extraction product comprised of light extraction layer/concavo-convex structure layer/substrate was heated at 200° C. for 30 minutes in a vacuum.

Material (5) . . . Material obtained by mixing 3-acryloxypropyl trimethoxysilane (made by Shin-Etsu silicone corporation, KBM-5103): tricyclodecane dimethyl diacrylate=20 g:80 g to perform partially polycondensation in an atmosphere of 80° C., and adding 2 parts by weight of 1-hydroxycyclohexyl-phenyl-ketone (made by BASF Company Irgacure (Registered Trademark) 184) to 100 parts by weight of the mixed material.

In addition, the layered product obtained by the operation was the light extraction product 2 according to the second aspect comprised of the substrate, the concavo-convex structure layer having the first refractive index and the light extraction layer having the second refractive index.

Formation of the flattened layer was performed as in the light extraction product in which the light extraction layer having the second refractive index was disposed in concave-portion inner portions of the concavo-convex structure layer having the first refractive index of each of Examples 1 to 5. The configurations of the light extraction products prepared in Examples 6 and 7 are shown in following Table 1.

Comparative Example 1

Only the substrate was used as a light extraction product without providing the concavo-convex structure layer, light extraction layer and flattened layer. The configuration is shown in following Table 2.

Comparative Example 2

A light extraction product was prepared as in Example 1 except that all the concavo-convex structure layer, light extraction layer and flattened layer were formed of the material (1). The configuration is shown in following Table 2.

Comparative Example 3

A light extraction product was prepared as in Example 6 except that all the concavo-convex structure layer, light extraction layer and flattened layer were formed of the material (5). The configuration is shown in following Table 2.

Comparative Example 4

A light extraction product was prepared as in Example 1 except that the light extraction layer was not provided and that Lor of the flattened layer was 200 nm. The configuration is shown in following Table 2. Herein, Lor in this case means the distance between the average position of the top of the convex portions of the concavo-convex structure layer and the exposed surface of the flattened layer.

Comparative Example 5

A light extraction product was prepared as in Example 4 except that the pitches Px and Py were 10 times, and that the long period was not provided. The configuration is shown in following Table 2.

<Preparation of a Semiconductor Light Emitting Device (Organic EL Device)>

An organic EL device was prepared on the following conditions, using the light extraction product according to each of Examples 1 to 7 and Comparative Examples 1 to 5, and the prepared organic EL devices were evaluated.

(Bottom Emission Type Organic EL Device)

An anode, hole transport layer, electron transport layer, and cathode were layered in this order on the flattened layer surface of the light extraction product (light extraction product 1 according to the first aspect as shown in FIG. 1) to prepare a bottom emission type organic EL device. The material, film thickness and film formation method of each layer are as described below.
(1) Anode: ITO 130 nm Sputtering
(2) Hole transport layer: N,N'-diphenyl-N,N'-bis(1-naphtyl)-(1,1'-biphenyl)-(4,4'-diamine) (NPB) 60 nm Vacuum deposition
(3) Electron transport layer: Tris-(8-hydroxyquinoline)aluminum (Alg3) 40 nm Vacuum deposition
(4) Cathode: Al 100 nm Vacuum deposition (Top Emission Type Organic EL Device)

A buffer layer was deposited on plate-shaped glass, subsequently a cathode, electron transport layer, hole transport layer and anode were layered in this order, and then, the light extraction layer surface of the light extraction product (light extraction product 2 according to the second aspect as shown in FIG. 3) was brought into contact with the anode using a silicone-based sealant as the adhesive layer 13a to prepare a top emission type organic EL device. The material, film thickness and film formation method of each layer are as described below.

(1) Buffer layer: SiO$_2$ 100 nm Vacuum deposition
(2) Cathode: Ag 40 nm Vacuum deposition
(3) Electron transport layer: Tris-(8-hydroxyquinoline)aluminum (Alq3) 40 nm Vacuum deposition
(4) Hole transport layer: N,N'-diphenyl-N,N'-bis(1-naphtyl)-(1,1'-biphenyl)-(4,4'-diamine) (NPB) 60 nm Vacuum deposition
(5) Anode: ITO 150 nm Sputtering

TABLE 1

| | | | | LIGHT EXTRACTION PRODUCT 2 | | | | | | | | |
| | | | | LIGHT EXTRACTION PRODUCT 1 | | | | | | | | |
| | | SUB- | CONCAVO-CONVEX STRUCTURE LAYER | | | LIGHT EXTRACTION LAYER | | | | FLATTENED LAYER | | REFRAC- |
| | | STRATE n4 | n1 | MATE-RIAL | STRUC-TURE | n2 | MATE-RIAL | Lcc (nm) | Lcv (nm) | n3 | MATE-RIAL | Lor (nm) | TIVE INDEX |
|---|---|---|---|---|---|---|---|---|---|---|---|---|---|
| EXAMPLE | 1 | 1.52 | 1.5 | (1) | Px = 433 nm<br>Py = 500 nm<br>H = 500 nm<br>PxL = PyL = 5000 nm | 1.861 | (2) | 50 (0.1H) | 0 | 1.5 | (1) | 250 | n2 > n1 = n3 |
| | 2 | 1.52 | 1.5 | (1) | Px = 433 nm<br>Py = 500 nm<br>H = 500 nm<br>PxL = PyL = 5000 nm | 1.861 | (2) | 50 (0.1H) | 0 | 1.76 | (4) | 250 | n2 > n3 > n1 |
| | 3 | 1.52 | 1.5 | (1) | Px = 433 nm<br>Py = 500 nm<br>H = 500 nm<br>PxL = PyL = 5000 nm | 1.61 | (2) | 50 (0.1H) | 0 | 1.861 | (2) | 250 | n3 > n2 > n1 |
| | 4 | 1.52 | 1.5 | (1) | Px = 433 nm<br>Py = 500 nm<br>H = 500 nm<br>PxL = PyL = 5000 nm | 1.861 | (2) | 50 (0.1H) | 0 | 1.5 | (1) | 250 | n2 > n1 = n3 |
| | 5 | 1.52 | 1.5 | (1) | Px = 433 nm<br>Py = 500 nm<br>H = 500 nm<br>PxL = PyL = 5000 nm | 1.861 | (2) | 100 (0.2H) | 0 | 1.5 | (1) | 300 | n2 > n1 = n3 |
| | 6 | 1.52 | 1.51 | (5) | Px = 433 nm<br>Py = 500 nm<br>H = 200 nm<br>PxL = PyL = 5000 nm | 1.861 | (2) | 200 (1H) | 300 (Lcv + H = 500 nm) | 1.51 | (5) | 250 | n2 > n1 = n3 |
| | 7 | 1.52 | 1.51 | (5) | Px = 433 nm<br>Py = 500 nm<br>H = 200 nm<br>PxL = PyL = 5000 nm | 1.861 | (2) | 200 (1H) | 300 (Lcv + H = 500 nm) | 1.51 | (5) | 300 | n2 > n1 = n3 |

TABLE 2

| | | | | LIGHT EXTRACTION PRODUCT 2 | | | | | | | | |
| | | | | LIGHT EXTRACTION PRODUCT 1 | | | | | | | | |
| | | SUB- | CONCAVO-CONVEX STRUCTURE LAYER | | | LIGHT EXTRACTION LAYER | | | | FLATTENED LAYER | | REFRAC- |
| | | STRATE n4 | n1 | MATE-RIAL | STRUC-TURE | n2 | MATE-RIAL | Lcc (nm) | Lcv (nm) | n3 | MATE-RIAL | Lor (nm) | TIVE INDEX |
|---|---|---|---|---|---|---|---|---|---|---|---|---|---|
| COMPARATIVE EXAMPLE | 1 | 1.52 | — | — | — | — | — | — | — | — | — | — | — |
| | 2 | 1.52 | 1.5 | (1) | Px = 433 nm<br>Py = 500 nm<br>H = 500 nm<br>PxL = PyL = 5000 nm | 1.5 | (1) | 50 (0.1H) | 0 | 1.5 | (1) | 250 | n1 = n2 = n3 |
| | 3 | 1.52 | 1.5 | (5) | Px = 433 nm<br>Py = 500 nm<br>H = 200 nm<br>PxL = PyL = 5000 nm | 1.5 | (5) | 200 (1H) | 300 (Lcv + H = 500 nm) | 1.5 | (5) | 250 | n1 = n2 = n3 |
| | 4 | 1.52 | 1.5 | (1) | Px = 433 nm<br>Py = 500 nm<br>H = 500 nm | — | — | — | — | 1.861 | (2) | 200 | n3 > n1 |

TABLE 2-continued

| | | | LIGHT EXTRACTION PRODUCT 2 LIGHT EXTRACTION PRODUCT 1 | | | | | | | | |
|---|---|---|---|---|---|---|---|---|---|---|---|
| | SUB- | CONCAVO-CONVEX STRUCTURE LAYER | | | LIGHT EXTRACTION LAYER | | | FLATTENED LAYER | | | REFRAC- |
| | STRATE n4 | n1 | MATE- RIAL | STRUC- TURE | n2 | MATE- RIAL | Lcc (nm) | Lcv (nm) | n3 | MATE- RIAL | Lor (nm) | TIVE INDEX |
| 5 | 1.52 | 1.5 | (1) | PxL = PyL = 5000 nm Px = 4330 nm Py = 5000 nm H = 2500 nm | — | — | — | — | 1.861 | (2) | 200 | n1 = n2 = n3 |

In addition, in Tables 1 to 4, the column of the refractive index shows the relationship of the refractive index.

As can be seen from Tables 1 and 2, as compared with the organic EL device using the light extraction product according to Comparative Example 2, the emission intensity was increased in the organic EL devices using the light extraction products according to Examples 1 to 7. This is conceivable that by meeting the predetermined structure and the relationship of the refractive index, the emitted light derived from the waveguide mode propagating inside the flattened layer was extracted. Further, in the organic EL devices using the light extraction products according to Examples 5 and 7 with the concavo-convex structure varying in a long period, the emission intensity was stronger, and glare was more suppressed, relative to the organic EL devices using the light extraction products according to Examples 1 to 4 and 6. This is conceivable that since the structure varies in the long period, light extraction was strongly provided with scattering properties. From the result, it is understood that efficiency of light extraction from the organic EL device is improved by having the concavo-convex structure with long-period variations.

Further, in the organic EL devices using the light extraction products according to Comparative Examples 4 and 5, the emission intensity was significantly increased relative to the organic EL device using the light extraction product (Comparative Example 1) using only the substrate and the organic EL devices using the light extraction products (Comparative Examples 2 and 3) having the concavo-convex structure layer, light extraction layer and flattened layer formed of the same material with the refractive index being substantially equal. The result is presumed that the oozing light propagating inside the flattened layer was extracted due to the concavo-convex structure as the diffraction phenomenon. However, the organic EL devices using the light extraction products according to Comparative Examples 4 and 5, the color shift was large, and the devices glared in visually identifying. The result is conceivable that since the light extraction layer was not provided or the structure arrangement of the concavo-convex structure layer was regular, it was not possible to suppress output characteristics to the predetermined angle specific to diffracted light based on the interface between the concavo-convex structure layer and the flattened layer.

<Light Extraction Product B: Palisade Concavo-Convex Structure>

(Preparation of a Cylindrical Mold)

Used as a substrate of a cylindrical mold was a cylindrical quartz glass roll with a diameter of 80 mm and a length of 50 mm. A resist layer was deposited on the quartz glass roll surface, and a concavo-convex structure was formed on the surface of the resist layer by the direct-write lithography method using a semiconductor pulse laser. A plurality of types of concavo-convex structures was prepared, and a concavo-convex structure (arrangement LP) having a long period structure will be described as a representative.

First, the resist layer was deposited on the surface of the quartz glass roll by the sputtering method. Next, the quartz glass roll with the resist layer deposited was exposed on the following conditions while rotating at linear speed s=1.0 m/sec.

Exposure semiconductor laser wavelength: 405 nm

Exposure laser power: 3.6 mV

Y-axis direction pitch (Py): 500 nm

Variable width $\delta1$ with respect to the Y-axis direction pitch (Py): ±10%

Long period (Py)L in the Y-axis direction of the variable width $\delta1$: 5000 nm In other words, exposure in the shape of a line in the circumferential direction was performed on the cylindrical quartz glass roll surface. Herein, the distance between one line and an adjacent line corresponds to the pitch (Py). The center of the pitch Py was 500 nm, and had a variation between 450 nm and 550 nm. The variation was ±10% relative to the center pitch (Py), and was modulated by multiplying by a sine curve. In other words, the pitch Py was the amplitude of the sine curve with a wavelength of 5000 nm having the amplitude ranging from 450 nm to 550 nm.

After exposing by the above-mentioned operation, the resist layer was developed. Development of the resist layer was carried out using 0.03 wt % glycine aqueous solution on the condition that treatment time was 240 seconds. Next, using the developed resist layer as a mask, etching of the quartz glass was performed by dry etching. Next, the residual resist layer was only removed from the quartz glass roll provided with the concavo-convex structure on its surface to prepare a cylindrical mold (mold for transfer).

(Preparation of the Reel-Shaped Mold G1)

The obtained cylindrical mold was coated with Durasurf HD-1101Z (made by Daikin Industries, Ltd.), heated at 60° C. for 1 hour, and then, allowed to stand at room temperature for 24 hours to fix. Then, cleaning was performed three times using Durasurf HD-ZV (made by Daikin Industries, Ltd.), and mold release treatment was performed.

Next, a photocurable resin was prepared by mixing a fluorine-containing additive (made by Daikin Industries, Ltd. OPTOOL DAC HP), trimethylolpropane (EO-modified) triacrylate (made by TOAGOSEI Co., Ltd. M350), 1-hydroxy-cyclohexyl-phenyl-ketone (made by BASF Company Irgacure (Registered Trademark) 184), and 2-benzyl-2-dimethylamino-1-(4-morpholino phenyl)-butanone-1 (made by BASF Company Irgacure (Registered Trademark) 369) in a ratio of 15:100:5.5:2.0 in parts by weight. Next, the photocurable resin was applied on an easy adhesion surface of the PET film (A4100, made by Toyobo Co., Ltd.: width 300 mm, thickness 100 μm) by Micro Gravure coating (made by Yasui Seiki Co., Ltd.) so that the coating film thickness was 6 μm.

Next, the PET film coated with the photocurable resin was pressed against the cylindrical mold with a nip roll (0.1 MPa), and was irradiated with ultraviolet rays at a temperature of 25° C. and humidity of 60% under atmospheric pressure using the UV exposure apparatus (made by Fusion UV Systems Japan Co., Ltd., H bulb) so that the integral amount of exposure below the center of the lamp was 1000 mJ/cm$^2$, photo-curing was carried out successively, and obtained was a reel-shaped mold G1 with the concavo-convex structure inversely transferred to the surface. The reel-shaped mold G1 was 200 m length, and 300 mm width.

When the reel-shaped mold G1 was observed with the scanning electron microscope described below, convex portions of cross-sectional shape of 450 nm and h800 nm were formed in periodical structure having the following long period structure.

Y-axis direction pitch (Py): 500 nm
Variable width δ1 with respect to the Y-axis direction pitch (Py): ±10%
Long period (Py) L in the Y-axis direction of the variable width δ1: 5000 nm
  (Scanning Electron Microscope)
  Apparatus; HITACHI s-5500
  Acceleration voltage; 10 kV
  MODE; Normal
(Preparation of the Reel-Shaped Mold G2)

Next, the above-mentioned photocurable resin was applied on an easy adhesion surface of the PET film (A4100, made by Toyobo Co., Ltd.: width 300 mm, thickness 100 μm) by Micro Gravure coating (made by Yasui Seiki Co., Ltd.) so that the coating film thickness was 2 μm.

Next, the PET film coated with the photocurable resin was pressed against the above-mentioned reel-shaped mold G1 with the nip roll (0.1 MPa), and was irradiated with ultraviolet rays at a temperature of 25° C. and humidity of 60% under atmospheric pressure using the UV exposure apparatus (made by Fusion UV Systems Japan Co., Ltd., H bulb) so that the integral amount of exposure below the center of the lamp was 1000 mJ/cm$^2$, photo-curing was carried out successively, and obtained was a reel-shaped mold G2 with the concavo-convex structure inversely transferred to the surface. The reel-shaped mold G2 was 200 m length, and 300 mm width.

When the reel-shaped mold G2 was observed with the scanning electron microscope described below, concave portions of cross-sectional shape of Φ450 nm and concave-portion depth h 800 nm were formed in periodical structure having the following long period structure.

Y-axis direction pitch (Py): 500 nm
Variable width δ1 with respect to the Y-axis direction pitch (Py): ±10%
Long period (Py)L in the Y-axis direction of the variable width δ1: 5000 nm
  (Scanning Electron Microscope)
  Apparatus; HITACHI s-5500
  Acceleration voltage; 10 kV
  MODE; Normal In addition, XPS measurement as described below was performed on the concavo-convex structure surface of each of obtained reel-shaped molds G1 and G2, the surface layer fluorine element concentration Es was obtained, and was divided by the average fluorine element concentration Eb to calculate Es/Eb, and the values were varied with the structure, and ranged approximately between 40 and 80.

(Fluorine Element Concentration Measurement)
The reel-shaped mold was cut into small pieces of about 2 mm square, and the piece was covered with a 1 mm×2 mm slot type mask and underwent XPS measurement on the following conditions.
XPS Measurement Condition
  Used apparatus; Thermo Fisher ESCALAB 250
  Excitation source; mono. AlKα 15 kV×10 mA
  Analysis size; About 1 mm (shape was an ellipse)
  Retrieve Region
  Survey scan; 0~1, 100 ev
  Narrow scan; F 1s, C 1s, O 1s, N 1s
  Pass Energy
  Survey scan; 100 ev
  Narrow scan; 20 eV Examples 8 and 9

Preparation of the Concavo-Convex Structure Layer

The above-mentioned reel-shaped mold G1 was cut to the length of 50 cm. Next, the material (1) diluted with propylene glycol monomethyl ether was applied on a glass film (refractive index 1.52) with a width of 300 mm and a length of 600 mm by the bar coating method. In addition, the main surface of the glass film was beforehand treated with the silane coupling agent with an acryloxy terminal (3-acryloxypropyl trimethoxysilane) and was used. The coating film thickness was set so that the solid film thickness subsequent to solvent evaporation was 800 nm. After coating, the film was allowed to stand at room temperature for 2 minutes, and then, the concavo-convex structure formation surface side of the cut reel-shaped mold G1 was laminated to the surface coated with the following material (1) of the glass film at a pressure of 0.01 Mpa. Subsequently, UV light with an integral amount of exposure of 1000 mJ/cm$^2$ was applied from the reel-shaped mold G1 side, and after heating at 105° C. for 2 minutes, the reel-shaped mold G1 was peeled off. After peeling, the obtained layered product comprised of concavo-convex structure layer/substrate was heated at 200° C. for 30 minutes in a vacuum.

(Formation of the Light Extraction Layer)
The material (2) was diluted with propylene glycol monomethyl ether, and was applied on the concavo-convex structure of the concavo-convex structure layer of the layered product comprised of concavo-convex structure layer/substrate by the bar coat method. Herein, it was set that the volume of the concavo-convex structure in a unit area was larger than the solid amount per unit area. After coating, the resultant was allowed to stand for 3 minutes in an environment of a temperature of 25° C. and humidity of 50%, and further, was heated at 80° C. for 60 seconds. Subsequently, the resultant was subjected to heat treatment for 30 minutes in an atmosphere of 200° C. in a vacuum. The layered product obtained by the operation was the light extraction product 2 according to the second aspect comprised of the substrate, the concavo-convex structure layer having the first refractive index and the light extraction layer having the second refractive index.

(Formation of the Flattened Layer)
A silicon wafer surface of 4-inch Φ was treated with UV-O$_3$ for 15 minutes. Next, a film of Durasurf 1101Z was formed by spin coating, and was allowed to stand in an atmosphere of a temperature of 25° C. and humidity of 50% for 12 hours. Then, using a Durasurf HD-ZV solution, spin coat cleaning was performed three times.

One of the above-mentioned materials (1) to (3) was diluted with propylene glycol monomethyl ether and methyl isobutyl ketone, and was applied on the layered layer of the layered product of concavo-convex structure layer with the light extraction layer formed/substrate by the bar coat method. After coating, the resultant was allowed to stand for 1 minute at room temperature (25° C.), and then, was heated at 80° C. for 30 seconds.

Next, in the case where the above-mentioned material (1) was used as the flattened layer, the treated surface of a silicon wafer subjected to surface treatment was disposed on the surface coated with the above-mentioned material (1) and was pressed at a pressure of 0.01 Mpa, while UV light was applied from the substrate surface side so that the integral amount of exposure was 1000 mJ/cm². After UV irradiation, the silicon wafer was removed to obtain the light extraction product 1 according to the first aspect.

On the other hand, in the case where the above-mentioned material (2) was used as the flattened layer, the treated surface of a silicon wafer subjected to surface treatment was disposed on the surface coated with the above-mentioned material (2) and was pressed at a pressure of 0.01 Mpa for 3 minutes. After pressing, the pressure was released, and the resultant was allowed to stand for 1 hour in an environment of a temperature of 25° C. and humidity of 50%. Subsequently, the silicon wafer was removed, and the resultant was subjected to heat treatment for 30 minutes in an atmosphere of 200° C. in a vacuum to prepare the light extraction product 1 according to the first aspect. Surface accuracy of the flattened layer was measured in a range of 5 μm×5 μm with the atomic force microscope, and Ra was 5 nm or less in all the samples. The configurations of the light extraction layered products for a semiconductor light emitting device prepared in Examples 8 and 9 are shown in following Table 3.

Comparative Example 6

A light extraction layered product for a semiconductor light emitting device was prepared as in Example 8 except that all the concavo-convex structure layer, light extraction layer and flattened layer were formed of the material (1). The configuration is shown in following Table 3.

Comparative Example 7

Preparation was made as in Example 8 except that the distribution with respect to the pitch of the concave-convex structure of the concavo-convex structure layer was varied.

Comparative Example 8

A light extraction layered product for a semiconductor light emitting device was prepared as in Example 8 except that the light extraction layer was not provided and that Lor of the flattened layer was 200 nm. The configuration is shown in following Table 3. In addition, Lor in this case means the distance between the average position of the top of the convex portions of the concavo-convex structure layer and the exposed surface of the flattened layer.

Comparative Example 9

A light extraction layered product for a semiconductor light emitting device was prepared as in Example 8 except that the pitches Px and Py were 10 times, and that the long period was not provided. The configuration is shown in following Table 3.

<Preparation of a Semiconductor Light Emitting Device (Organic EL Device)>

An organic EL device was prepared on the following conditions, using the light extraction layered product for a semiconductor light emitting device according to each of Examples 8 and 9 and Comparative Examples 6 to 9, and the prepared organic EL devices were evaluated.

(Bottom Emission Type Organic EL Device)

An anode, hole transport layer, electron transport layer, and cathode were layered in this order on the flattened layer surface of the light extraction product (light extraction product 1 according to the first aspect as shown in FIG. 1) to prepare a bottom emission type organic EL device. The material, film thickness and film formation method of each layer are as described below.

(1) Anode: ITO 130 nm Sputtering
(2) Hole transport layer:
N,N'-diphenyl-N,N'-bis(1-naphtyl)-(1,1'-biphenyl)-(4,4'-diamine) (NPB) 60 nm Vacuum deposition
(3) Electron transport layer: Tris-(8-hydroxyquinoline)aluminum (Alg3) 40 nm Vacuum deposition
(4) Cathode: Al 100 nm Vacuum deposition

TABLE 3

| | | SUBSTRATE | CONCAVO-CONVEX STRUCTURE LAYER | | | STANDARD DEVIATION/ ARITHMETICAL MEAN | LIGHT EXTRACTION LAYER | |
|---|---|---|---|---|---|---|---|---|
| | | n4 | n1 | MATERIAL | STRUCTURE | PITCH | n2 | MATERIAL |
| EXAMPLE | 8 | 1.52 | 1.5 | (1) | Py = 500 nm<br>H = 500 nm<br>PyL = 5000 nm | 0.071 | 1.861 | (2) |
| | 9 | 1.52 | 1.5 | (1) | Py = 500 nm<br>H = 500 nm<br>PyL = 5000 nm | 0.071 | 1.861 | (2) |
| COMPARATIVE EXAMPLE | 1 | 1.52 | — | — | — | — | — | — |
| | 6 | 1.52 | 1.5 | (1) | Py = 500 nm<br>H = 500 nm<br>PyL = 5000 nm | 0.007 | 1.5 | (1) |
| | 7 | 1.52 | 1.5 | (1) | Py = 500 nm<br>H = 500 nm | 0.023 | 1.861 | (2) |

TABLE 3-continued

| | | | | | | | | |
|---|---|---|---|---|---|---|---|---|
| | 8 | 1.52 | 1.5 | (1) | Py = 500 nm<br>H = 500 nm<br>PyL = 5000 nm | 0.009 | — | — |
| | 9 | 1.52 | 1.5 | (1) | Py = 5000 nm<br>H = 2500 nm | 0.025 | — | — |

| | | LIGHT EXTRACTION PRODUCT 2 | | | | | |
|---|---|---|---|---|---|---|---|
| | | LIGHT EXTRACTION PRODUCT 1 | | | | | |
| | | LIGHT EXTRACTION LAYER | | FLATTENED LAYER | | | REFRACTIVE |
| | | Lcc(nm) | Lcv(nm) | n3 | MATERIAL | Lor(nm) | INDEX |
| EXAMPLE | 8 | 50<br>(0.1H) | 10 | 1.5 | (1) | 250 | n2 > n1 = n3 |
| | 9 | 100<br>(0.2H) | 10 | 1.5 | (1) | 300 | n2 > n1 = n3 |
| COMPARATIVE<br>EXAMPLE | 1 | — | — | — | — | — | — |
| | 6 | — | — | 1.5 | (1) | 250 | n1 = n2 = n3 |
| | 7 | 100<br>(0.2H) | 10 | 1.5 | (1) | 300 | n2 > n1 = n3 |
| | 8 | — | — | 1.861 | (2) | 200 | n3 > n1 |
| | 9 | — | — | 1.861 | (2) | 200 | n3 > n1 |

As shown in Table 3, as compared with the organic EL device using the light extraction product according to Comparative Example 6, the emission intensity was increased in the organic EL devices using the light extraction products according to Examples 8 and 9. This is conceivable that by meeting the predetermined structure and the relationship of the refractive index, the emitted light derived from the waveguide mode propagating inside the flattened layer was extracted. Further, the color shifts of the organic EL devices using the light extraction products according to Examples 8 and 9 were decreased as compared with Comparative Example 7. This is presumed that since the distribution (standard deviation/arithmetical mean) with respect to the pitch was large, the number of diffraction modes that disturb the waveguide mode was increased, and that the observed emitted light was provided with scattering properties.

Further, in the organic EL devices using the light extraction products according to Comparative Examples 8 and 9, the emission intensity was significantly increased relative to the organic EL device using the light extraction product (Comparative Example 1) using only the substrate and the organic EL device using the light extraction product (Comparative Example 6) having the concavo-convex structure layer, light extraction layer and flattened layer formed of the same material with the refractive index being substantially equal. The result is presumed that the oozing light derived from the waveguide mode propagating inside the flattened layer was extracted due to the concavo-convex structure as the diffraction phenomenon. However, the organic EL devices using the layered products according to Comparative Examples 8 and 9, the color shift was large, and the devices glared in visually identifying. The result is conceivable that since the light extraction layer was not provided or the structure arrangement of the concavo-convex structure layer was regular, it was not possible to suppress output characteristics to the predetermined angle specific to diffracted light based on the interface between the concavo-convex structure layer and the flattened layer.

<Light Extraction Product C: Nanoparticle Dispersion Structure>

The reel-shaped mold G1 and reel-shaped mold G2 were prepared as in the light extraction product A.

Examples 10 to 14

Preparation of the Concavo-Convex Structure Layer

The above-mentioned reel-shaped mold G1 was cut to the length of 50 cm. Next, the material (1) diluted with propylene glycol monomethyl ether was applied on a glass film (refractive index 1.52) with a width of 300 mm and a length of 600 mm by the bar coating method. In addition, the main surface of the glass film was beforehand treated with the silane coupling agent with an acryloxy terminal (3-acryloxypropyl trimethoxysilane) and was used. The coating film thickness was set so that the solid film thickness subsequent to solvent evaporation was 800 nm. After coating, the film was allowed to stand at room temperature for 2 minutes, and then, the concavo-convex structure formation surface side of the cut reel-shaped mold G1 was laminated to the surface coated with the above-mentioned material (1) of the glass film at a pressure of 0.01 Mpa. Subsequently, UV light with an integral amount of exposure of 1200 mJ/cm$^2$ was applied from the reel-shaped mold G1 side, and after heating at 105° C. for 2 minutes, the reel-shaped mold G1 was peeled off. After peeling, the obtained light extraction product comprised of concavo-convex structure layer/substrate was heated at 200° C. for 30 minutes in a vacuum.

(Formation of Nanoparticles)

The material (2) was diluted with a mixed solvent of propylene glycol monomethyl ether and methyl ethyl ketone, and was applied on the concavo-convex structure of the concavo-convex structure layer of the light extraction product comprised of concavo-convex structure layer/substrate by the bar coat method. Herein, it was set that the volume of the concavo-convex structure in a unit area was larger than the solid amount per unit area. After coating, the resultant was allowed to stand for 3 minutes in an environment of a temperature of 25° C. and humidity of 50%, and further, was heated at 80° C. for 60 seconds. Subsequently, the resultant was subjected to heat treatment for 30 minutes in an atmosphere of 200° C. in a vacuum. The light extraction product obtained by the operation was the light extraction product comprised of the substrate, the concavo-convex structure layer having the first refractive index and the nanoparticles having the second refractive index.

(Preparation of a Film-Shaped Mold with Nanoparticles Filled and Arranged)

The reel-shaped mold G2 (L 200 m, W 300 mm) obtained as described above was wound off, and using the material (2) diluted with propylene glycol monomethyl ether as a coating solution, coating was made on the concavo-convex structure by micro-gravure. The coating film thickness was set so that the volume of the concavo-convex structure in a unit area was larger than the solid amount per unit area. After coating, while transporting the reel-shaped mold G2, the resultant was dried for 2 minutes in an environment of humidity of 50% and a temperature of 80° C., reeled and collected.

(Nanoparticle Transfer)

The above-mentioned reel-shaped mold G2 filled with the nanoparticles was cut to the length of 50 cm. Next, the material (5) diluted with a mixed solvent of propylene glycol monomethyl ether and methyl ethyl ketone was applied on a glass film (refractive index 1.52) with a width of 300 mm and a length of 600 mm by the bar coating method. In addition, the main surface of the glass film was beforehand treated with the silane coupling agent with an acryloxy terminal (3-acryloxypropyl trimethoxysilane) and was used. The coating film thickness was set so that the solid film thickness subsequent to solvent evaporation was 500 nm. After coating, the film was allowed to stand at room temperature for 2 minutes, and then, the concavo-convex structure formation surface side of the cut reel-shaped mold G2 filled with the nanoparticles was laminated to the surface coated with the following material (5) of the glass film at a pressure of 0.01 Mpa using the laminate roll. Subsequently, UV light with an integral amount of exposure of 1300 mJ/cm$^2$ was applied from the reel-shaped mold G2 filled with the nanoparticles side, and after heating at 120° C. for 30 minutes, the reel-shaped mold G2 was peeled off. After peeling, the obtained light extraction product was heated at 200° C. for 30 minutes in a vacuum.

(Flattened Layer Formation)

A silicon wafer surface of 4-inch Φ was treated with UV-O$_3$ for 15 minutes, and was cleaned while making the surface hydrophilicity. Next, a film of Durasurf 1101Z was formed by spin coating, and was allowed to stand in an atmosphere of a temperature of 25° C. and humidity of 50% for 12 hours. Then, using a Durasurf HD-ZV solution, spin coat cleaning was performed three times.

The above-mentioned material (1) or material (3) diluted with propylene glycol monomethyl ether and methyl isobutyl ketone was applied on the nanoparticles of the light extraction product of nanoparticles/<medium of the first refractive index (n1)>/substrate by the bar coat method. After coating, the resultant was allowed to stand for 1 minute at room temperature (25° C.), and then, was heated at 80° C. for 30 seconds.

Next, the treated surface of a silicon wafer subjected to surface treatment was disposed on the surface coated with the above-mentioned material (1) and was pressed at a pressure of 0.01 Mpa, while UV light was applied from the substrate surface side so that the integral amount of exposure was 1300 mJ/cm$^2$. After UV irradiation, the silicon wafer was removed to obtain the light extraction product.

Figure 44:
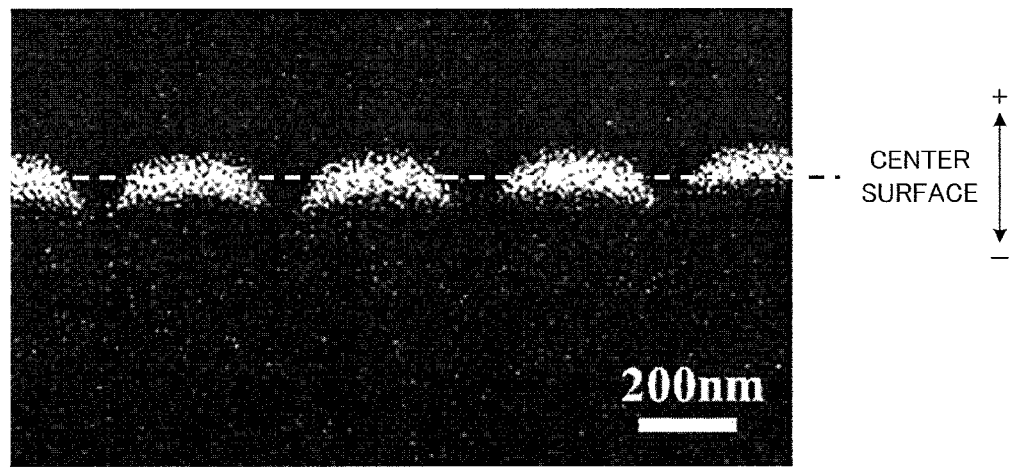
FIG. 44 is a transmission electron microscope photograph of the light extraction product according to Example 13 of the present invention.

Details of the prepared light extraction products are described in Table 4. The refractive indexes of the medium having the first refractive index and the nanoparticles having the second refractive index were obtained by measurement using spectroscopic ellipsometry on a flat film without a concavo-convex structure separately prepared on quartz. Lorb was obtained from a cross-sectional observation image of the light extraction product using a scanning electron microscope. The height of the nanoparticle and Lort were obtained by using a transmission electron microscope and energy dispersive X-ray spectroscopy together and performing mapping of Ti. In Examples 10 to 14 as described in Table 4, it was confirmed that the nanoparticles were disposed to decrease with distance from the center surface in the film thickness direction M of the light extraction product from mapping of Ti using the transmission electron microscope and energy dispersive X-ray spectroscopy together. As a representative example, FIG. 44 shows a dispersibility conformation result of the nanoparticles of the light extraction product of Example 13. FIG. 44 is a transmission electron microscope photograph of the light extraction product according to Example 13. FIG. 44 shows the result obtained by using the transmission electron microscope and energy dispersive X-ray spectroscopy together and performing mapping of Ti. In addition, in FIG. 44, the light input surface (first surface) exists in an upper portion, and the light output surface (second surface) exists in a lower portion. In addition, in FIG. 44, since observation was of an extremely high magnification, the light input surface and light output surface are not included in FIG. 44.

Figure 45:
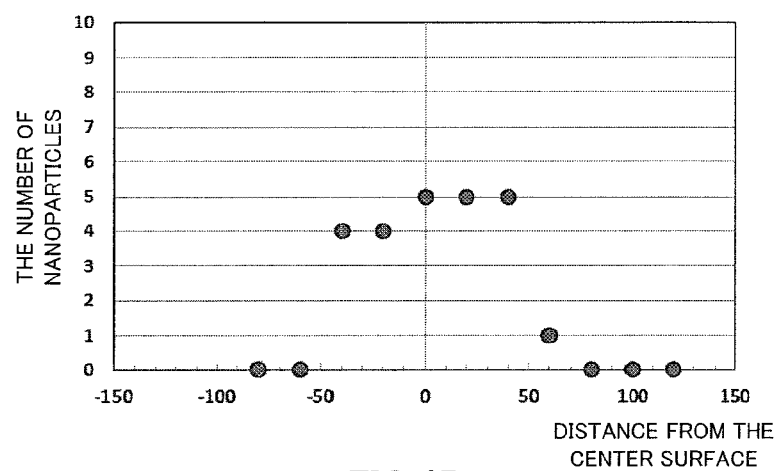
FIG. 45 is a graph showing a result of the Example of the invention.

From the observation image as shown in FIG. 44, the center surface that maximizes the number of nanoparticles was set. Next, the number of nanoparticles was measured in each virtual surface parallel to the center surface every 20 nm in the upward direction (+ direction) and the downward direction (− direction) in FIG. 44 from the center surface. The measurement results were shown in following Table 5. The column on the left side in following Table 5 means the position from the center surface. A cell of 0 nm represents the center surface. On the other hand, the column on the right side shows the number of nanoparticles. In addition, results observed by the same technique up to vicinities of the first surface and second surface are also described. FIG. 45 shows a result obtained by summarizing descriptions of following Table 5. As can be seen from FIG. 45, the number of nanoparticles decreases with distance from the center surface, without increasing. This means that in the obtained light extraction product, spread of nanoparticles exists inside the center surface, and that spread in the film thickness direction of the light extraction product is restricted. The distribution of the number of nanoparticles in the film thickness direction M of the light extraction product was examined using such a technique.

TABLE 4

| | | SUB-STRATE n3 | MEDIUM n1 | MATE-RIAL | ARRANGEMENT | HEIGHT/ nm | n2 | MATE-RIAL | Lort/ nm | Lorb/ nm | REFRACTIVE INDEX |
|---|---|---|---|---|---|---|---|---|---|---|---|
| EXAMPLE | 10 | 1.52 | 1.5 | (1) | Px = 433 nm<br>Py = 500 nm | 300 | 1.82 | (2) | 50 | 2500 | n1 = n3 < n2 |
| | 11 | 1.52 | 1.5 | (2) | Px = 433 nm<br>Py = 500 nm<br>PxL = PyL = 500 nm | 250 | 1.82 | (2) | 100 | 2500 | n1 = n3 < n2 |

TABLE 4-continued

| | SUBSTRATE n3 | MEDIUM n1 | MATERIAL | ARRANGEMENT | HEIGHT/nm | n2 | MATERIAL | Lort/nm | Lorb/nm | REFRACTIVE INDEX |
|---|---|---|---|---|---|---|---|---|---|---|
| 12 | 1.52 | 1.51 | (5) | Px = 433 nm<br>Py = 500 nm<br>PxL = PyL = 500 nm | 200 | 1.82 | (2) | 150 | 2500 | n1 = n3 < n2 |
| 13 | 1.52 | 1.51 | (5) | Px = 433 nm<br>Py = 500 nm | 100 | 1.82 | (2) | 400 | 2500 | n1 = n3 < n2 |
| 14 | 1.52 | 1.51 | (5) | Px = 433 nm<br>Py = 500 nm<br>PxL = PyL = 500 nm | 150 | 1.82 | (2) | 250 | 2500 | n1 = n3 < n2 |
| 15 | 1.52 | 1.51 | (5) | Px = 606 nm<br>Py = 700 nm<br>配列 α | 400 | 1.82 | (2) | 100 | 2500 | n1 = n3 < n2 |

TABLE 5

| POSITION FROM THE CENTER SURFACE | THE NUMBER OF NANOPARTICLES |
|---|---|
| FIRST SURFACE | 0 |
| // | 0 |
| 120 nm | 0 |
| 100 nm | 0 |
| 80 nm | 0 |
| 60 nm | 1 |
| 40 nm | 5 |
| 20 nm | 5 |
| 0 nm (=CENTER SURFACE) | 5 |
| −20 nm | 4 |
| −40 nm | 4 |
| −60 nm | 0 |
| −80 nm | 0 |
| // | 0 |
| SECOND SURFACE | 0 |

The arrangements of nanoparticles in Examples 11, 12 and 14 have the long period PxL and long period PyL. Further, these nanoparticles were prepared by the transfer method using a guide. Herein, it was confirmed that by using the guide having the long period, the height of the nanoparticle varies corresponding to the long period. More specifically, it was confirmed that the height of the nanoparticles is high in a portion with a high aperture ratio made by the long period, and that the height of the nanoparticle is low in a portion with a low aperture ratio. In other words, the nanoparticles of Examples 11, 12 and 14 include the distribution in the pitch as the arrangement, and further include the distribution in the height of the nanoparticle.

Comparative Example 10

TiO$_2$ fine particles with an average particle diameter of 25 nm were dispersed in the material (1) used in the above-mentioned Examples. More specifically, preparation was performed as described below.

First, 10 weight % of TiO$_2$ fine particles were added to a mixed solvent of propylene glycol monomethyl ether and ethanol, and stirred strongly. Next, the mixture was heated to 60° C., and was subjected to supersonic treatment for 1.5 hour. Subsequently, the resultant was cooled naturally while stirring strongly.

The above-mentioned material (1) was gradually dropped into the TiO$_2$ dispersion solution returned to room temperature while stirring strongly. The prepared solution was applied on the substrate used as described above using a bar coater. After coating, the resultant was allowed to stand for 2.5 minutes in an environmental atmosphere of a temperature of 26° C. and humidity of 49%, and next, was laminated to a PET film at 0.01 Mpa using the laminate roll. Subsequently, UV light was applied so that the integral amount of exposure was 1200 mJ/cm$^2$, and the PET film was peeled off.

Figure 46:
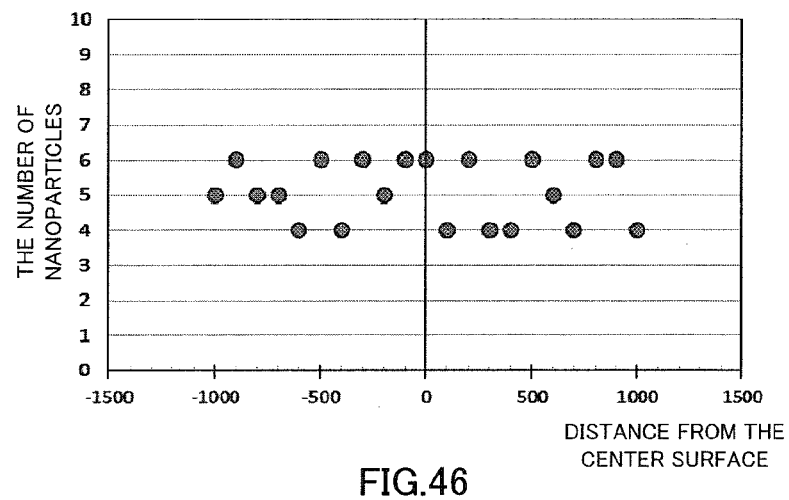
FIG. 46 is a graph showing a result of Comparative Example of the invention.

Analysis was performed on the obtained light extraction product using the scanning electron microscope, transmission electron microscope and energy dispersive X-ray spectroscopy. From the cross-sectional observation of the light extraction product, it was confirmed that TiO$_2$ fine particles were dispersed inside the light extraction product. Further, it was confirmed that TiO$_2$ fine particles with the first particle diameter of 25 nm formed TiO$_2$ aggregates with a second particle diameter of about 100 nm. Since it was extremely difficult to decompose the TiO$_2$ aggregates into each TiO$_2$ particle to measure, the dispersibility of TiO$_2$ particles in the film thickness direction was judged using the aggregates. FIG. 46 shows a result of measuring the number of nanoparticles as in the Examples with resolution of 100 nm. FIG. 46 is a graph showing the distribution of nanoparticles from the center surface as in FIG. 45. As can be seen from FIG. 46, it is understood that the nanoparticles of the obtained light extraction product repeated an increase and decrease with distance from the center surface. This means that the nanoparticles are spread with the large distribution in the thickness M direction of the light extraction product.

<Preparation of a Semiconductor Light Emitting Device (Organic EL Device)>

An organic EL device was prepared on the following conditions, using the light extraction product according to each of Examples 10 to 14 and Comparative Example 10, and the prepared organic EL devices were evaluated.

An anode, hole transport layer, electron transport layer, and cathode were layered in this order on the light input surface of the light extraction product to prepare a bottom emission type organic EL device, and the prepared organic EL device was evaluated. The material, film thickness and film formation method of each layer are as described below.

(1) Anode: ITO 130 nm Sputtering
(2) Hole transport layer: N,N'-diphenyl-N,N'-bis(1-naphtyl)-(1,1'-biphenyl)-(4,4'-d iamine) (NPB) 60 nm Vacuum deposition
(3) Electron transport layer: Tris-(8-hydroxyquinoline)aluminum (Alg3) 40 nm Vacuum deposition
(4) Cathode: Al 100 nm Vacuum deposition As compared with the cases of using the light extraction products of Examples 10 to 14, in the case of using the light extraction product of Comparative Example 10, the result was that output intensity of the organic EL device was low. This is presumed that in the case of Comparative Example 10, since the nanoparticles were dispersed over the entire light extraction product, roughness of the first surface was poor, and that the roughness affected light-emitting characteristics. Actually, it is was confirmed that roughness of the first surface of each of Examples 10 to 14 was Ra≤5 nm in each sample from measurement in the range of 5 μm×5 μm with the atomic force microscope. On the other hand, in the sample of Comparative Example 10, Ra was about 50 nm. Further, in the sample of Comparative Example 10, it was also confirmed that a dark spot occurred by long-time emission. This is conceivable that a spike was formed on the ITO surface by roughness of the first surface as described previously, and a short circuit in the spike portion was a cause. Among the Examples, output intensity of the organic EL device was higher in the case of Example 12 than Example 14, in the case of Example 11 than Example 12, and in the case of Example 10 than Example 13. This is conceivable that since Lort that is the average distance between the first surface and the nanoparticle was short, and that propagation properties were thereby improved in the oozing light oozing from the ITO interface. Further, by comparing Examples 10 and 13 with Examples 11, 12 and 14, the cases of Examples 11, 12 and 14 resulted in large scattering components in the output light of the organic EL device. This is presumed that in the cases of Examples 11, 12 and 14, in-plane parallel arrangement of nanoparticles was the arrangement having both the arrangement of nanoscale and the arrangement of microscale, and that diffracted light between nanoparticles was scatted in a macro manner.

Example 15

Figure 47:
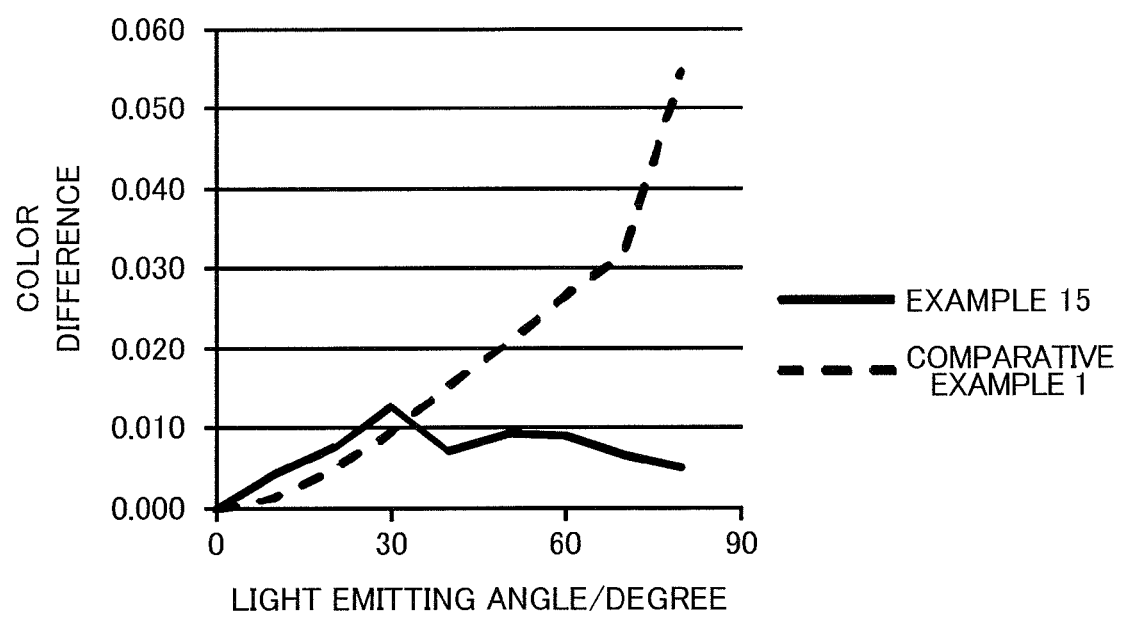
FIG. 47 is a graph showing a result of Example 15 of the invention.

A light extraction product was prepared as in Example 12 except that the X-axis direction pitch (Px) was 606 nm, Y-axis direction pitch (Py) was 700 nm and that the arrangement α was provided. An organic EL device was prepared on the following conditions using the light extraction product, and the prepared organic EL device was evaluated. The material, film thickness and film formation method of each layer are as described below.
(1) Anode: ITO 150 nm Sputtering
(2) PEDOT 50 nm Spin Coat
(3) NPB 40 nm Vacuum deposition
(4) Light emitting layer (R) 5 nm Vacuum deposition
(5) Light emitting layer (B) 15 nm Vacuum deposition
(6) Alq3 25 nm Vacuum deposition
(7) Cathode: Al 100 nm Vacuum deposition A color difference (Δu'v') for each light emitting angle of the obtained organic EL device was measured for each light emitting angle. The obtained results are shown in FIG. 47. In the organic EL device of Example 15, it is understood that the color difference (Δu'v') is smaller than, that in the light emitting device obtained from Comparative Example 1, and that the dependence on the light emitting angle is little. This shows that the light emitting color does not differ in viewing the device from any direction, and the color shift was significantly reduced.

In addition, the present invention is not limited to the above-mentioned Embodiments, and is capable of being carried into practice with various modifications thereof. In the above-mentioned Embodiments, the sizes, shapes and the like shown in the accompanying drawings are not limited thereto, and are capable of being modified as appropriate within the scope of exhibiting the effects of the invention. Further, the aspects, Embodiments of the concavo-convex structure and the like of the present invention are capable of being carried into practice in combination as appropriate. Moreover, the present invention is capable of being carried into practice with modifications thereof as appropriate without departing from the scope of the object of the invention.

INDUSTRIAL APPLICABILITY

The present invention has the effects of enabling light extraction efficiency from a semiconductor light emitting device to be improved, and further enabling glare and color shift of light to be reduced, and particularly, is capable of being suitably used in an organic EL device and LED. Further, it is possible to provide a semiconductor light emitting device with luminance improved for enabling the color shift caused by diffraction of light to be reduced. Accordingly, the light extraction product for a semiconductor light emitting device and the semiconductor light emitting device of the present invention have high luminous efficiency while suppressing the color shift, thereby enable power to be used effectively, and are capable of significantly contributing to energy saving.

The present application is based on Japanese Patent Application No. 2012-092266 filed on Apr. 13, 2012, Japanese Patent Application No. 2012-144616 filed on Jun. 27, 2012, Japanese Patent Application No. 2012-227296 filed on Oct. 12, 2012, Japanese Patent Application No. 2012-227297 filed on Oct. 12, 2012 and Japanese. Patent Application No. 2012-227298 filed on Oct. 12, 2012, entire contents of which are expressly incorporated by reference herein.

The invention claimed is:

1. A light extraction product for a semiconductor light emitting device, comprising:
   a concavo-convex structure layer, provided with a concavo-convex structure on a surface thereof, having a first refractive index (n1); and
   a light extraction layer, provided on the concavo-convex structure, having a second refractive index (n2),
   wherein the first refractive index (n1) is substantially different from the second refractive index (n2),
   the light extraction layer includes a second light extraction layer provided inside a concave portion of the concavo-convex structure,
   in the second light extraction layer a distance Lcc between an average position Sh of tops of convex portions and an average surface position Scc of the second light extraction layer in the concave portion and a convex-portion average height H meet following equation (5), and in the concavo-convex structure the convex-portion average height H meets following equation (2), while an average pitch P meets following equation (3), $$10 \text{ nm} \leq H \leq 5000 \text{ nm} \qquad \text{Eq.(2)}$$

$$50 \text{ nm} \leq P \leq 5000 \text{ nm} \qquad \text{Eq.(3)}$$

$$0.0H < Lcc < 1.0H. \qquad \text{Eq.(5)}$$

2. A light extraction product for a semiconductor light emitting device, comprising:
   a concavo-convex structure layer, provided with a concavo-convex structure on a surface thereof, having a first refractive index (n1); and
   a light extraction layer, provided on the concavo-convex structure, having a second refractive index (n2),
   wherein the first refractive index (n1) is substantially different from the second refractive index (n2),
   the light extraction layer includes a first light extraction layer provided on a convex portion of the concavo-convex structure and a second light extraction layer provided inside a concave portion of the concavo-convex structure, in the second light extraction layer a distance Lcc between an average position Sh of tops of convex portions and an average surface position Sec of the second light extraction layer in the concave portions and a convex-portion average height H meet following equation (5), in the first light extraction layer a distance Lcv between the average position Sh and an average surface position Scv of the first light extraction layer provided on the convex portion of the concavo-convex structure and the convex-portion average height H meet following equation (6), and in the concavo-convex structure the convex-portion average height H meets following equation (2), while an average pitch meets following equation (3), $$10\ nm \leq H \leq 5000\ nm \qquad Eq.(2)$$

$$50\ nm \leq P \leq 5000\ nm \qquad Eq.(3)$$

$$0.0H < Lcc < 1.0H \qquad Eq.(5)$$

$$0.0H < Lcv \leq 1.5H. \qquad Eq.(6)$$

3. A light extraction product for a semiconductor light emitting device, comprising:
   a concavo-convex structure layer, provided with a concavo-convex structure on a surface thereof, having a first refractive index (n1);
   a light extraction layer, provided on the concavo-convex structure, having a second refractive index (n2), and
   a flattened layer, provided to cover the concavo-convex structure layer and the light extraction layer, having a third refractive index (n3),
   wherein the first refractive index (n1) is substantially different from the second refractive index (n2),
   the light extraction layer includes a first light extraction layer provided on a convex portion of the concavo-convex structure,
   in the first light extraction layer a distance Lcv between an average position Sh of tops of convex portions and an average surface position Scv of the first light extraction layer on the convex portion meets following equation (1), in the concavo-convex structure a convex-portion average height H meets following equation (2), while an average pitch P meets following equation (3), and the distance Lcv and the convex-portion average height H meet following equation (4),
   the first refractive index (n1), the second refractive index (n2) and the third refractive index (n3) meet any one of following equations (7) to (9), and
   in the flattened layer, an average distance Lor between the average surface position Scv of the first light extraction layer on the convex portion and a surface of the flattened layer meets following equation (10), $$10\ nm \leq Lcv \leq 5000\ nm \qquad Eq.(1)$$

$$10\ nm \leq H \leq 5000\ nm \qquad Eq.(2)$$

$$50\ nm \leq P \leq 5000\ nm \qquad Eq.(3)$$

$$50\ nm \leq Lcv + H \leq 6000\ nm \qquad Eq.(4)$$

$$n2 > n3 \geq n1\ and\ (n2-n3) \geq 0.1 \qquad Eq.(7)$$

$$n3 > n2 > n1\ and\ (n3-n2) \geq 0.1 \qquad Eq.(8)$$

$$n3 \geq n1 > n2\ and\ (n1-n2) \geq 0.1 \qquad Eq.(9)$$

$$0\ nm \leq Lor \leq 800\ nm. \qquad Eq.(10)$$

4. The light extraction product for a semiconductor light emitting device according to claim 1, further comprising:
   a flattened layer, provided to cover the concavo-convex structure layer and the light extraction layer, having a third refractive index (n3),
   wherein the first refractive index (n1), the second refractive index (n2) and the third refractive index (n3) meet any one of following equations (7) to (9), and
   in the flattened layer, an average distance Lor between the average surface position Scc of the second light extraction layer in the concave portion and a surface of the flattened layer and the distance Lcc meet following equation (11), $$n2 > n3 \geq n1\ and\ (n2-n3) \geq 0.1 \qquad Eq.(7)$$

$$n3 > n2 > n1\ and\ (n3-n2) \geq 0.1 \qquad Eq.(8)$$

$$n3 \geq n1 > n2\ and\ (n1-n2) \geq 0.1 \qquad Eq.(9)$$

$$Lcc \leq Lor \leq 800\ nm. \qquad Eq.(11)$$

5. The light extraction product for a semiconductor light emitting device according to claim 2, further comprising:
   a flattened layer, provided to cover the concavo-convex structure layer and the light extraction layer, having a third refractive index (n3),
   wherein the first refractive index (n1), the second refractive index (n2) and the third refractive index (n3) meet any one of following equations (7) to (9), and
   in the flattened layer, an average distance Lor between the average surface position Sec of the second light extraction layer in the concave portion and a surface of the flattened layer, the distance Lcc and the distance Lcv meet following equation (12), $$n2 > n3 \geq n1\ and\ (n2-n3) \geq 0.1 \qquad Eq.(7)$$

$$n3 > n2 > n1\ and\ (n3-n2) \geq 0.1 \qquad Eq.(8)$$

$$n3 \geq n1 > n2\ and\ (n1-n2) \geq 0.1 \qquad Eq.(9)$$

$$(Lcc+Lcv) \leq Lor \leq 800\ nm. \qquad Eq.(12)$$

6. A light extraction product for a semiconductor light emitting device, comprising:
   a concavo-convex structure layer, provided with a concavo-convex structure on a surface thereof, having a first refractive index (n1); and
   a light extraction layer, provided on the concavo-convex structure, having a second refractive index (n2),
   wherein the first refractive index (n1) is substantially different from the second refractive index (n2),
   the light extraction layer includes a first light extraction layer provided on a convex portion of the concavo-convex structure,
   in the first light extraction layer a distance Lcv between an average position Sh of tops of convex portions and an average surface position Scv of the first light extraction layer on the convex portion meets following equation (1), in the concavo-convex structure a convex-portion average height H meets following equation (2), while an average pitch P meets following equation (3), and the distance Lcv and the convex-portion average height H meet following equation (4),
   in a first direction in which the concavo-convex structure layer belong to the inside of the surface, a plurality of convex portions or concave portions has a plurality of convex portion lines or concave portion lines arranged with a pitch (Py), the plurality of convex portion lines or concave portion lines is arranged parallel with a pitch (Px) in a second direction orthogonal to the first direction, each of the pitch (Px) and the pitch (Py) ranges from 50 nm to 5000 nm, and one of the pitch (Py) and the pitch (Px) is a constant interval, while the other one is an inconstant interval, or both are inconstant intervals, $$10\ nm \leq Lcv \leq 5000\ nm \qquad Eq.(1)$$

$$10\ nm \leq H \leq 5000\ nm \qquad Eq.(2)$$

$$50\ nm \leq P \leq 5000\ nm \qquad Eq.(3)$$

$$50\ nm \leq Lcv + H \leq 6000\ nm. \qquad Eq.(4)$$

7. The light extraction product for a semiconductor light emitting device according to claim 6, wherein the pitch (Py) with the inconstant interval is equal to a distance between centers of respective convex portions or concave portions, the pitch (Px) with the inconstant interval is equal to a distance among the plurality of convex portion lines or concave portion lines, the pitch (Py) and the pitch (Px) are larger than a diameter of the convex portion or an opening diameter of the concave portion, pitches (Py)n among at least adjacent four or more to m or less convex portions or concave portions (3≤n≤2a or 3≤n≤2a+1, where m and a are positive integers and n=m−1) meet a relationship of following equation (13) while at least one or more convex portion groups or concave portion groups formed with the pitches (Py)1 to (Py)n are arranged in the first direction when the pitch (Py) is the inconstant interval, and when the pitch (Px) is the inconstant interval, pitches (Px)n among at least adjacent four or more to m or less convex portion lines or concave portion lines (3≤n≤2a or 3≤n≤2a+1, where m and a are positive integers and n=m−1) meet a relationship of following equation (14) while at least one or more convex portion line groups or concave portion line groups formed with the pitches (Px)1 to (Px)n are arranged in the second direction, $$(Py)1 < (Py)2 < (Py)3 < \ldots < (Py)a > \ldots > (Py)n \qquad Eq.(13)$$

$$(Px)1 < (Px)2 < (Px)3 < \ldots < (Px)a > \ldots > (Px)n. \qquad Eq.(14)$$

8. The light extraction product for a semiconductor light emitting device according to claim 6, wherein the pitch (Py) with the inconstant interval is equal to a distance between centers of respective convex portions or concave portions, the pitch (Px) with the inconstant interval is equal to a distance among the plurality of convex portion lines or concave portion lines, the pitch (Py) and the pitch (Px) are larger than a diameter of the convex portion or an opening diameter of the concave portion, pitches (Py)n among at least adjacent four or more to m or less convex portions or concave portions (3≤n≤2a or 3≤n≤2a+1, where m and a are positive integers and n=m−1) meet a relationship of following equation (13) while convex portion groups or concave portion groups formed with the pitches (Py)1 to (Py)n are arranged repeatedly with a long period Lyz in the first direction when the pitch (Py) is the inconstant interval, and when the pitch (Px) is the inconstant interval, pitches (Px)n among at least adjacent four or more to m or less convex portion lines or concave portion lines (3≤n≤2a or 3≤n≤2a+1, where m and a are positive integers and n=m−1) meet a relationship of following equation (14) while convex portion line groups or concave portion line groups formed with the pitches (Px)1 to (Px)n are arranged repeatedly with a long period Lxz in the second direction, $$(Py)1 < (Py)2 < (Py)3 < \ldots < (Py)a > \ldots > (Py)n \qquad Eq.(13)$$

$$(Px)1 < (Px)2 < (Px)3 < \ldots < (Px)a > \ldots > (Px)n. \qquad Eq.(14)$$

9. The light extraction product for a semiconductor light emitting device according to claim 7, wherein the diameter of the convex portion or the opening diameter of the concave portion increases or decreases corresponding to the pitch (Py) or the pitch (Px) or both, diameters or opening diameters (Dyn) of at least adjacent four or more to m or less convex portions or concave portions (3≤n≤2a or 3≤n≤2a+1, where m and a are positive integers and n=m−1) forming the pitch meet a relationship of following equation (15) while at least one or more convex portion groups or concave portion groups formed with the diameters or the opening diameters (Dy)1 to (Dy)n are arranged in the first direction when the pitch (Py) is the inconstant interval, and when the pitch Px is the inconstant interval, diameters or opening diameters (Dxn) of at least adjacent four or more to m or less convex portions or concave portions (3≤n≤2a or 3≤n≤2a+1, where m and a are positive integers and n=m−1) forming the pitch meet a relationship of following equation (16) while at least one or more convex portion line groups or concave portion line groups formed with the diameters or the opening diameters Dx1 to Dxn are arranged in the second direction, $$Dy1 < Dy2 < Dy3 < \ldots < Dya > \ldots > Dyn \qquad Eq.(15)$$

$$Dx1 < Dx2 < Dx3 < \ldots < Dxa > \ldots > Dxn. \qquad Eq.(16)$$

10. The light extraction product for a semiconductor light emitting device according to claim 8, wherein the diameter of the convex portion or the opening diameter of the concave portion increases or decreases corresponding to the pitch (Py) or the pitch (Px) or both, diameters or opening diameters (Dyn) of at least adjacent four or more to m or less convex portions or concave portions (3≤n≤2a or 3≤n≤2a+1, where m and a are positive integers and n=m−1) forming the pitch meet a relationship of following equation (15) while convex portion groups or concave portion groups formed with the diameters or the opening diameters (Dy)1 to (Dy)n are arranged repeatedly with a long period unit Lyz in the first direction when the pitch (Py) is the inconstant interval, and when the pitch (Px) is the inconstant interval, diameters or opening diameters (Dxn) of at least adjacent four or more to m or less convex portions or concave portions (3≤n≤2a or 3≤n≤2a+1, where m and a are positive integers and n=m−1) forming the pitch meet a relationship of following equation (16) while convex portion line groups or concave portion line groups formed with the diameters or the opening diameters Dx1 to Dxn are arranged with a long period unit Lxz, $$Dy1 < Dy2 < Dy3 < \ldots < Dya > \ldots > Dyn \qquad Eq.(15)$$

$$Dx1 < Dx2 < Dx3 < \ldots < Dxa > \ldots > Dxn. \qquad Eq.(16)$$

11. The light extraction product for a semiconductor light emitting device according to claim 7, wherein a height of each of the convex portion or the concave portion increases or decreases corresponding to the pitch (Py) or the pitch (Px) or both, heights Hyn of at least adjacent four or more to m or less convex portions or concave portions (3≤n≤2a or 3≤n≤2a+1, in addition, m and a are positive integers and n=m−1) forming the pitch meet a relationship of following equation (17) while at least one or more convex portion groups or concave portion groups formed with the heights Hy1 to Hyn are arranged in the first direction when the pitch (Py) is the inconstant interval, and when the pitch (Px) is the inconstant interval, heights Hxn of at least adjacent four or more to m or less convex portions or concave portions ($3 \le n \le 2a$ or $3 \le n \le 2a+1$, in addition, m and a are positive integers and n=m−1) forming the pitch meet a relationship of following equation (18) while at least one or more convex portion line groups or concave portion line groups formed with the heights Hx1 to Hxn are arranged in the second direction, $$Hy1<Hy2<Hy3<\ldots<Hya>\ldots>Hyn \quad \text{Eq.(17)}$$

$$Hx1<Hx2<Hx3<\ldots<Hxa>\ldots>Hxn. \quad \text{Eq.(18)}$$

12. The light extraction product for a semiconductor light emitting device according to claim 8, wherein the height of each of the convex portion or the concave portion increases or decreases corresponding to the pitch (Py) or the pitch (Px) or both, heights Hyn of at least adjacent four or more to m or less convex portions or concave portions ($3 \le n \le 2a$ or $3 \le n \le 2a+1$, in addition, m and a are positive integers and n=m−1) forming the pitch meet a relationship of following equation (17) while convex portion groups or concave portion groups formed with the heights Hy1 to Hyn are arranged repeatedly with a long period unit Lyz in the first direction when the pitch (Py) is the inconstant interval, and when the pitch (Px) is the inconstant interval, heights Hxn of at least adjacent four or more to m or less convex portions or concave portions ($3 \le n \le 2a$ or $3 \le n \le 2a+1$, in addition, m and a are positive integers and n=m−1) forming the pitch meet a relationship of following equation (18) while convex portion line groups or concave portion line groups formed with the heights Hx1 to Hxn are arranged repeatedly with a long period unit Lxz in the second direction, $$Hy1<Hy2<Hy3<\ldots<Hya>\ldots>Hyn \quad \text{Eq.(17)}$$

$$Hx1<Hx2<Hx3<\ldots<Hxa>\ldots>Hxn. \quad \text{Eq.(18)}$$

13. The light extraction product for a semiconductor light emitting device according to claim 6, wherein a shift amount al in the first direction between mutually adjacent first convex portion line and second convex portion line or between mutually adjacent first concave portion line and second concave portion line is different from a shift amount α2 in the first direction between mutually adjacent the second convex portion line and third convex portion line or between mutually adjacent the second concave portion line and third concave portion line.

14. The light extraction product for a semiconductor light emitting device according to claim 13, wherein a difference between the shift amount al and the shift amount α2 is not constant.

15. The light extraction product for a semiconductor light emitting device according to claim 6, wherein the product has a minimal convex portion or a minimal concave portion provided between adjacent convex portions or concave portions.

16. The light extraction product for a semiconductor light emitting device according to claim 6, wherein the plurality of convex portions or concave portions of the concavo-convex structure includes a plurality of first convex portions or concave portions having a first height and a plurality of second convex portions or concave portions having a second height lower than the first height, and the second convex portions or concave portions have a convex-portion height hn meeting following equation (19) relative to a convex-portion average height h of the concavo-convex structure, and exist in a probability of Z meeting following equation (20) in the concavo-convex structure, $$0.9h \ge hn \quad \text{Eq.(19)}$$

$$1/10000 \le Z \le 1/5. \quad \text{Eq.(20)}$$

17. The light extraction product for a semiconductor light emitting device according to claim 16, wherein a distance tcv between adjacent the first convex portions or concave portions via the second convex portion or concave portion on a line segment lcv inside the convex-portion average position scv of the plurality of convex portions or concave portions, and an interval P between adjacent convex portions or concave portions meet following equation (21), $$1.0P<tcv \le 9.5P. \quad \text{Eq.(21)}$$

18. The light extraction product for a semiconductor light emitting device according to claim 6, further comprising:
an antireflection layer comprised of a single layer or multilayer provided on a main surface opposed to the main surface on which the concavo-convex structure layer is formed of the light extraction product, or an antireflection layer comprised of a plurality of convex portions or concave portions arranged at intervals of nanoscale.

19. The light extraction product for a semiconductor light emitting device according to claim 6, further comprising:
a substrate having a fourth refractive index (n4) provided on a main surface opposed to the main surface on which the concavo-convex structure layer is formed of the light extraction product,
wherein the fourth refractive index (n4) is substantially equal or equal to the first refractive index (n1).

20. The light extraction product for a semiconductor light emitting device according to claim 19, wherein the substrate has at least one of a gas barrier function and a water vapor barrier function.

21. The light extraction product for a semiconductor light emitting device according to claim 19, wherein the product has dots or holes provided on the surface of the substrate, and the average pitch of the dots or holes ranges from 100 nm to 5000 nm.

22. The light extraction product for a semiconductor light emitting device according to claim 19, further comprising:
at least one function layer selected from the group consisting of the gas barrier function, the water vapor barrier function, an antifriction function, a reserve printing function, a hydrophobic function, a hydrophilic function, an antistatic function, a color filter function, a color shift function, a polarization modifying function, an antireflection function, a light re-directivity function, a diffusion function, and an optical rotation function.

23. A light emitting device comprising:
the light extraction product for a semiconductor light emitting device according to claim 6; and
a light emitting portion provided on a main surface side on which the concavo-convex structure layer is formed of the semiconductor light emitting device.

24. A top emission type organic EL device comprising:
a light extraction product for a semiconductor light emitting device having:
a concavo-convex structure layer, provided with a concavo-convex structure on a surface thereof, having a first refractive index (n1); and
a light extraction layer, provided on the concavo-convex structure, having a second refractive index (n2); and a light emitting layer provided on the light extraction layer via an adhesive layer, wherein the first refractive index (n1) is substantially different from the second refractive index (n2), the light extraction layer includes a first light extraction layer provided on a convex portion of the concavo-convex structure, in the first light extraction layer a distance Lcv between an average position Sh of tops of convex portions and an average surface position Scv of the first light extraction layer on the convex portion meets following equation (1), in the concavo-convex structure a convex-portion average height H meets following equation (2), while an average pitch P meets following equation (3), and the distance Lcv and the convex-portion average height H meet following equation (4), a distance between an interface between the light emitting layer surface and the adhesive layer and an interface between the adhesive layer and the light extraction layer ranges from 10 nm to 800 nm, $$10 \text{ nm} \leq Lcv \leq 5000 \text{ nm} \qquad \text{Eq.(1)}$$

$$10 \text{ nm} \leq H \leq 5000 \text{ nm} \qquad \text{Eq.(2)}$$

$$50 \text{ nm} \leq P \leq 5000 \text{ nm} \qquad \text{Eq.(3)}$$

$$50 \text{ nm} \leq Lcv + H \leq 6000 \text{ nm}. \qquad \text{Eq.(4)}$$

25. A top emission type organic EL device comprising:
the light extraction product for a semiconductor light emitting device according to claim 3; and
a light emitting layer surface provided on the surface of the flattened layer.

26. A bottom emission type organic EL device comprising:
the light extraction product for a semiconductor light emitting device according to claim 3;
a transparent conductive layer provided on the flattened layer; and
a light emitting portion provided on the transparent conductive layer.

27. A method of manufacturing the light extraction product for a semiconductor light emitting device according to claim 6, including:
a concavo-convex structure layer formation step of providing a concavo-convex structure layer having a first refractive index (n1) on a surface of a substrate having a fourth refractive index (n4) by a transfer method;
a light extraction layer formation step of applying a dilute solution of light extraction layer raw materials having a second refractive index (n2) onto the concavo-convex structure layer, and removing an excessive solvent to form a light extraction layer having the second refractive index (n2) on the concavo-convex structure layer; and
a flattened layer formation step of forming a flattened layer having a third refractive index (n3) to cover the light extraction layer and the concavo-convex structure layer.

28. The method of manufacturing the light extraction product for a semiconductor light emitting device according to claim 27, further including:
an adhesive layer formation step of providing an adhesive layer on the surface of the substrate or a hydrophilic treatment step of making the surface of the substrate hydrophilic, before the concavo-convex structure layer formation step.

29. A method of manufacturing the light extraction product for a semiconductor light emitting device according to claim 6, comprising:
a concavo-convex structure layer formation step of providing a concavo-convex structure layer containing a medium having the first refractive index (n1) on a surface of a substrate having a third refractive index (n3) by a transfer method;
a nanoparticle arrangement step of applying a solution containing nanoparticle raw materials onto the concavo-convex structure layer provided in the concavo-convex structure formation step, and arranging the nanoparticles having the second refractive index (n2) only in the inside of each concave portion of the concavo-convex structure layer; and
a flattened layer formation step of applying a solution of medium raw materials having the first refractive index (n1) onto the concavo-convex structure layer and the nanoparticles arranged in the inside of each concave portion of the concavo-convex structure layer, and forming a flattened layer having the first refractive index (n1) to cover the nanoparticles and the concavo-convex structure layer.

30. The method of manufacturing the light extraction product for a semiconductor light emitting device according to claim 29, wherein in the concavo-convex structure layer, at least the concavo-convex structure surface is hydrophobic.

31. The method of manufacturing the light extraction product for a semiconductor light emitting device according to claim 30, wherein the solution containing nanoparticle raw materials contains an aqueous solvent.

32. The method of manufacturing the light extraction product for a semiconductor light emitting device according to claim 31, wherein the nanoparticle raw materials contain metal alkoxide.

33. The method of manufacturing the light extraction product for a semiconductor light emitting device according to claim 32, further including:
an adhesive layer formation step of providing an adhesive layer on the surface of the substrate or a hydrophilic treatment step of making the surface of the substrate hydrophilic, before the concavo-convex structure layer formation step.

34. The method of manufacturing the light extraction product for a semiconductor light emitting device according to claim 29, wherein in the flattened layer formation step, the solution of medium raw materials is applied onto the concavo-convex structure layer and the nanoparticles, a mirror surface is laminated and pressed to the medium raw materials, and then, the mirror surface is peeled off from the medium raw materials to form the flattened layer.

35. The method of manufacturing the light extraction product for a semiconductor light emitting device according to claim 34, wherein an energy line is applied in a state in which the mirror surface is laminated and pressed to the medium raw materials, and then, the mirror surface is peeled off from the medium raw materials to form the flattened layer.

36. A method of manufacturing the light extraction product for a semiconductor light emitting device according to claim 19, including:
a mold formation step of transferring a concavo-convex structure provided on a cylindrical mold surface by a light transfer method, and adding a concavo-convex structure onto a main surface of a film-shaped substrate to obtain a film-shaped mold;
a light extraction layer filling step of applying a dilute solution of a light extraction layer having a second refractive index (n2) onto a surface of the concavo-convex structure of the film-shaped mold, removing an excessive solvent, and forming the light extraction layer in the inside of each concave portion of the concavo-convex structure;

a light extraction layer transfer step of obtaining a light extraction product for a semiconductor light emitting device comprised of a substrate having a fourth refractive index (n4)/concavo-convex structure layer having a first refractive index (n1)/light extraction layer having the second refractive index (n2) provided on a top of each convex portion of the concavo-convex structure layer by laminating the surface of the concavo-convex structure of the film-shaped mold with the light extraction layer filled and arranged to a surface of the substrate having the fourth refractive index (n4) via concavo-convex structure layer raw materials having the first refractive index (n1), applying an energy line, and then, peeling off the film-shaped mold; and a flattened layer formation step of forming a flattened layer having a third refractive index (n3) to cover the light extraction layer and the concavo-convex structure layer after the light extraction layer transfer step.

37. A method of manufacturing the light extraction product for a semiconductor light emitting device according to claim 19, including:

a first mold formation step of transferring a concavo-convex structure provided on a cylindrical mold surface by a light transfer method, and adding a concavo-convex structure onto a main surface of a film-shaped substrate to obtain a first film-shaped mold;

a second mold formation step of transferring the concavo-convex structure of the first film-shaped mold by the light transfer method, and adding a concavo-convex structure substantially equal to the concavo-convex structure of the cylindrical mold onto a main surface of a film-shaped substrate to obtain a second film-shaped mold;

a light extraction layer filling step of applying a dilute solution of a light extraction layer having a second refractive index (n2) onto a surface of the concavo-convex structure of the second film-shaped mold, removing an excessive solvent, and forming the light extraction layer in the inside of each concave portion of the concavo-convex structure;

a light extraction layer transfer step of obtaining a light extraction product for a semiconductor light emitting device comprised of a substrate having a fourth refractive index (n4)/concavo-convex structure layer having a first refractive index (n1)/light extraction layer having the second refractive index (n2) provided on a top of each convex portion of the concavo-convex structure layer by laminating the surface of the concavo-convex structure of the second film-shaped mold with the light extraction layer filled and arranged to a surface of the substrate having the fourth refractive index (n4) via concavo-convex structure layer raw materials having the first refractive index (n1), applying an energy line, and then, peeling off the second film-shaped mold; and a flattened layer formation step of forming a flattened layer having a third refractive index (n3) to cover the light extraction layer and the concavo-convex structure layer after the light extraction layer transfer step.

* * * * *